US011462693B2

(12) United States Patent
Kim

(10) Patent No.: US 11,462,693 B2
(45) **Date of Patent: *Oct. 4, 2022**

(54) ORGANIC ELECTROLUMINESCENCE DEVICE

(71) Applicant: Samsung Display Co., Ltd., Yongin-si (KR)

(72) Inventor: Minkyung Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 215 days.

This patent is subject to a terminal disclaimer.

(21) Appl. No.: 16/532,434

(22) Filed: Aug. 5, 2019

(65) Prior Publication Data

US 2020/0168809 A1 May 28, 2020

(30) Foreign Application Priority Data

Nov. 23, 2018 (KR) ........................ 10-2018-0146629

(51) Int. Cl.

*H01L 51/50* (2006.01)
*H01L 51/00* (2006.01)
*H01L 51/52* (2006.01)

(52) U.S. Cl.

CPC ...... *H01L 51/0072* (2013.01); *H01L 51/0067* (2013.01); *H01L 51/0069* (2013.01); *H01L 51/5024* (2013.01); *H01L 51/5036* (2013.01); *H01L 51/5203* (2013.01)

(58) Field of Classification Search

None
See application file for complete search history.

(56) References Cited

U.S. PATENT DOCUMENTS

| | | | | |
|---|---|---|---|---|
| 2004/0214036 | A1 | 10/2004 | Bentsen et al. | |
| 2012/0080670 | A1 | 4/2012 | Park et al. | |
| 2012/0181518 | A1 | 7/2012 | Ogiwara et al. | |
| 2012/0273764 | A1 | 11/2012 | Yu et al. | |
| 2014/0299865 | A1 | 10/2014 | Nishimura et al. | |
| 2014/0326987 | A1 | 11/2014 | Park et al. | |
| 2017/0117483 | A1 | 4/2017 | Kim et al. | |
| 2017/0125699 | A1* | 5/2017 | Ahn | H01L 51/0071 |
| 2017/0358756 | A1 | 12/2017 | Chung et al. | |

FOREIGN PATENT DOCUMENTS

| | | | |
|---|---|---|---|
| JP | 03-205479 | B2 | 9/2001 |
| JP | 2005-093159 | A | 4/2005 |
| KR | 10-2010-0125928 | A | 12/2010 |

(Continued)

OTHER PUBLICATIONS

Machine translation of JP 2005-093159 A, published on Apr. 7, 2005.

(Continued)

*Primary Examiner* — Gregory D Clark
(74) *Attorney, Agent, or Firm* — Lewis Roca Rothgerber Christie LLP

(57) ABSTRACT

An organic electroluminescence device includes a first electrode, a second electrode, and an emission layer between the first electrode and the second electrode. The emission layer includes a first host and a second host different from the first host, thereby achieving high efficiency and a long device life.

20 Claims, 2 Drawing Sheets

(56) References Cited

FOREIGN PATENT DOCUMENTS

| | | | | |
|---|---|---|---|---|
| KR | 10-2011-0048838 A | | 5/2011 | |
| KR | 10-2011-0092263 | | 8/2011 | |
| KR | 10-2011-0095847 A | | 8/2011 | |
| KR | 10-2012-0020816 A | | 3/2012 | |
| KR | 10-2012-0034140 A | | 4/2012 | |
| KR | 10-2012-0042633 | | 5/2012 | |
| KR | 10-2013-0011405 A | | 1/2013 | |
| KR | 10-2013-0022473 A | | 3/2013 | |
| KR | 10-2014-0059176 A | | 5/2014 | |
| KR | 10-2014-0092332 A | | 7/2014 | |
| KR | 10-2014-0108477 A | | 9/2014 | |
| KR | 101556823 | * | 9/2015 | ............ H01L 51/50 |
| KR | 10-2015-0115633 A | | 10/2015 | |
| KR | 10-2015-0148815 | | 10/2015 | |
| KR | 10-1556823 B1 | | 10/2015 | |
| KR | 10-1778046 B1 | | 9/2017 | |
| KR | 10-2017-0140989 A | | 12/2017 | |
| WO | WO 2012/026780 A1 | | 3/2012 | |

OTHER PUBLICATIONS

Machine translation of KR 10-2014-0108477, published on Sep. 11, 2014.

U.S. Office Action dated Jul. 19, 2017, issued in cross-reference U.S. Appl. No. 14/935,226 (25 pages).

U.S. Office Action dated Oct. 2, 2017, issued in U.S. Appl. No. 15/245,148 (13 pages).

U.S. Notice of Allowance dated Mar. 26, 2018, issued in U.S. Appl. No. 15/245,148 (9 pages).

U.S. Non-Final Office action dated Dec. 15, 2017, for cross reference U.S. Appl. No. 14/935,226, issued as U.S. Pat. No. 10,361,372, 16 Pages.

U.S. Final Office action dated Apr. 9, 2018, for cross reference U.S. Appl. No. 14/935,226, issued as U.S. Pat. No. 10,361,372, 19 Pages.

U.S. Advisory action dated Jun. 21, 2018, for cross reference U.S. Appl. No. 14/935,226, issued as U.S. Pat. No. 10,361,372, 3 Pages.

U.S. Non-Final Office action dated Aug. 15, 2018, for cross reference U.S. Appl. No. 14/935,226, issued as U.S. Pat. No. 10,361,372, 13 Pages.

U.S. Final Office action dated Dec. 18, 2018, for cross reference U.S. Appl. No. 14/935,226, issued as U.S. Pat. No. 10,361,372, 13 Pages.

U.S. Notice of Allowance and Notice of Allowability dated Mar. 6, 2019, for cross reference U.S. Appl. No. 14/935,226, issued as U.S. Pat. No. 10,361,372, 31 Pages.

Patent Abstract and Machine English Translation of KR 10-2012-0020816 A, dated Mar. 8, 2012, 19 Pages.

Patent Abstract and Machine English Translation of KR 10-2012-0034140 A, dated Apr. 10, 2012, 37 Pages.

* cited by examiner

ORGANIC ELECTROLUMINESCENCE DEVICE

CROSS-REFERENCE TO RELATED APPLICATION

This application claims priority to and the benefit of Korean Patent Application No. 10-2018-0146629, filed on Nov. 23, 2018, in the Korean Intellectual Property Office (KIPO), the entire content of which is hereby incorporated by reference.

BACKGROUND

1. Field

Embodiments of the present disclosure relate to an organic electroluminescence device.

2. Description of the Related Art

Development on an organic electroluminescence display as an image display is being actively conducted. An organic electroluminescence display is different from a liquid crystal display and is a so-called self-luminescent display, which accomplishes display by recombining holes and electrons, injected from a first electrode and a second electrode, in an emission layer, and emitting light from a luminescent material (which is an organic compound included in the emission layer).

In an application of an organic electroluminescence device to a display device, increase of efficiency and extension of life (e.g, lifespan) for the organic electroluminescence device are desired, and development of materials which may reliably implement the desired features in the organic electroluminescence device is continuously being researched.

SUMMARY

An aspect according to embodiments of the present disclosure is directed toward an organic electroluminescence device having improved efficiency and extended device life.

According to an embodiment of the present disclosure, an organic electroluminescence device includes a first electrode, a second electrode on the first electrode, and an emission layer between the first electrode and the second electrode. The emission layer may include a first host represented by the following Formula 1 and a second host represented by any one of the following Formulae 2-1 to 2-6.

Formula 1

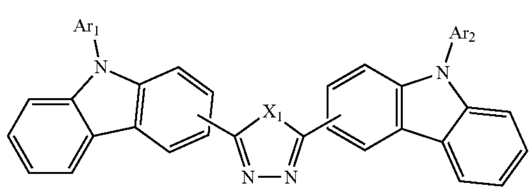

-continued

Formula 2-1

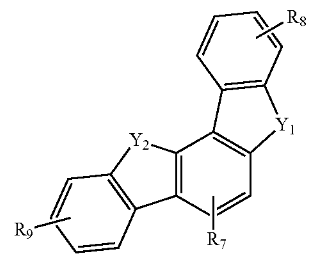

Formula 2-2

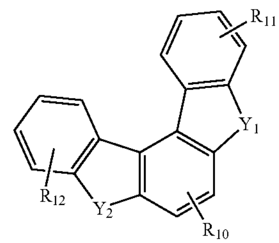

Formula 2-3

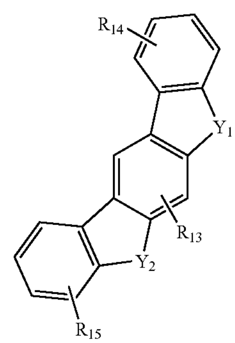

Formula 2-4

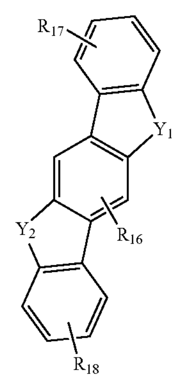

Formula 2-5

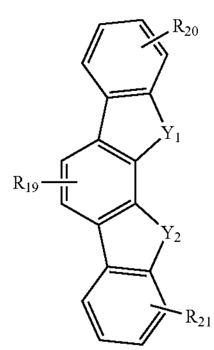

-continued

Formula 2-6

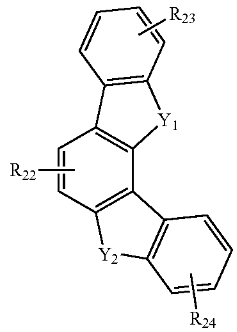

In Formula 1, $X_1$ may be 0, S, or $NR_1$, $R_1$ may be a hydrogen atom, a deuterium atom, a cyano group, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $Ar_1$ and $Ar_2$ may be each independently a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring.

In Formulae 2-1 to 2-6, $Y_1$ and $Y_2$ may be each independently $NR_2$, $CR_3R_4$, or $SiR_5R_6$, $R_2$ to $R_6$ may be each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $R_7$ to $R_{24}$ may be each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring.

In an embodiment, a weight ratio of the first host to the second host may be about 10:90 to about 90:10.

In an embodiment, the first host and the second host may form an exciplex.

In an embodiment, a HOMO energy level and a LUMO energy level of the first host are higher than a HOMO energy level and a LUMO energy level of the second host, respectively.

In an embodiment, the first host represented by Formula 1 may be represented by any one of the following Formulae 1-1 to 1-7.

Formula 1-1

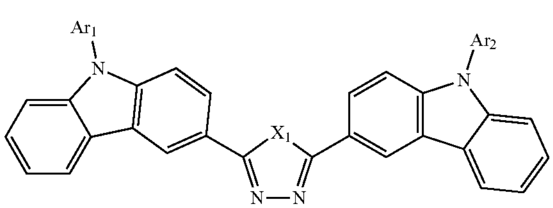

-continued

Formula 1-2

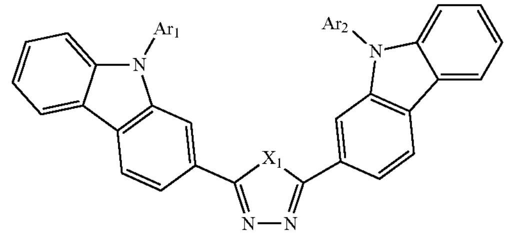

Formula 1-3

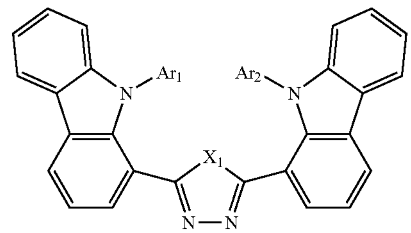

Formula 1-4

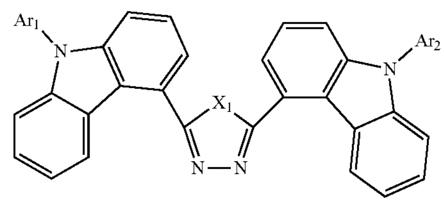

Formula 1-5

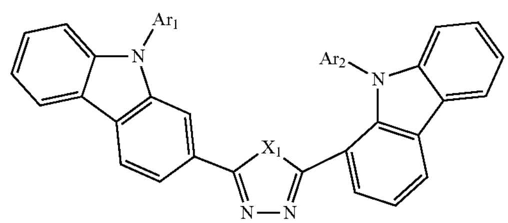

Formula 1-6

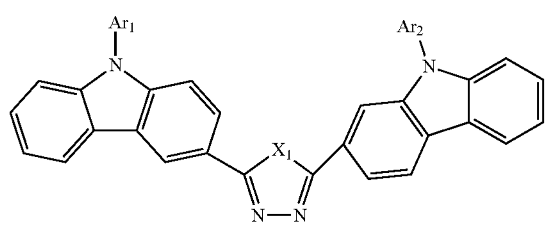

Formula 1-7

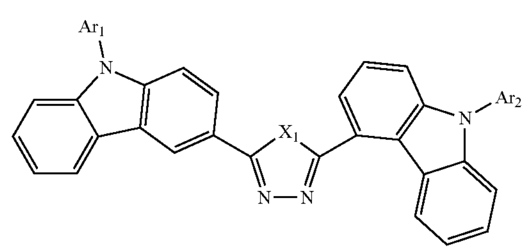

In Formulae 1-1 to 1-7, $X_1$, $Ar_1$, and $Ar_2$ may be the same as respectively defined with respect to Formula 1.

In an embodiment, the second host may include at least one of compounds represented by the following Formulae TC1 to TC12.

TC1
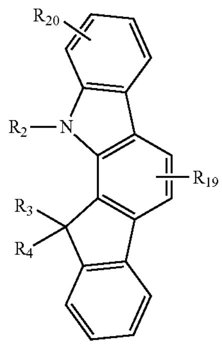
TC2
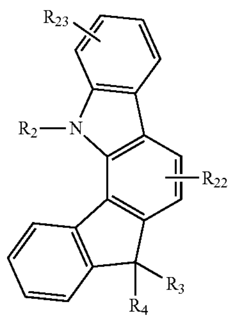
TC3
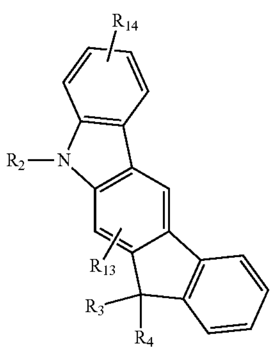
TC4
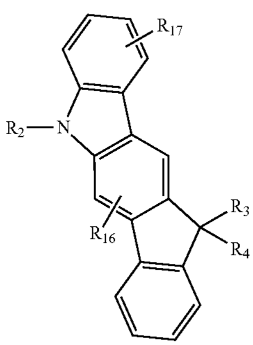
TC5
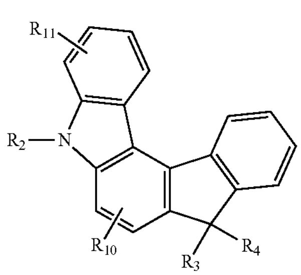
-continued
TC6
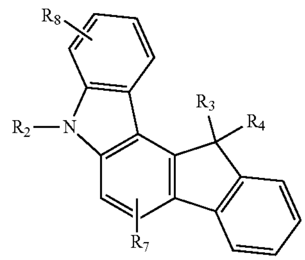
TC7
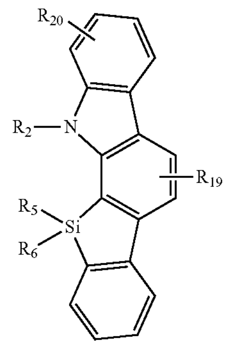
TC8
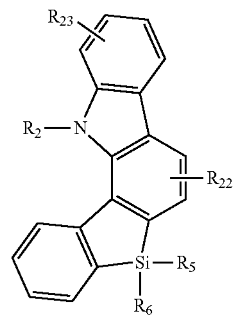
TC9
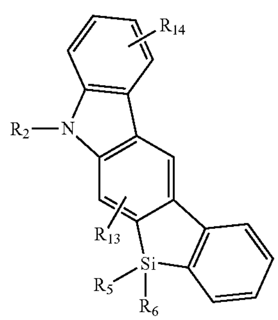
TC10
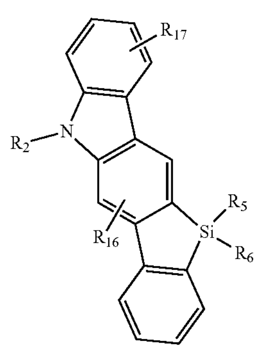

-continued
TC11
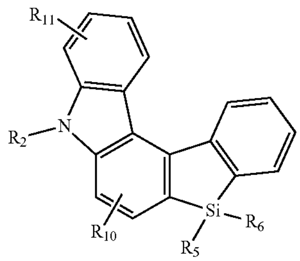
TC12
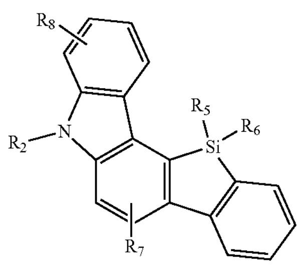
In Formulae TC1 to TC12, $R_2$ to $R_6$, $R_7$, $R_8$, $R_{10}$, $R_{11}$, $R_{13}$, $R_{14}$, $R_{16}$, $R_{17}$, $R_{19}$, $R_{20}$, $R_{22}$, and $R_{23}$ may be the same as respectively defined with respect to Formulae 2-1 to 2-6.
In an embodiment, at least one of $R_2$ to $R_6$ or $R_7$ to $R_{24}$ may be represented by any one of the following H1 to H89, and H91 to H110.
H1
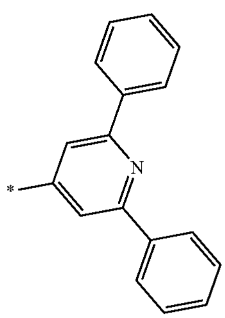
H2
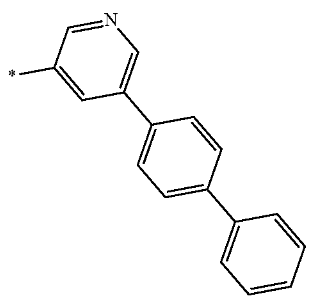
-continued
H3
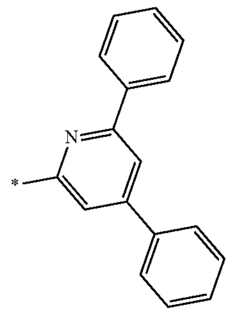
H4
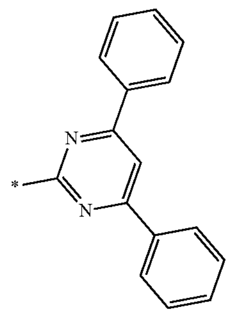
H5
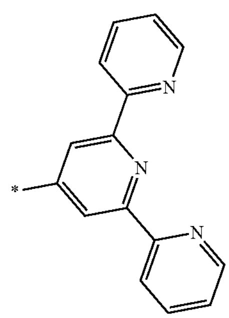
H6
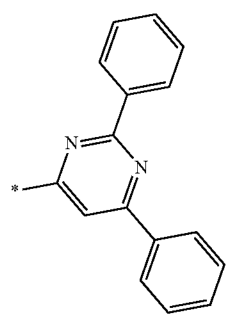
H7
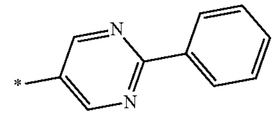
H8
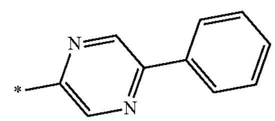

-continued
H9
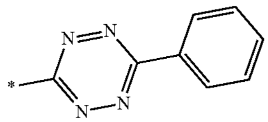
H10
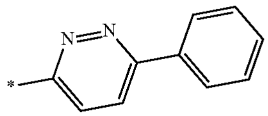
H11
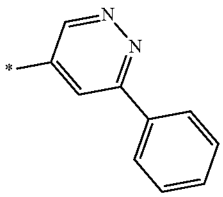
H12
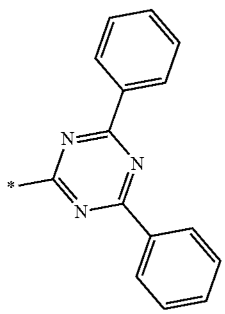
H13
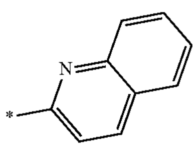
H14
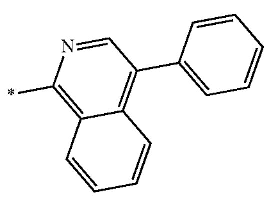
H15
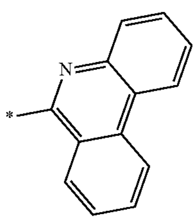
H16
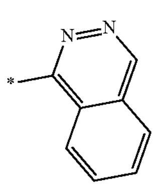
-continued
H17
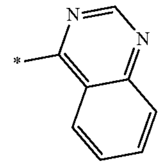
H18
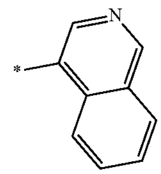
H19
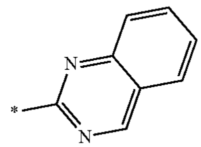
H20
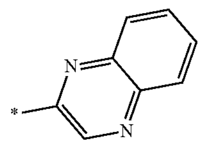
H21
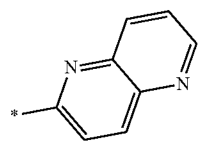
H22
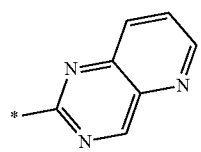
H23
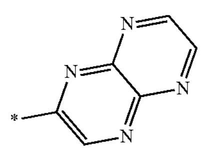
H24
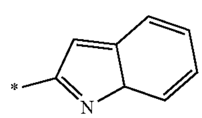
H25
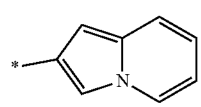
H26
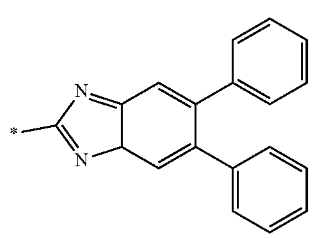

-continued
H27
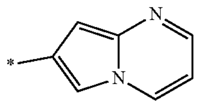
H28
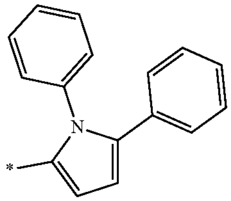
H29
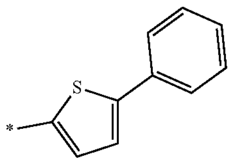
H30
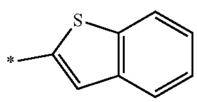
H31
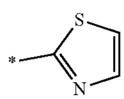
H32
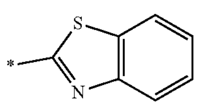
H33
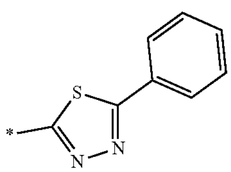
H34
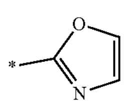
H35
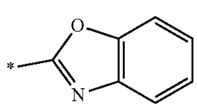
H36
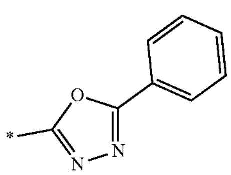
H37
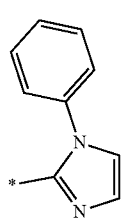
-continued
H38
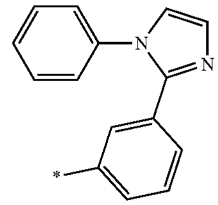
H39
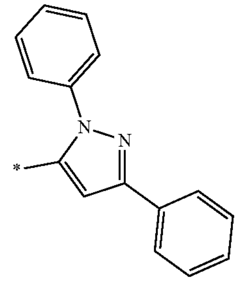
H40
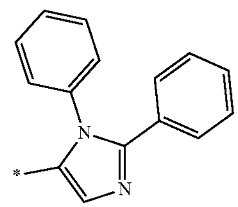
H41
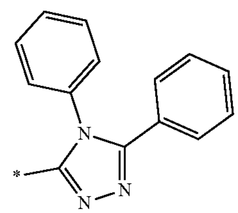
H42
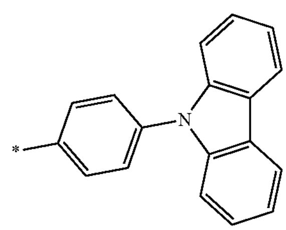
H43
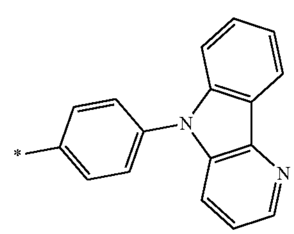
H44
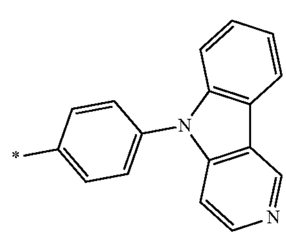

-continued
H45
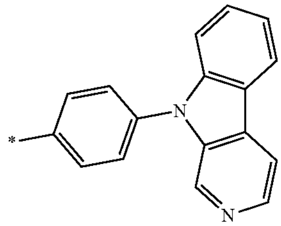
H46
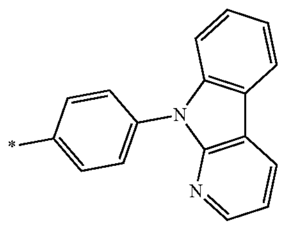
H47
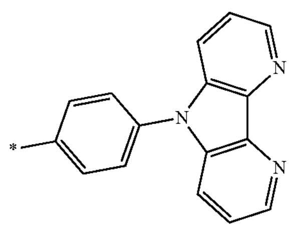
H48
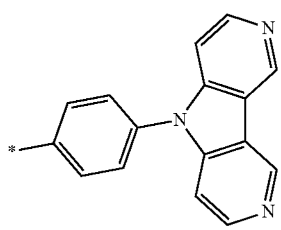
H49
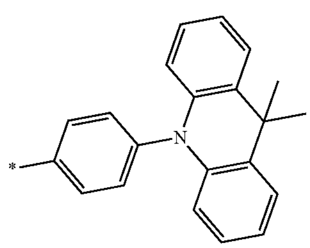
H50
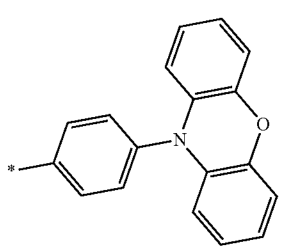
-continued
H51
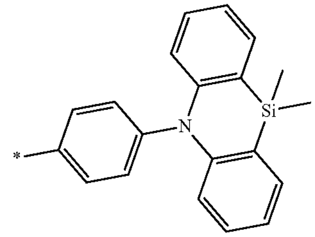
H52
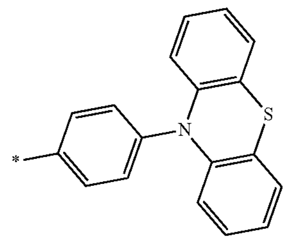
H53
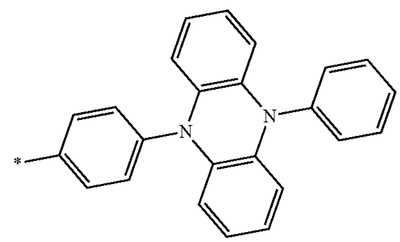
H54
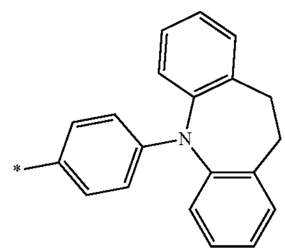
H55
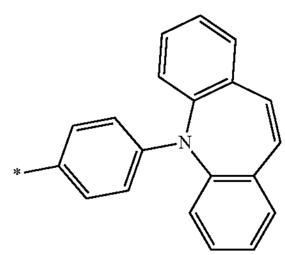
H56
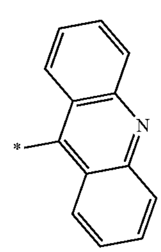

-continued
H57
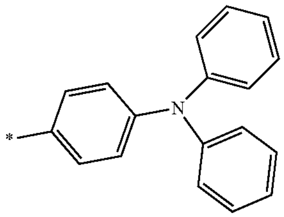
H58
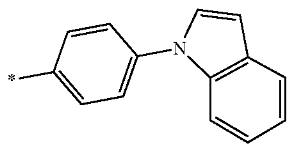
H59
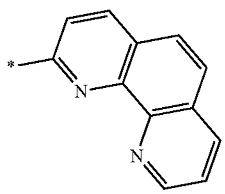
H60
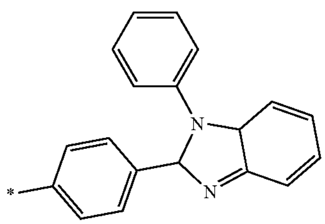
H61
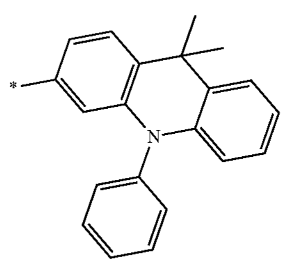
H62
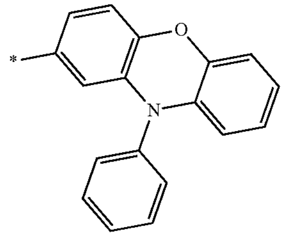
H63
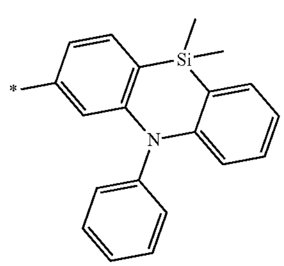
-continued
H64
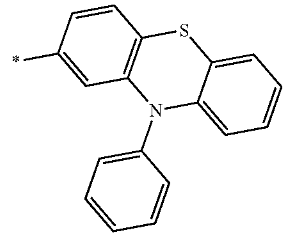
H65
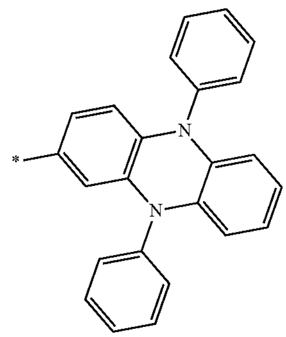
H66
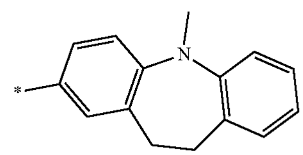
H67
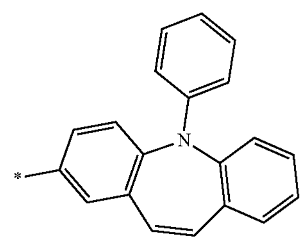
H68
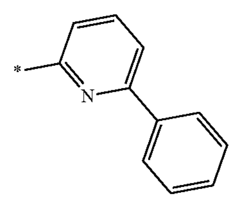
H69
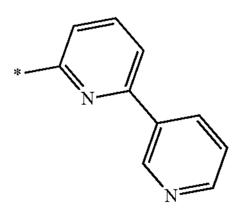
H70
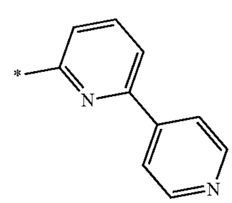

-continued
H71
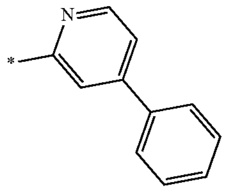
H72
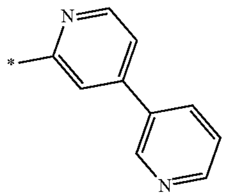
H73
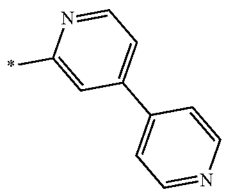
H74
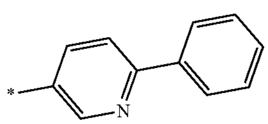
H75
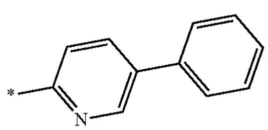
H76
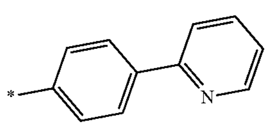
H77
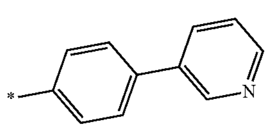
H78
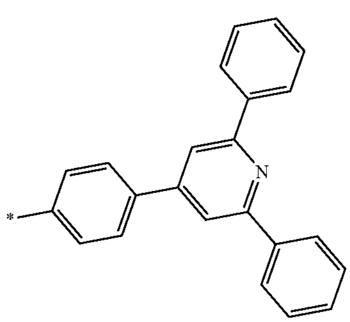
-continued
H79
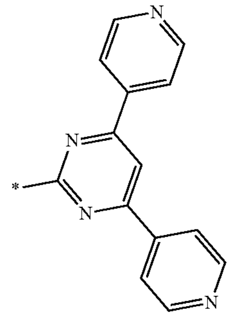
H80
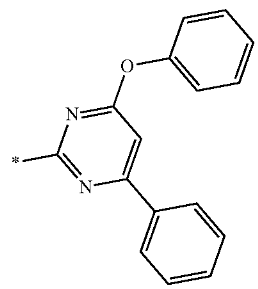
H81
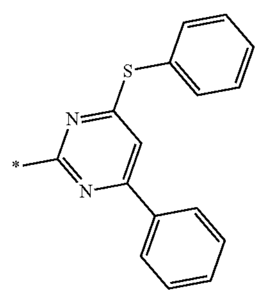
H82
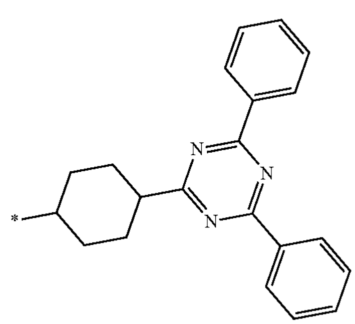

-continued
H83
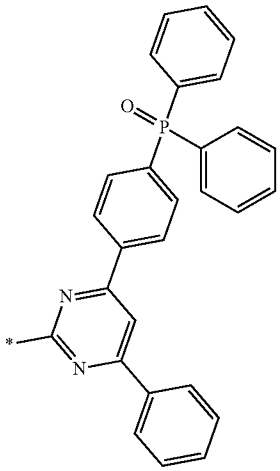
H84
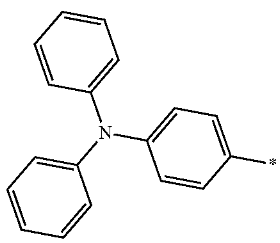
H85
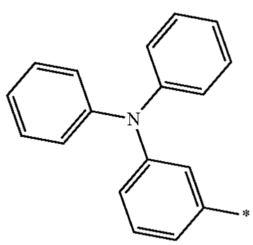
H86
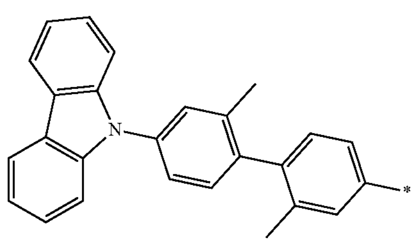
H87
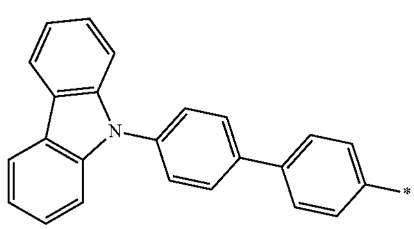
H88
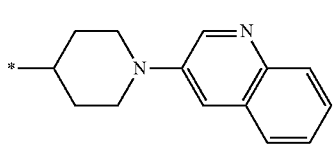
-continued
H89
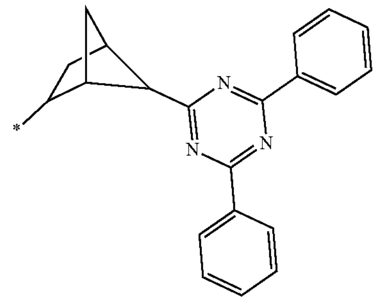
H91
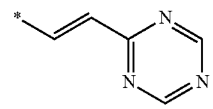
H92
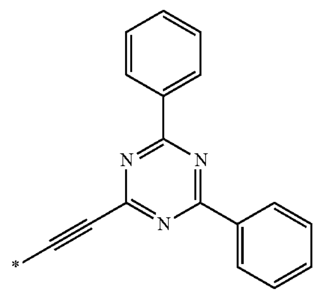
H93
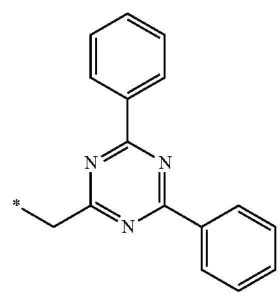
H94
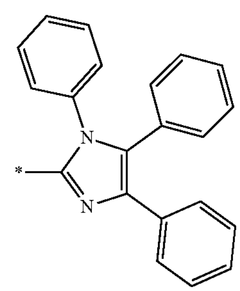
H95
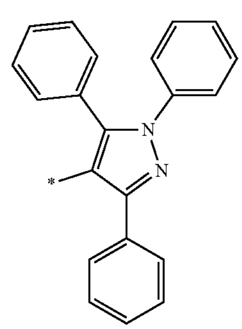

-continued
H96
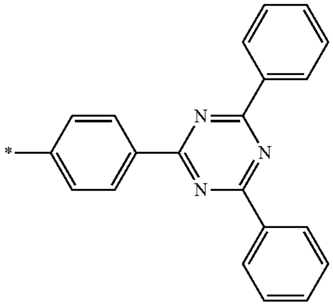
H97
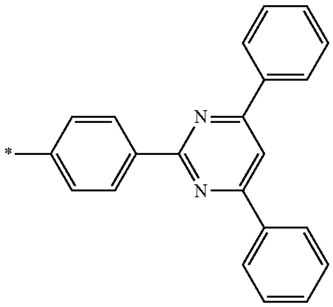
H98
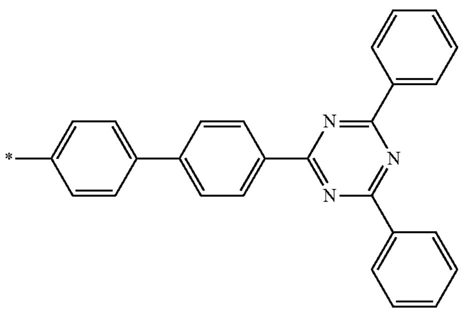
H99
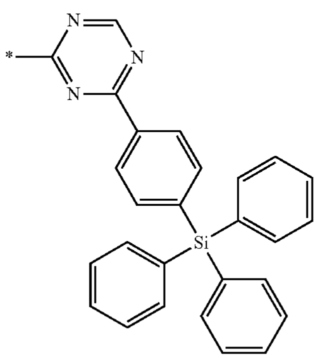
H100
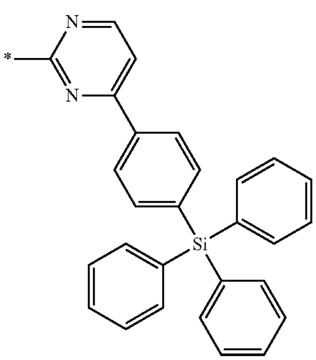
-continued
H101
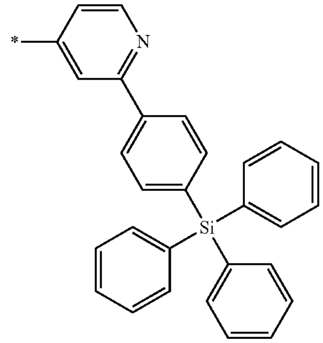
H102
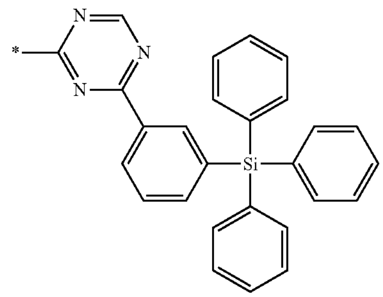
H103
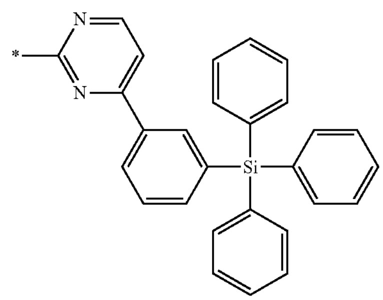
H104
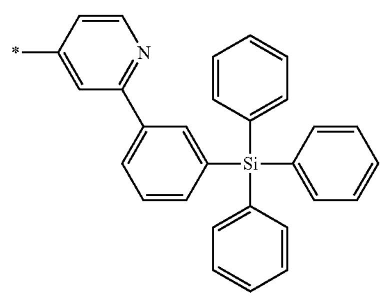
H105
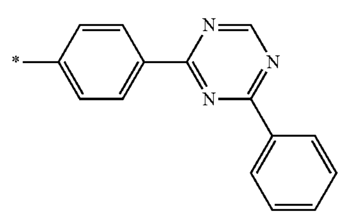

-continued

H106

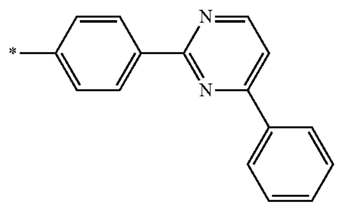

H107

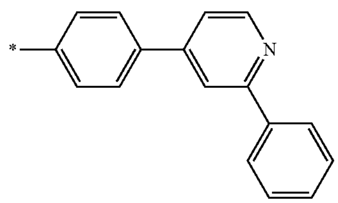

H108

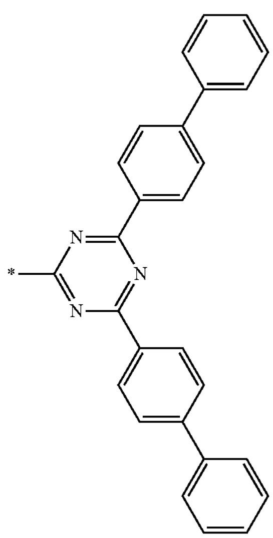

H109

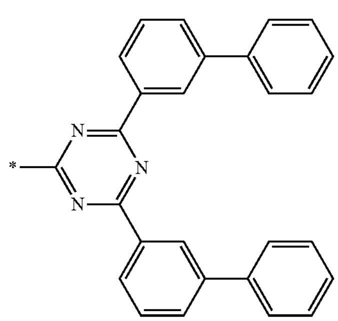

-continued

H110

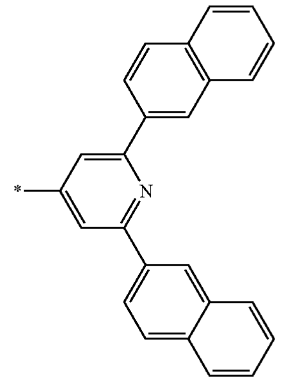

In an embodiment, the first host may be represented by Formula 1-1 or 1-2 and the second host may be represented by Formula 2-4.

In an embodiment, the emission layer may further include a dopant, and the dopant may be a phosphorescence dopant. The emission layer may be to emit light of a green wavelength region. The dopant may be a metal complex including Ir, Os, Pt or Pd as a central atom. A weight ratio of a sum of the first host and the second host to the dopant may be about 59:41 to about 95:5.

In an embodiment, the organic electroluminescence device may further include a hole transport region between the first electrode and the emission layer, and an electron transport region between the emission layer and the second electrode.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
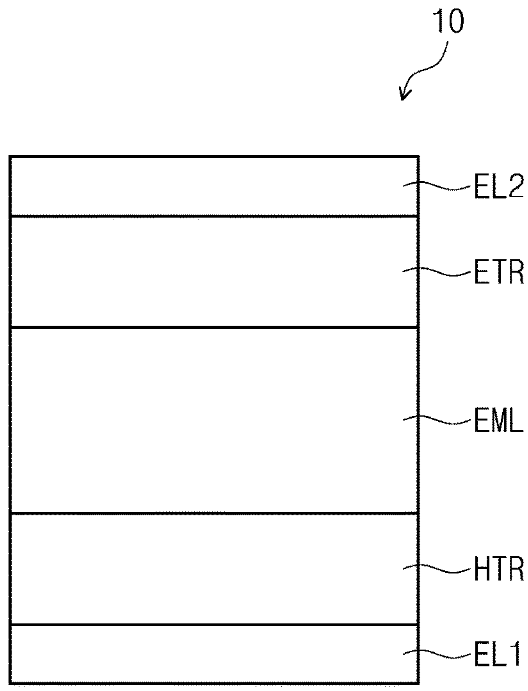
FIG. 1 is a schematic cross-sectional view of an organic electroluminescence device according to an embodiment of the present disclosure.

The subject matter of the present disclosure may have various modifications and may be embodied in different forms, and example embodiments will be explained in more detail with reference to the accompany drawings. However, the subject matter of the present disclosure should not be construed as limited to the embodiments set forth herein. Rather, it should be understood that the scope of the present disclosure includes all modification, equivalents and alternatives within the spirit and scope of the present disclosure as hereinafter claimed.

Like reference numerals refer to like elements for explaining each drawing. In the drawings, the sizes of elements may be enlarged for clarity of illustration. It will be understood that, although the terms first, second, etc., may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be understood that the terms "comprise" and/or "have," when used in this specification, specify the presence of stated features, numerals, steps, operations, elements, parts, or a combination thereof, but do not preclude the presence or addition of one or more other features, numerals, steps, operations, elements, parts, or a combination thereof.

In the present disclosure, when a layer, a film, a region, a plate, etc., is referred to as being "on" or "above" another part, it can be "directly on" the other part, or intervening parts may also be present. Similarly, when a layer, a film, a region, a plate, etc., is referred to as being "under" or "below" another part, it can be "directly under" or "directly below" the other part, or intervening parts may also be present. Furthermore, when used in this specification, the term "disposed on" may encompass both orientations of above and below.

In the present disclosure, the term "substituted or unsubstituted" may refer to an unsubstituted functional group or a functional group substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring, an aryl group and a heterocyclic group. In addition, each of the substituent illustrated above may be substituted or unsubstituted. For example, a biphenyl group may be interpreted as an aryl group, or a phenyl group substituted with a phenyl group.

In the present disclosure, examples of a halogen atom may include a fluorine atom, a chlorine atom, a bromine atom, and/or an iodine atom.

In the present disclosure, the alkyl group may have a linear, branched or cyclic form. The carbon number of the alkyl group may be 1 to 50, 1 to 40, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without being limited thereto.

In the present disclosure, the hydrocarbon ring includes an aliphatic hydrocarbon ring and an aromatic hydrocarbon ring. The heterocycle (i.e., heterocyclic group) includes an aliphatic heterocycle and an aromatic heterocycle. The hydrocarbon ring and heterocycle may be a monocycle or a polycycle.

In the present disclosure, the hydrocarbon ring may be any functional group or substituent derived from an aliphatic hydrocarbon ring, or any functional group or substituent derived from an aromatic hydrocarbon ring. The carbon number of the hydrocarbon ring for forming a ring may be 5 to 60.

In the present disclosure, the term "aryl group" refers to any functional group or substituent derived from an aromatic hydrocarbon ring. The aryl group may be a monocyclic aryl or a polycyclic aryl. The carbon number of the aryl group for forming a ring may be 6 to 40, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without being limited thereto.

In the present disclosure, the heteroaryl group may include B, O, N, P, Si, and/or S as a heteroatom. When the heteroaryl group includes two or more heteroatoms, these heteroatoms may be the same or different from each other. The heteroaryl group may be a monocyclic heteroaryl or a polycyclic heteroaryl. The carbon number of the heteroaryl group for forming a ring may be 3 to 40, 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isoxazole, oxadiazole, thiadiazole, phenothiazine, dibenzosilole, dibenzofuran, etc., without being limited thereto.

In the present disclosure, the carbon number of the amino group is not specifically limited, and may be 1 to 30. The amino group may include alkyl amino, aryl amino, or heteroaryl amino. Examples of the amino group may include methylamino, dimethylamino, phenylamino, diphenylamino, naphthylamino, 9-methyl-anthracenylamino, triphenylamino, etc., without being limited thereto.

In the present disclosure, the carbon number of the amine group is not specifically limited, and may be 1 to 30. The amine group may include alkyl amine and aryl amine. Examples of the amine group may include methylamine, dimethylamine, phenylamine, diphenylamine, naphthylamine, 9-methyl-anthracenylamine, triphenylamine, etc., without being limited thereto.

In the present disclosure, the above-described examples of the akyl group and aryl group may be applied to the alkyl group and aryl group in the alkyl amine group and the aryl amine group.

In the present disclosure, ——• * represents a position to be connected.

FIG. 1 is a schematic cross-sectional view illustrating an organic electroluminescence device according to an embodiment of the present disclosure. An organic electroluminescence device 10 according to an embodiment of the present disclosure may include a first electrode EL1, a hole transport region HTR, an emission layer EML, an electron transport region ETR, and a second electrode EL2, laminated (e.g., stacked) in the stated order.

Figure 2:
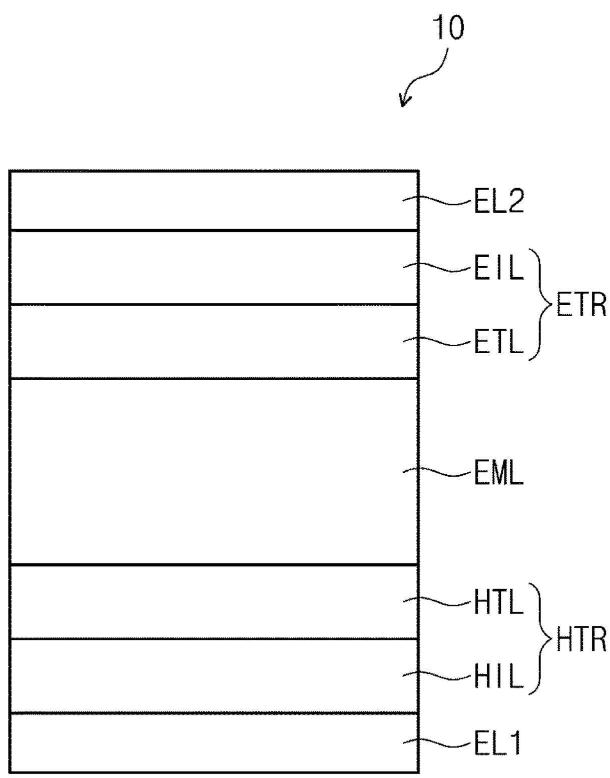
FIG. 2 is a schematic cross-sectional view of an organic electroluminescence device according to an embodiment of the present disclosure.
Figure 3:
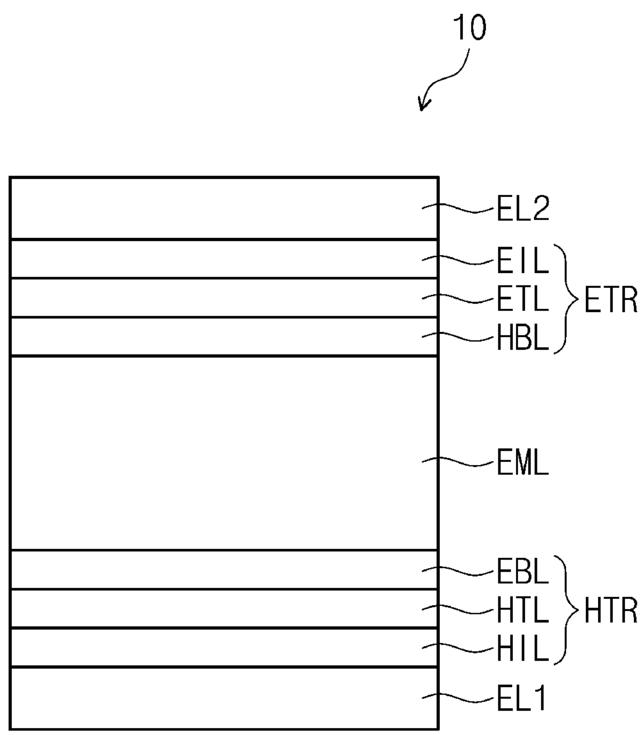
FIG. 3 is a schematic cross-sectional view of an organic electroluminescence device according to an embodiment of the present disclosure.

Comparing with FIG. 1, FIG. 2 shows a schematic cross-sectional view illustrating an organic electroluminescence device 10 according to an embodiment of the present disclosure, in which a hole transport region HTR includes a hole injection layer HIL and a hole transport layer HTL, and an electron transport region ETR includes an electron injection layer EIL and an electron transport layer ETL. Furthermore, comparing with FIG. 1, FIG. 3 shows a schematic cross-sectional view illustrating an organic electroluminescence device 10 according to an embodiment of the present disclosure, in which a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL.

The first electrode EL1 has conductivity. The first electrode EL1 may be formed by a metal alloy or a conductive compound. The first electrode EL1 may be an anode. The first electrode EL1 may also be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/AI, Mo, Ti, a compound thereof, or a mixture thereof (for example, a mixture of Ag and Mg). Also, the first electrode EL1 may have a structure including a plurality of layers including a reflective layer or a transflective layer formed utilizing the above materials, and a transparent conductive layer formed utilizing ITO, IZO, ZnO, and/or ITZO. For example, the first electrode EL1 may have a triple-layer structure of ITO/Ag/ITO. However, embodiments of the present disclosure are not limited thereto. The thickness of the first electrode EL1 may be from about 300 Å to about 10,000 Å, for example, from about 500 Å to about 3,000 Å.

The hole transport region HTR is disposed on the first electrode EL1. The hole transport region HTR may include at least one selected from a hole injection layer HIL, a hole transport layer HTL, a hole buffer layer, and an electron blocking layer EBL.

The hole transport region HTR may have a single layer formed utilizing a single material, a single layer formed utilizing a plurality of different materials, or a multilayer structure including a plurality of layers formed utilizing a plurality of different materials.

For example, the hole transport region HTR may have a single layer structure of a hole injection layer HIL or a hole transport layer HTL, or may have a single layer structure formed utilizing a hole injection material and a hole transport material. In addition, the hole transport region HTR may have a single layer structure formed utilizing a plurality of different materials, or a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, laminated (e.g., stacked) in the stated order from the first electrode EL1, without being limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-I-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport layer HTL may further include carbazole derivatives, such as N-phenyl carbazole and/or polyvinyl carbazole, fluorine-based derivatives, N,N'-bis(3-methylphenyl)-N,N'-diphenyl-[1,1-biphenyl]-4,4'-diamine (TPD), triphenylamine-based derivatives, such as 4,4',4"-tris(N-carbazolyl)triphenylamine (TCTA), N,N'-di(naphthalen-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), α-NPD, 1,3-bis(N-carbazolyl)benzene (mCP), etc.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be at least one selected from quinone derivatives, metal oxides, and cyano group-containing compounds, without being limited thereto. For example, non-limiting examples of the p-dopant may include quinone derivatives (such as tetracyanoquinodimethane (TCNQ), and 2,3,5,6-tetrafluoro-tetracyanoquinodimethane (F4-TCNQ)), and metal oxides (such as tungsten oxide and molybdenum oxide), without being limited thereto.

As described above, the hole transport region HTR may further include a hole buffer layer and/or an electron blocking layer EBL in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be utilized as materials included in the hole buffer layer. The electron blocking layer EBL is a layer preventing or reducing electron injection from the electron transport region ETR into the hole transport region HTR.

The emission layer EML is disposed on the hole transport region HTR. The thickness of the emission layer EML may be, for example, from about 100 Å to about 1,000 Å, or from about 100 Å to about 500 Å. The emission layer EML may have a single layer formed utilizing a single material, a single layer formed utilizing a plurality of different materials, or a multilayer structure having a plurality of layers formed utilizing a plurality of different materials.

In the organic electroluminescence device 10 according to an embodiment of the present disclosure, the emission layer EML may include a first host and a second host.

The first host may be represented by the following Formula 1.

Formula 1

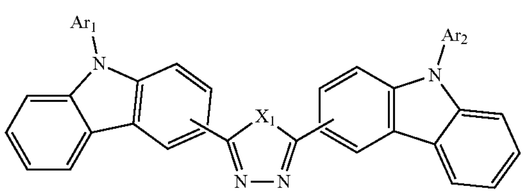

In Formula 1, $X_1$ may be 0, S, or $NR_1$.

$R_1$ may be a hydrogen atom, a deuterium atom, a cyano group, an alkyl group, an aryl group, or a heteroaryl group. The alkyl group may be a substituted or unsubstituted alkyl group having 1 to 40 carbon atoms, the aryl group may be a substituted or unsubstituted aryl group having 6 to 40 carbon atoms for forming a ring, and the heteroaryl group may be a substituted or unsubstituted heteroaryl group having 3 to 40 carbon atoms for forming a ring.

$Ar_1$ and $Ar_2$ may be each independently an alkyl group, an aryl group, or a heteroaryl group. The alkyl group may be a substituted or unsubstituted alkyl group having 1 to 40 carbon atoms, the aryl group may be a substituted or unsubstituted aryl group having 6 to 40 carbon atoms for forming a ring, and the heteroaryl group may be a substituted or unsubstituted heteroaryl group having 3 to 40 carbon atoms for forming a ring.

In one embodiment, $Ar_1$ and $Ar_2$ may include each independently an aryl group or a nitrogen-containing heteroaryl group. The heteroaryl group may include at least one selected from pyridine, pyrimidine, and triazine.

For example, the first host represented by Formula 1 may be represented by any one of the following Formulae 1-1 to 1-7.

Formula 1-1

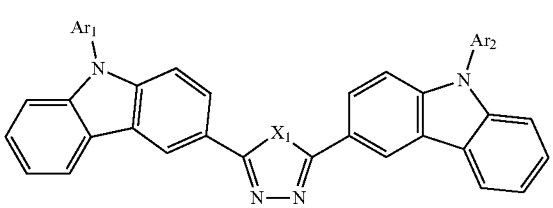

-continued

Formula 1-2

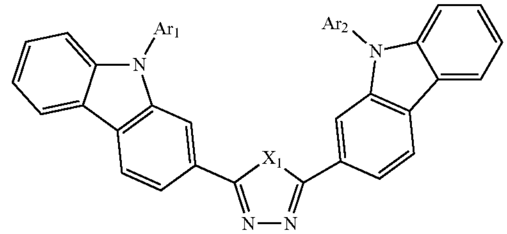

Formula 1-3

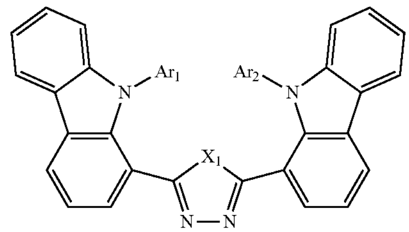

Formula 1-4

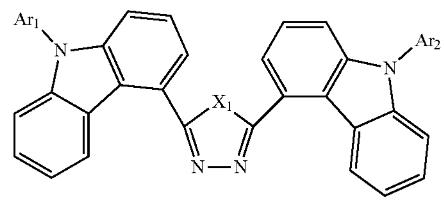

Formula 1-5

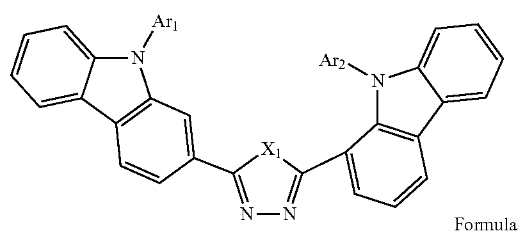

Formula 1-6

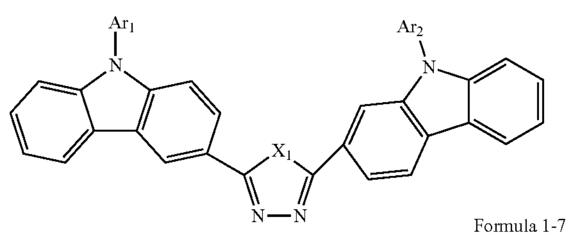

Formula 1-7

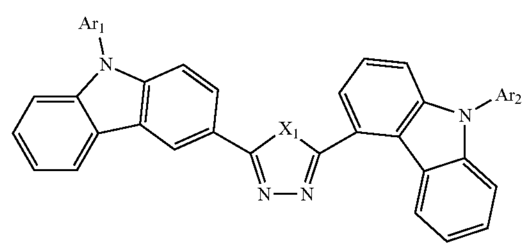

Each of Formulae 1-1 to 1-7 is an embodiment of Formula 1 in which the substitution positions of carbazole derivatives are specified. In Formulae 1-1 to 1-7, $X_1$, $Ar_1$, and $Ar_2$ may be the same as respectively defined with respect to Formula 1.

In the organic electroluminescence device 10 according to an embodiment of the present disclosure, the emission layer EML may include as a first host at least one of compounds represented in the following Compound Group 1.

[Compound Group 1]
C 1
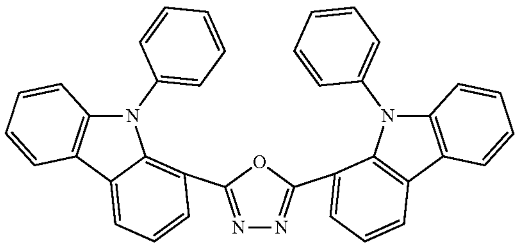
C 2
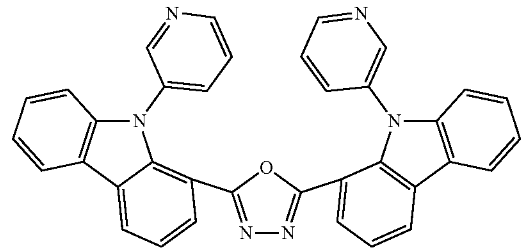
C 3
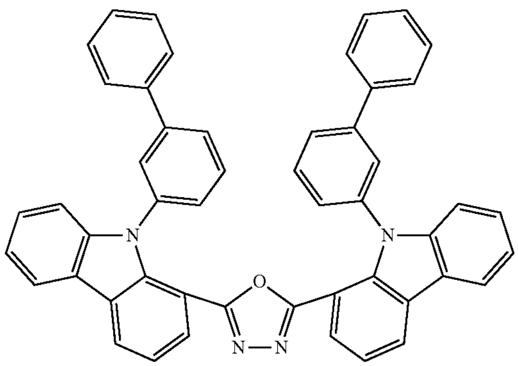
C 4
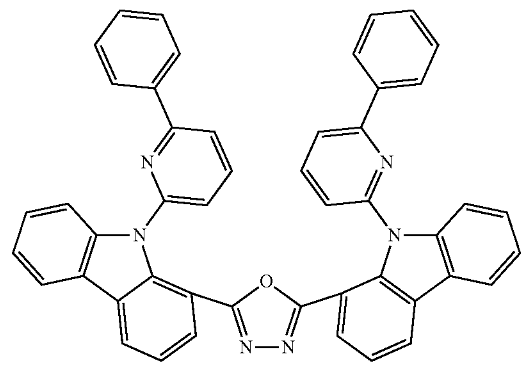
C 5
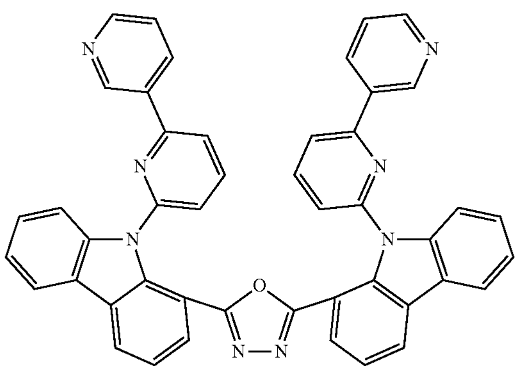
C 6
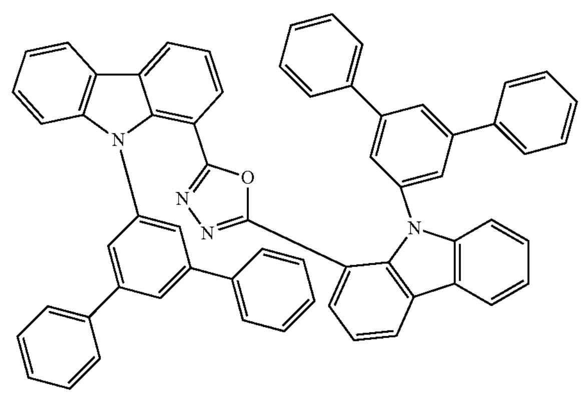
C 7
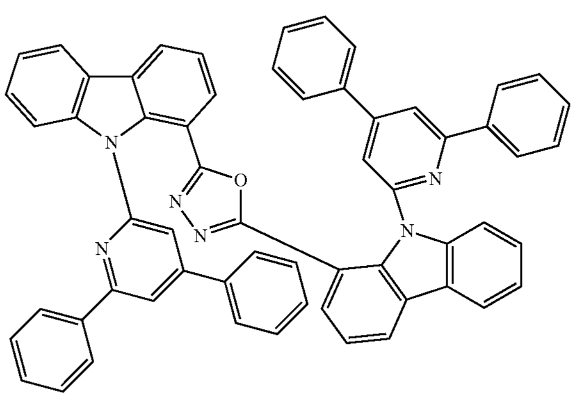
C 8
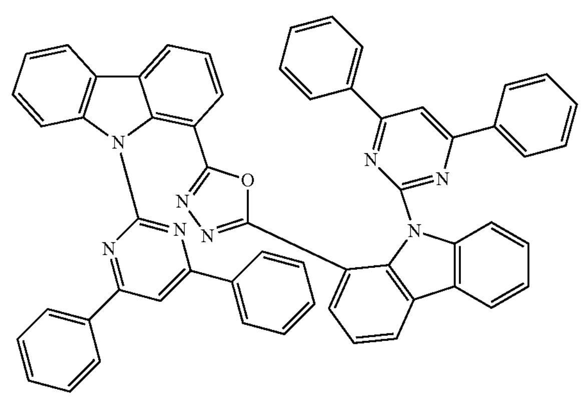

-continued
C 9
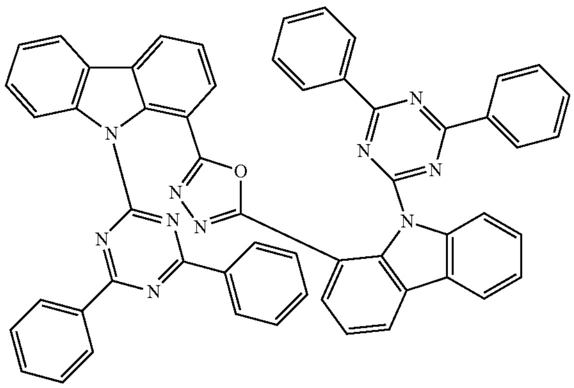
C 10
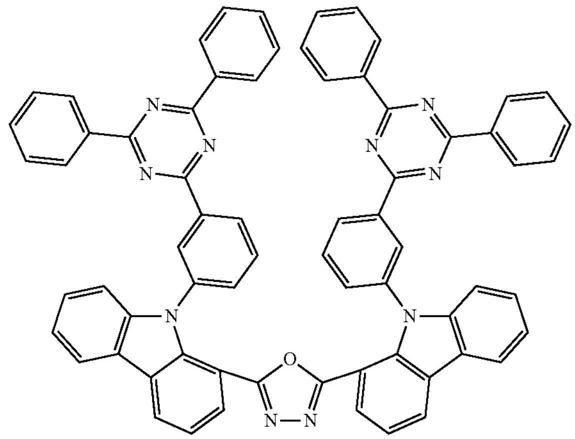
C 11
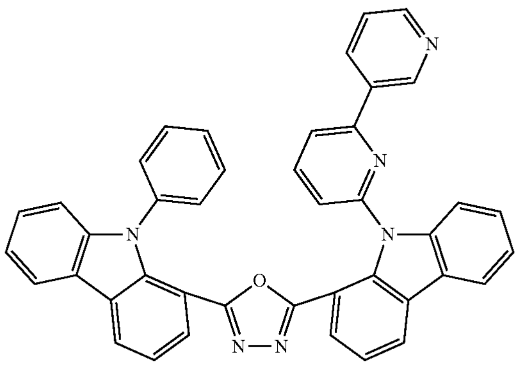
C 12
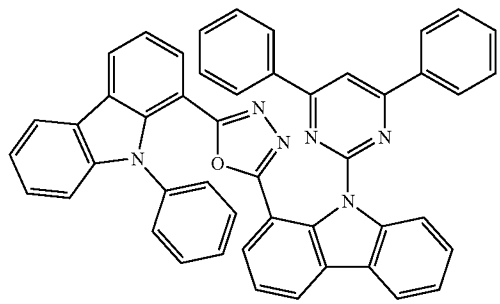
C 13
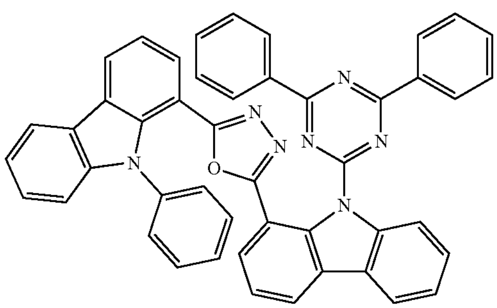
C 14
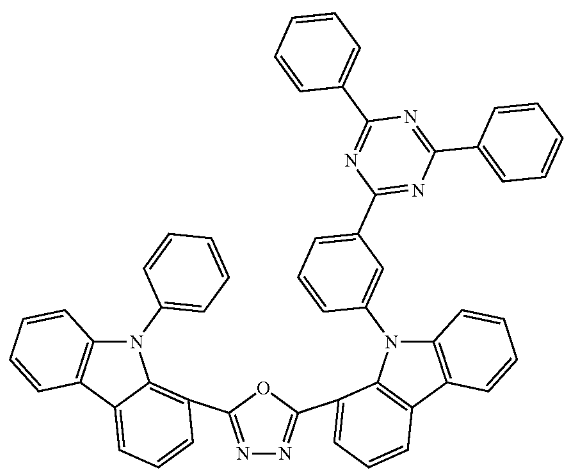
C 15
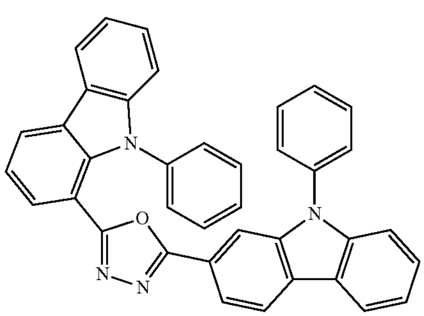
C 16
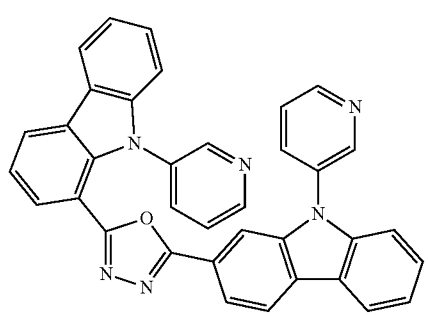

-continued
C 17
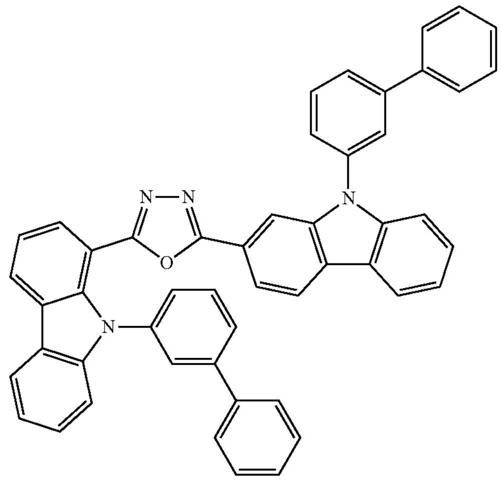
C 18
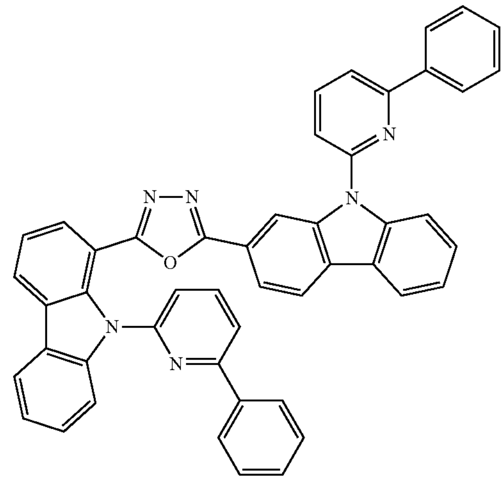
C 19
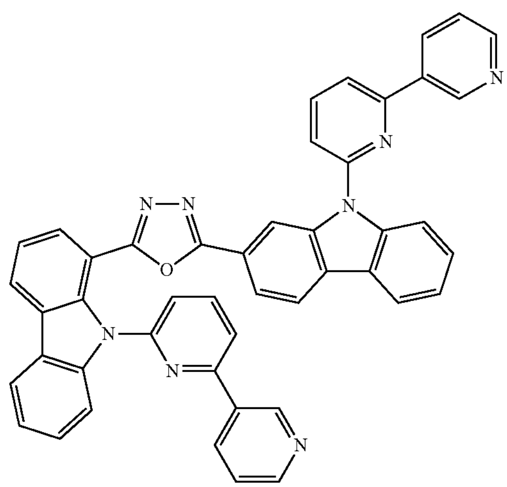
C 20
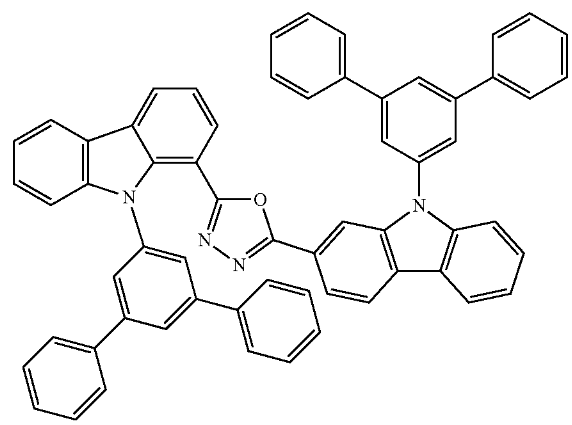
C 21
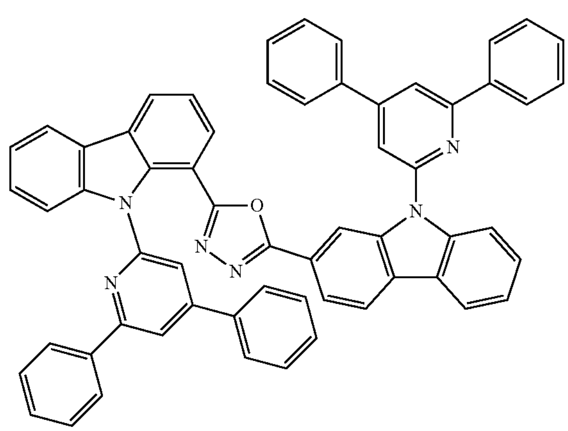
C 22
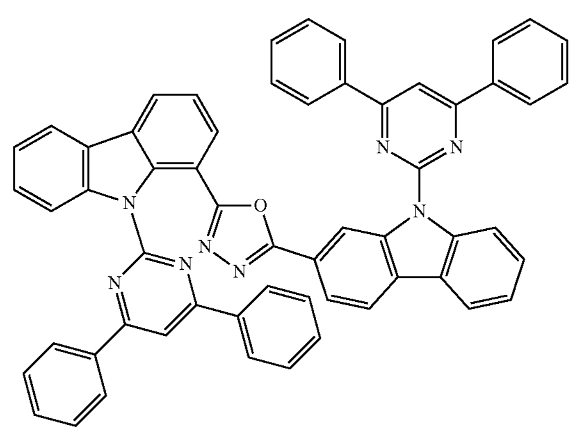

-continued
C 23
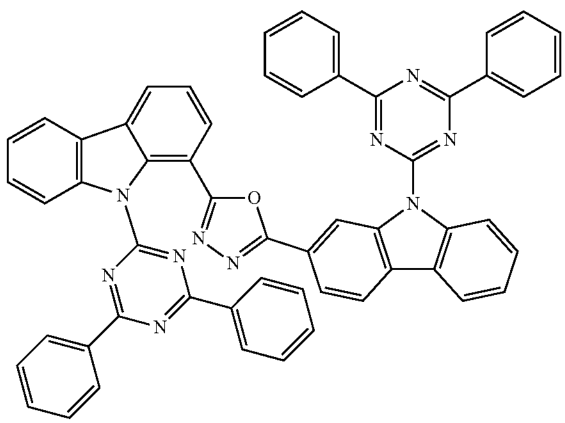
C 24
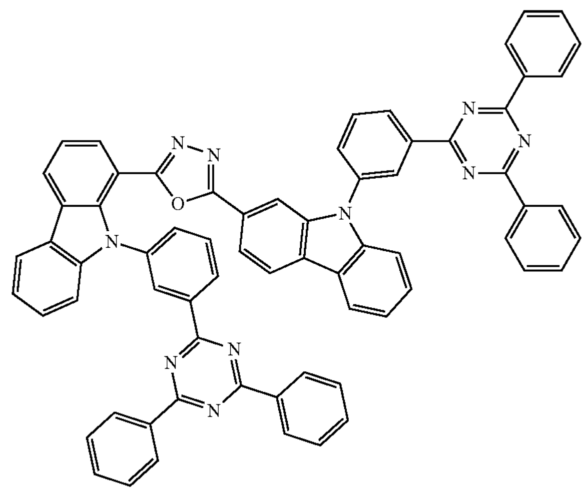
C 25
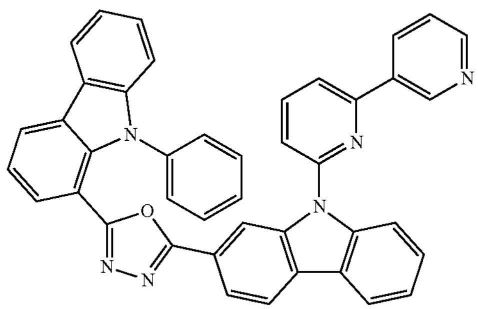
C 26
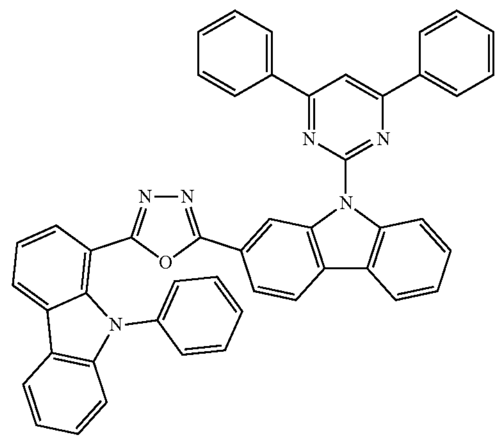
C 27
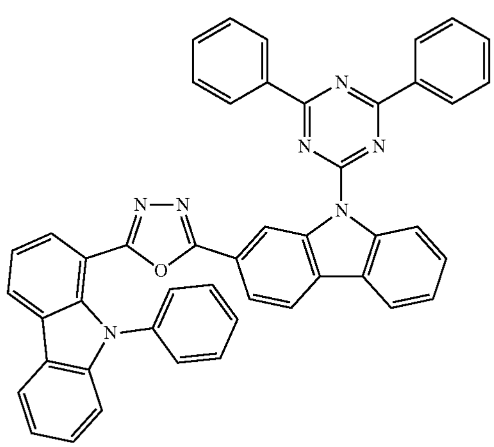
C 28
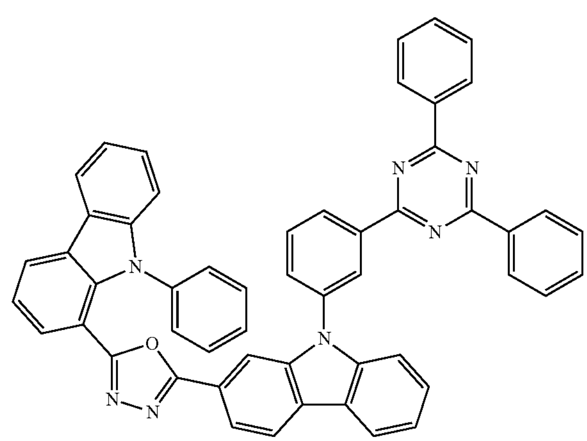

-continued
C 29
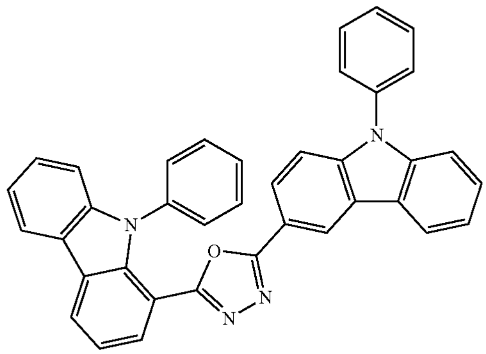
C 30
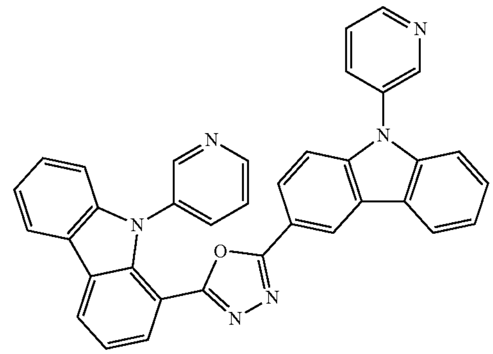
C 31
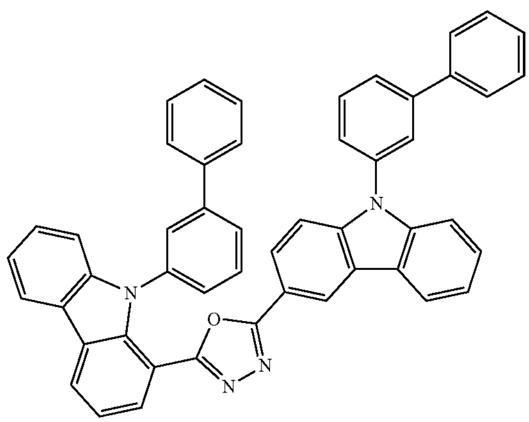
C 32
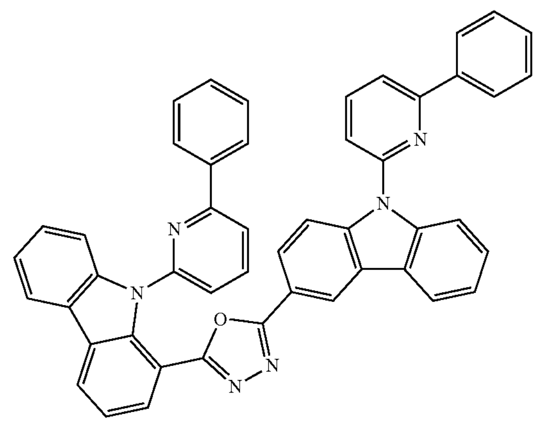
C 33
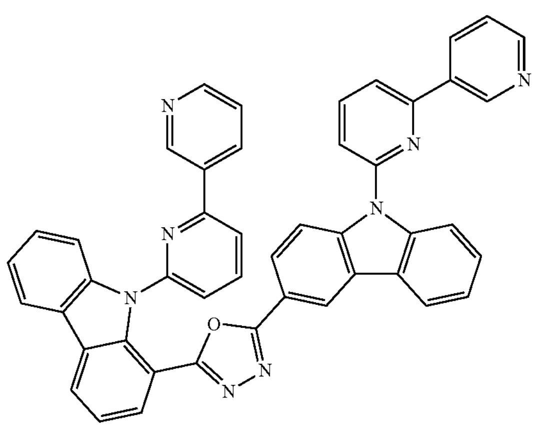
C 34
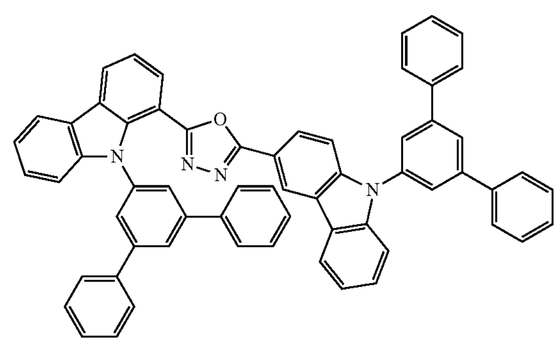
C 35
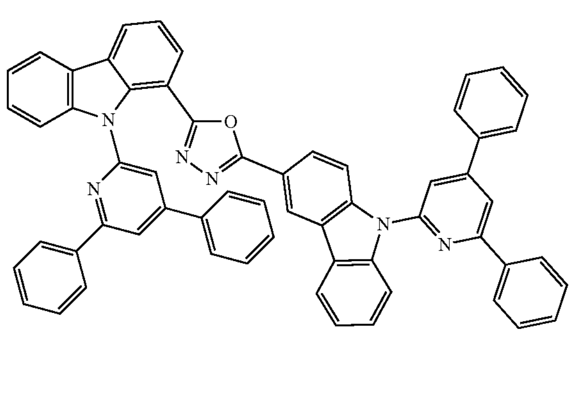
C 36
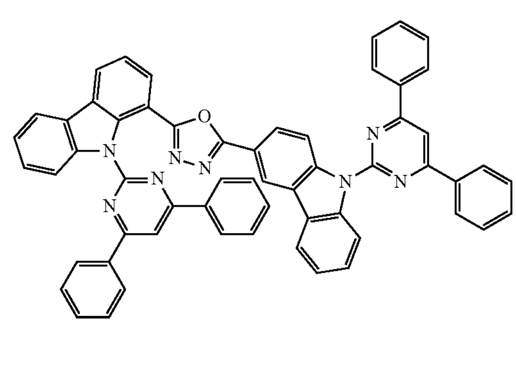

-continued
C 37
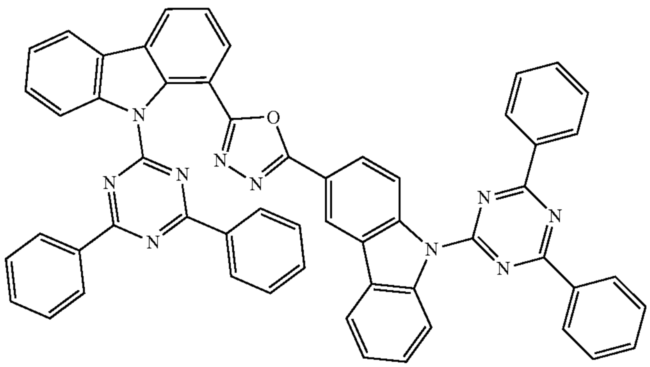
C 38
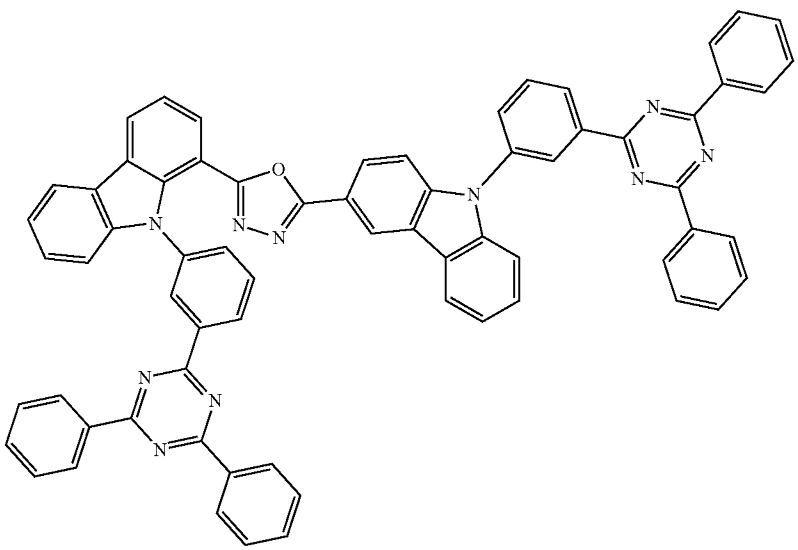
C 39
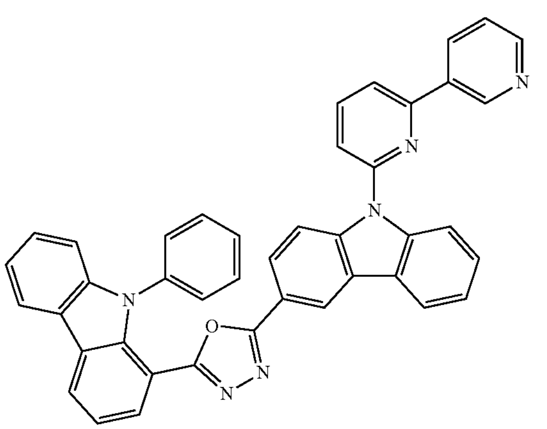
C 40
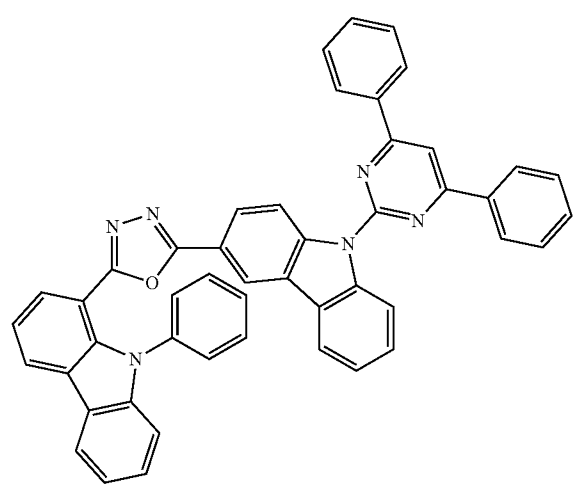

-continued
C 41
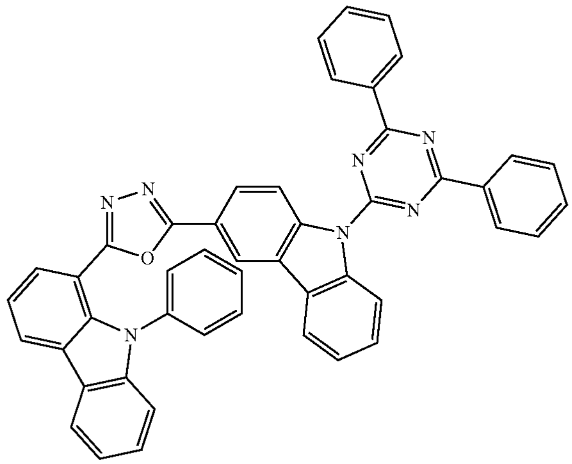
C 42
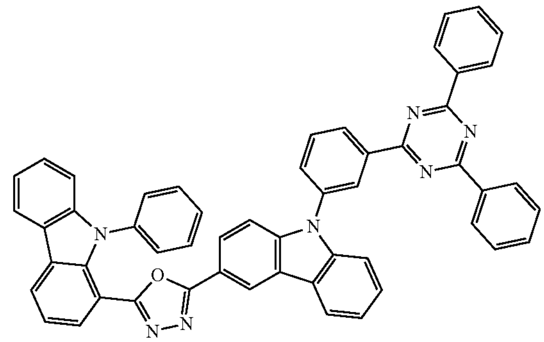
C 43
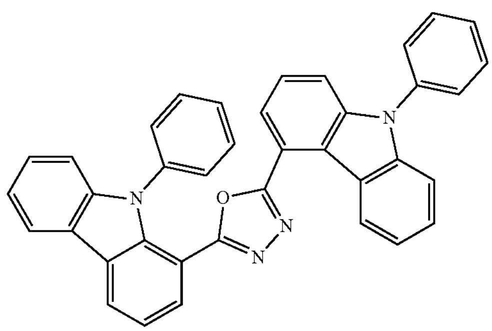
C 44
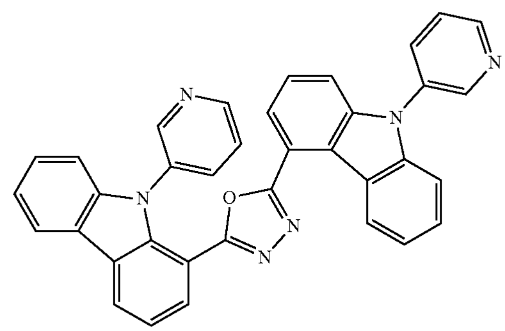
C 45
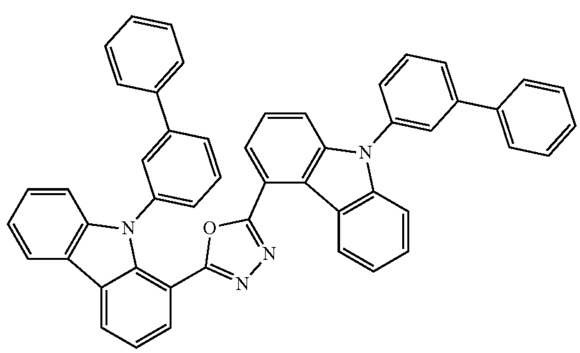
C 46
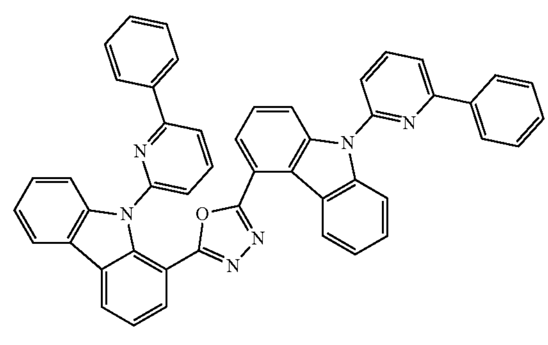
C 47
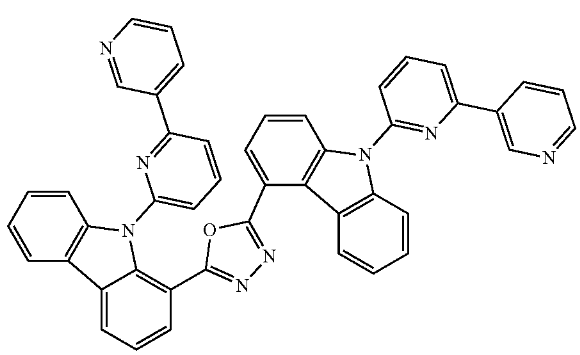
C 48
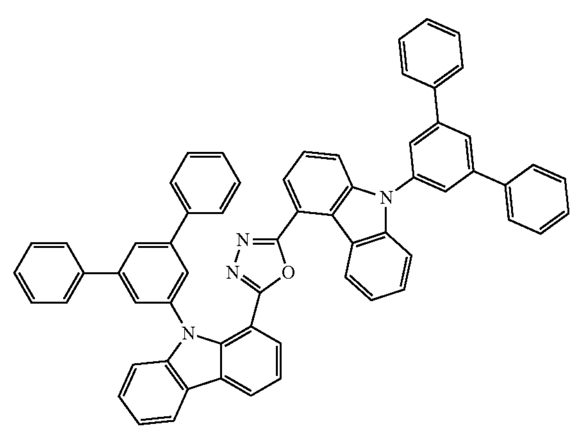

-continued
C 49
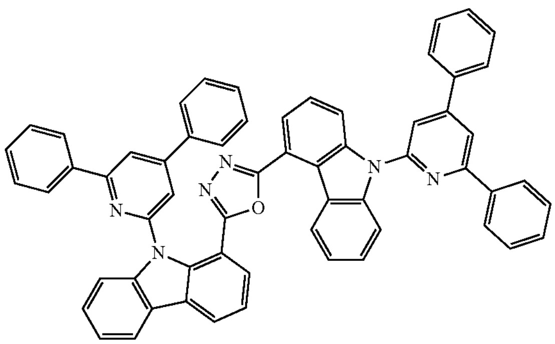
C 50
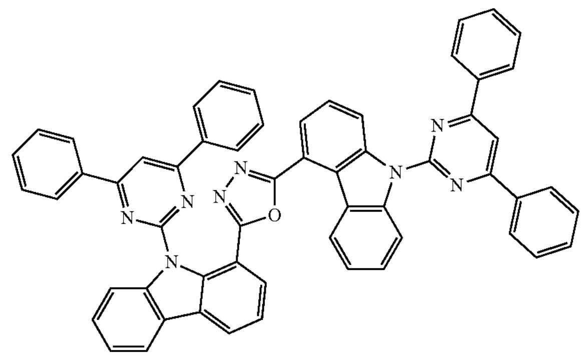
C 51
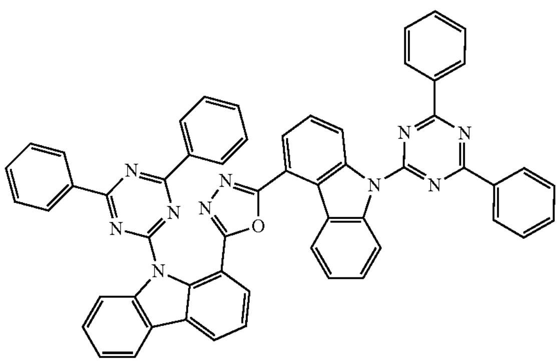
C 52
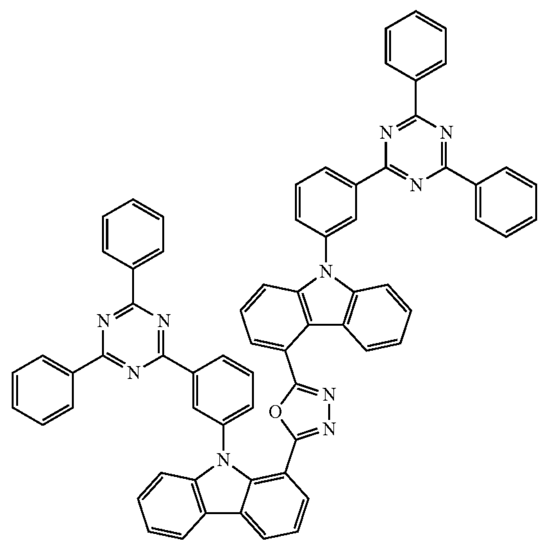
C 53
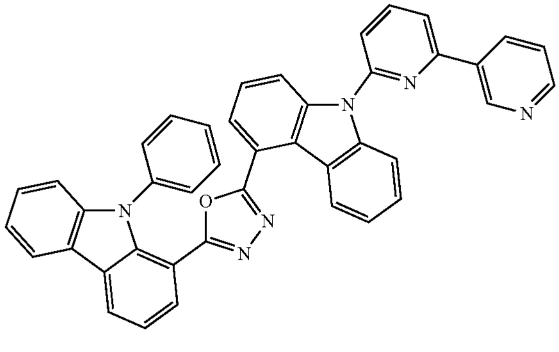
C 54
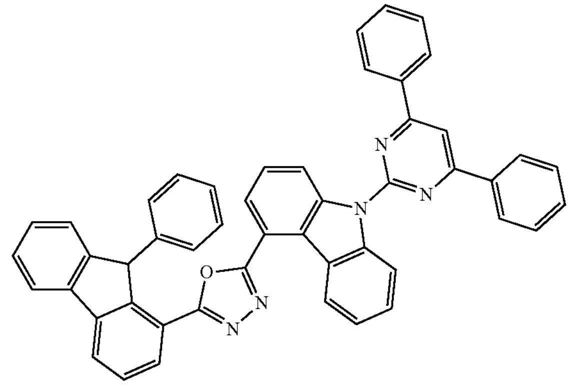

-continued
C 55
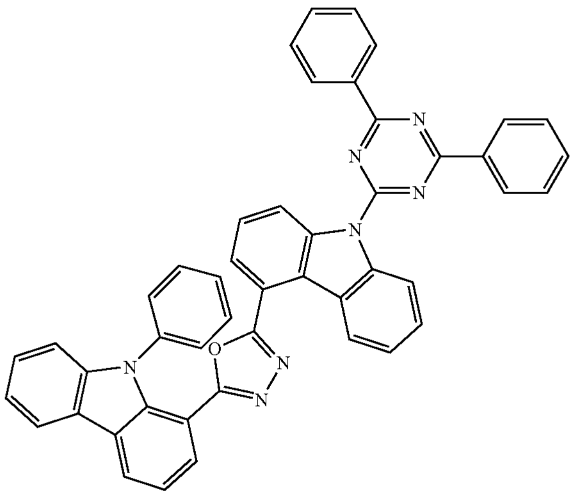
C 56
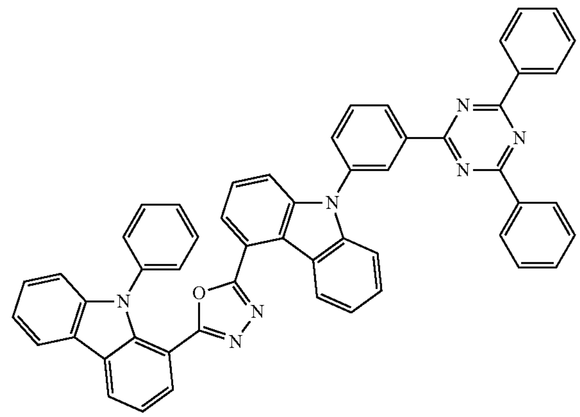
C 57
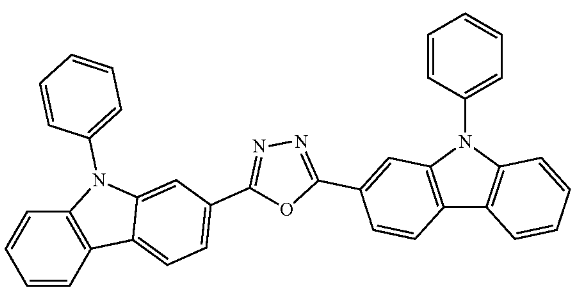
C 58
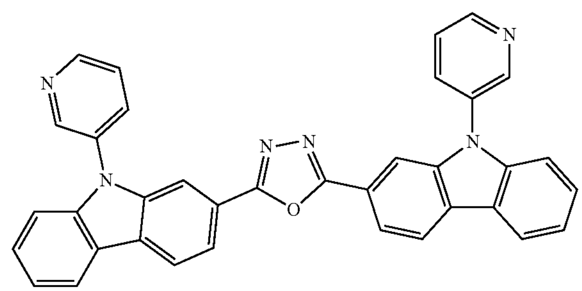
C 59
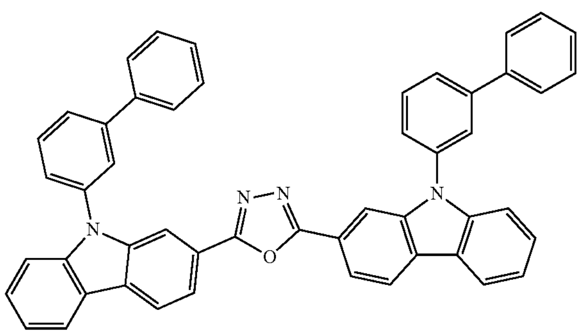
C 60
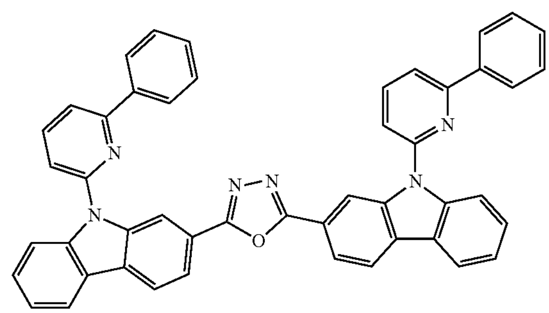
C 61
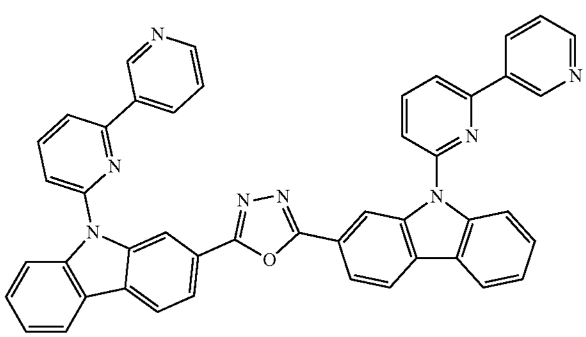
C 62
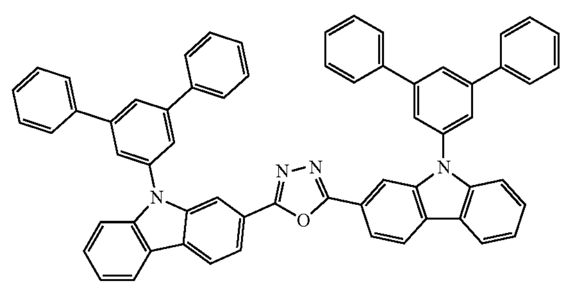

-continued
C 63
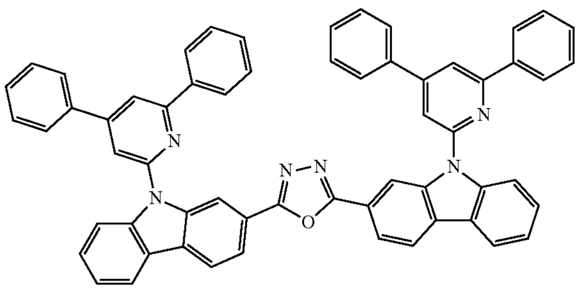
C 64
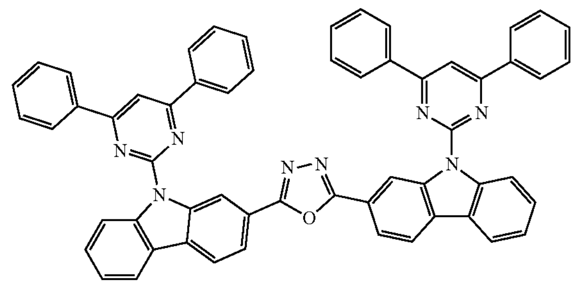
C 65
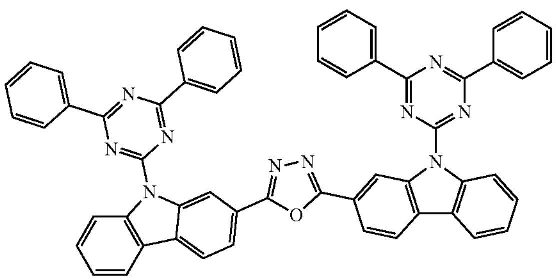
C 66
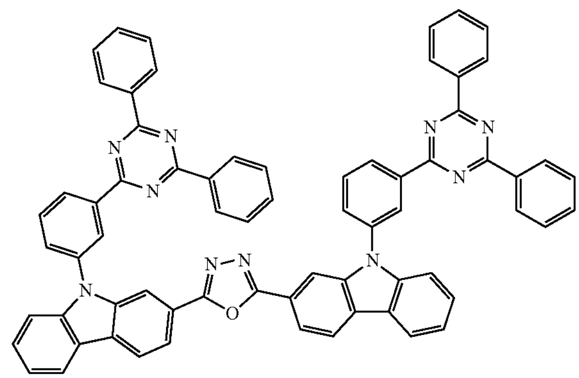
C 67
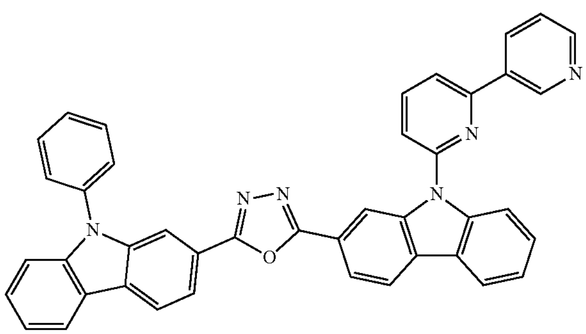
C 68
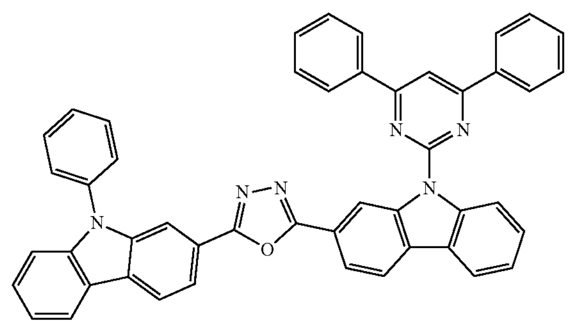
C 69
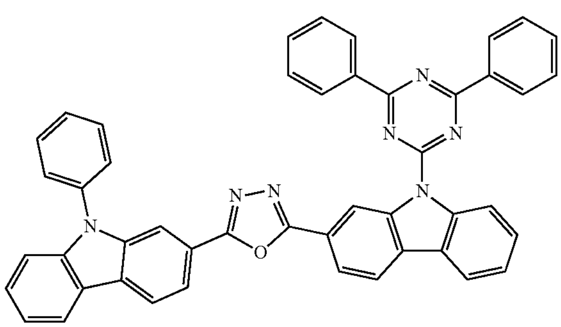
C 70
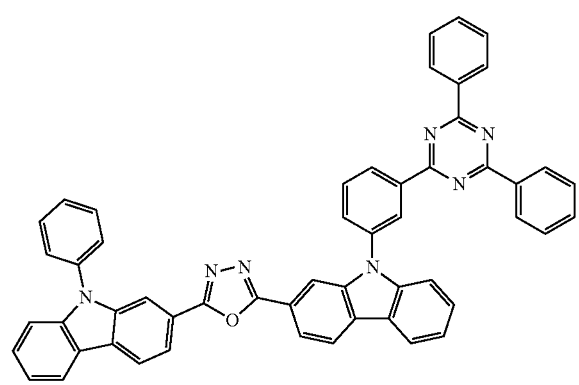

-continued
C 71
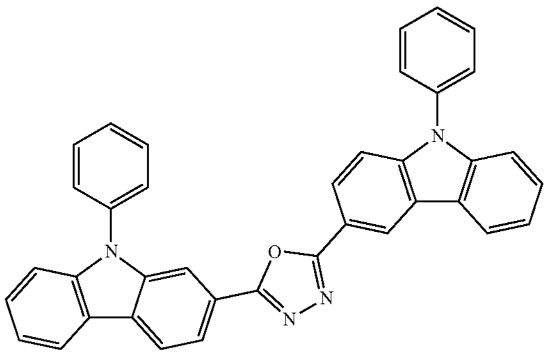
C 72
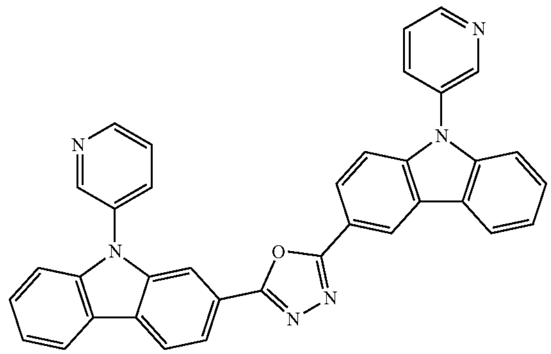
C 73
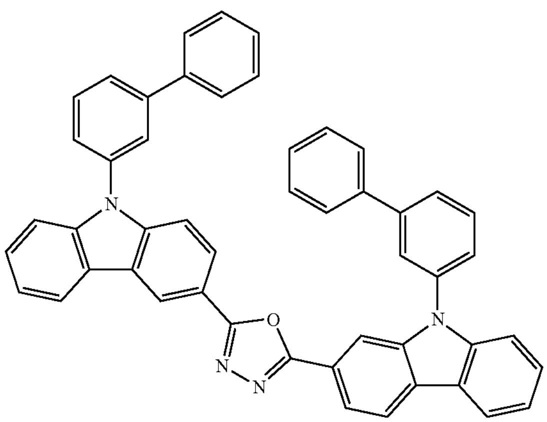
C 74
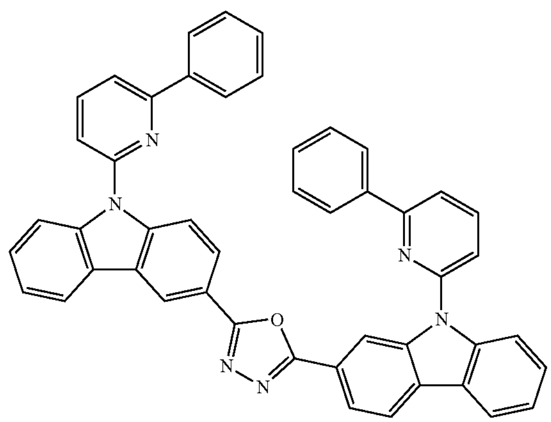
C 75
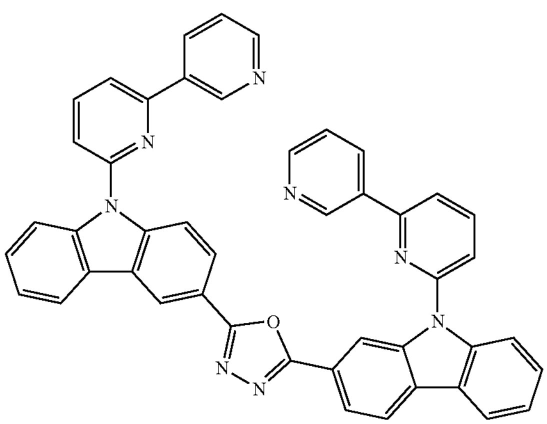
C 76
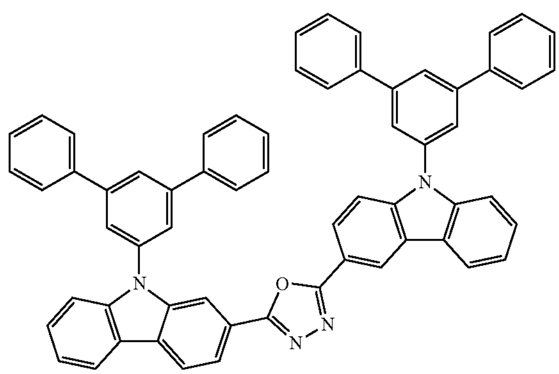
C 77
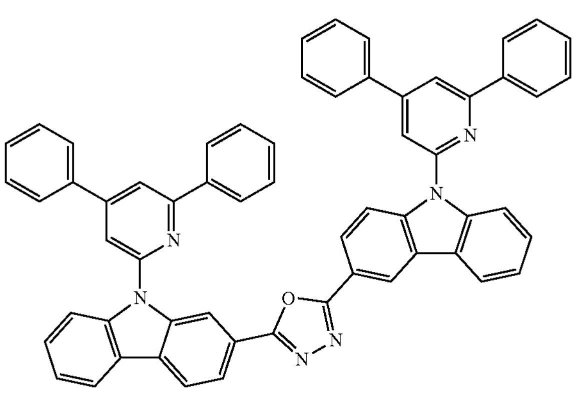
C 78
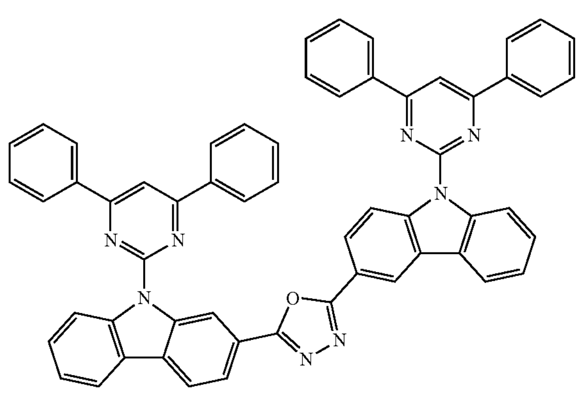

-continued
C 79
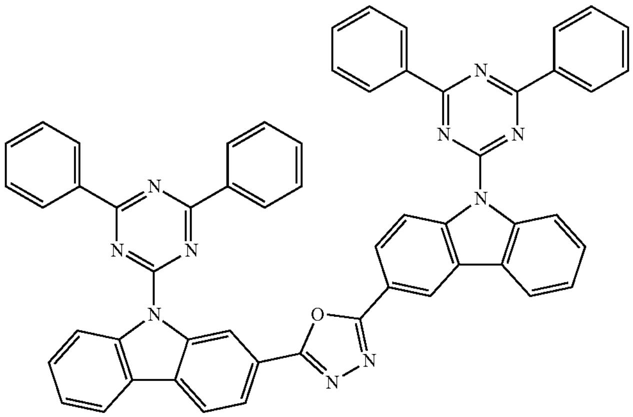
C 80
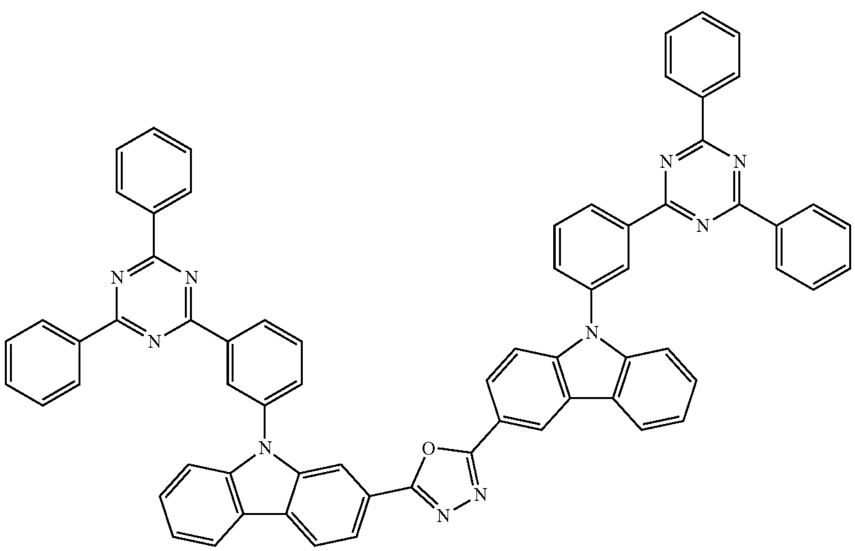
C 81
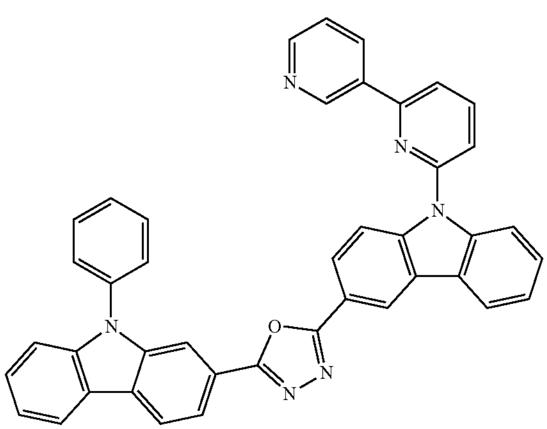
C 82
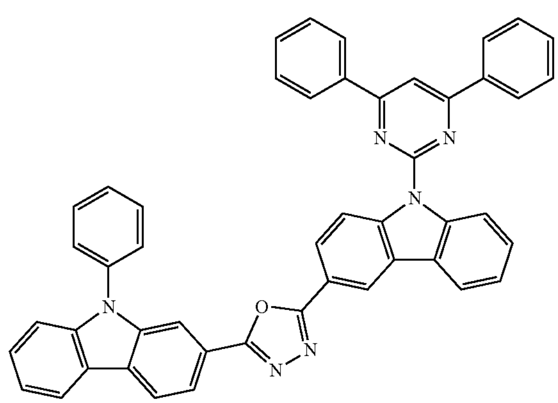

-continued
C 83
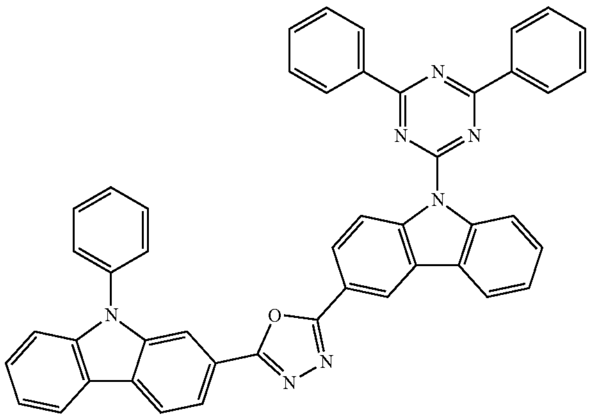
C 84
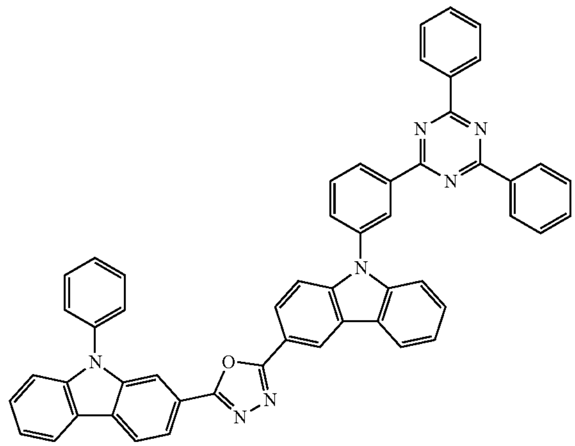
C 85
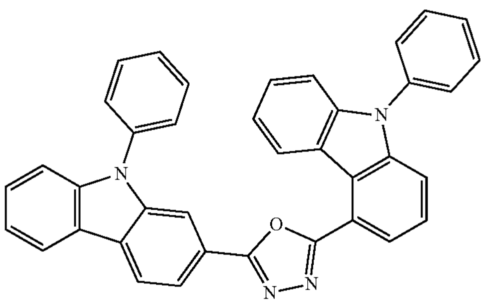
C 86
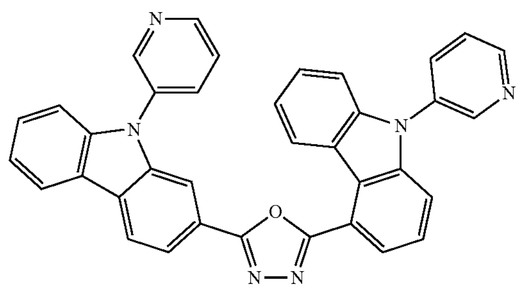
C 87
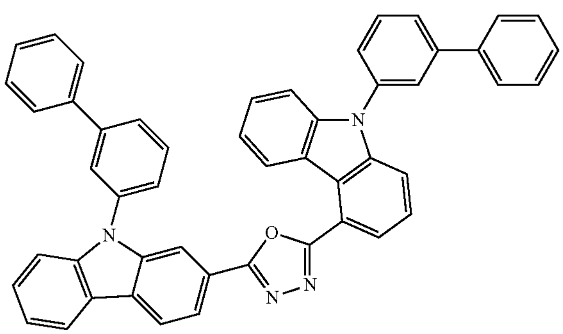
C 88
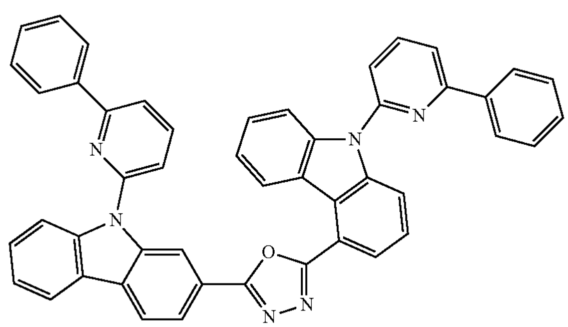
C 89
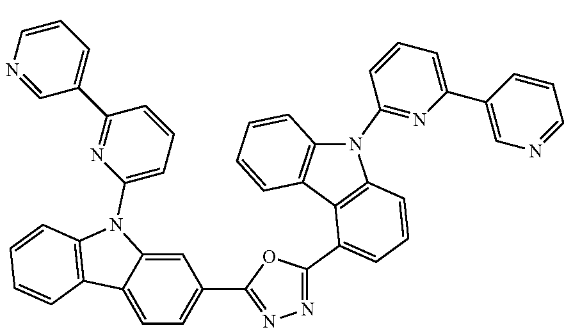
C 90
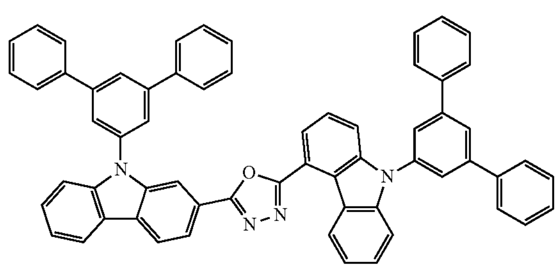

-continued
C 91
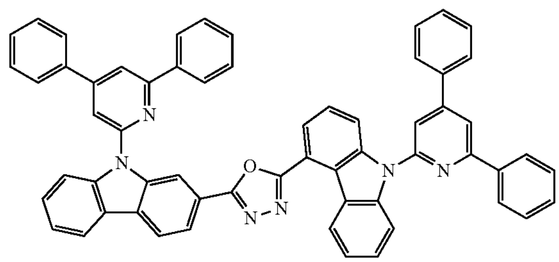
C 92
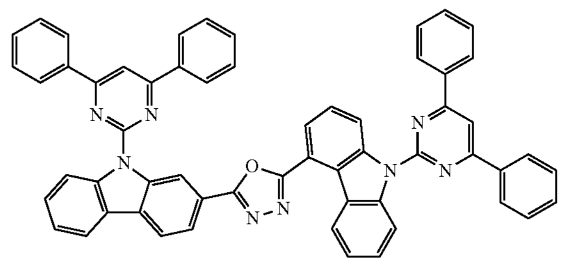
C 93
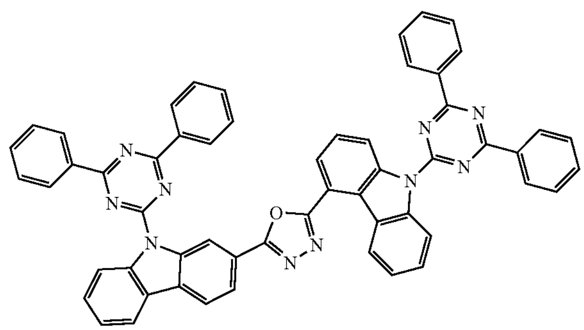
C 94
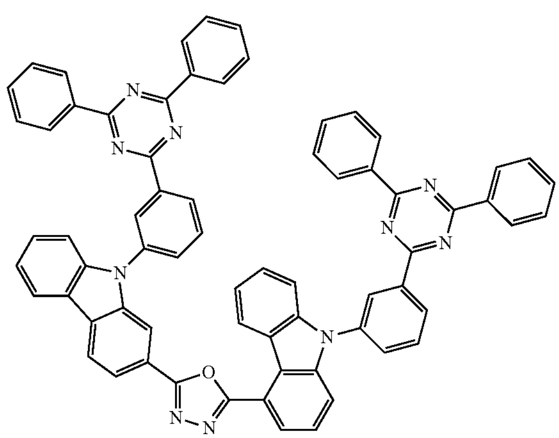
C 95
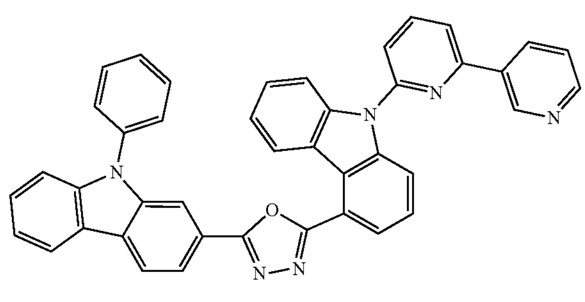
C 96
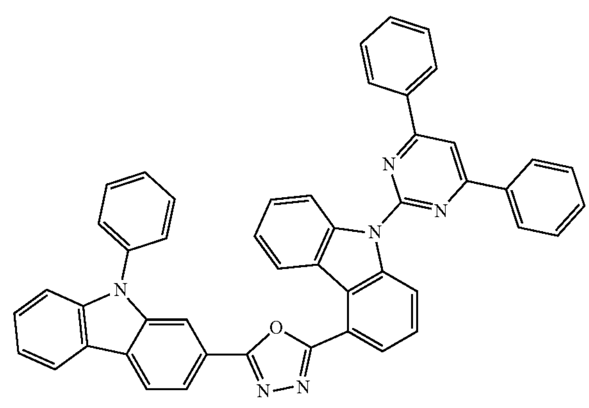
C 97
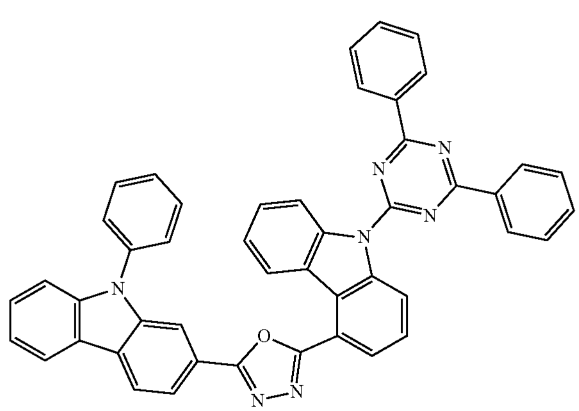
C 98
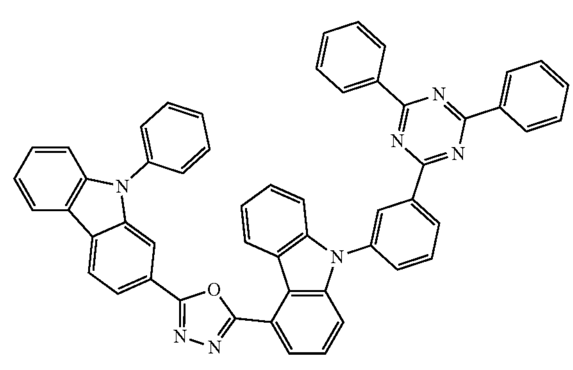

-continued
C 99
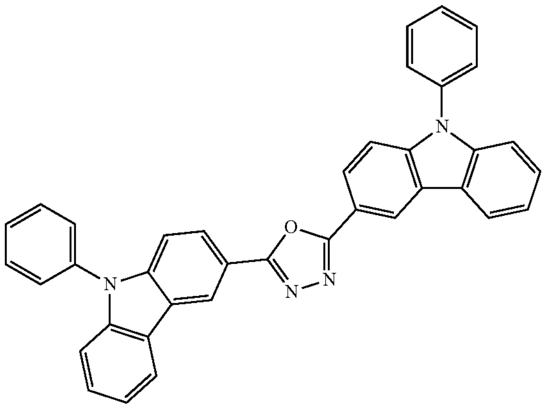
C 100
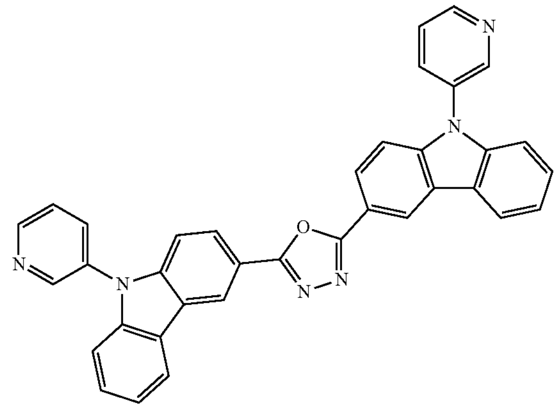
C 101
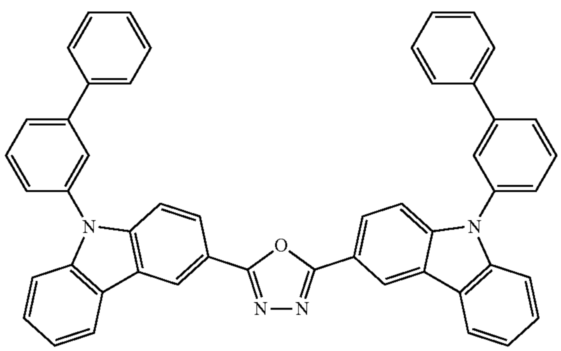
C 102
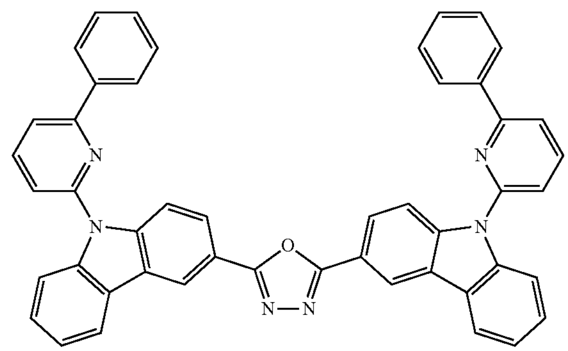
C 103
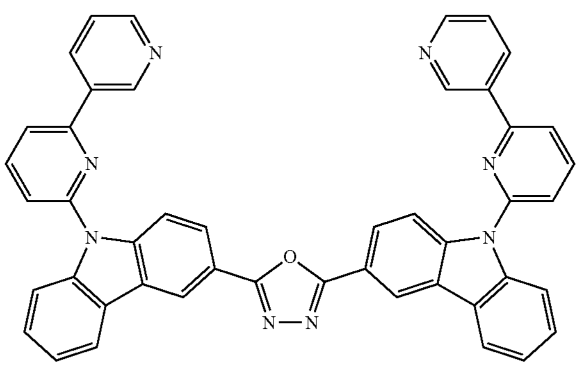
C 104
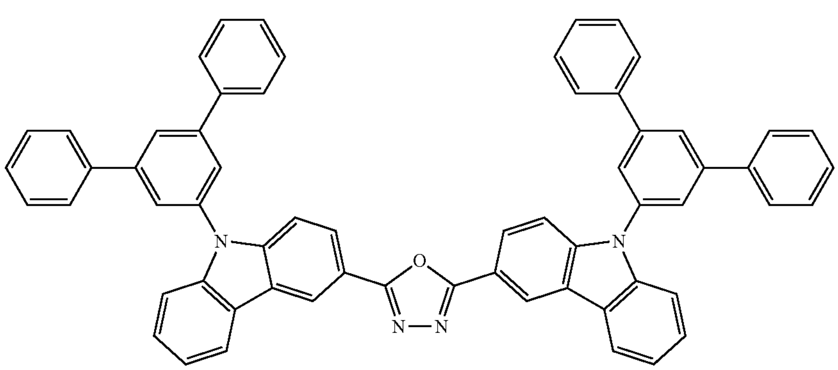

-continued
C 105
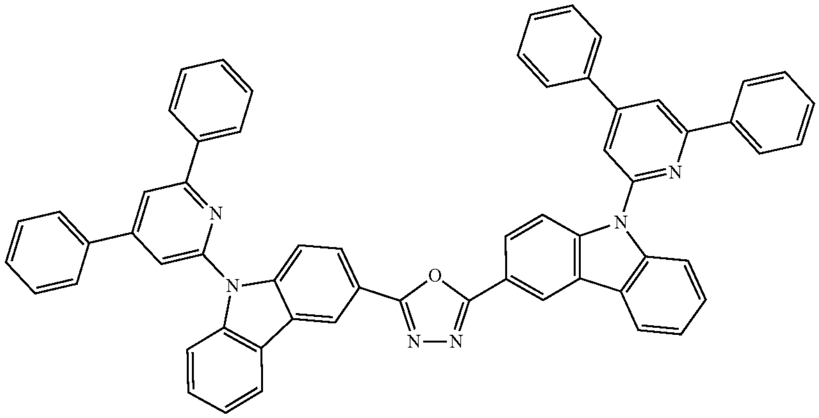
C 106
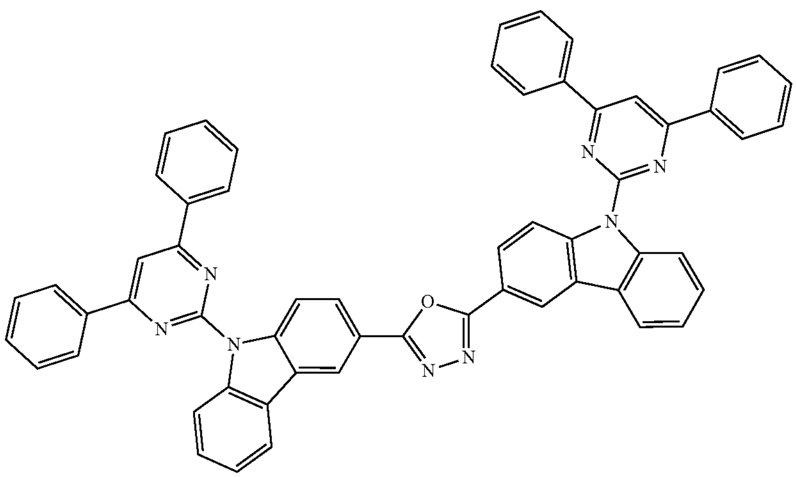
C 107
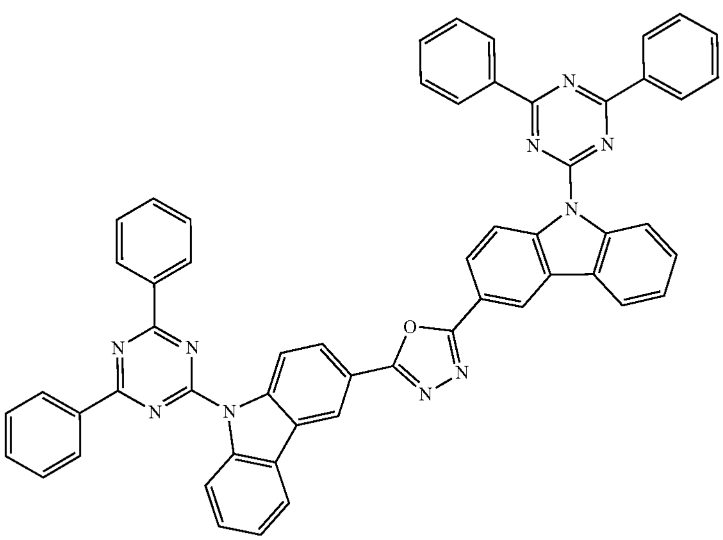

-continued
C 108
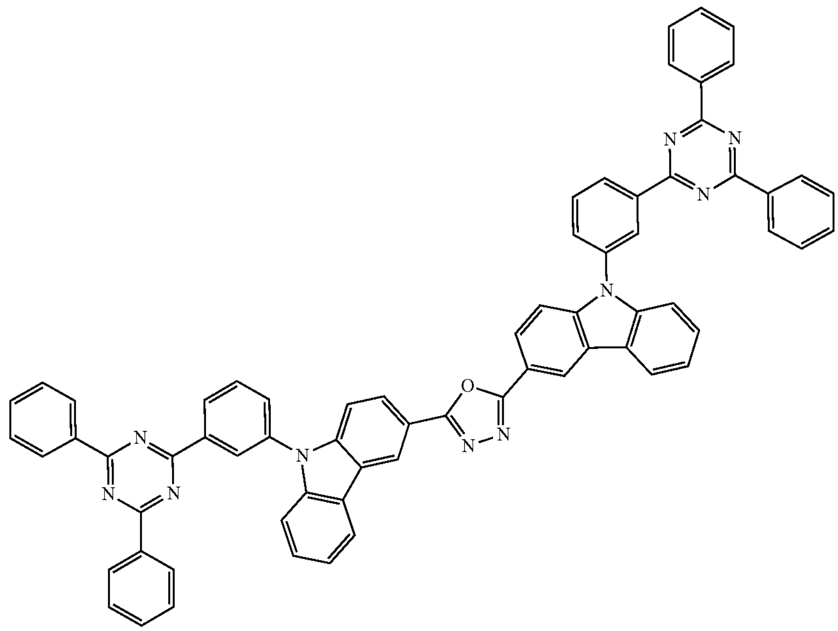
C 109
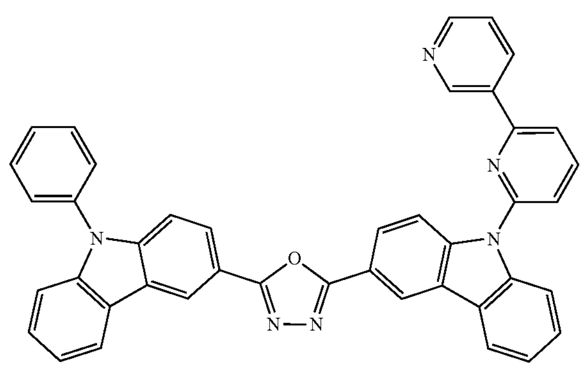
C 110
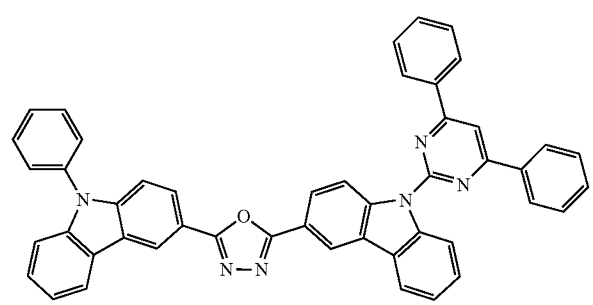
C 111
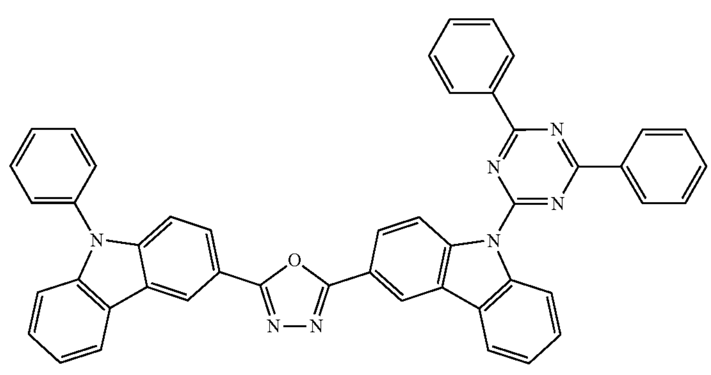

-continued
C 112
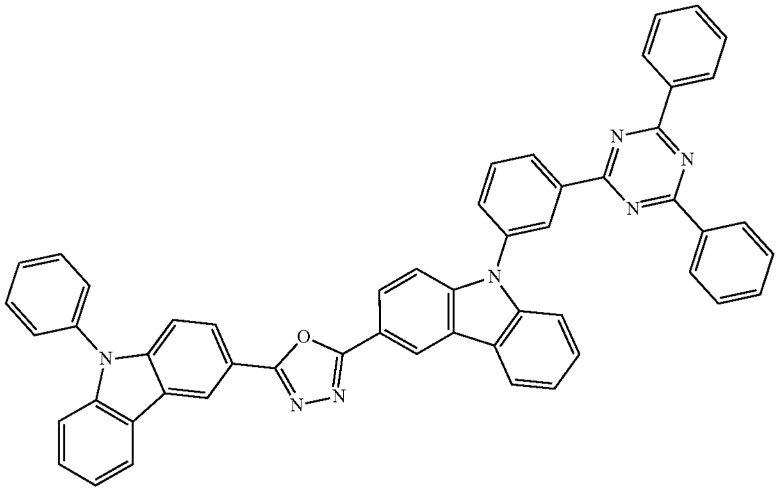
C 113
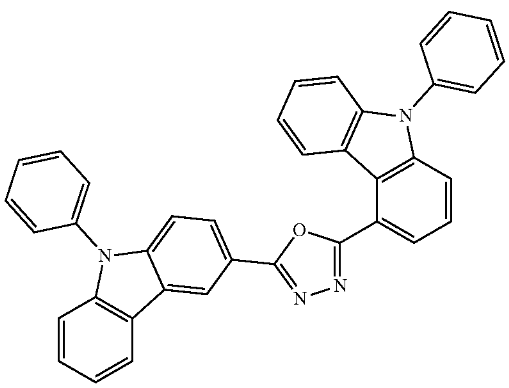
C 114
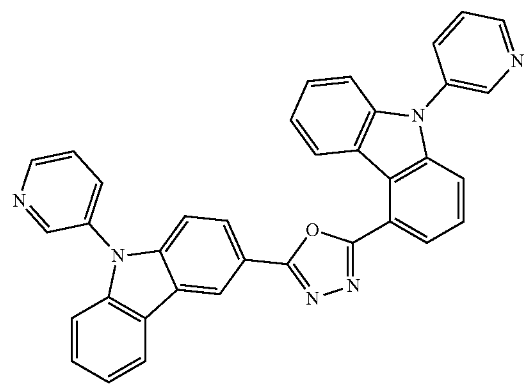
C 115
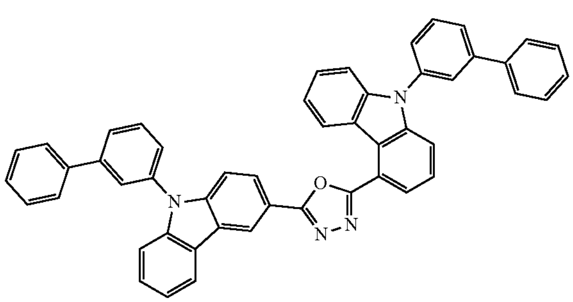
C 116
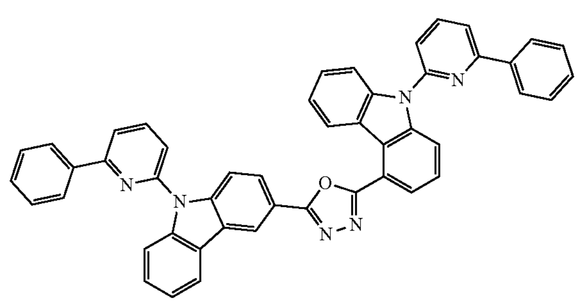

-continued
C 117
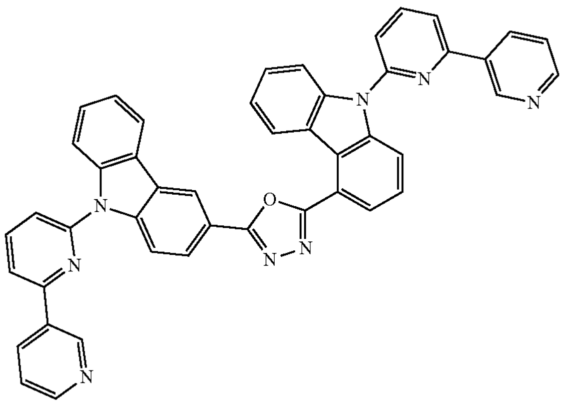
C 118
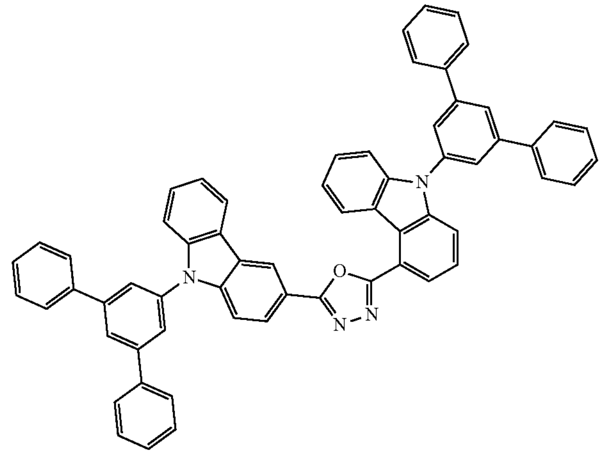
C 119
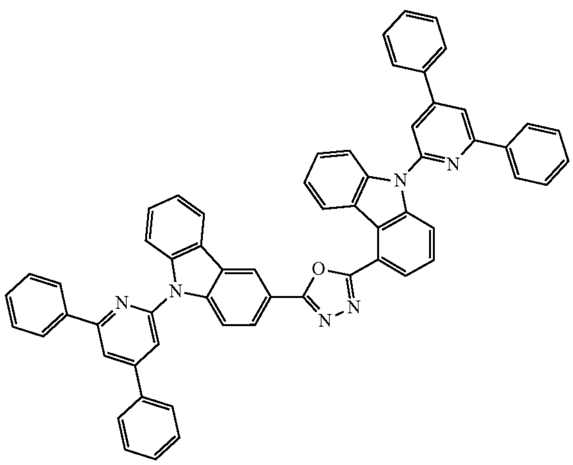
C 120
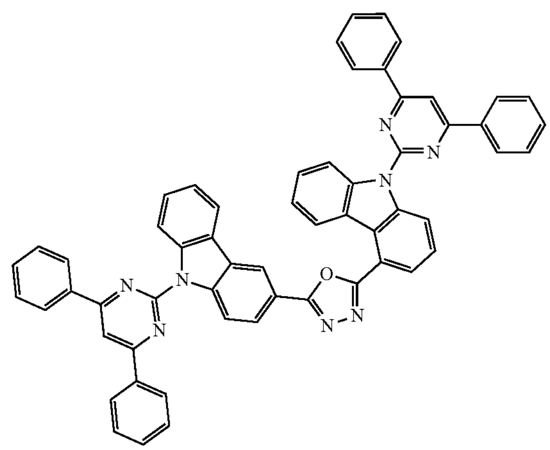
C 121
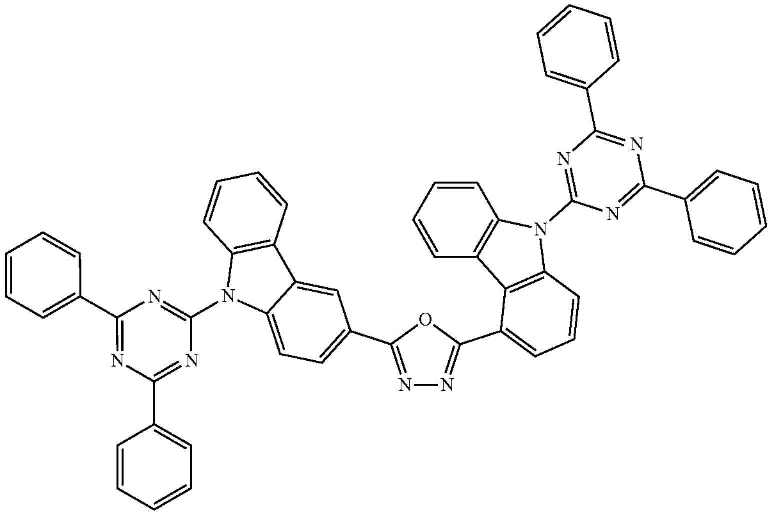

-continued
C 122
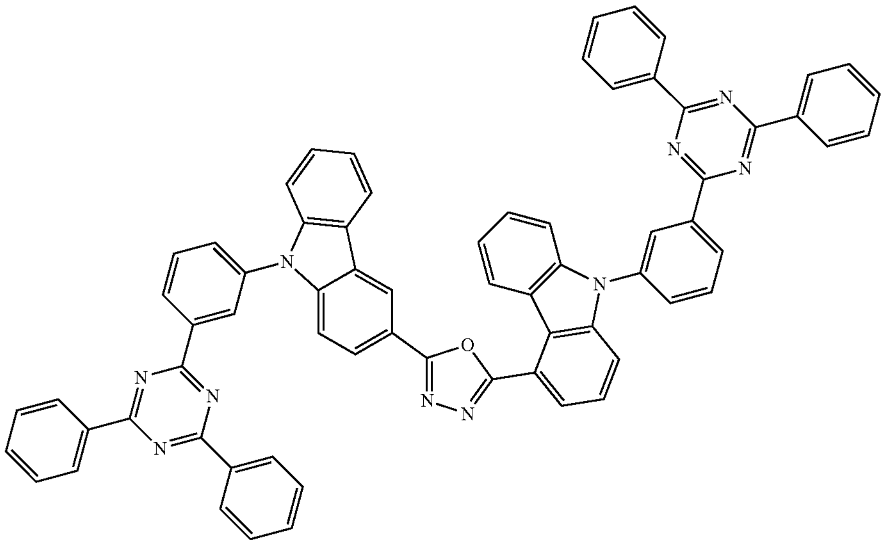
C 123
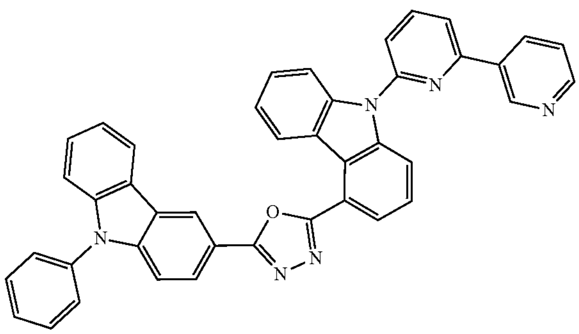
C 124
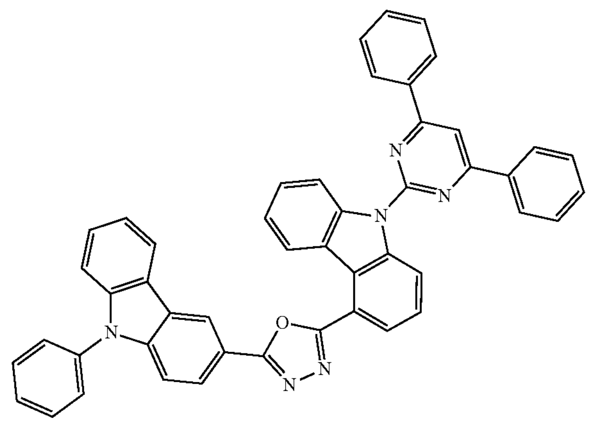
C 125
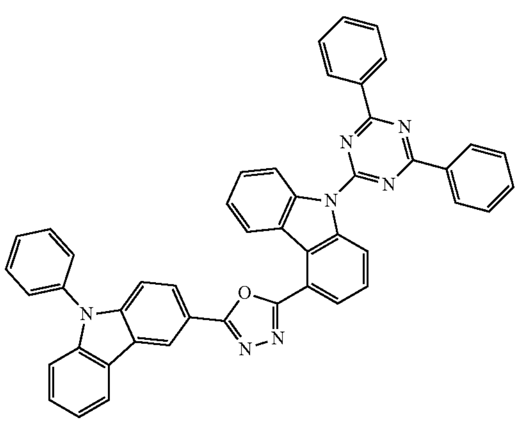
C 126
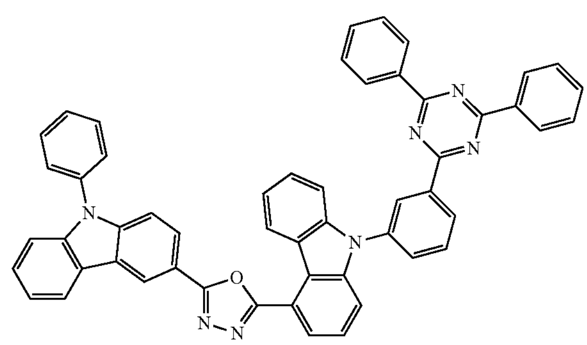

-continued
C 127
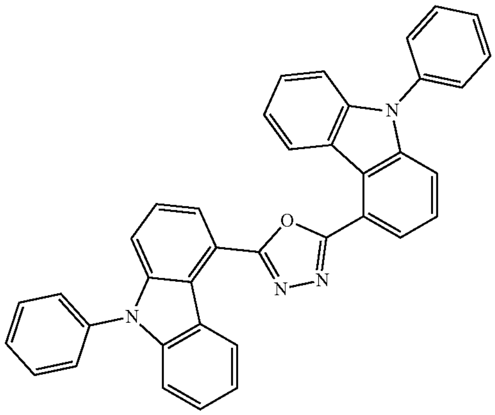
C 128
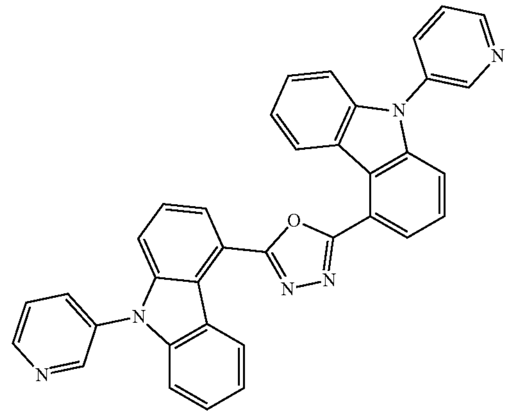
C 129
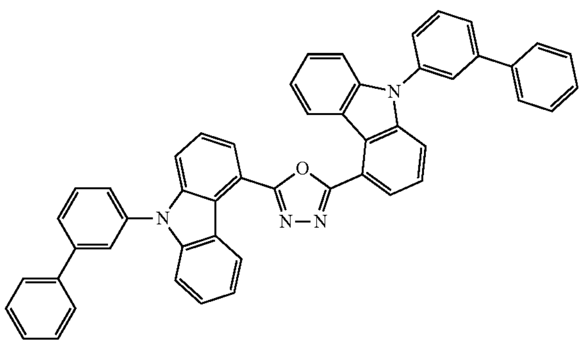
C 130
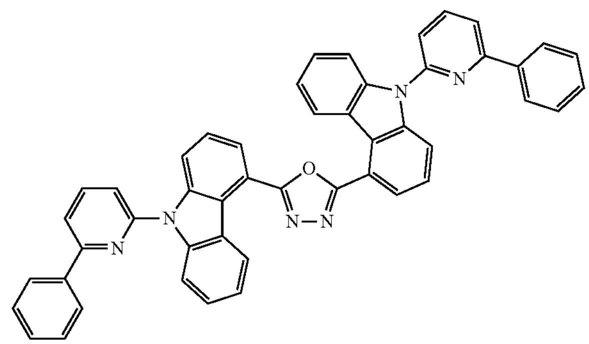
C 131
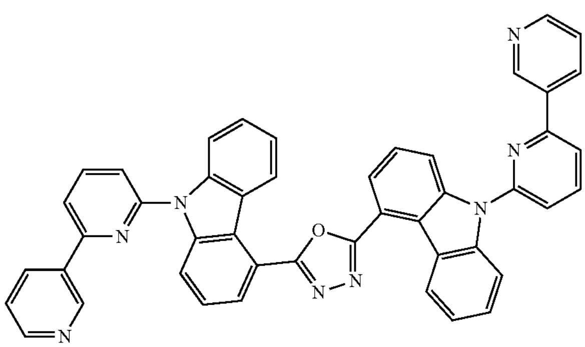
C 132
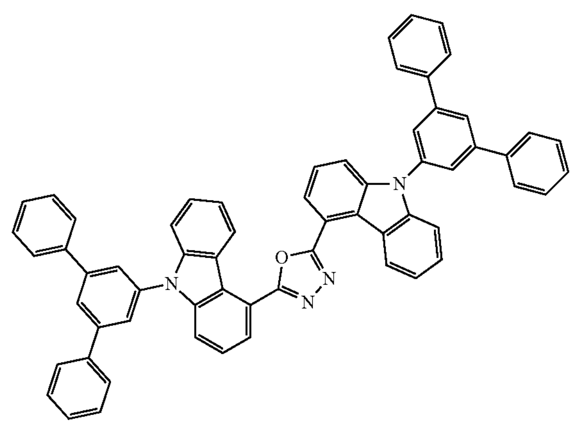
C 133
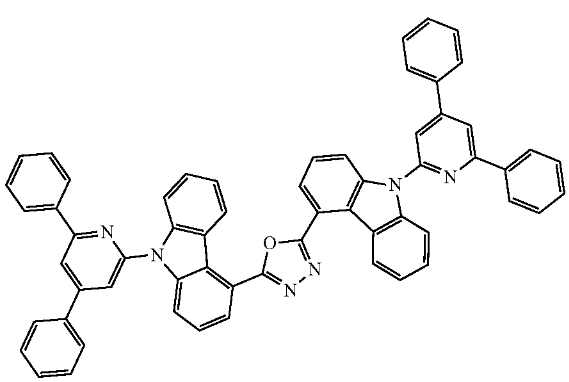
C 134
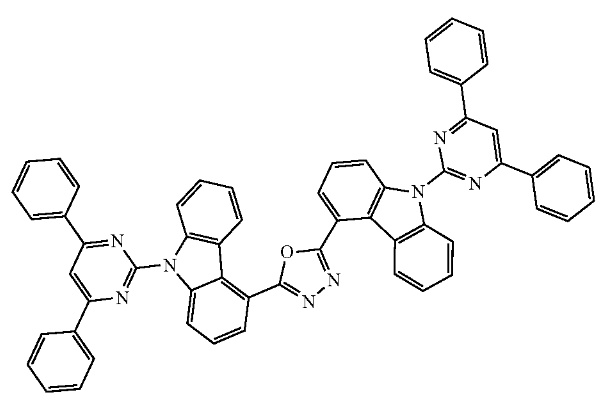

-continued
C 135
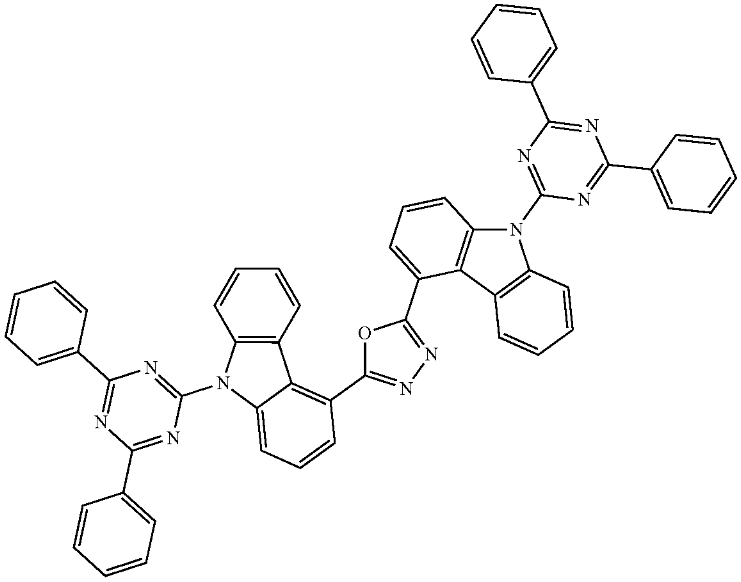
C 136
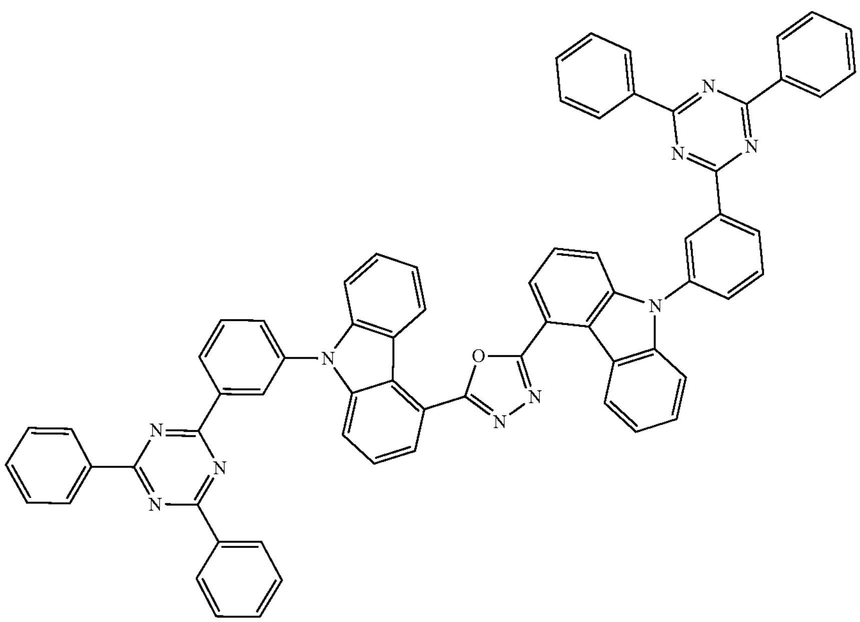
C 137
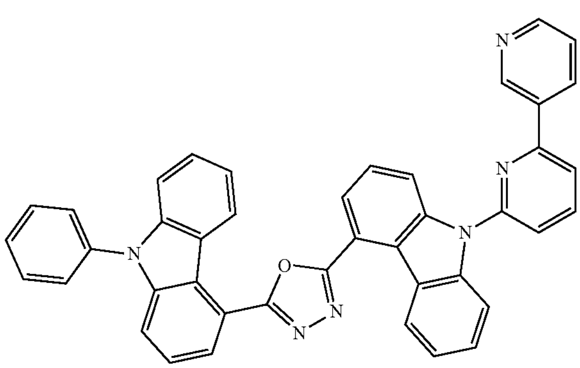
C 138
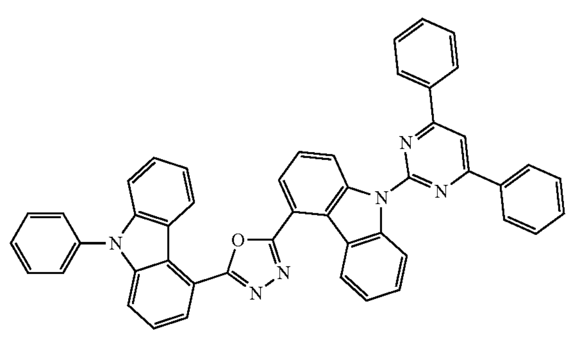

-continued
C 139
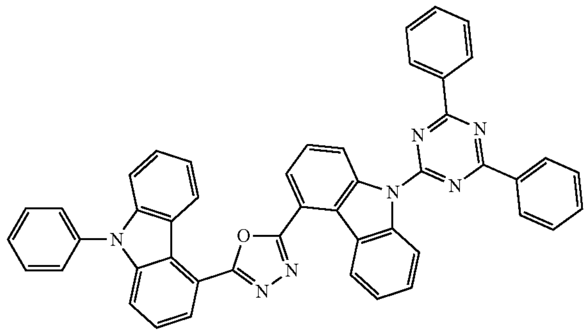
C 140
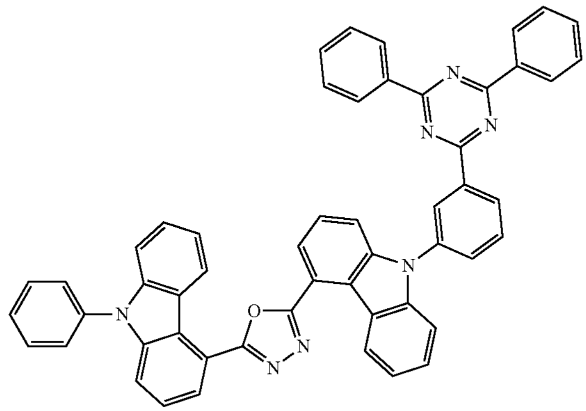
C 141
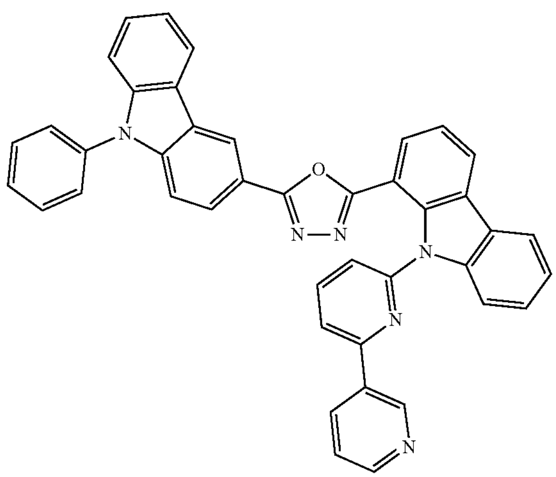
C 142
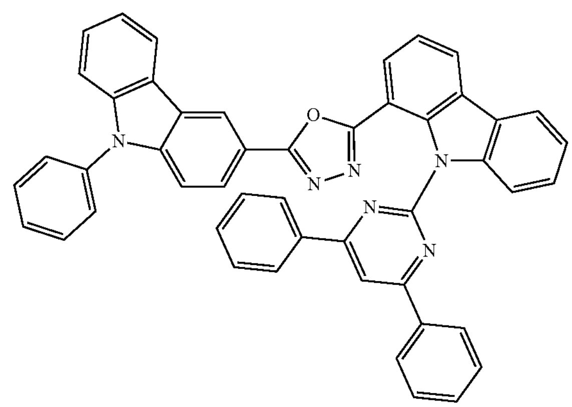
C 143
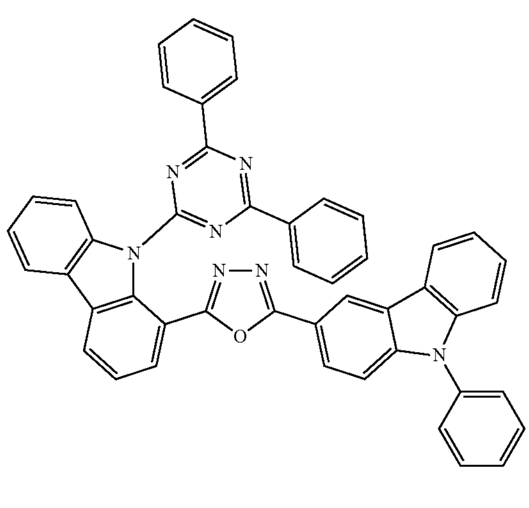
C 144
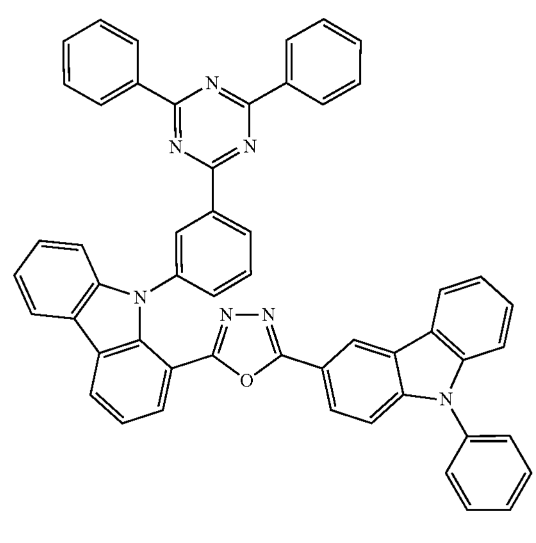

-continued
C 145
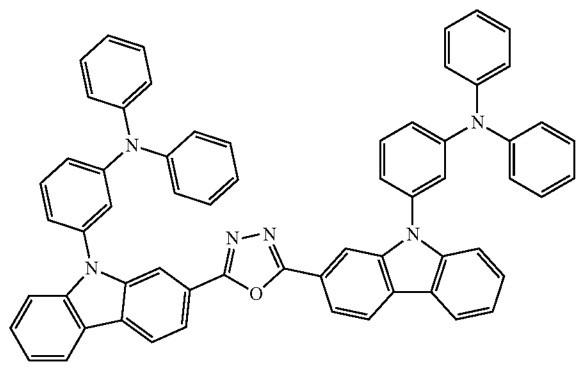
C 146
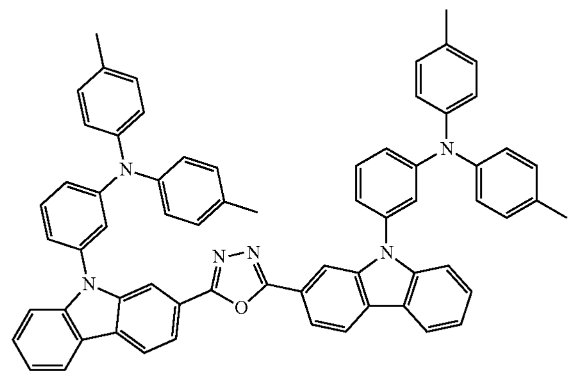
C 147
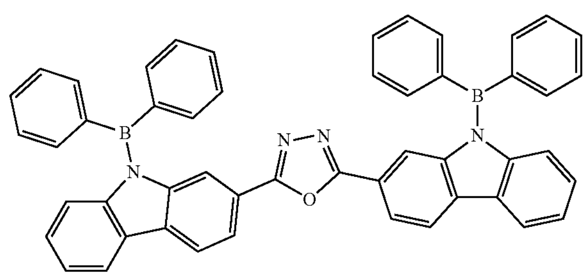
C 148
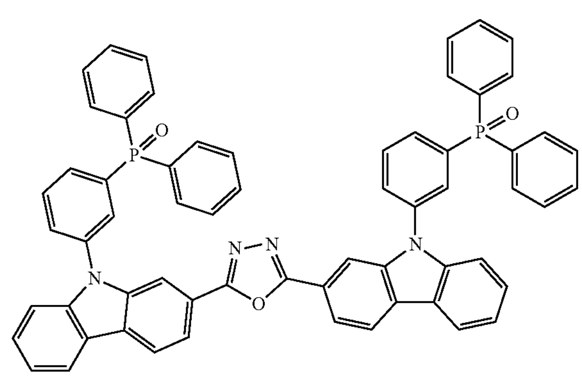
C 149
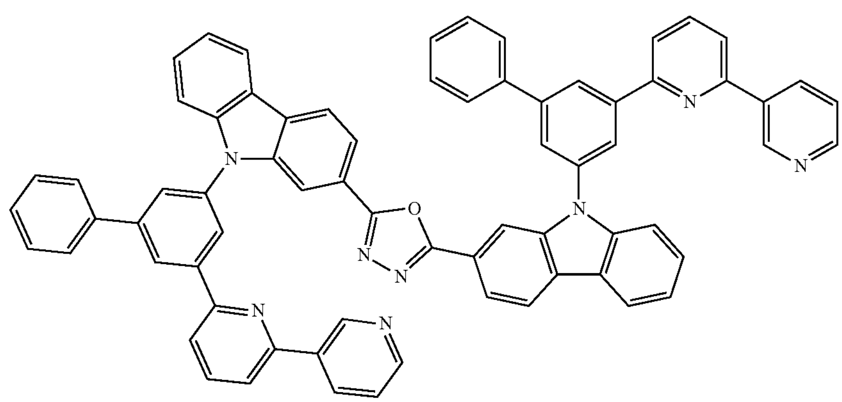
C 150
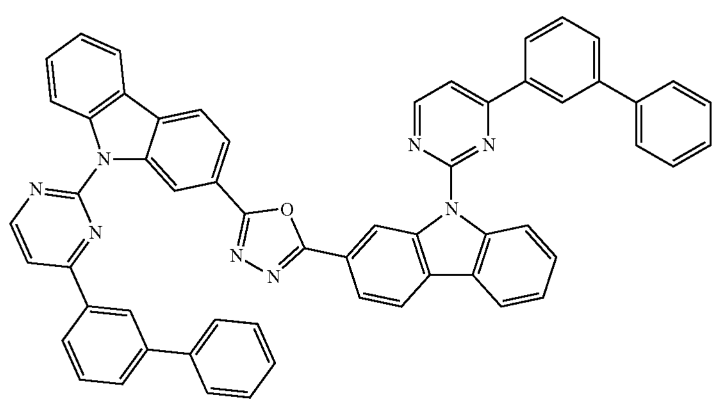

-continued
C 151
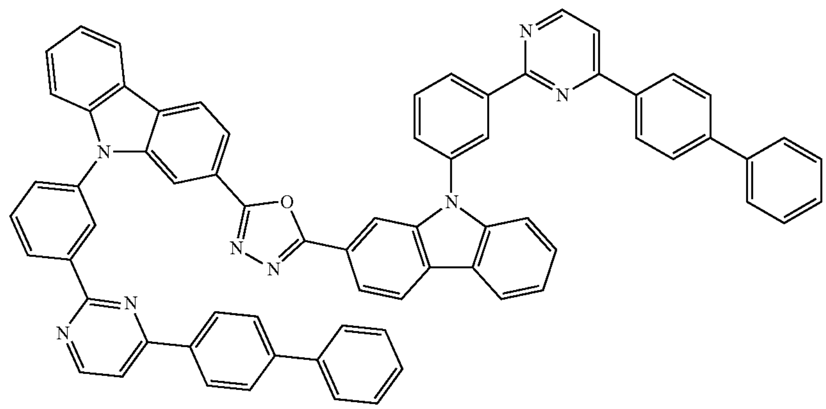
C 152
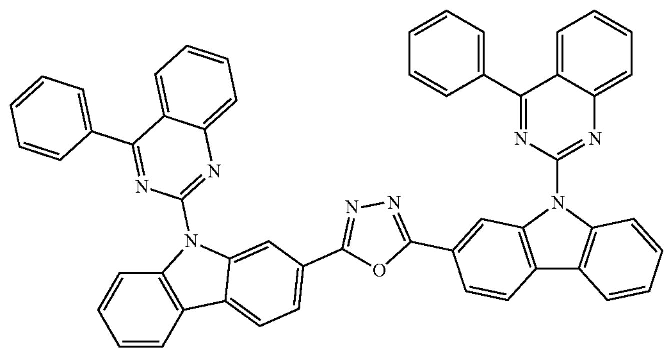
C 153
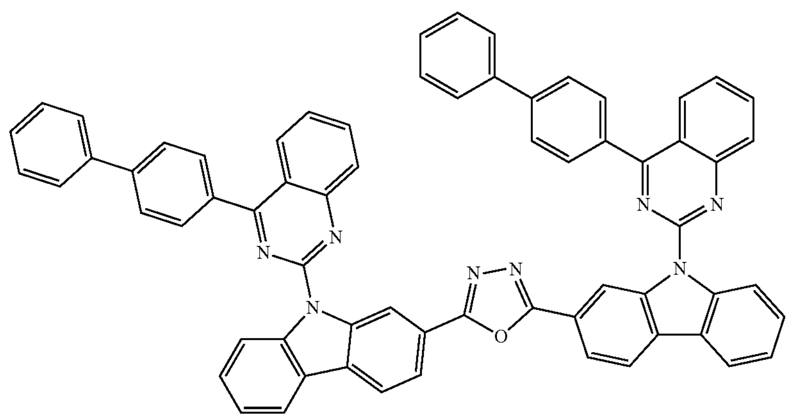
C 154
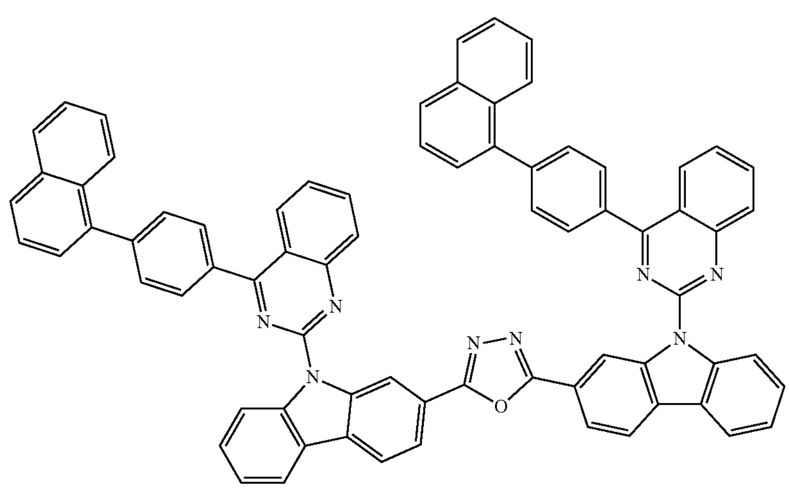

-continued
C 155
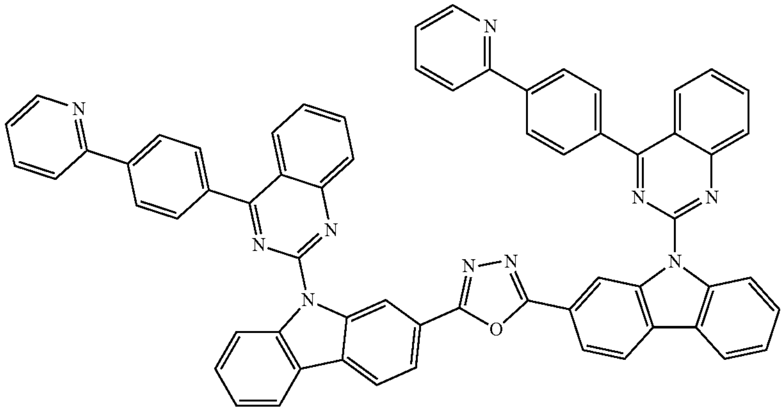
C 156
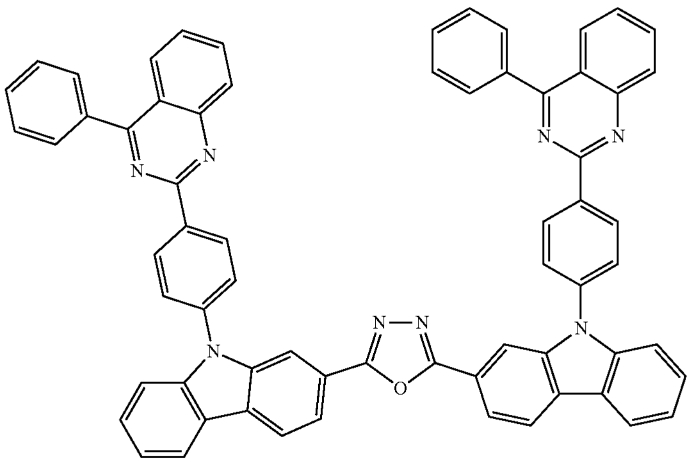
C 157
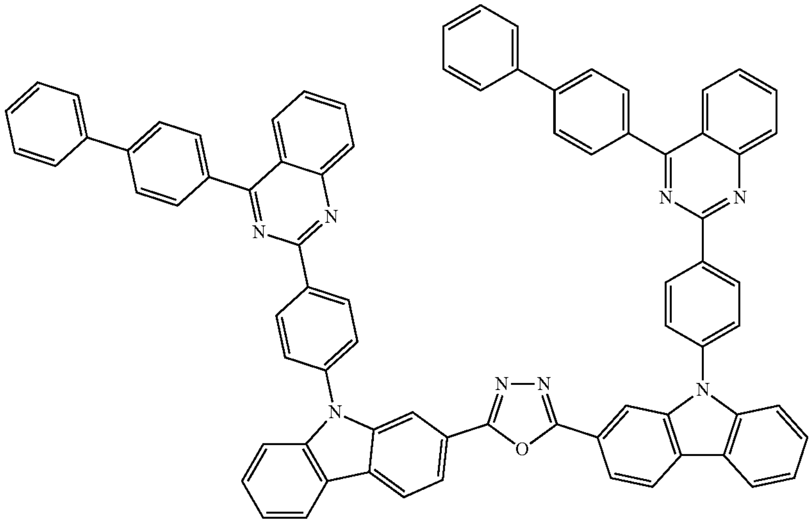

-continued
C 158
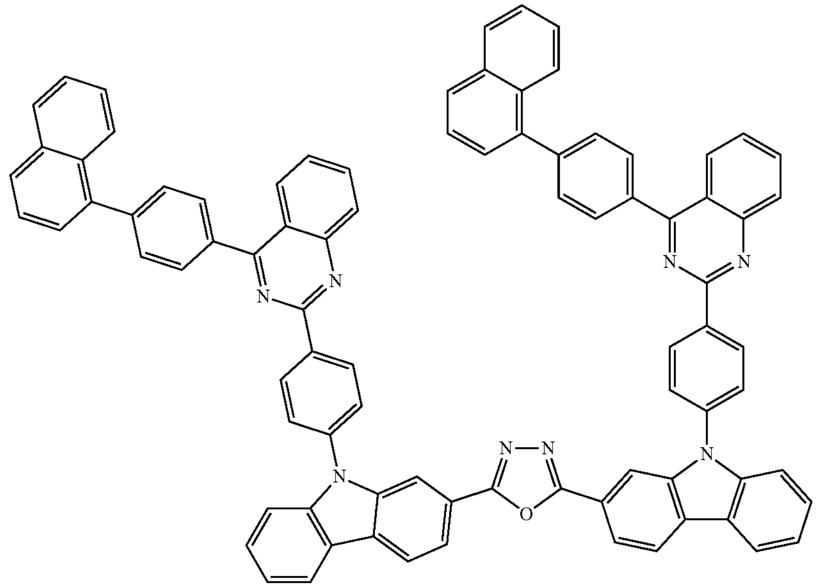
C 159
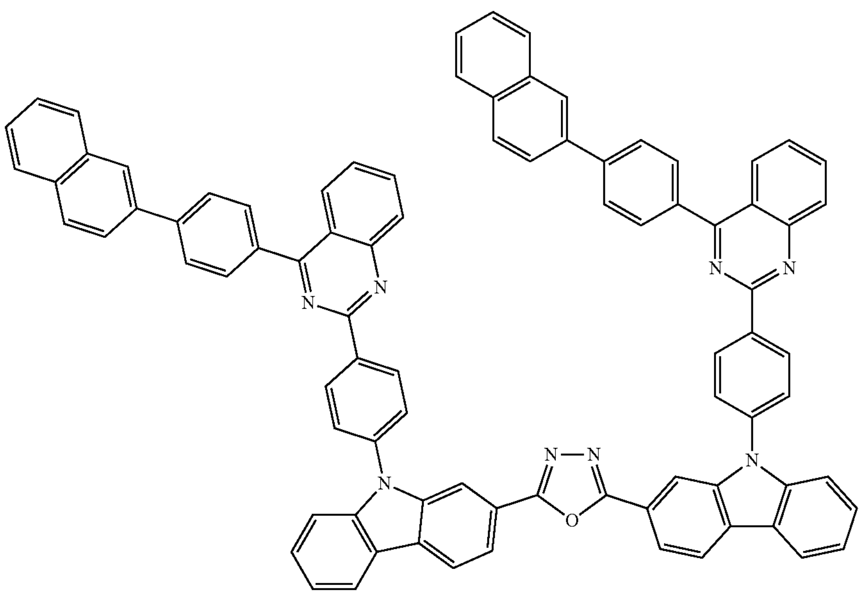
C 160
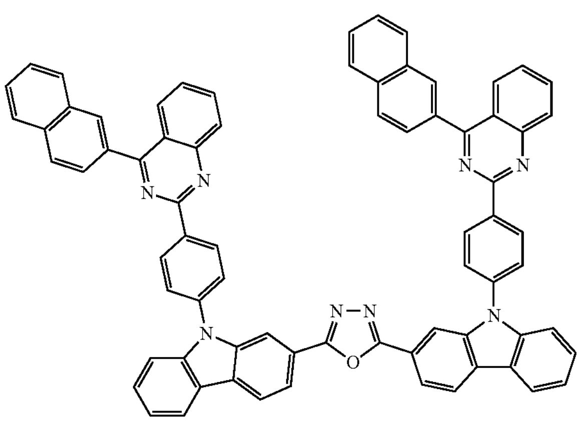
C 161
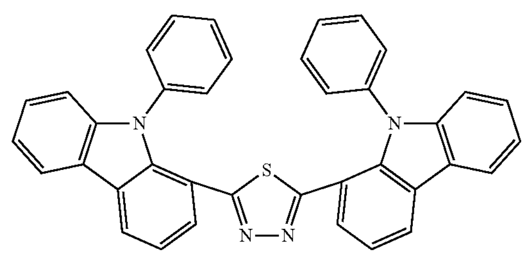

-continued
C 162
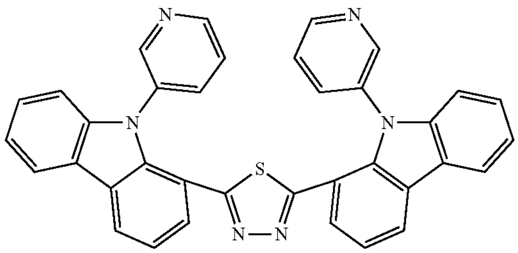
C 163
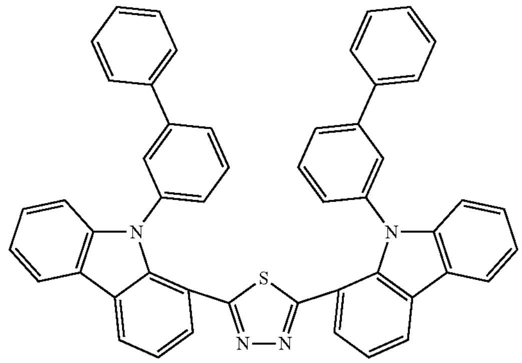
C 164
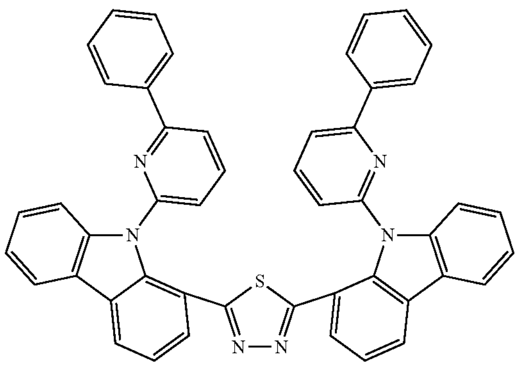
C 165
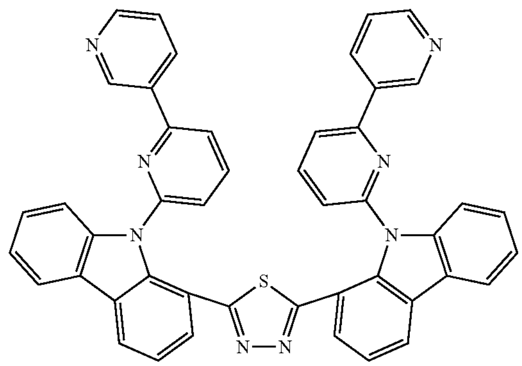
C 166
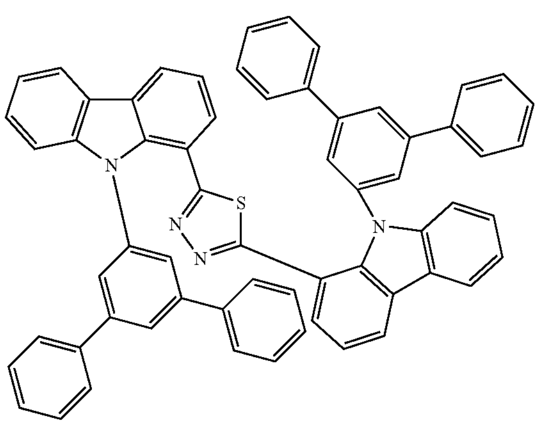
C 167
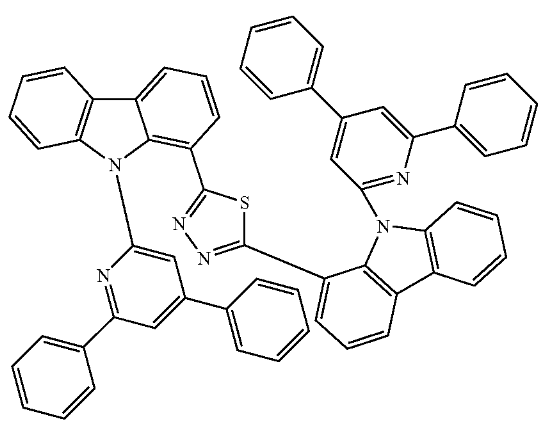
C 168
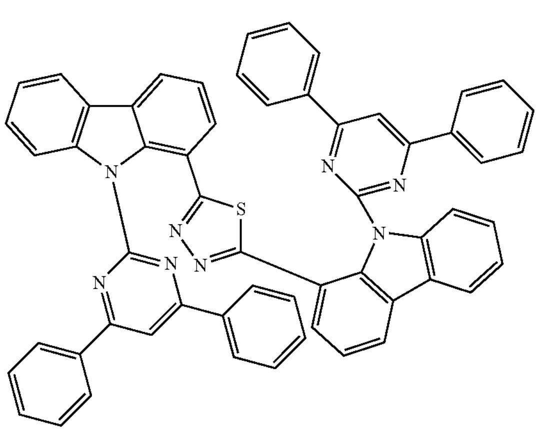
C 169
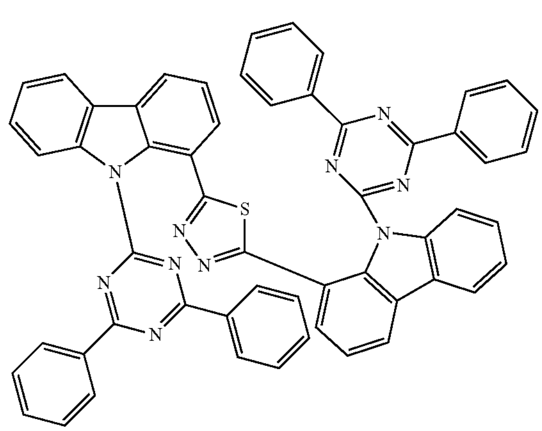

-continued
C 170
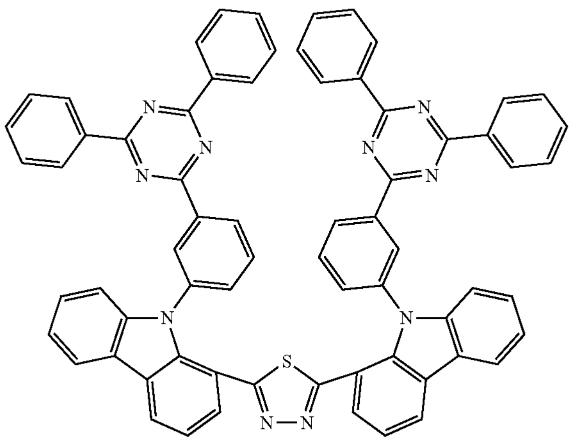
C 171
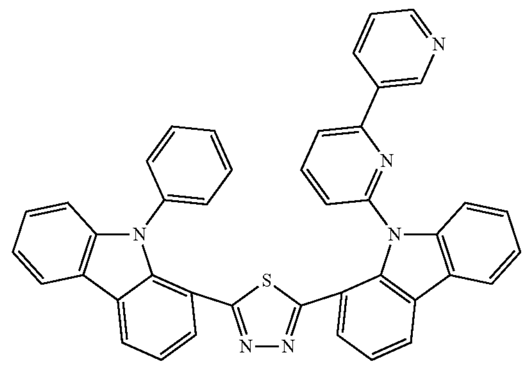
C 172
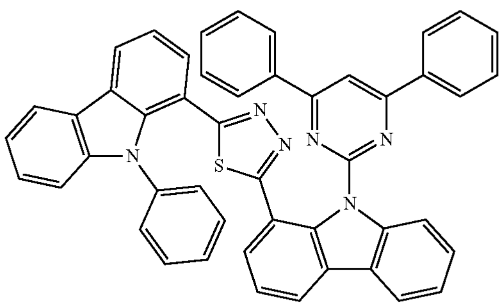
C 173
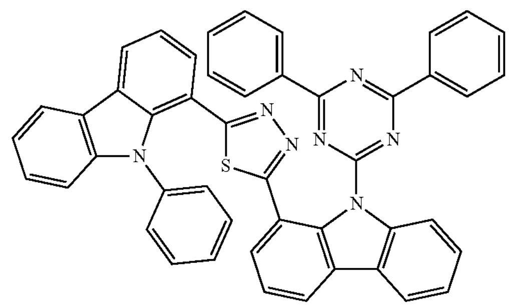
C 174
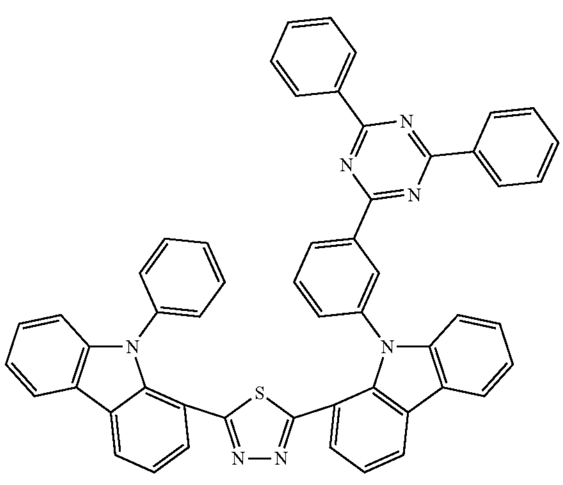
C 175
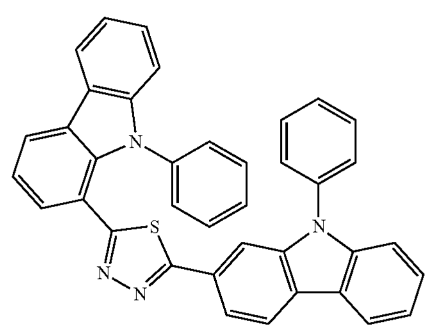

-continued
C 176
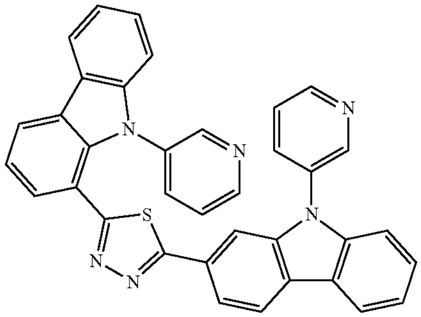
C 177
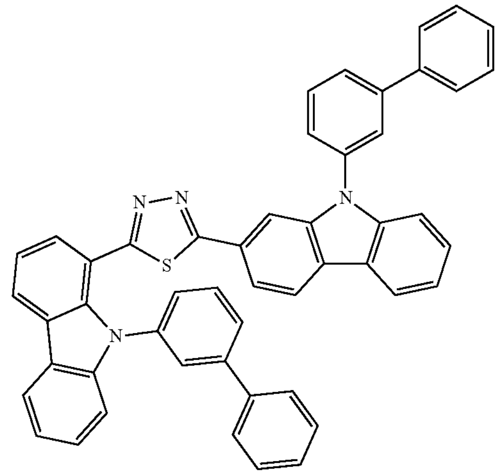
C 178
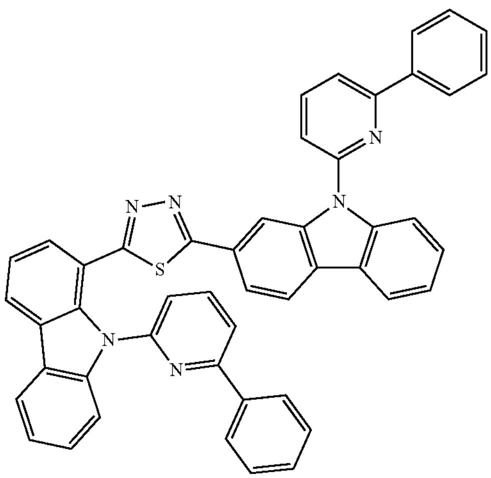
C 179
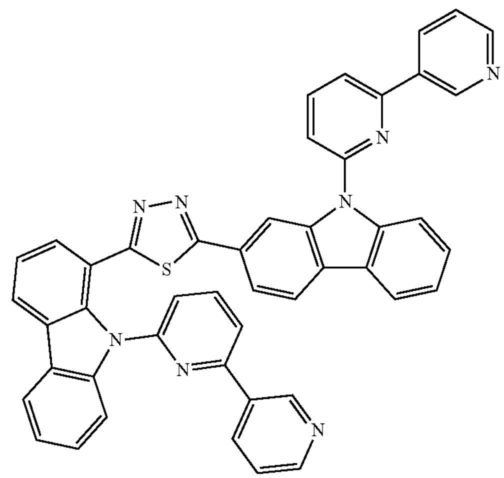
C 180
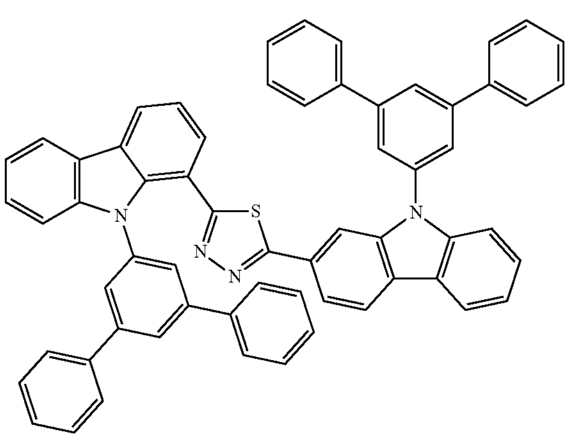
C 181
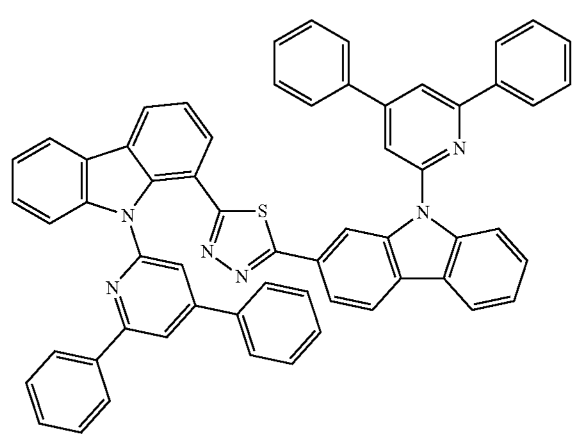

-continued
C 182
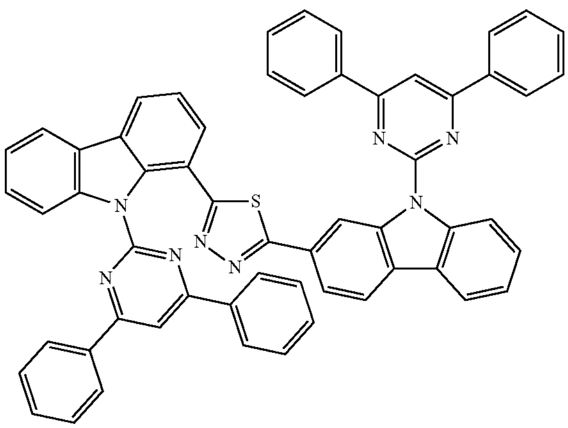
C 183
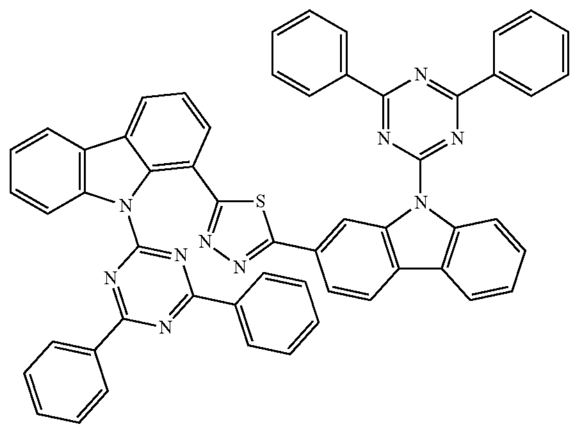
C 184
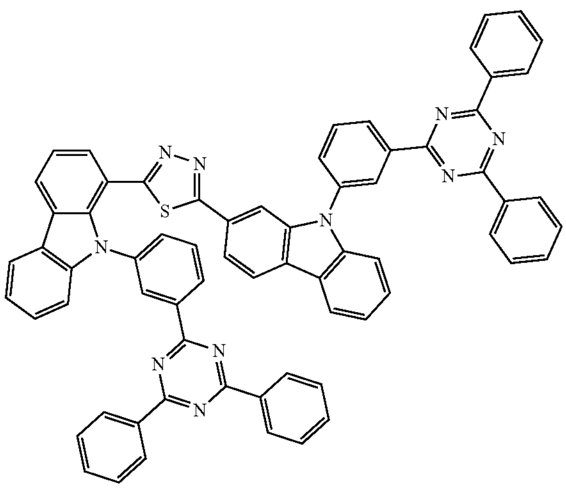
185
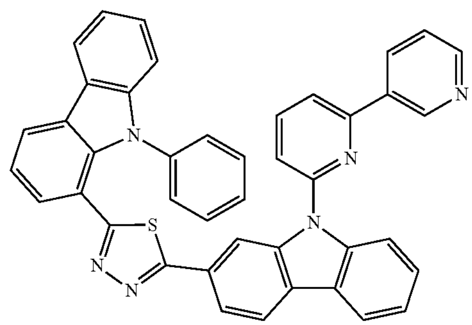
C 186
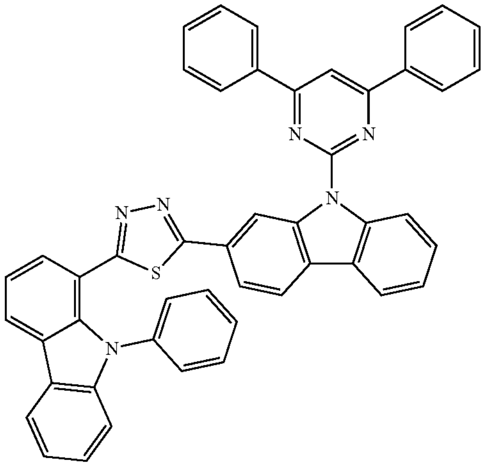
C 187
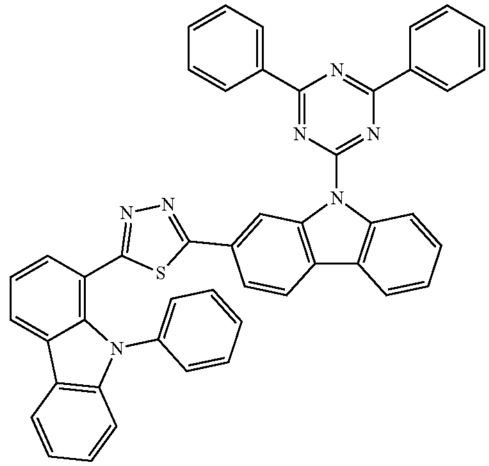

-continued
C 188
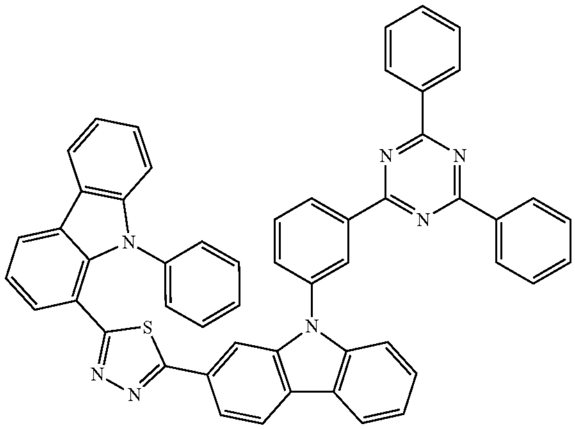
C 189
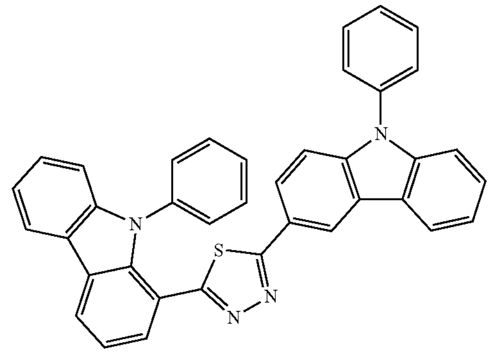
C 190
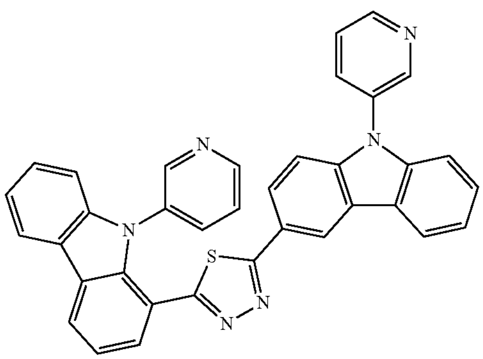
C 191
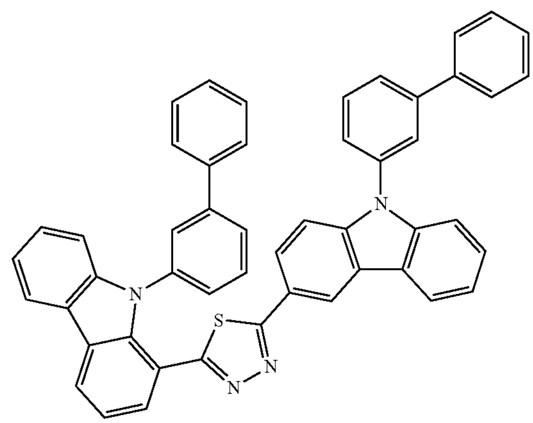
C 192
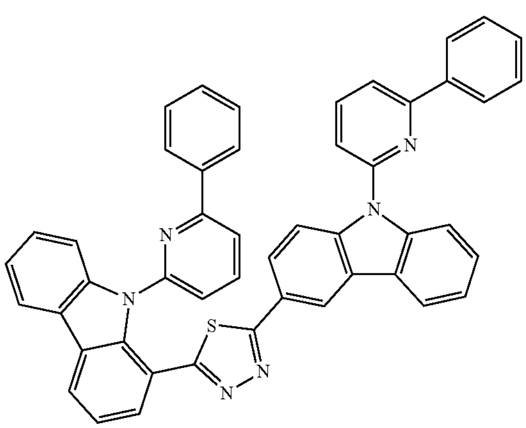
C 193
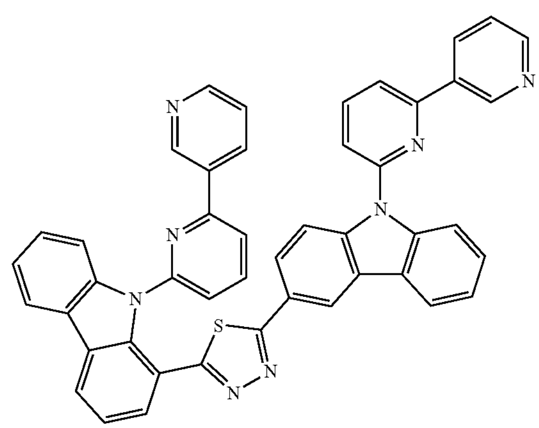

-continued
C 194
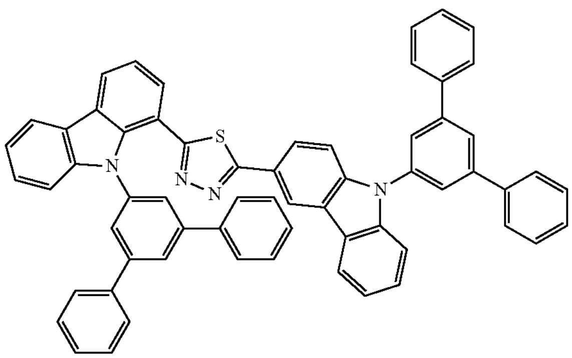
C 195
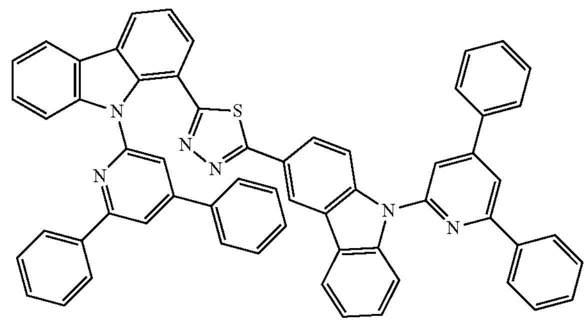
C 196
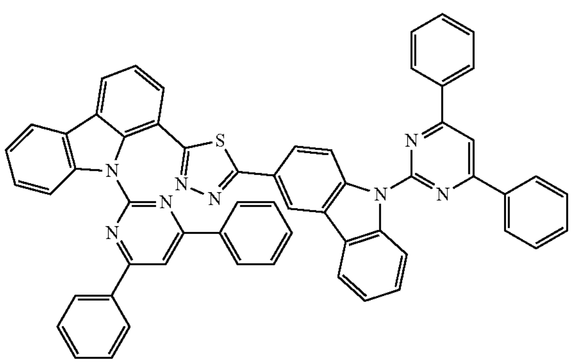
C 197
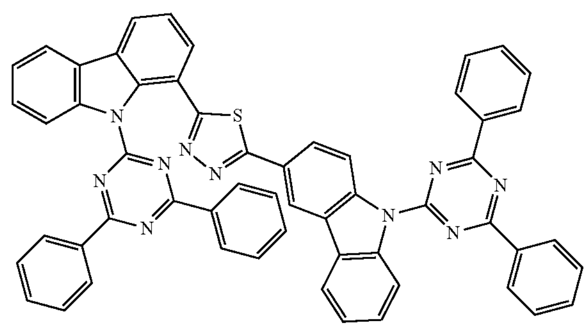
C 198
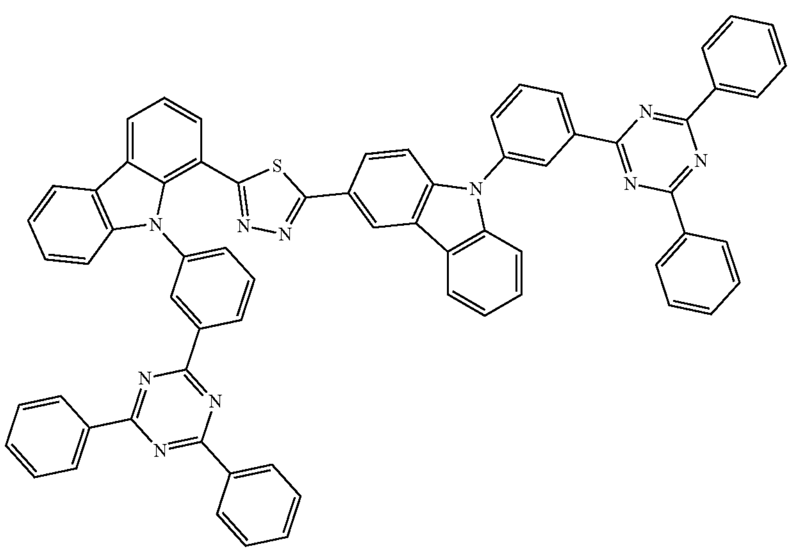

-continued
C 199
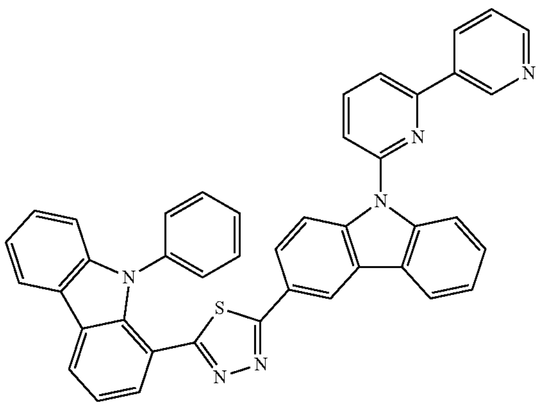
C 200
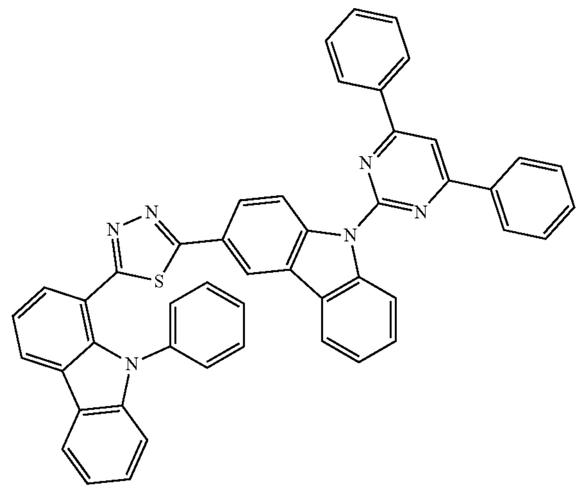
C 201
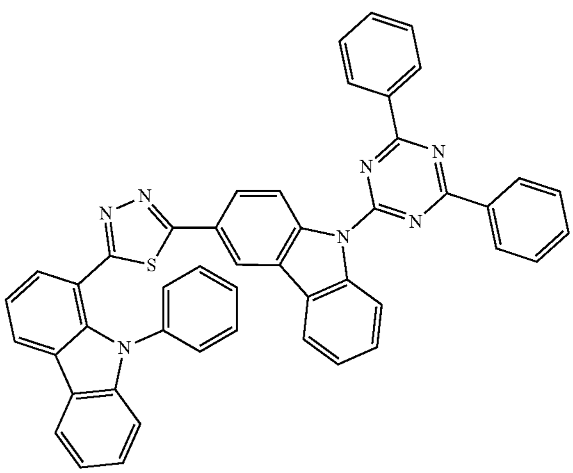
C 202
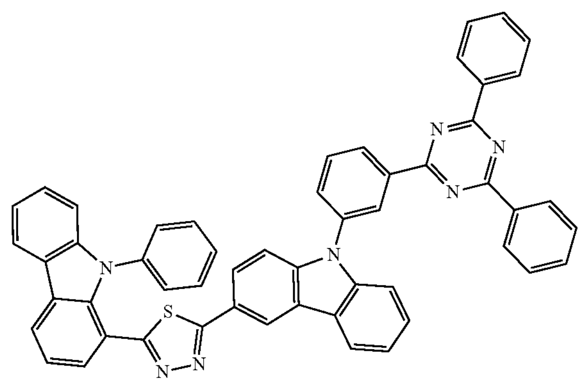
C 203
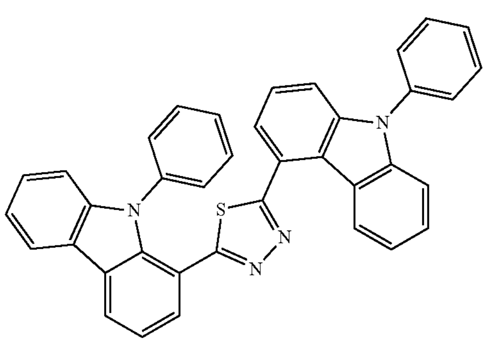
C 204
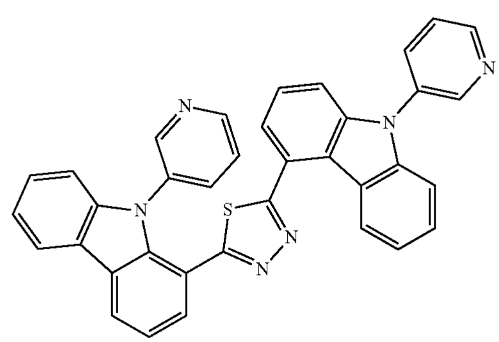

-continued
C 205
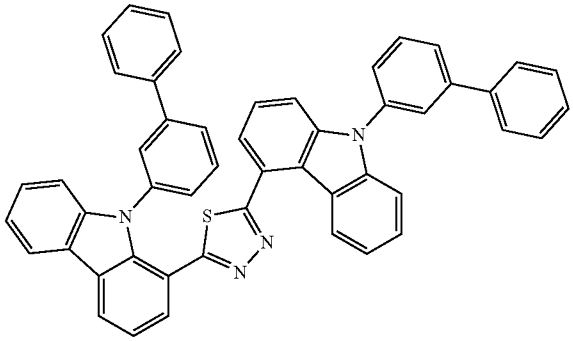
C 206
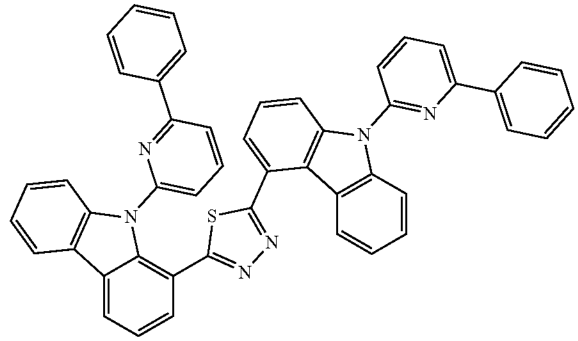
C 207
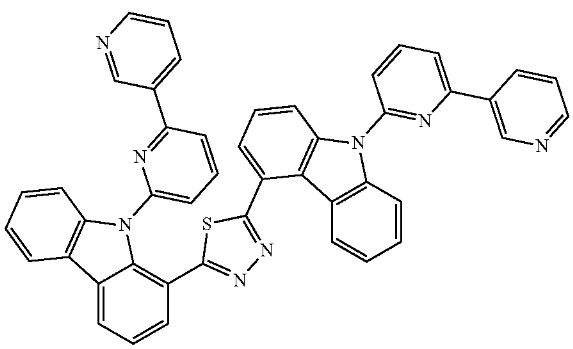
C 208
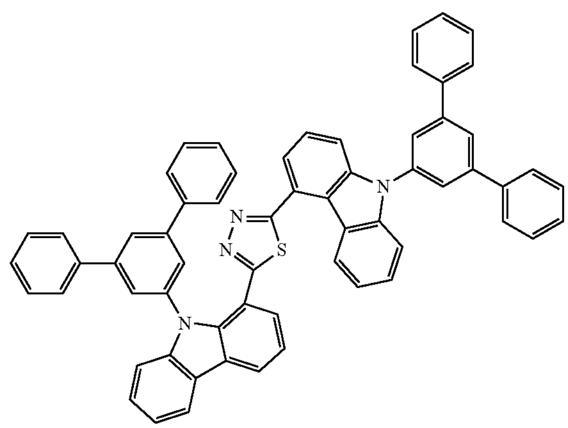
C 209
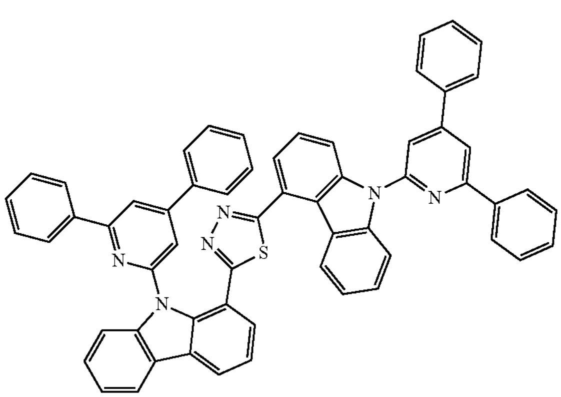
C 210
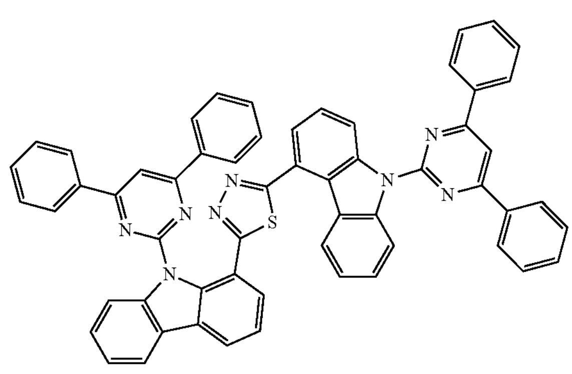

-continued
C 211
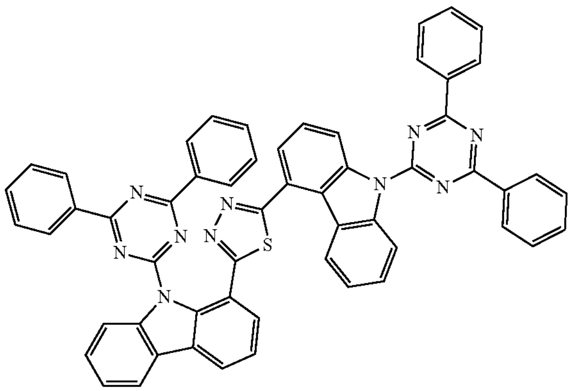
C 212
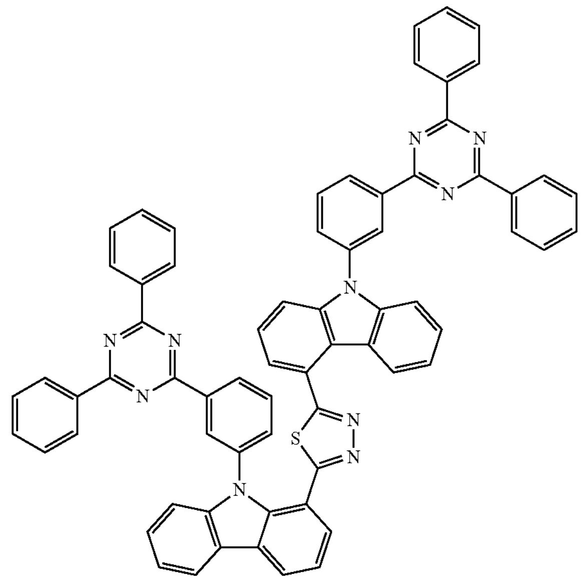
C 213
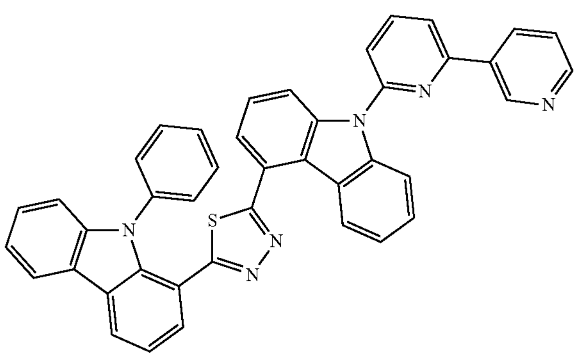
C 214
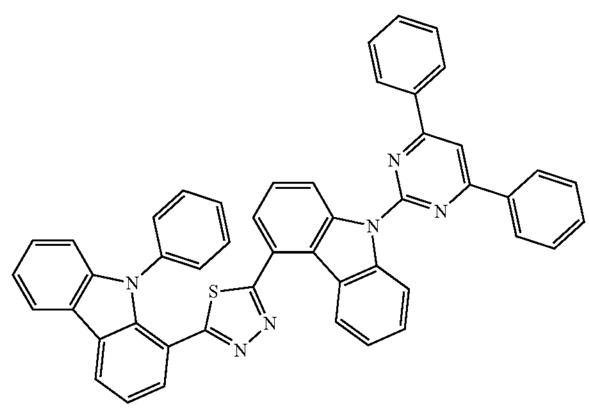
C 215
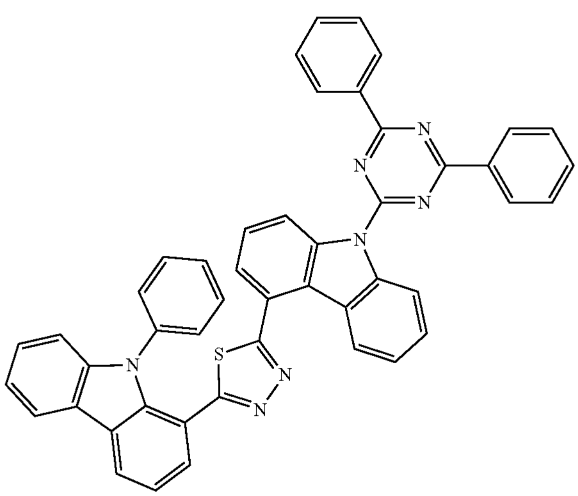
C 216
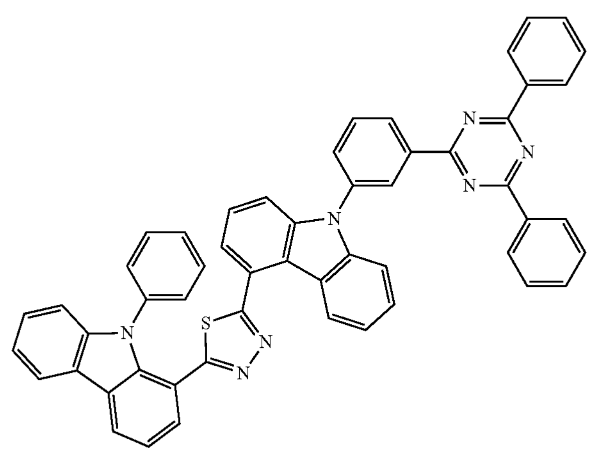

C217
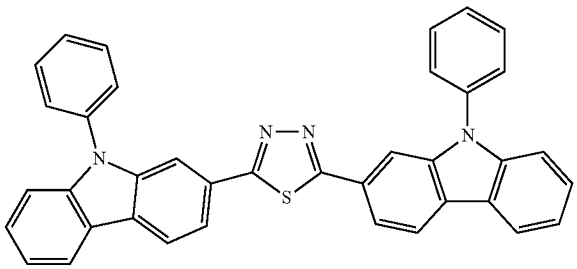
C218
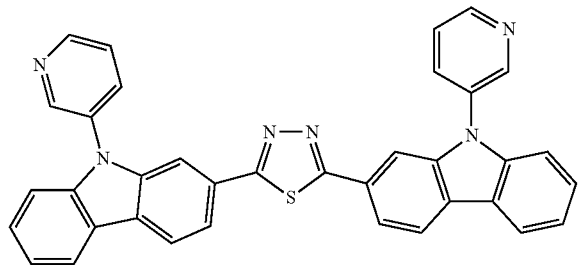
C 219
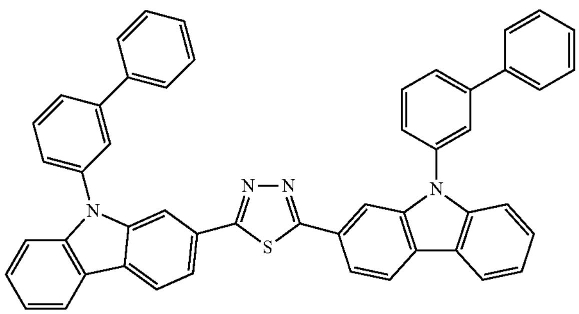
C 220
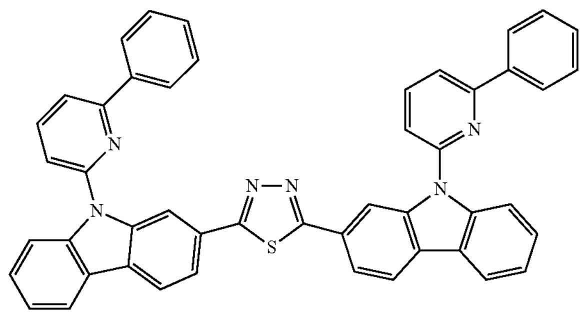
C 221
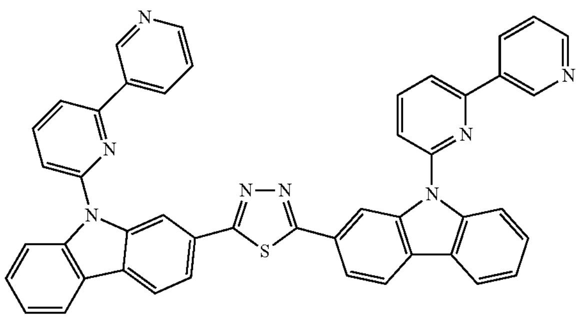
C 222
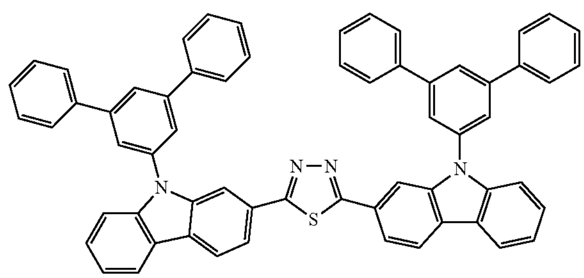
C 223
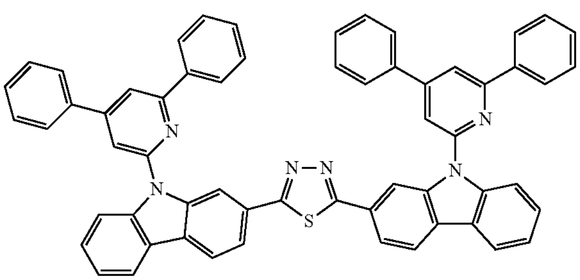
C 224
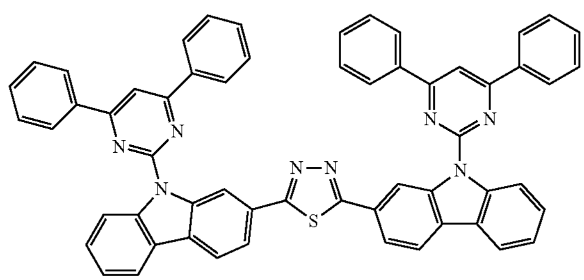

-continued
C 225
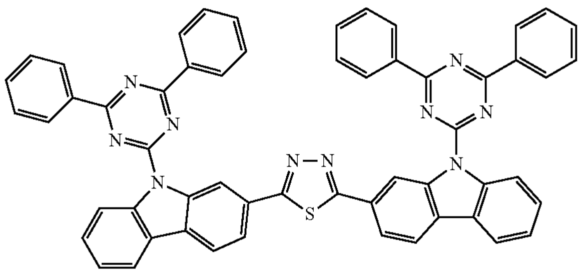
C 226
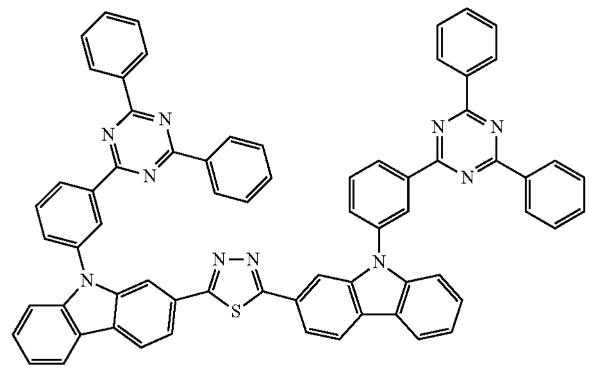
C 227
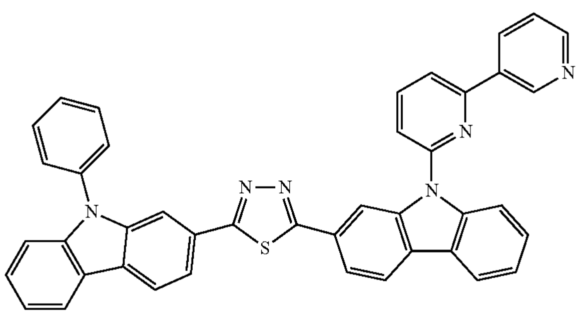
C 228
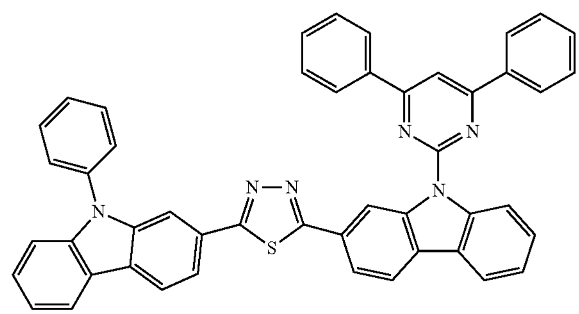
C 229
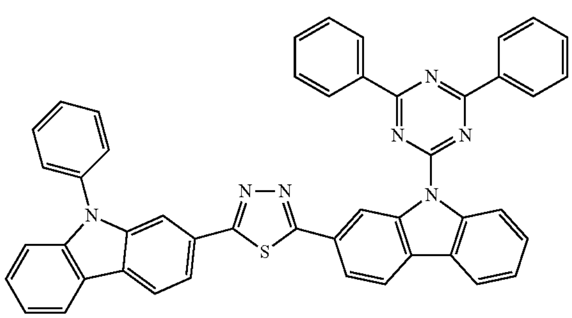
C 230
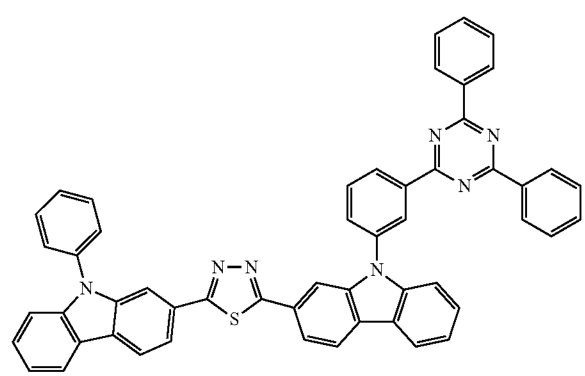
C 231
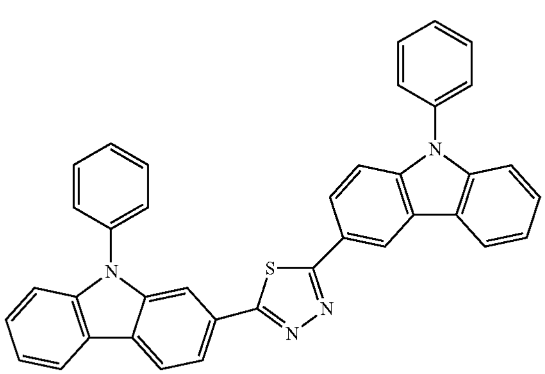
C 232
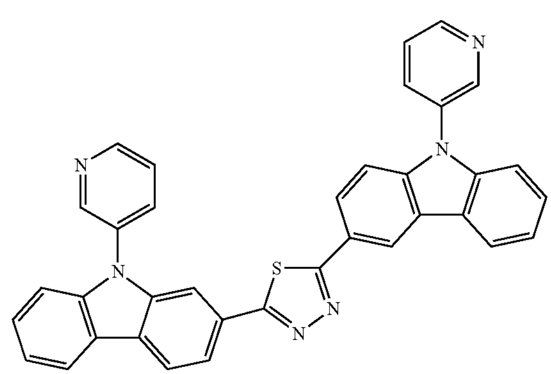

-continued
C 233
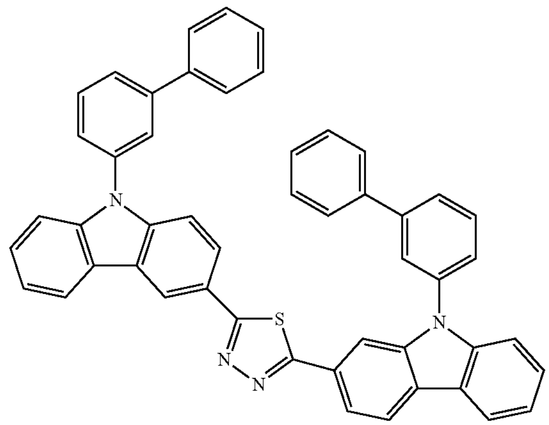
C 234
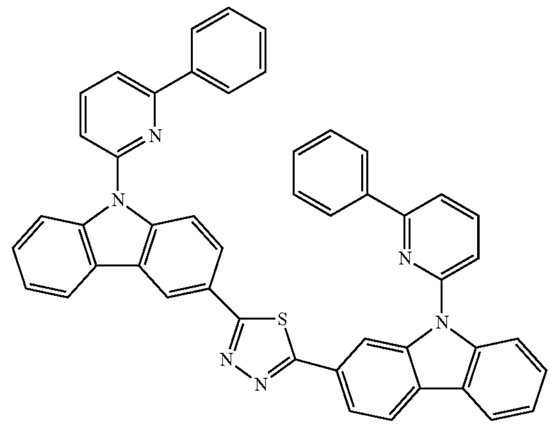
C 235
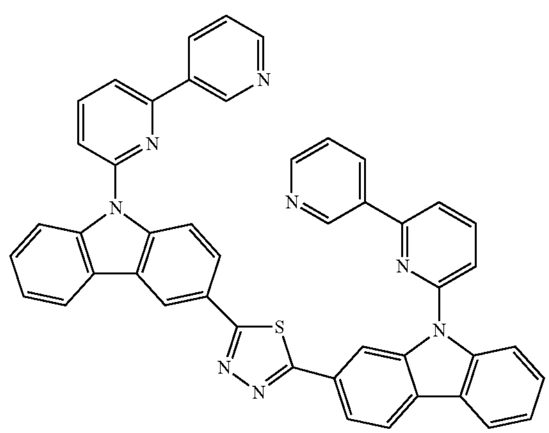
C 236
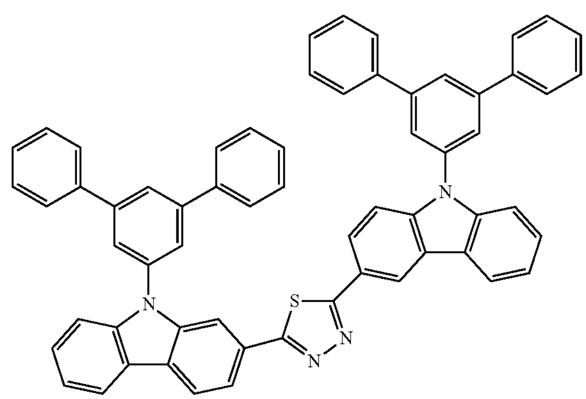
C 237
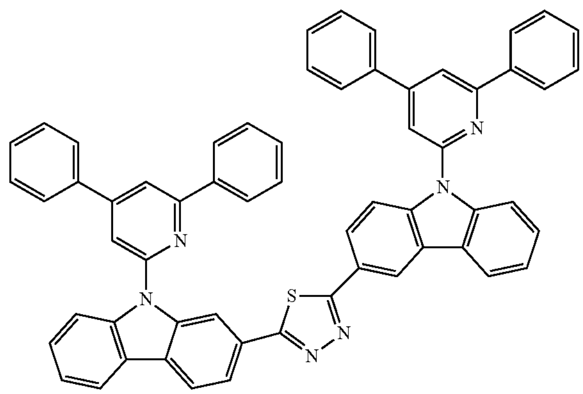
C 238
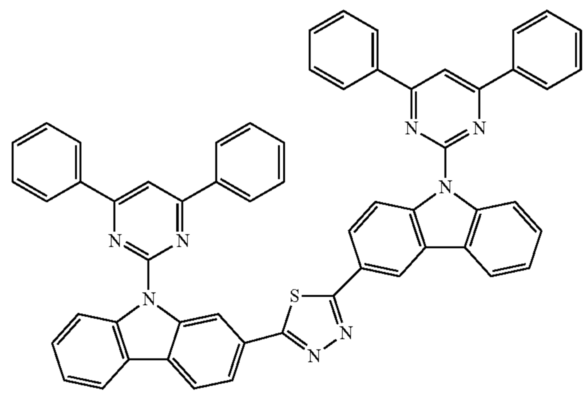

-continued
C 239
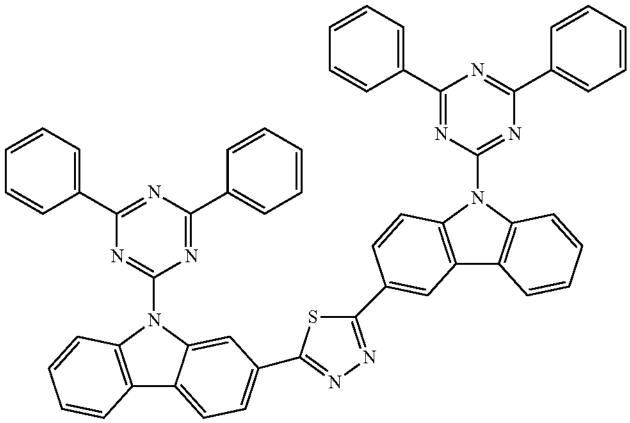
C 240
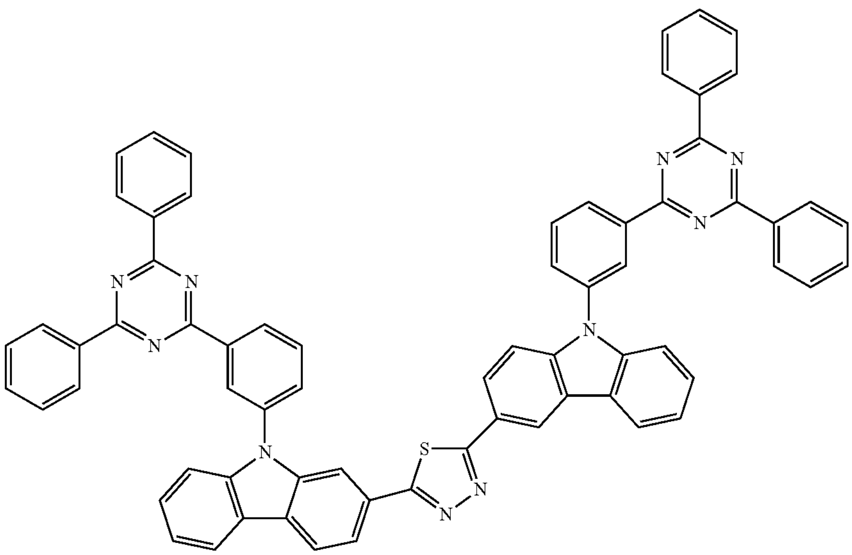
C 241
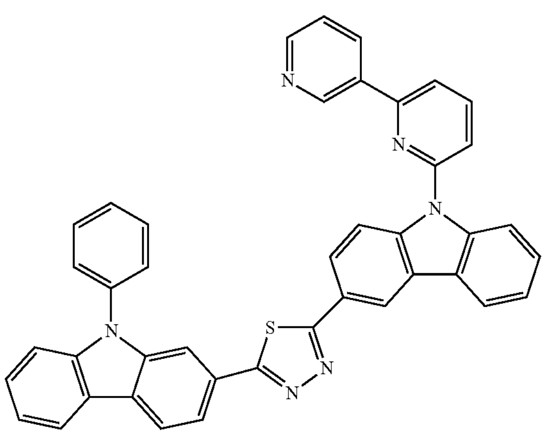
C 242
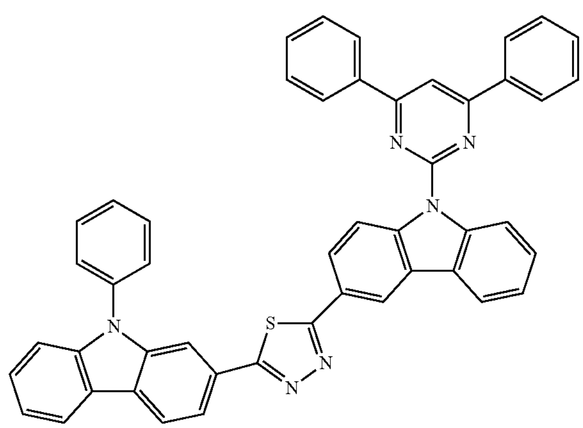

-continued
C 243
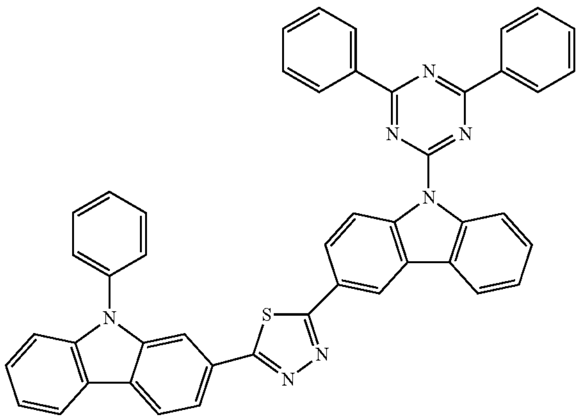
C 244
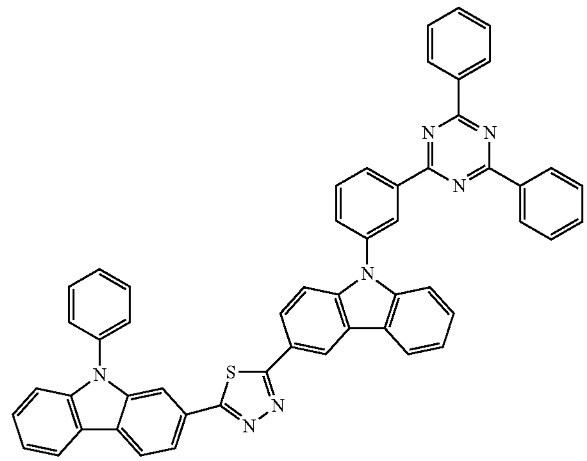
C 245
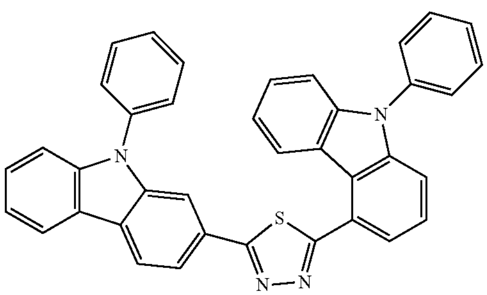
C 246
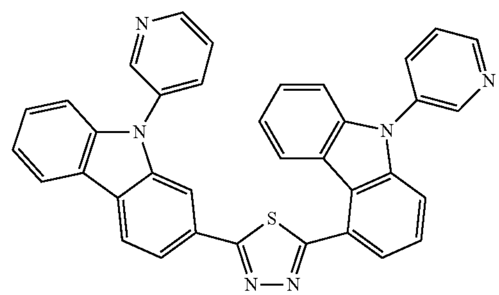
C 247
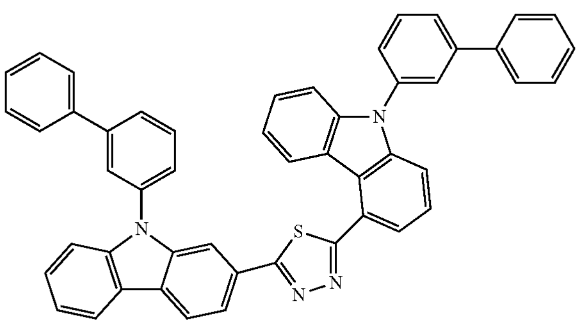
C 248
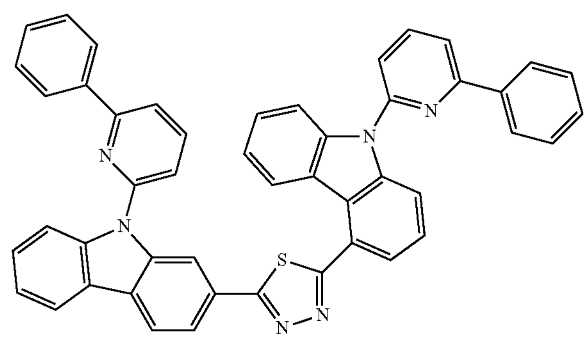
C 249
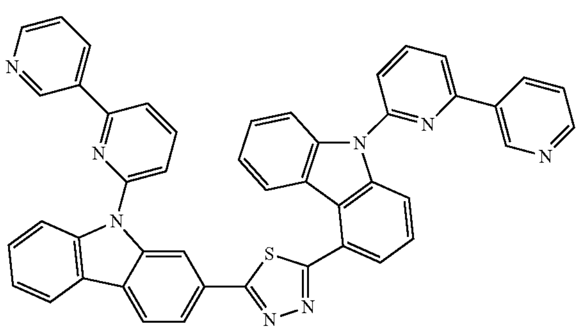
C 250
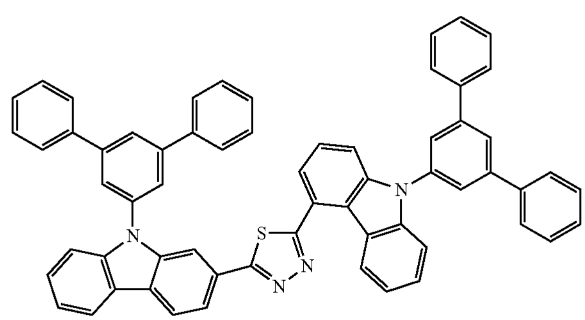

-continued
C 251
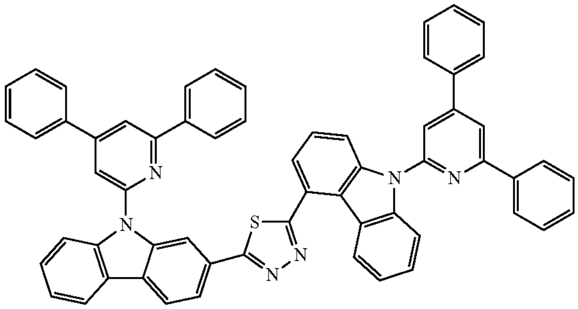
C 252
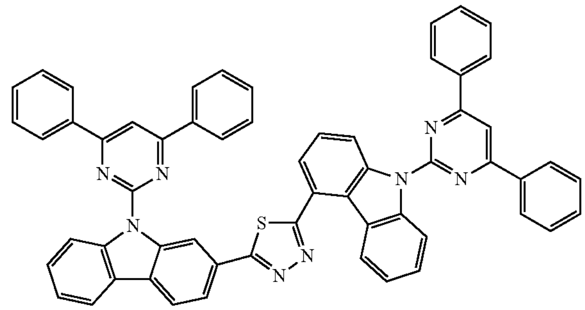
C 253
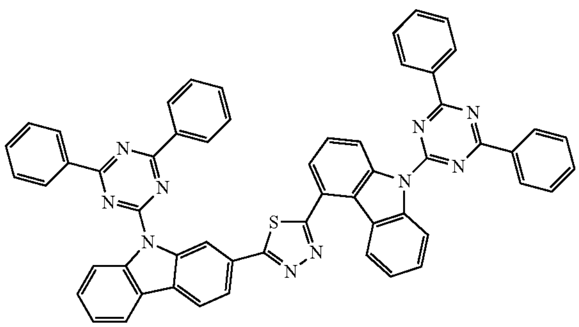
C 254
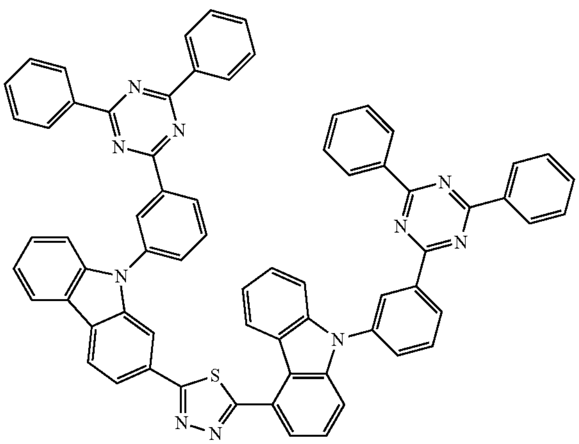
C 255
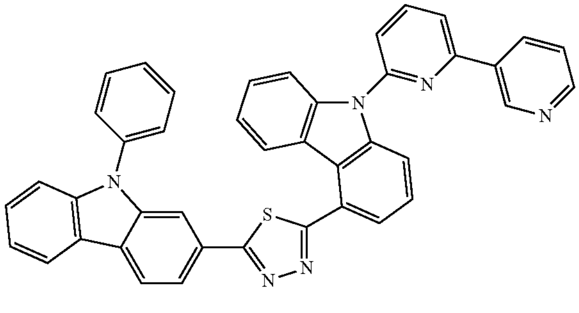
C 256
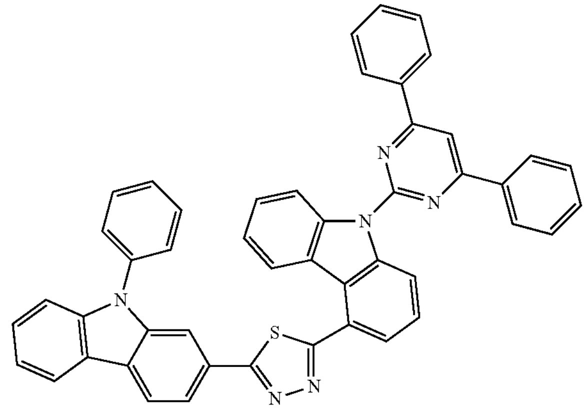

-continued
C 257
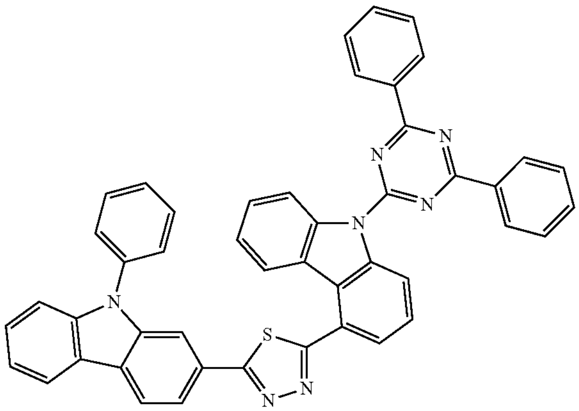
C 258
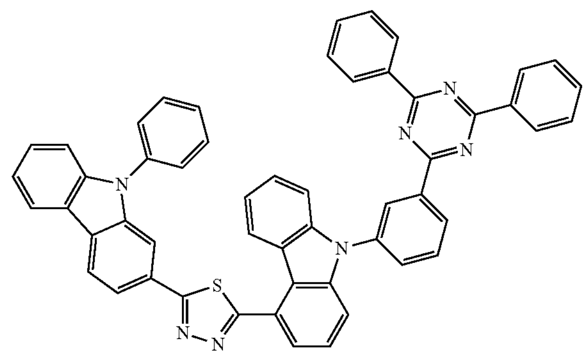
C 259
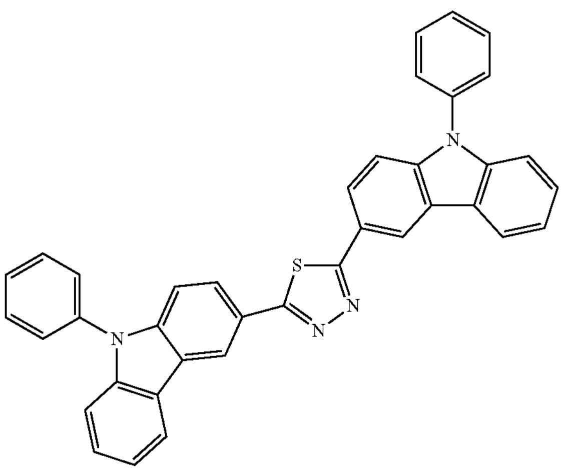
C 260
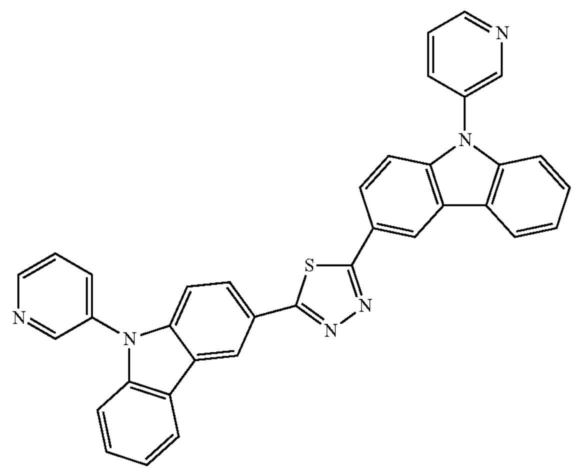
C 261
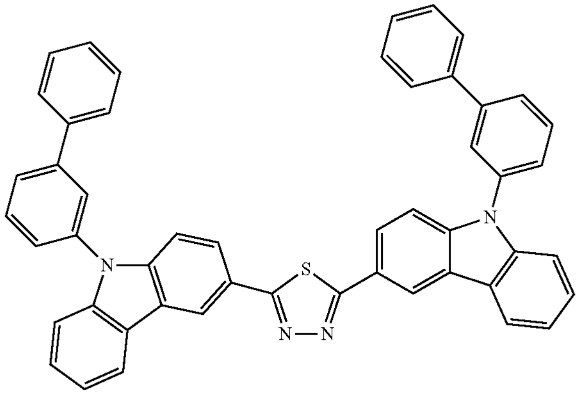
C 262
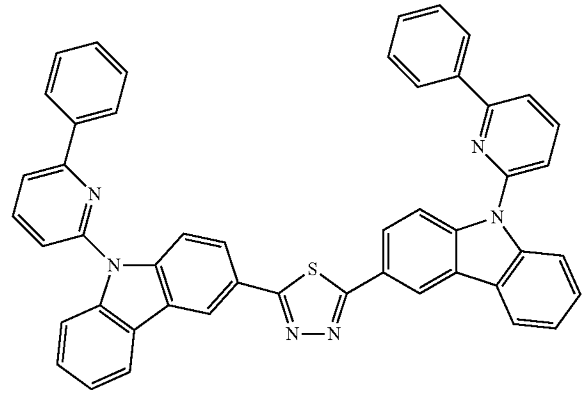

-continued
C 263
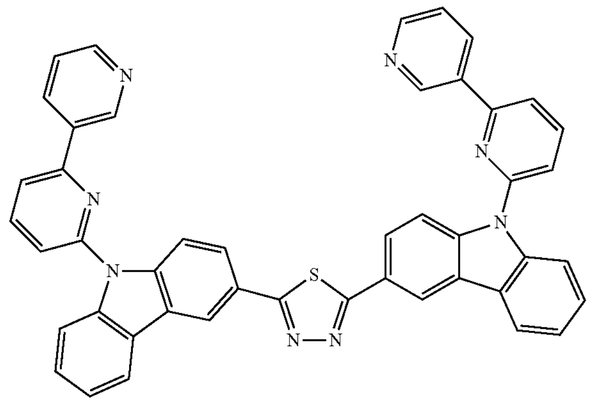
C 264
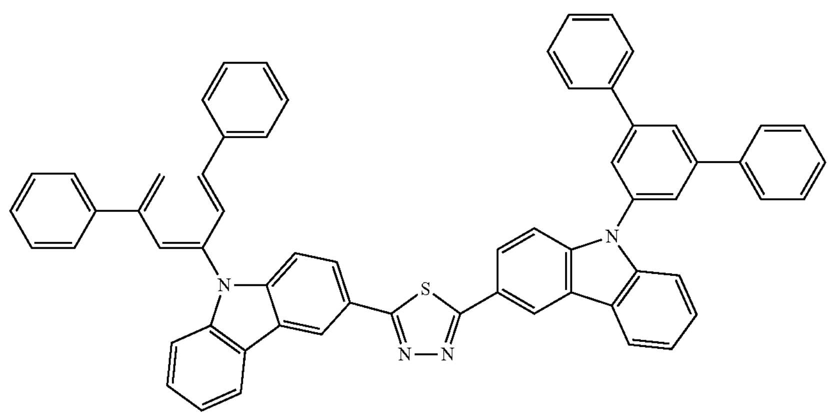
C 265
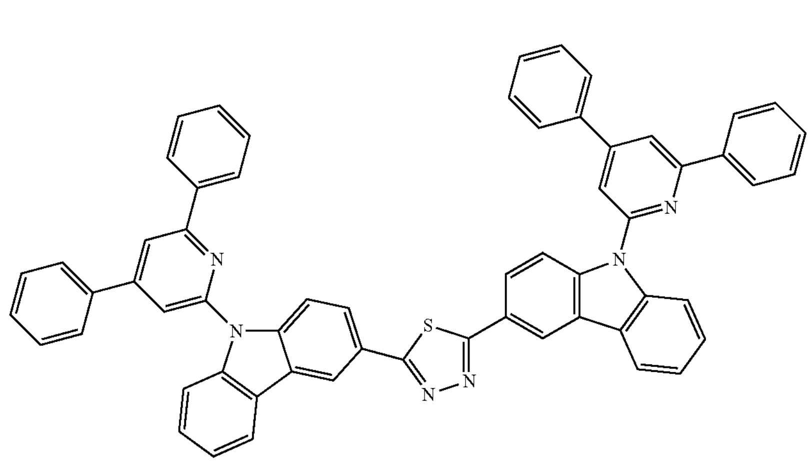

-continued
C 266
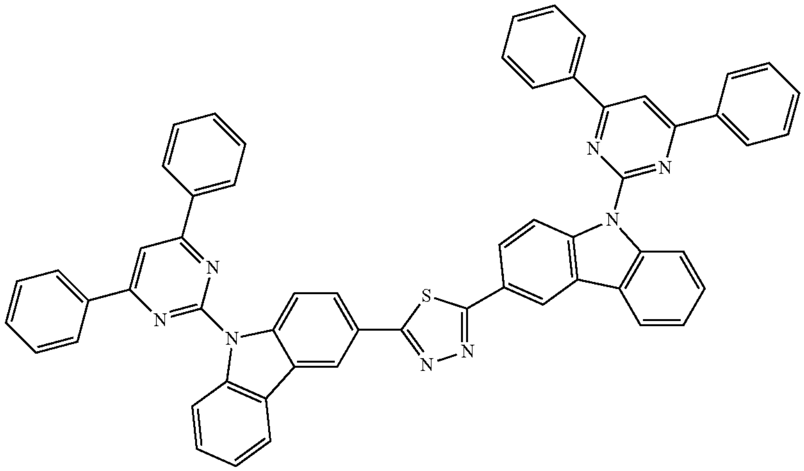
C 267
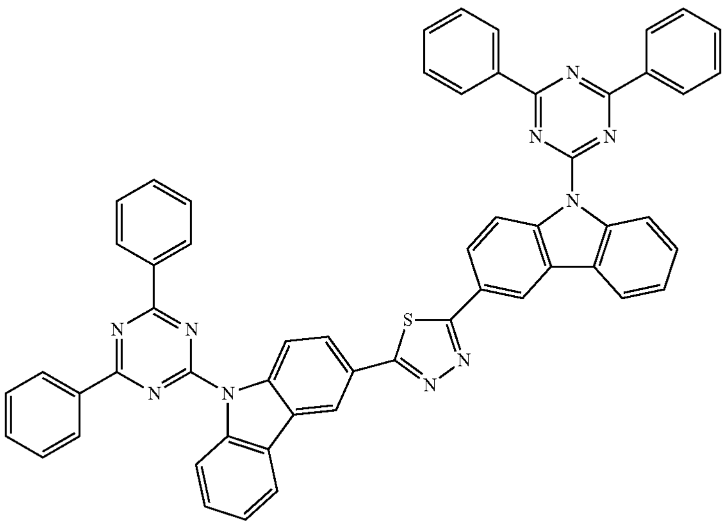
C 268
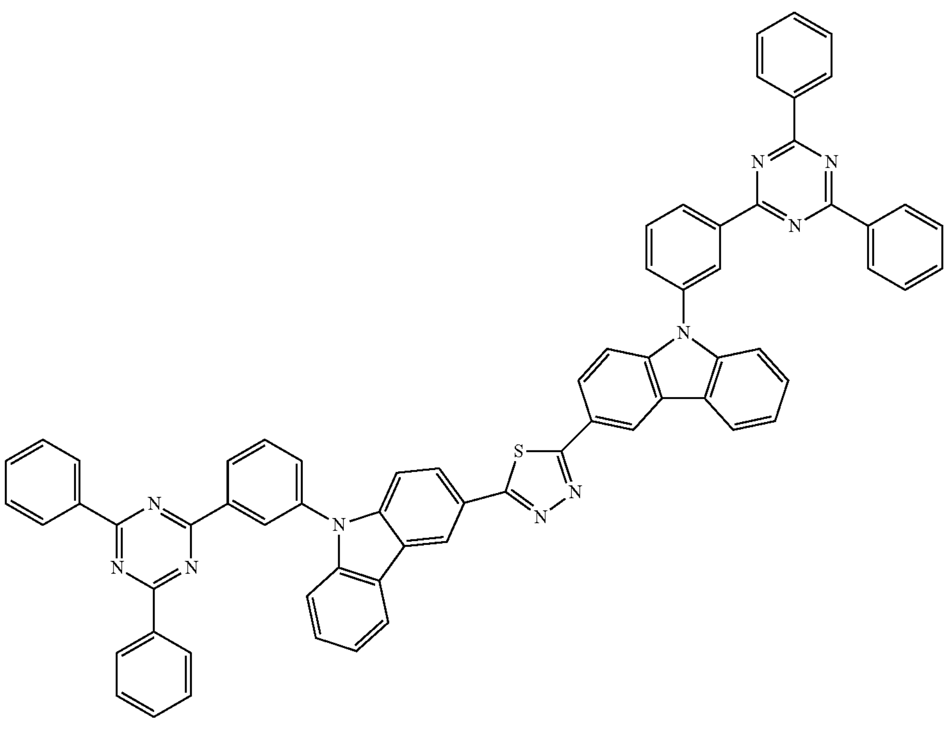

-continued
C 269
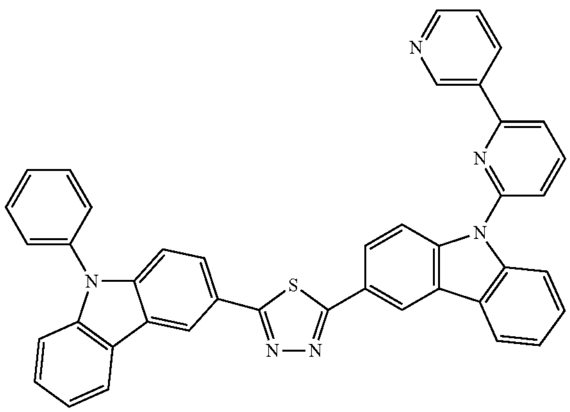
C 270
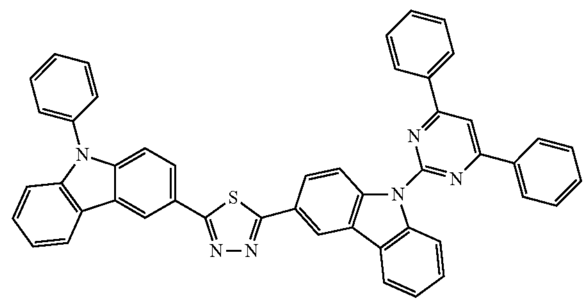
C 271
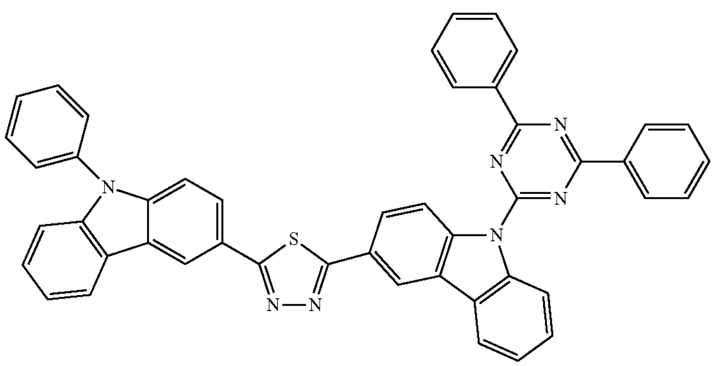
C 272
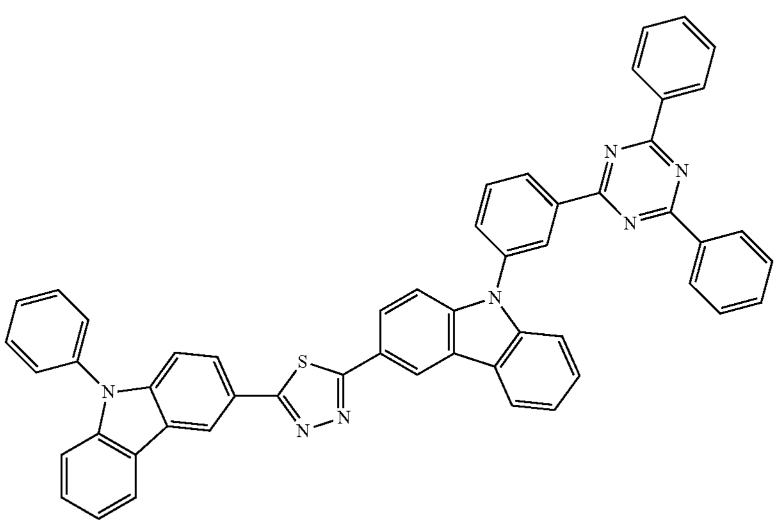

-continued
C 273
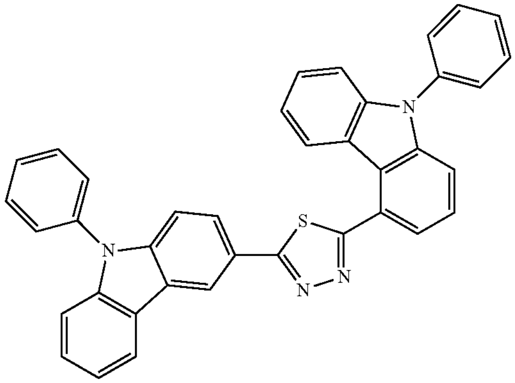
C 274
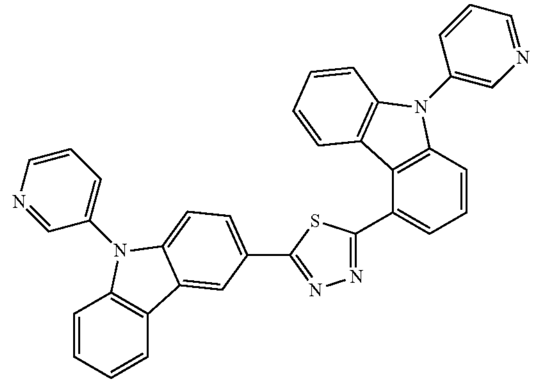
C 275
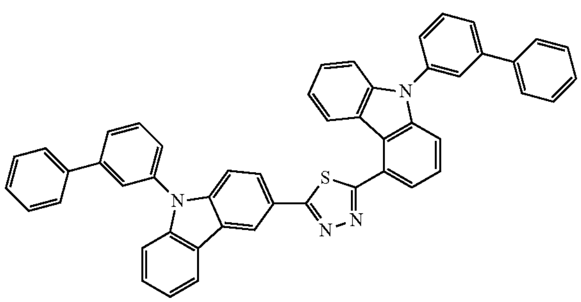
C 276
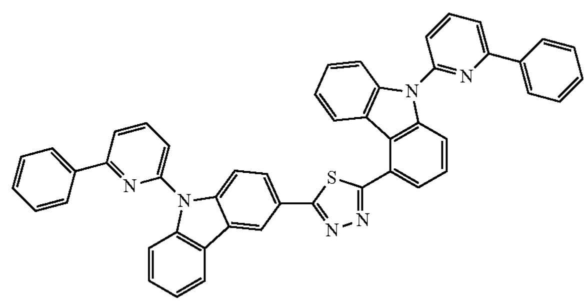
C 277
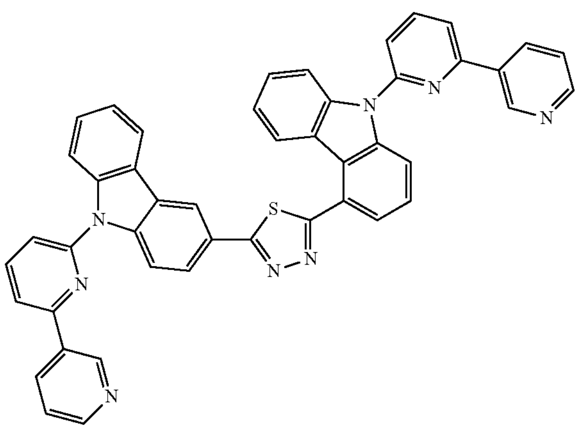
C 278
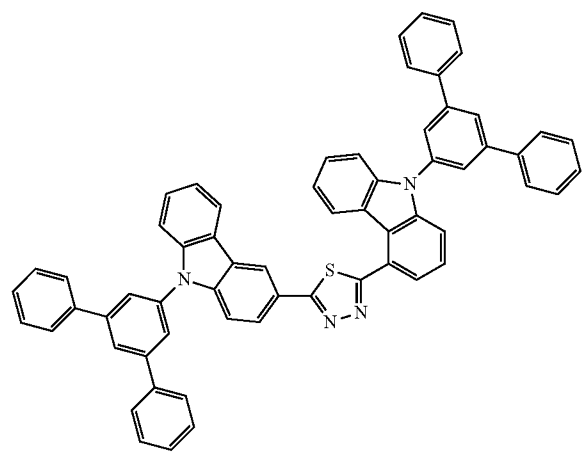
C 279
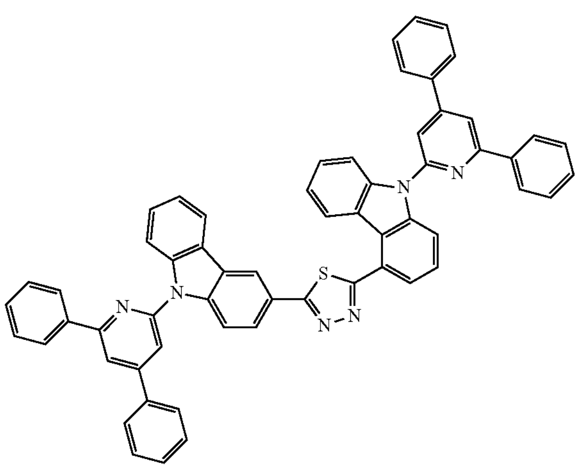
C 280
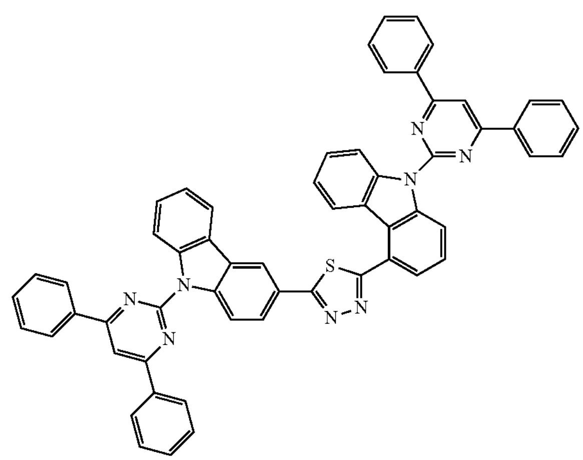

-continued
C 281
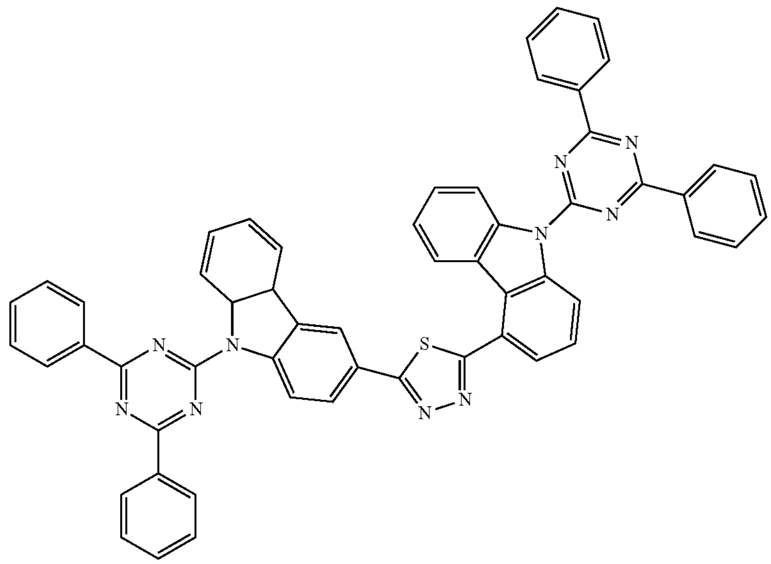
C 282
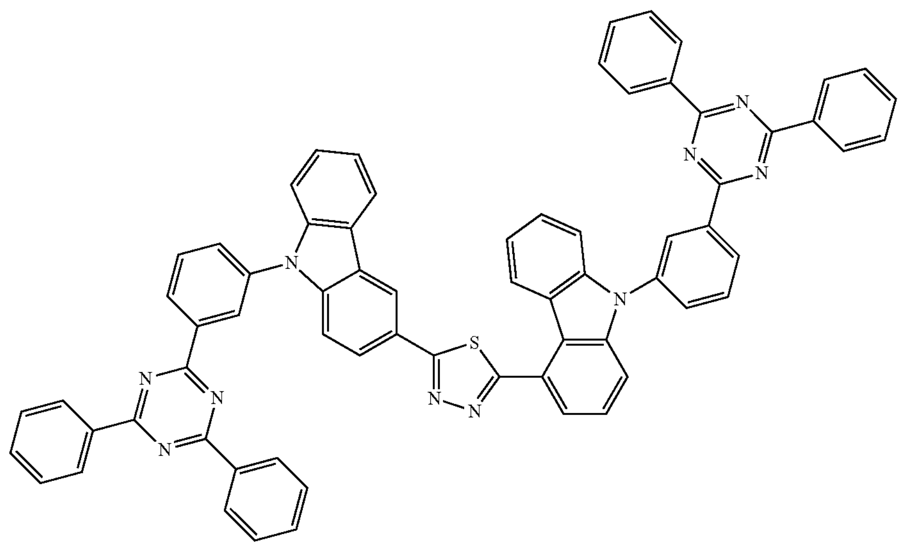
C 283
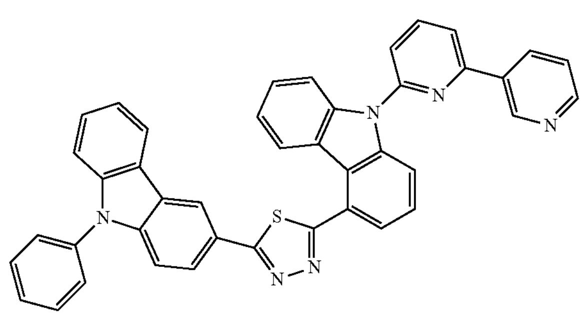
C 284
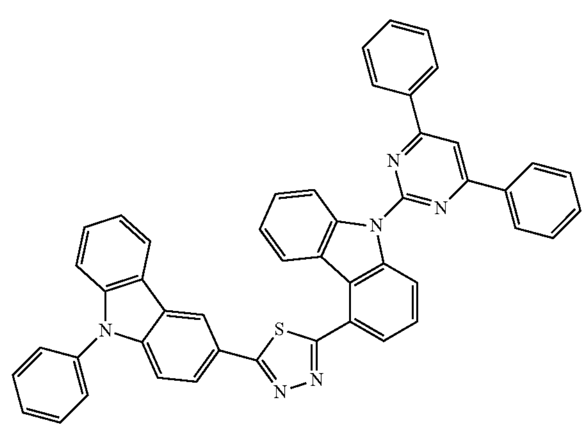

-continued
C 285
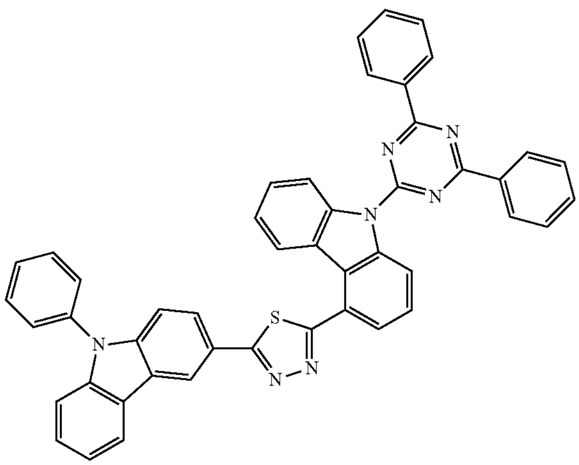
C 286
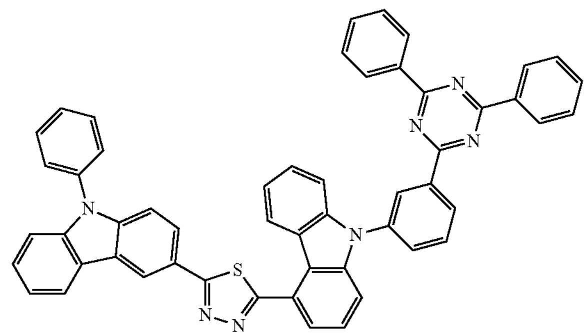
C 287
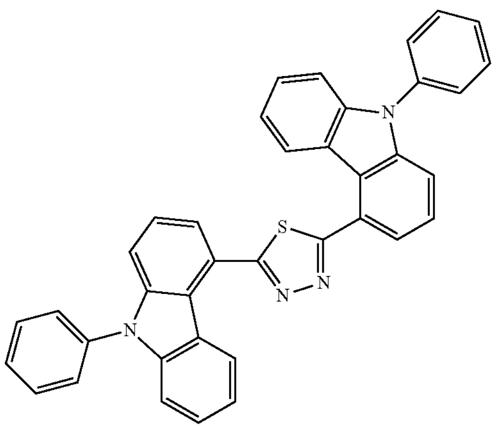
C 288
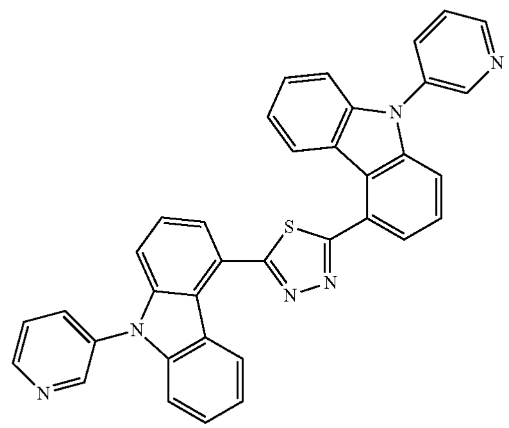
C 289
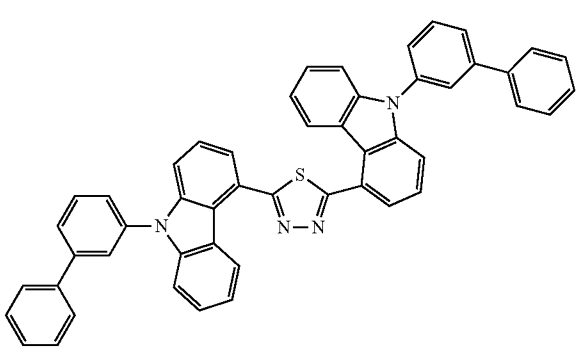
C 290
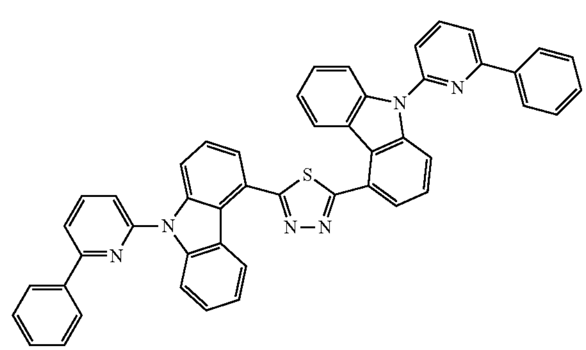

-continued
C 291
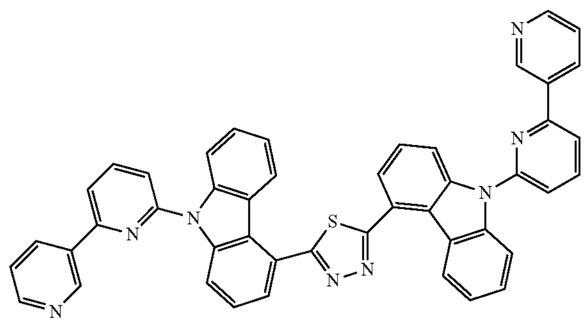
C 292
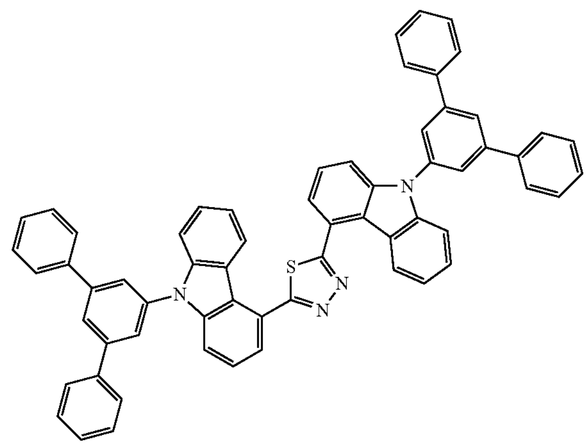
C 293
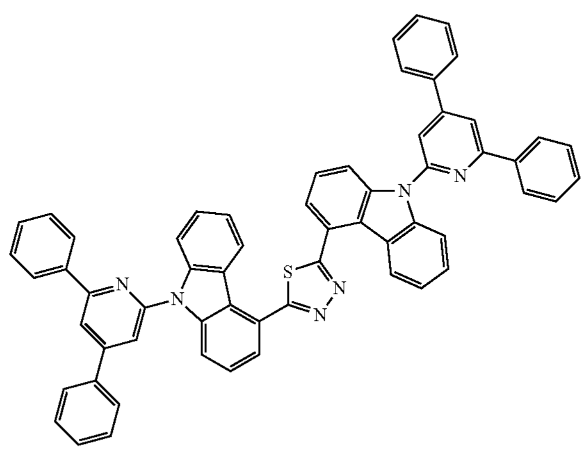
C 294
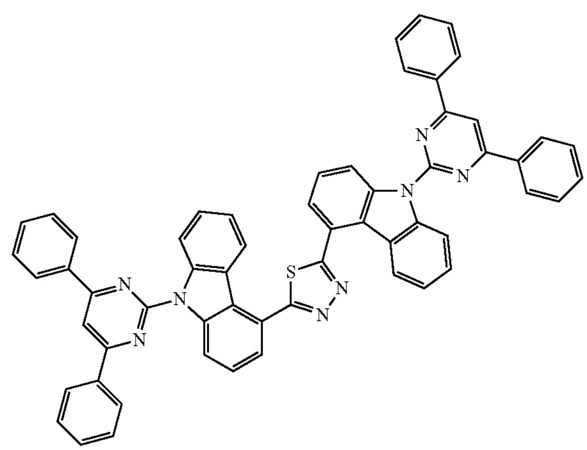
C 295
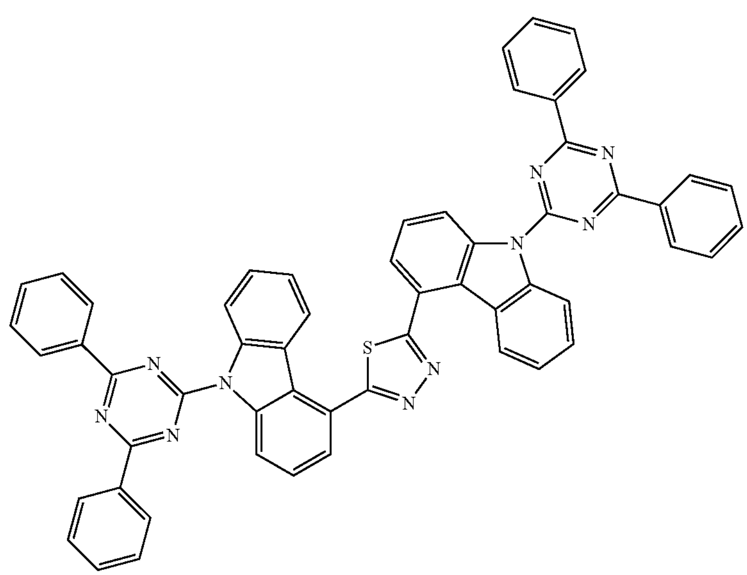

-continued
C 296
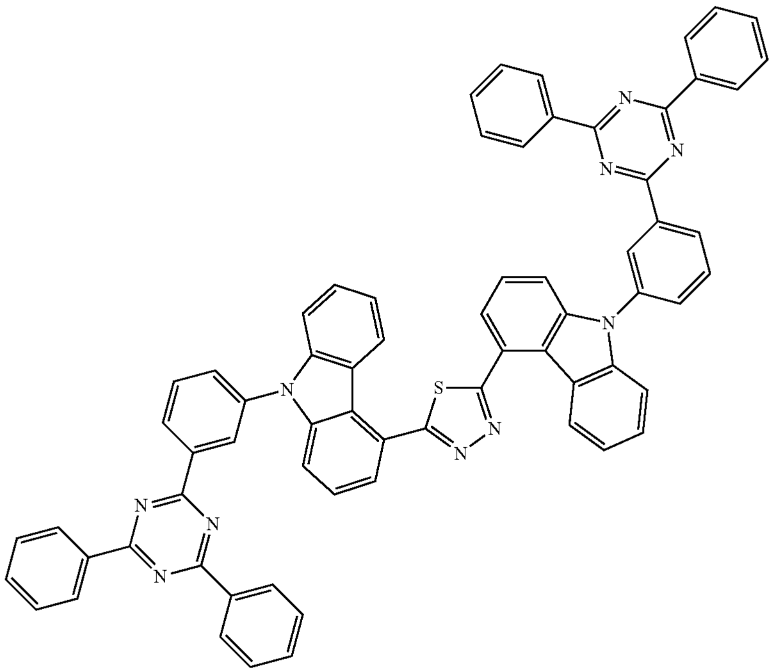
C 297
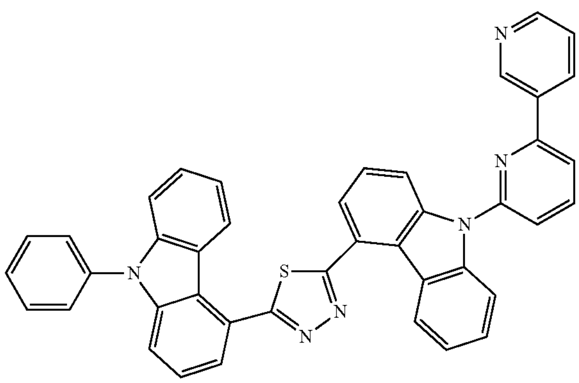
C 298
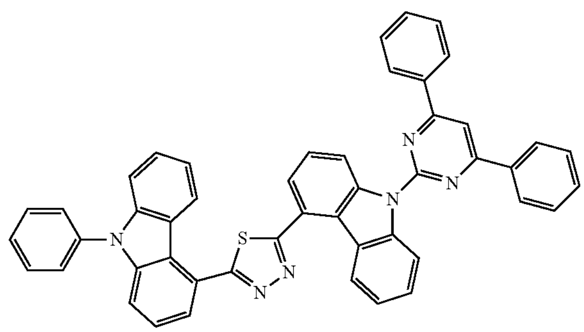
C 299
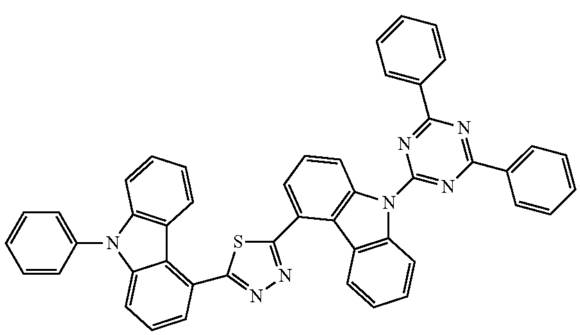
C 300
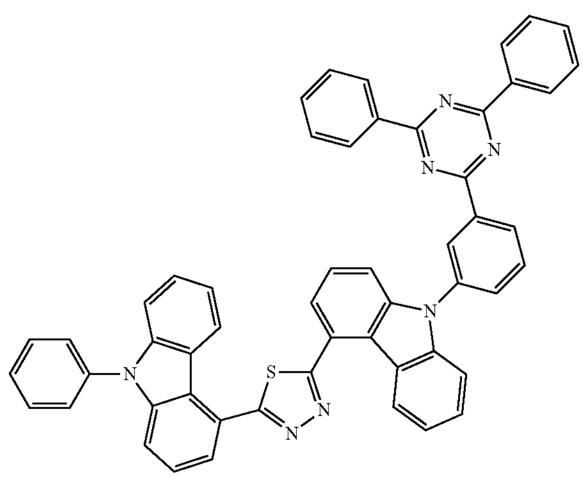

-continued
C 301
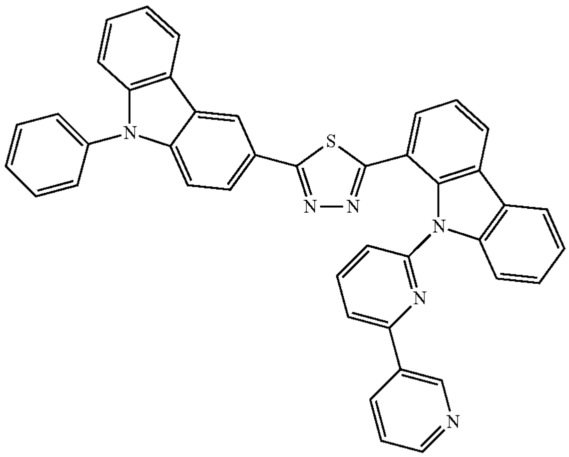
C 302
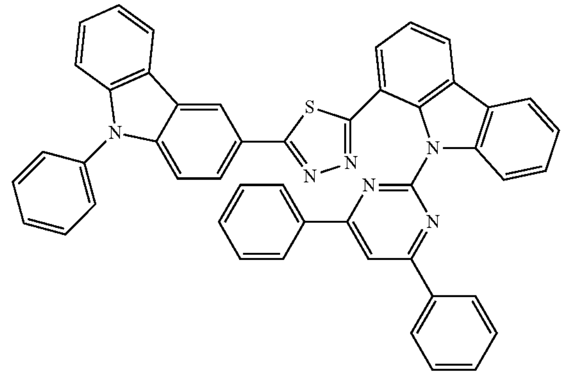
C 303
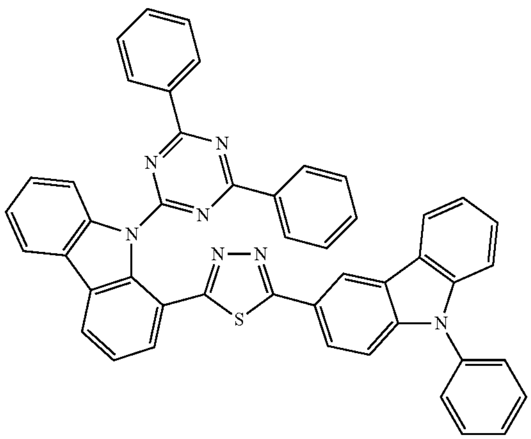
C 304
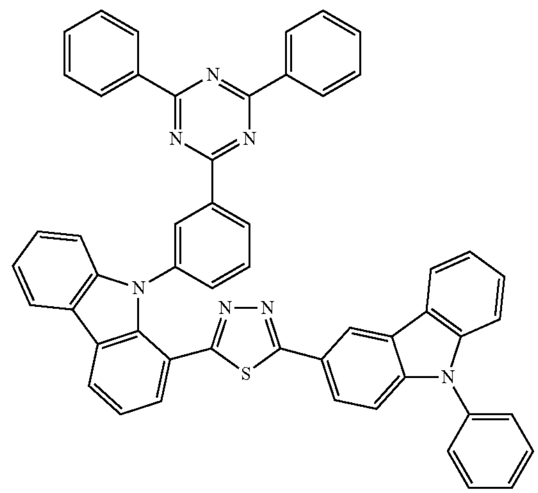
C 305
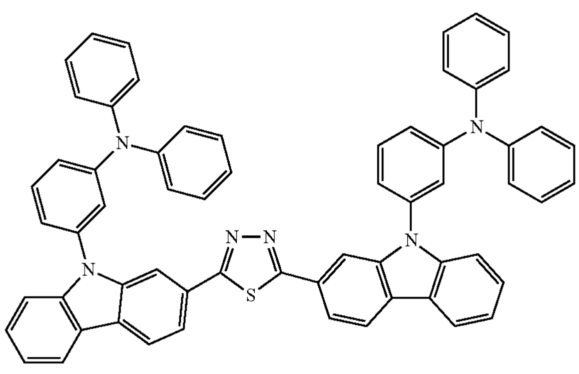
C 306
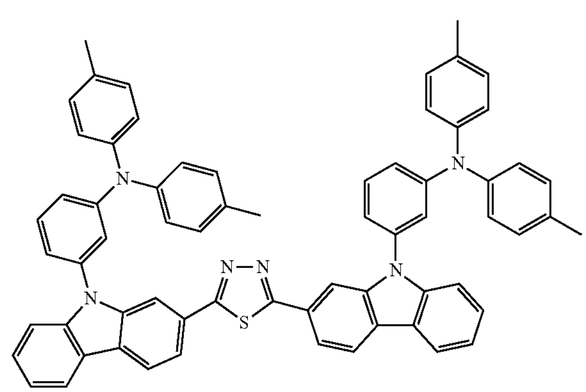

-continued
C 307
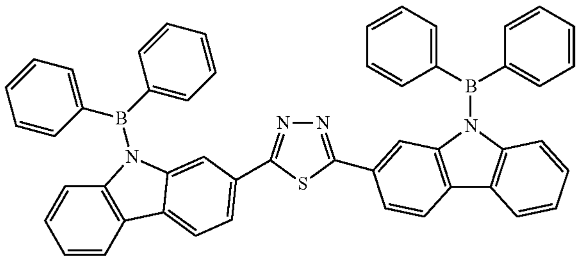
C 308
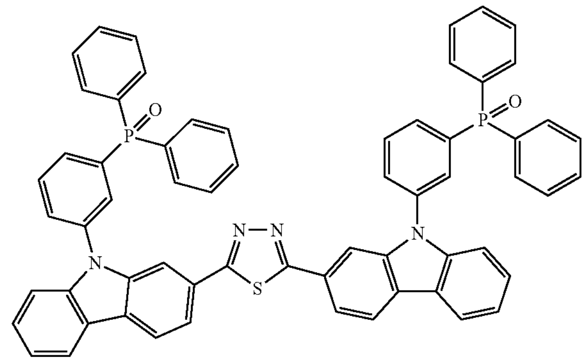
C 309
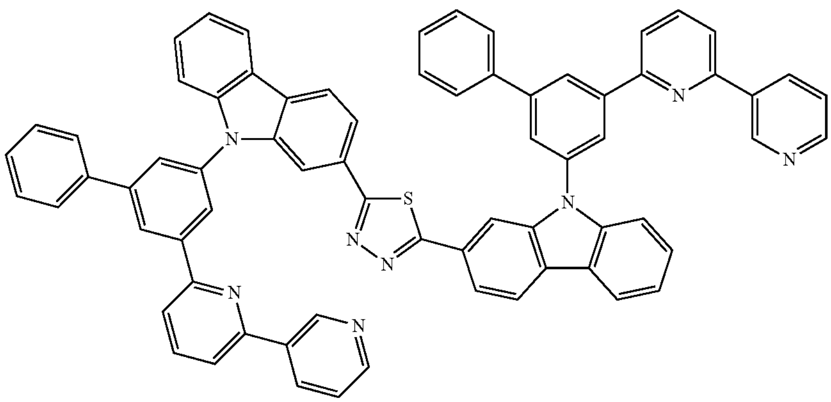
C 310
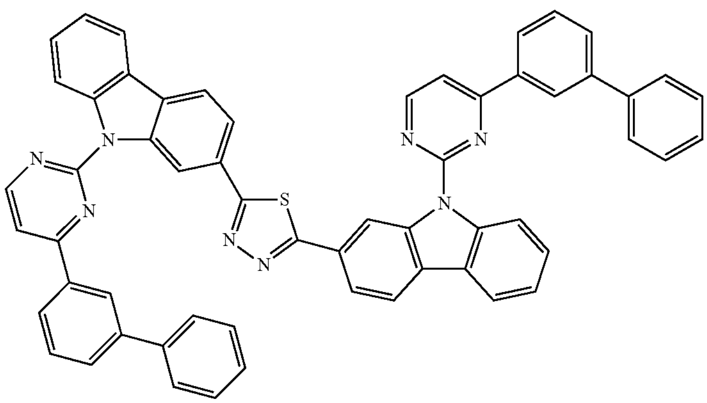
C 311
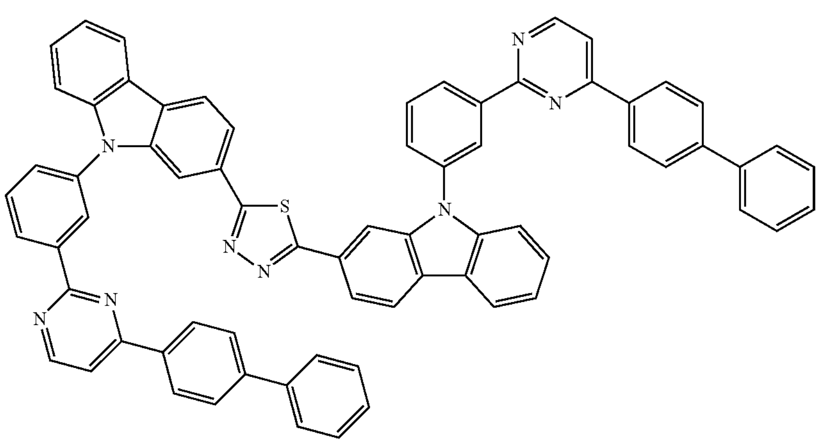

-continued
C 312
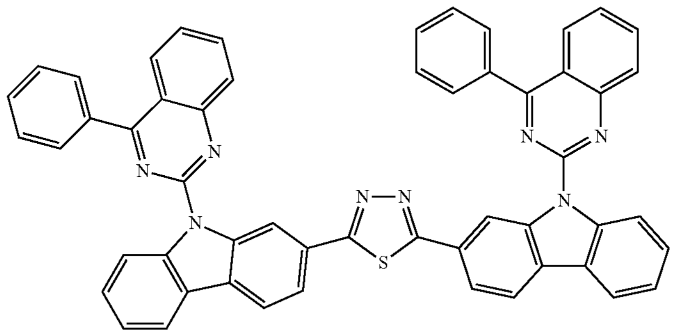
C 313
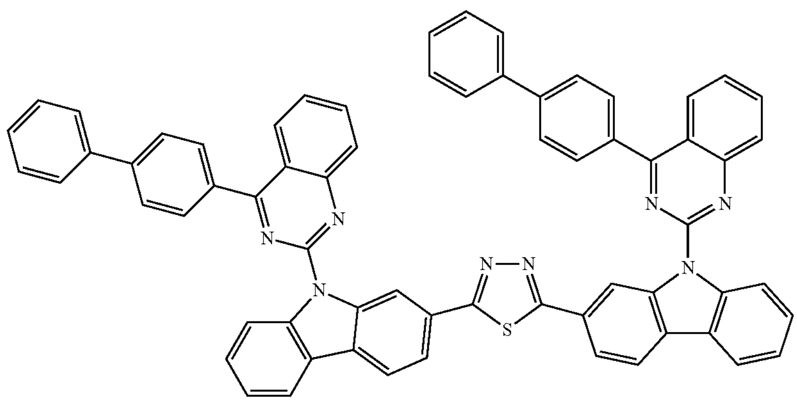
C 314
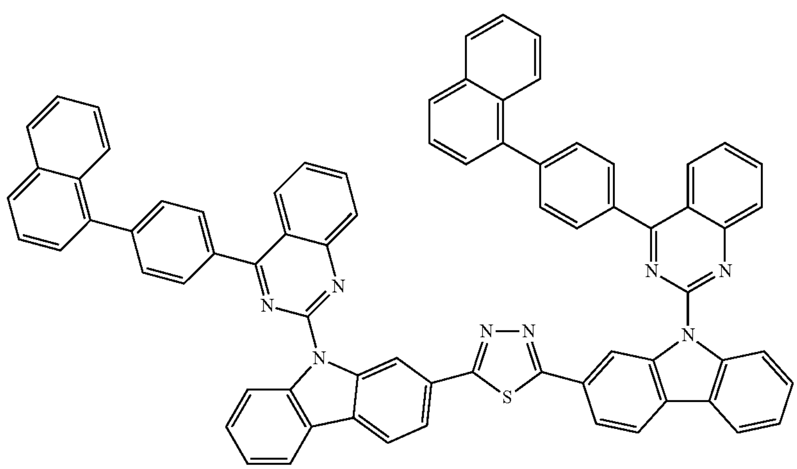
C 315
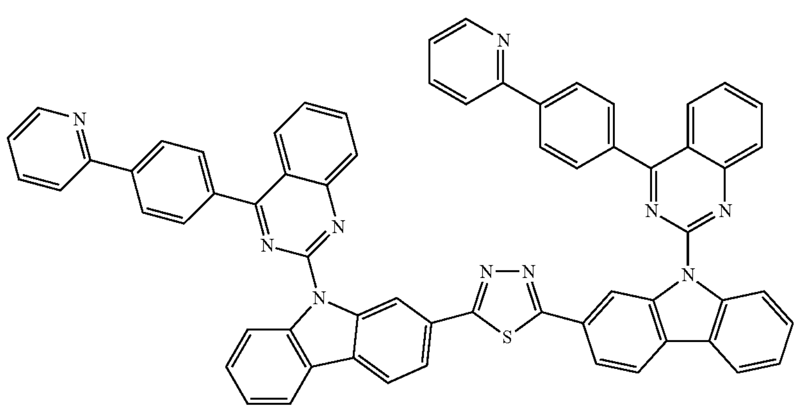

-continued
C 316
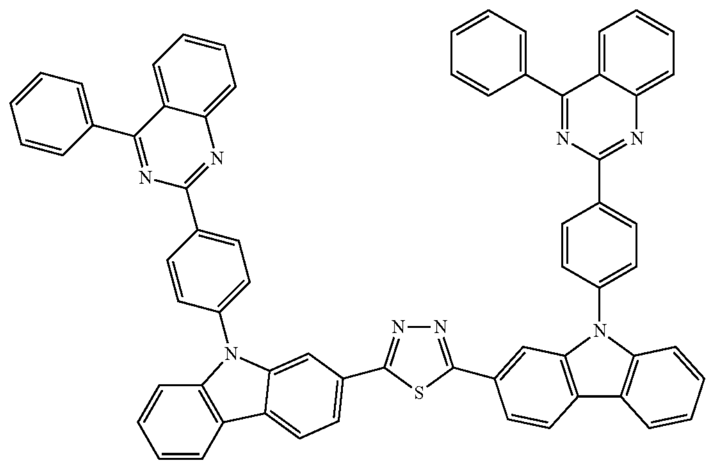
C 317
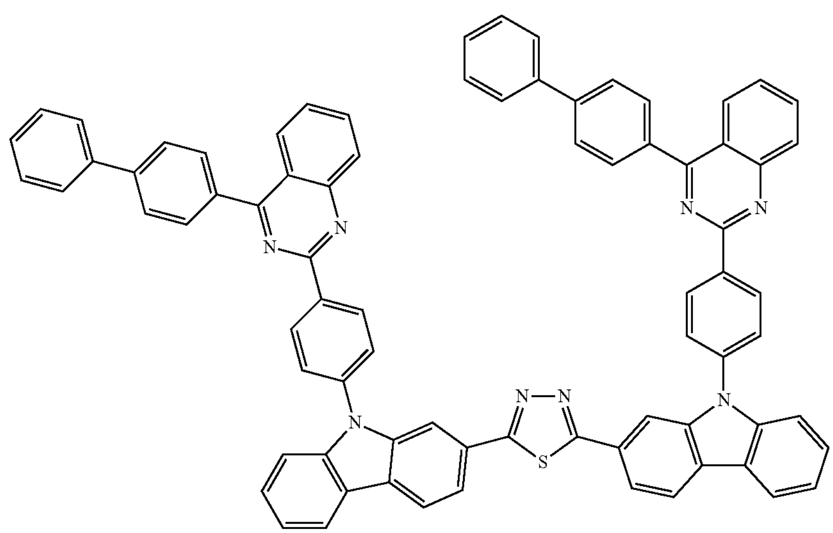
C 318
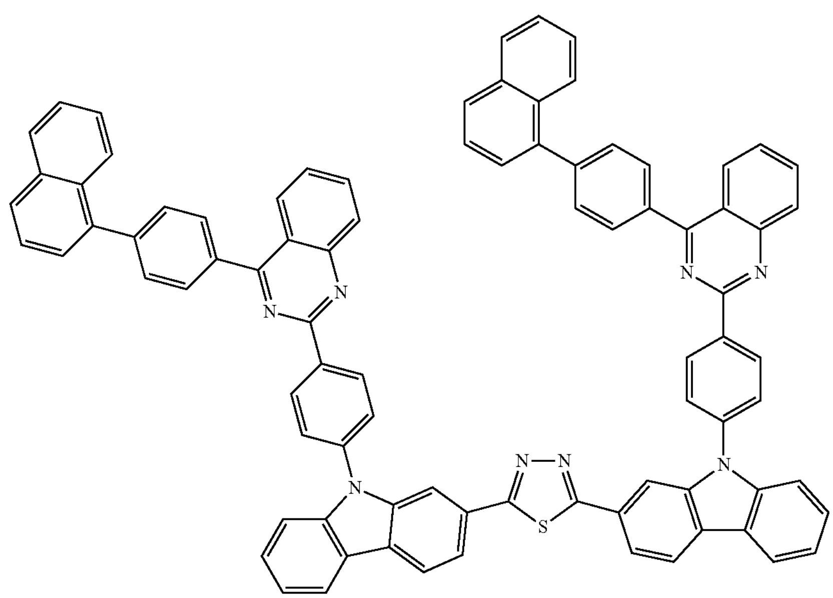

-continued
C 319
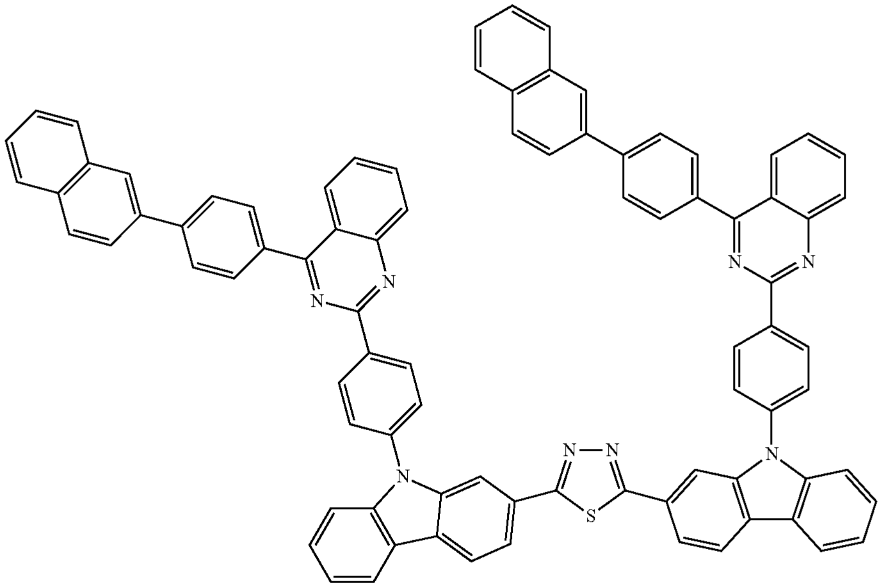
C 320
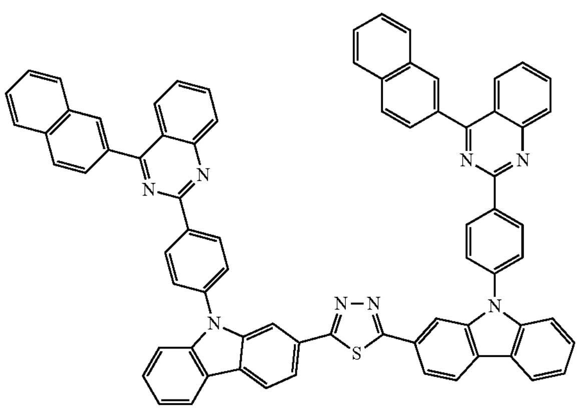
C 321
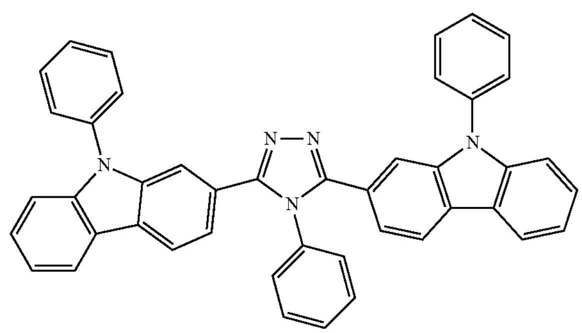
C 322
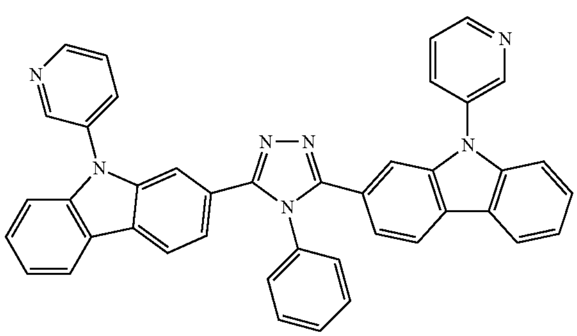
C 323
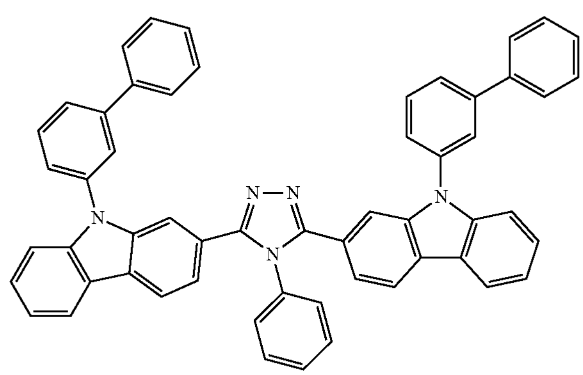

-continued
C 324
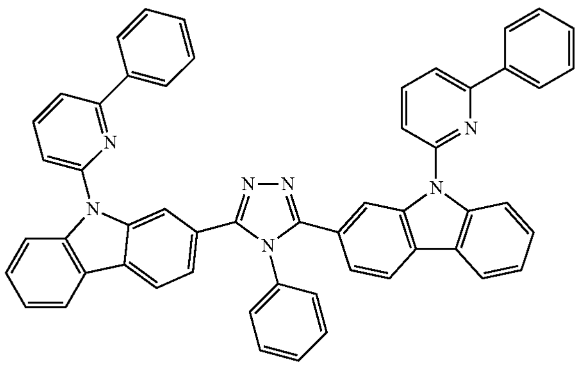
C 325
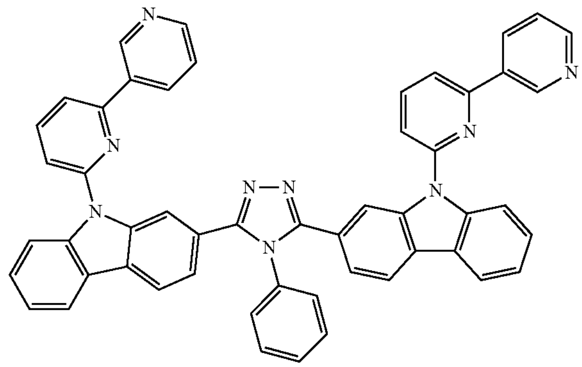
C 326
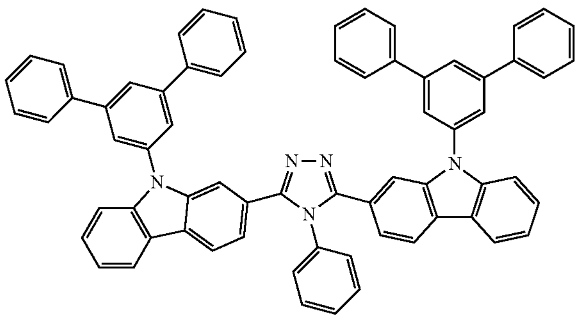
C 327
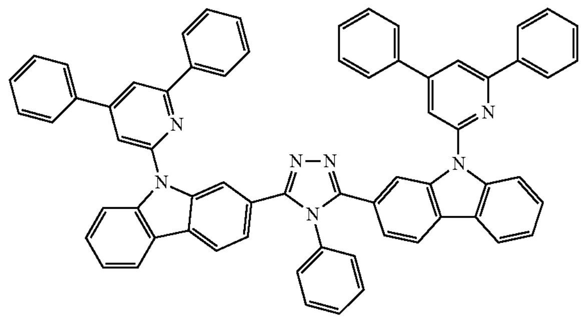
C 328
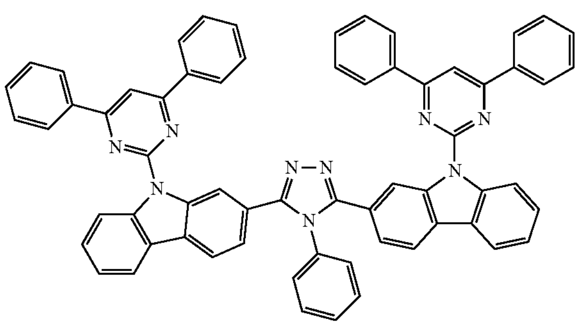
C 329
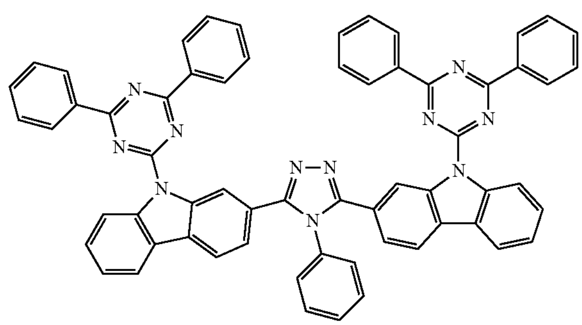
C 330
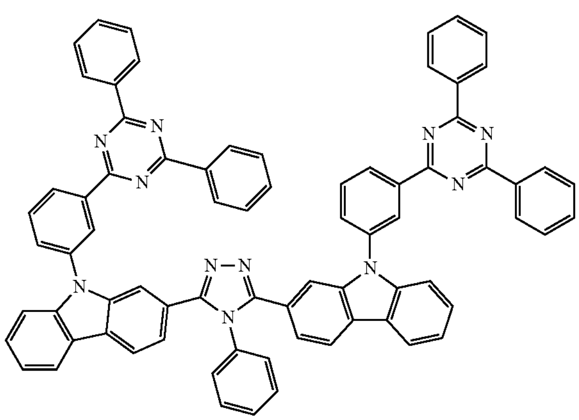
C 331
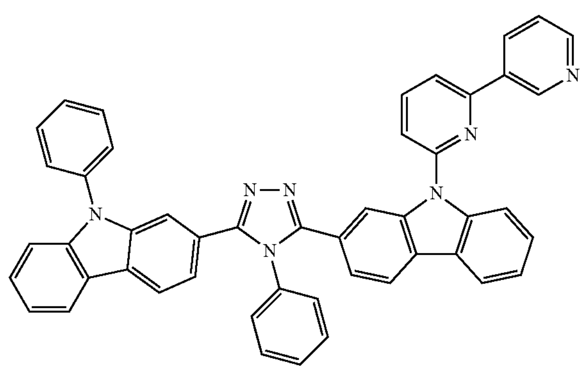

-continued
C 332
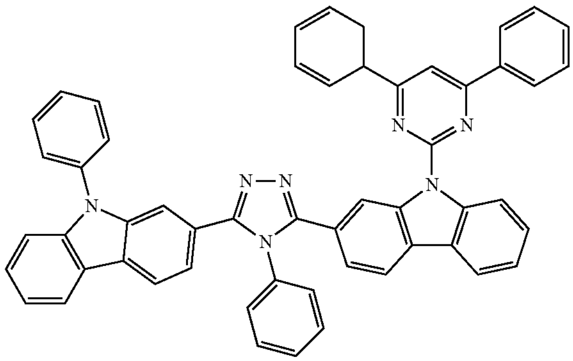
C 333
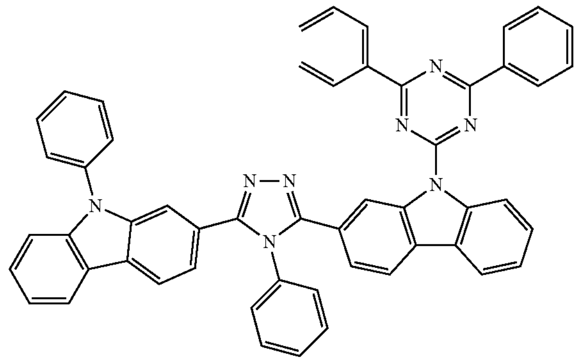
C 334
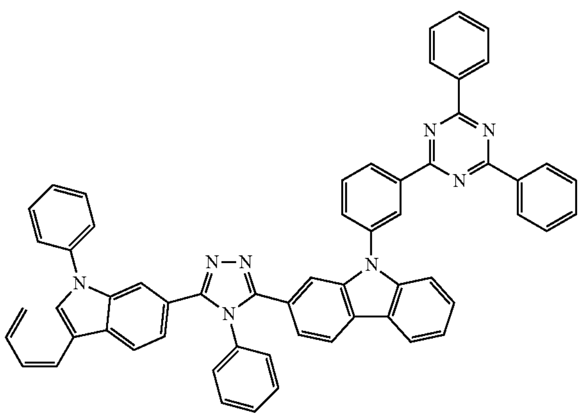
C 335
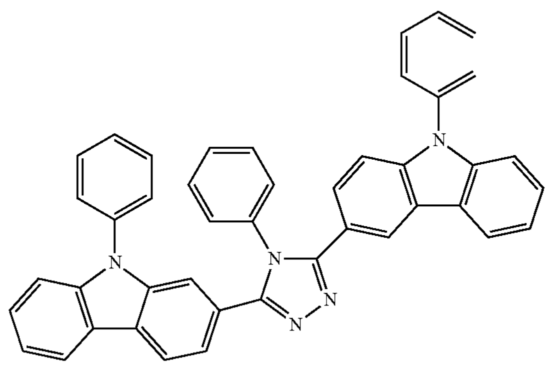
C 336
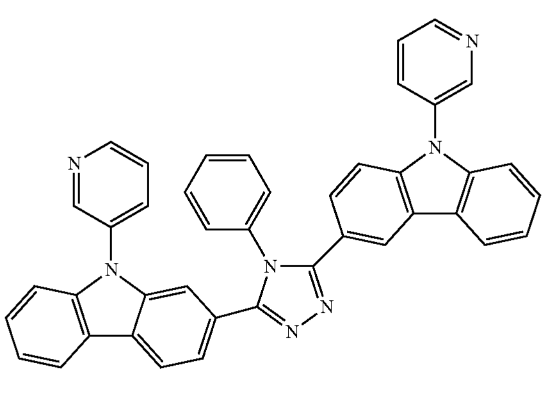
C 337
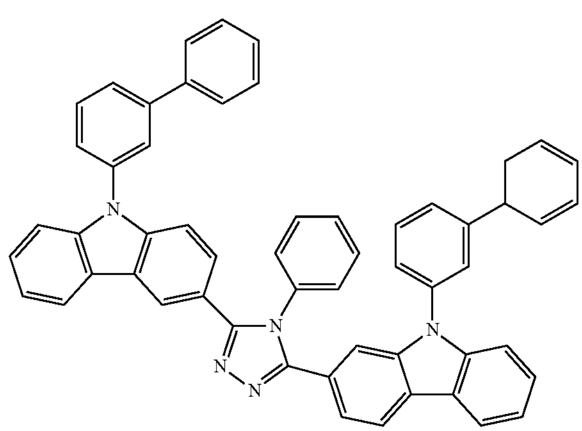

-continued
C 338
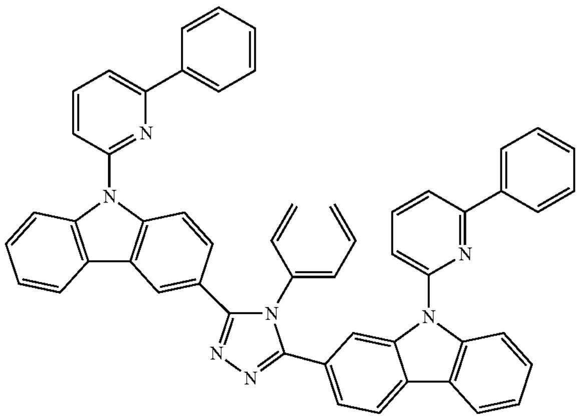
C 339
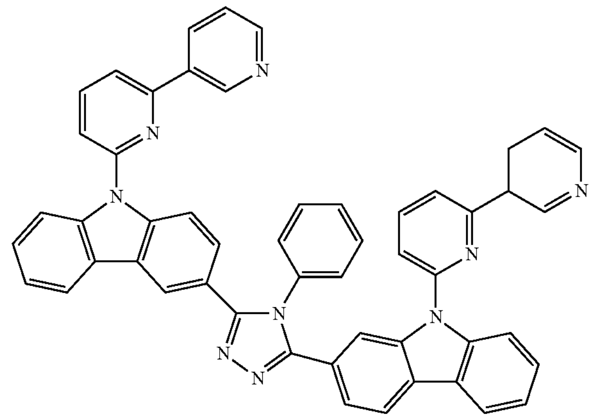
C 340
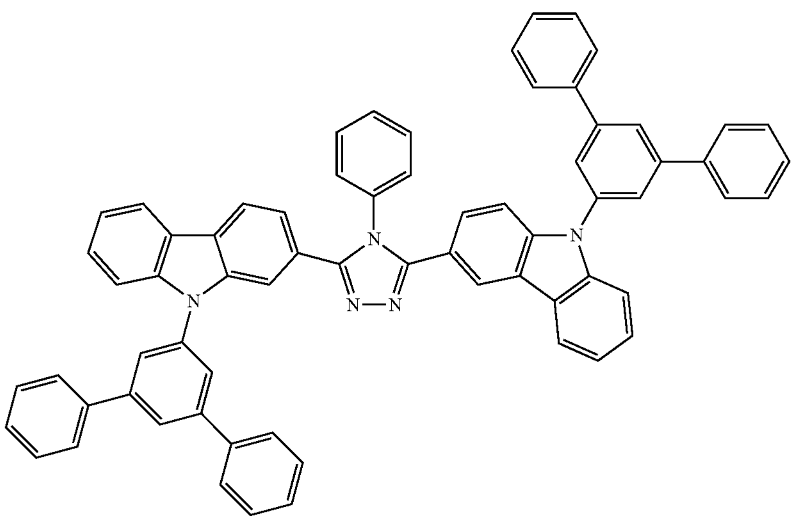
C 341
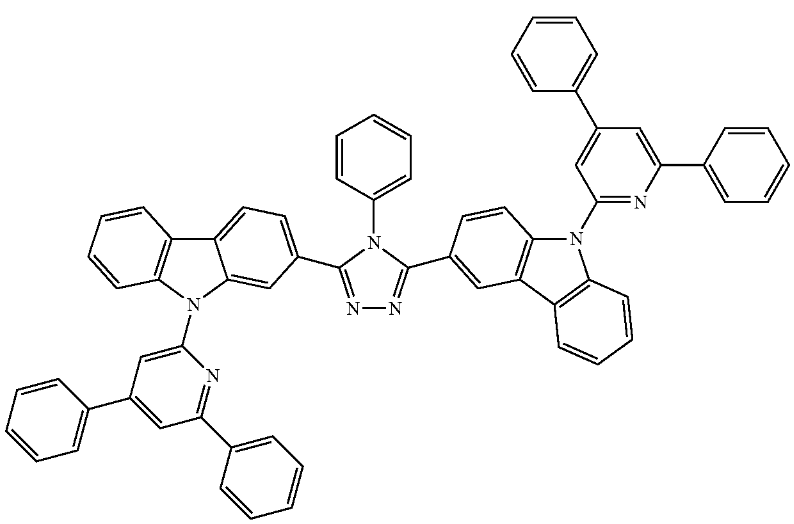

-continued
C 342
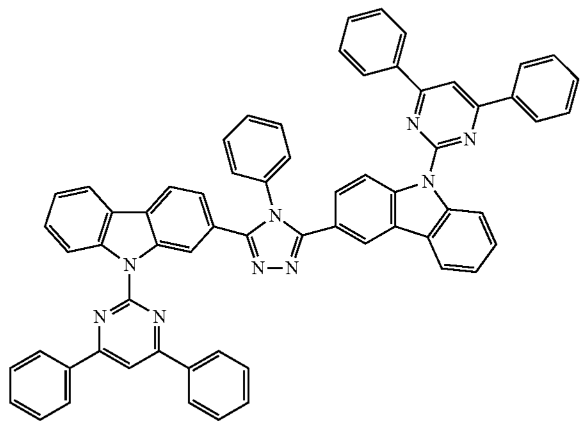
C 343
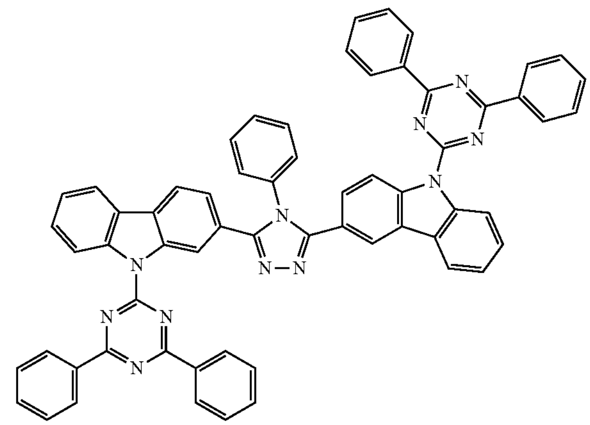
C 344
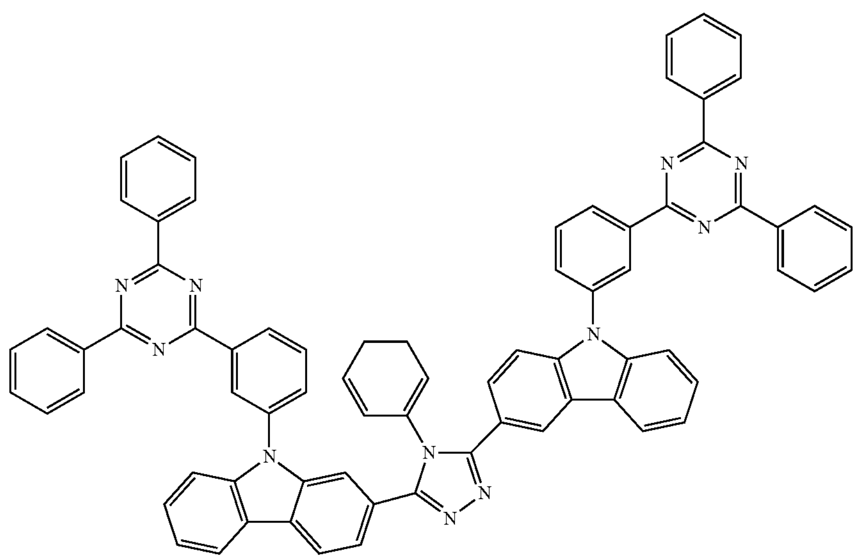
C 345
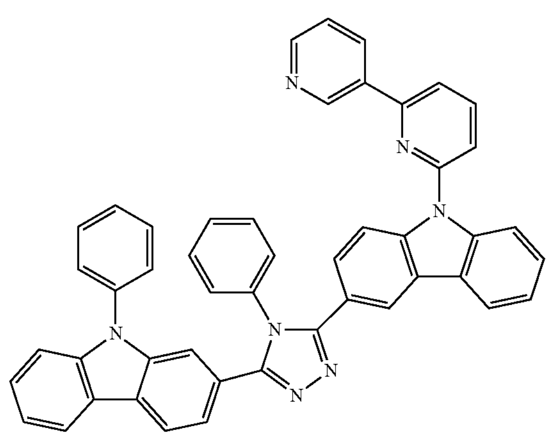
C 346
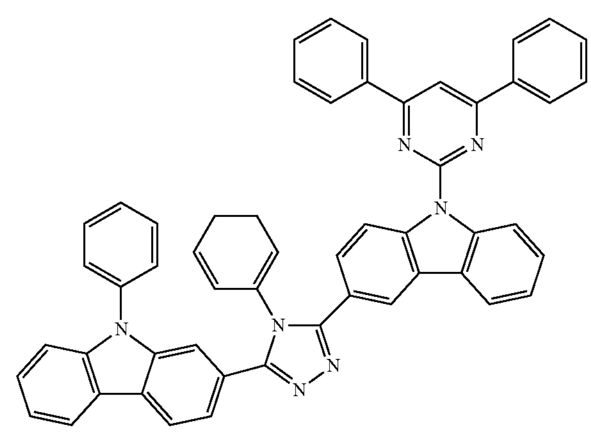

-continued
C 347
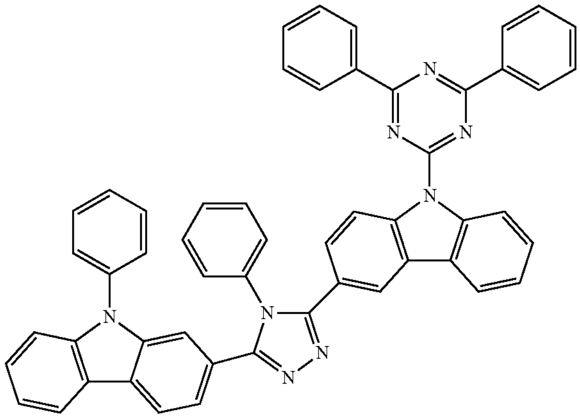
C 348
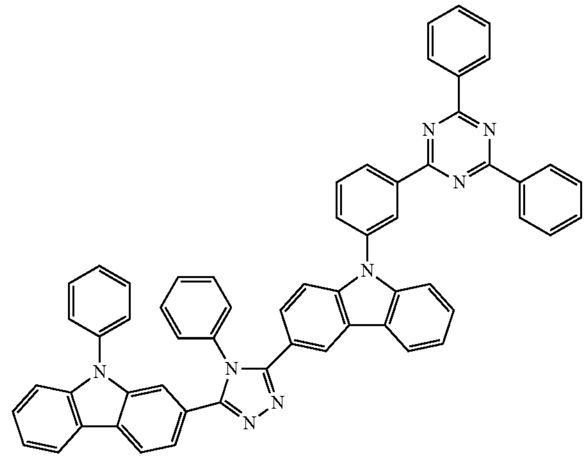
C 349
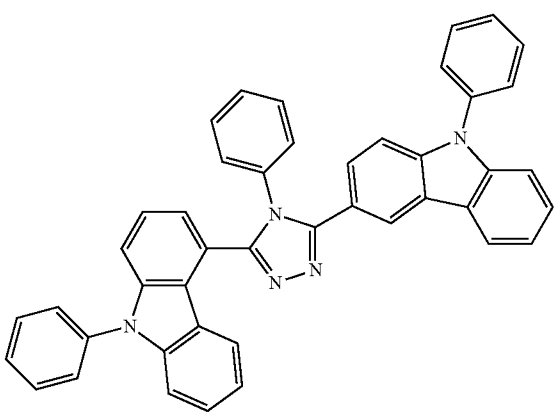
C 350
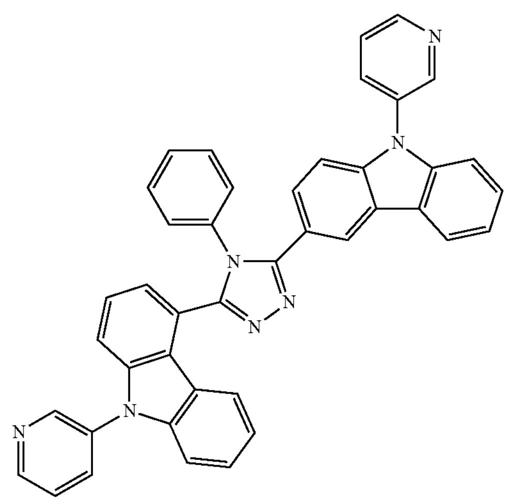
C 351
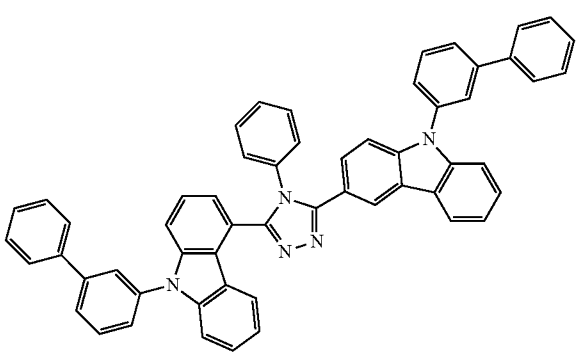
C 352
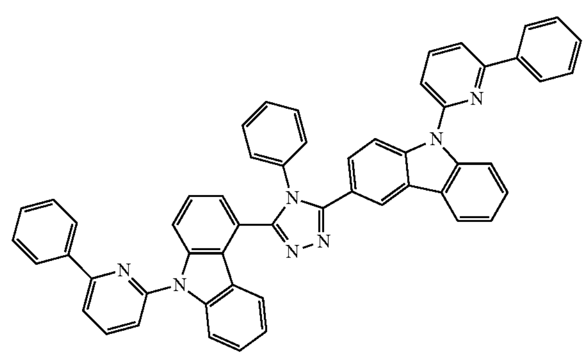

-continued
C 353
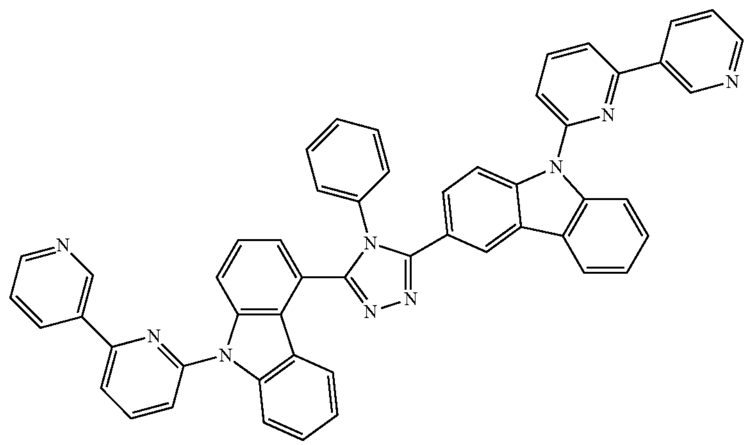
C 354
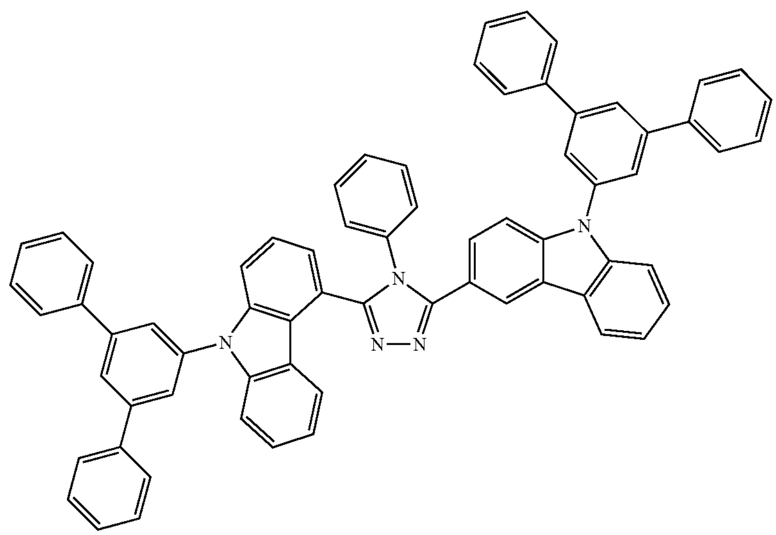
C 355
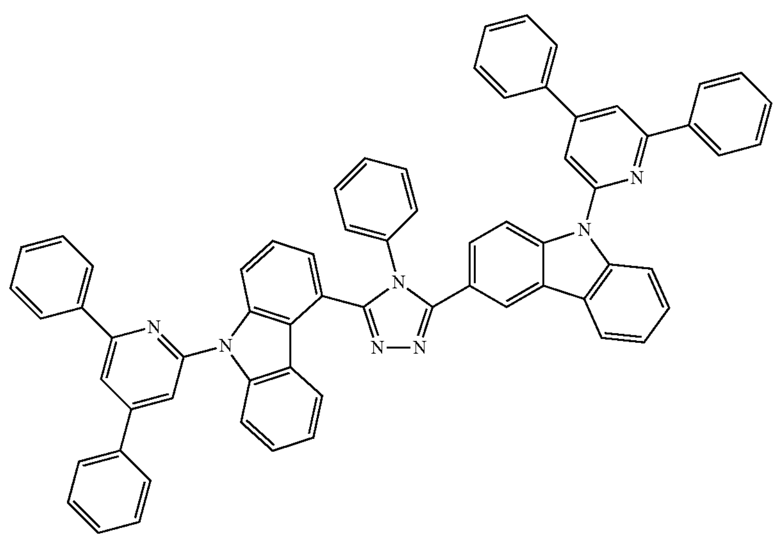

-continued
C 356
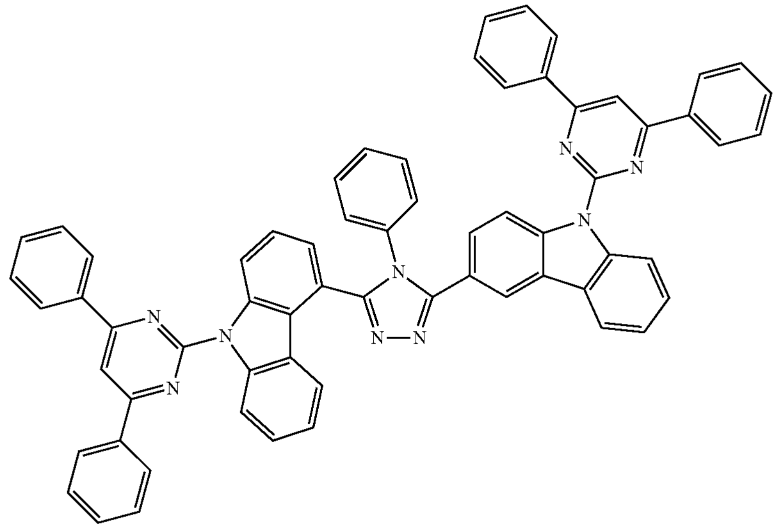
C 357
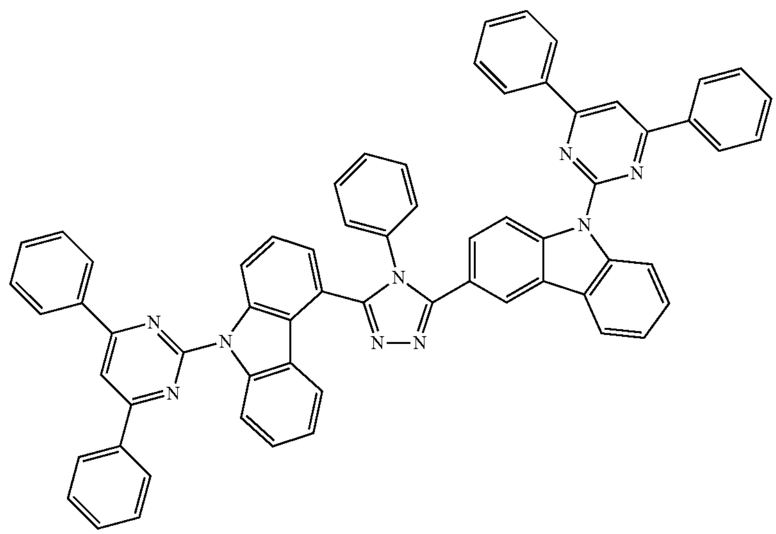
C 358
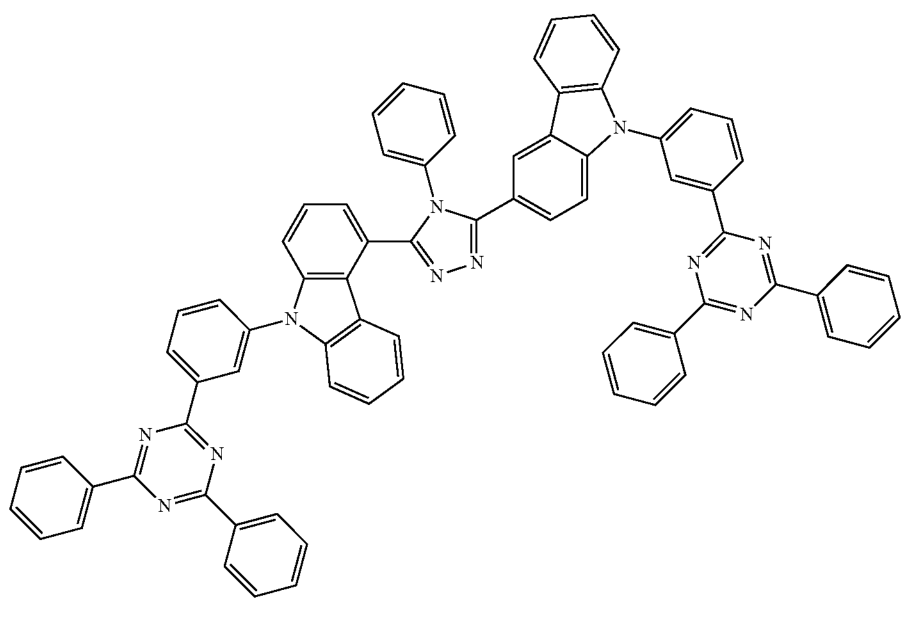

-continued
C 359
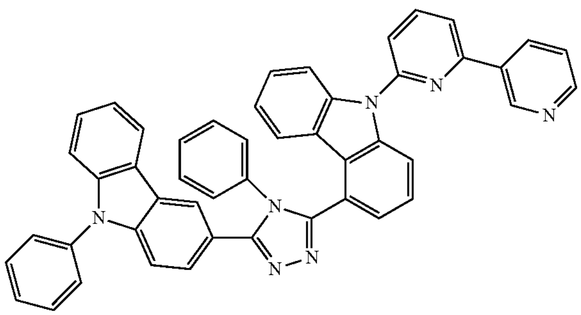
C 360
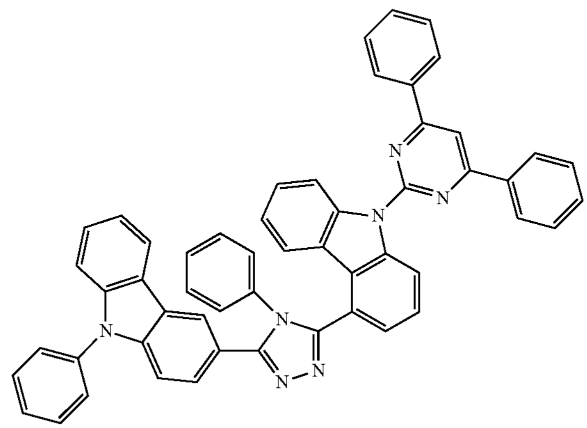
C 361
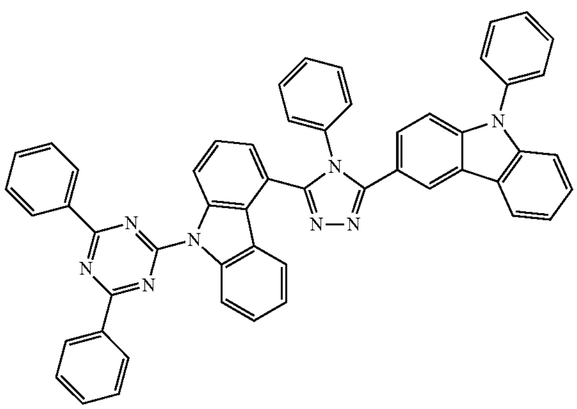
C 362
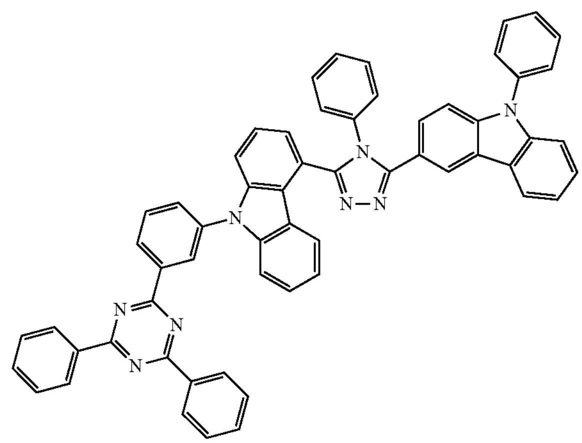
C 363
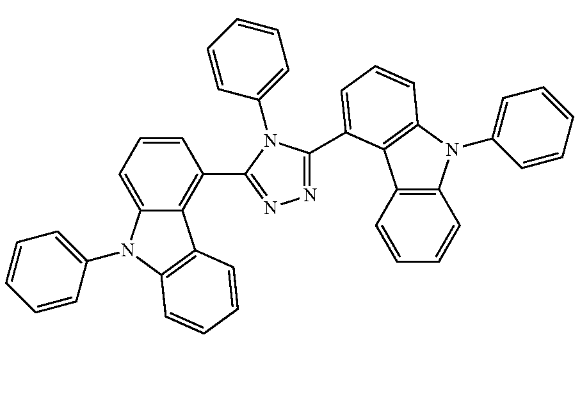
C 364
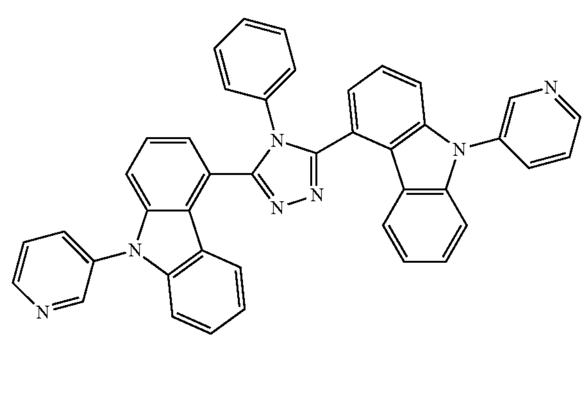

-continued
C 365
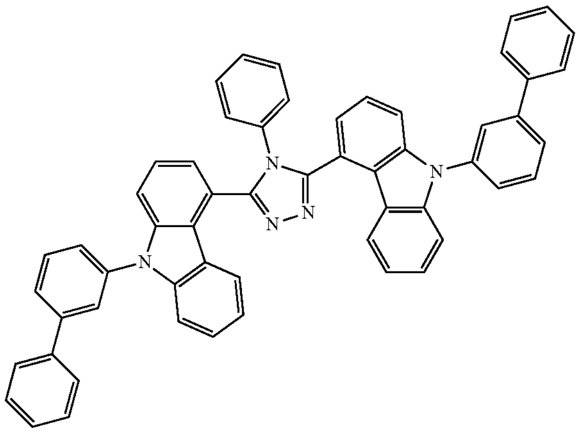
C 366
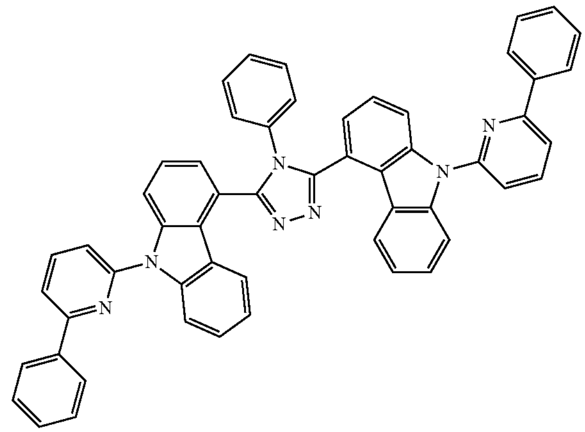
C 367
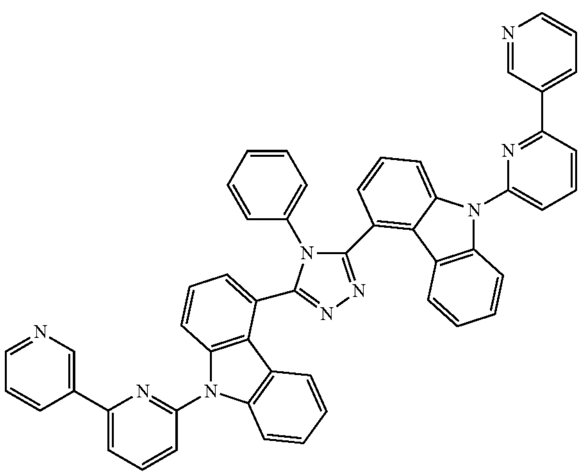
C 368
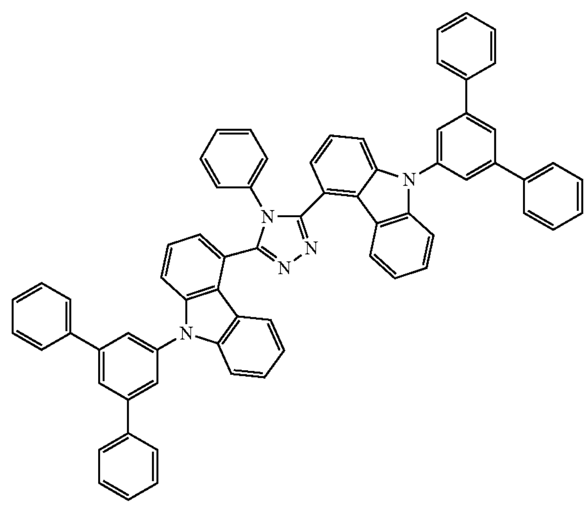
C 369
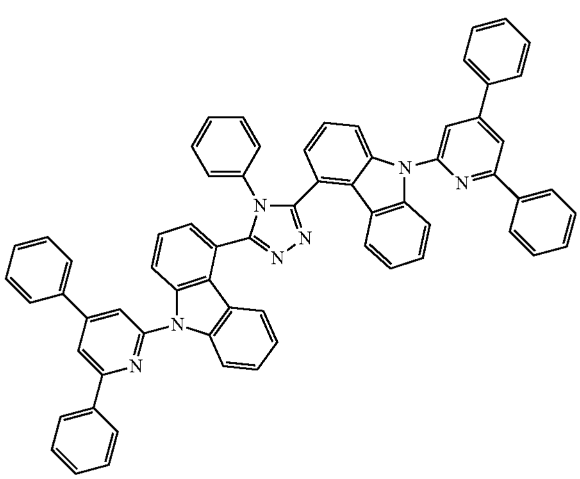
C 370
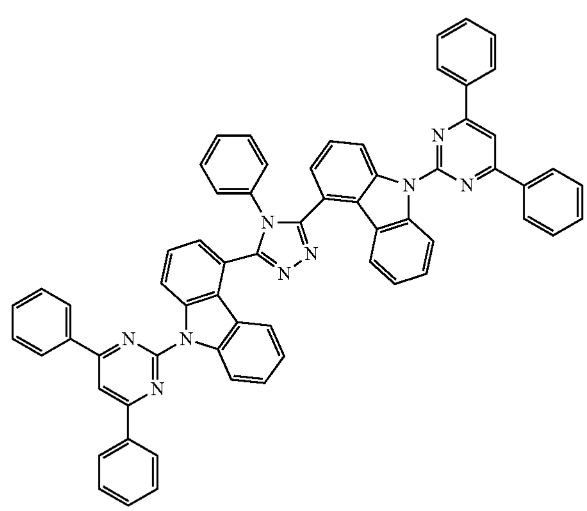

-continued
C 371
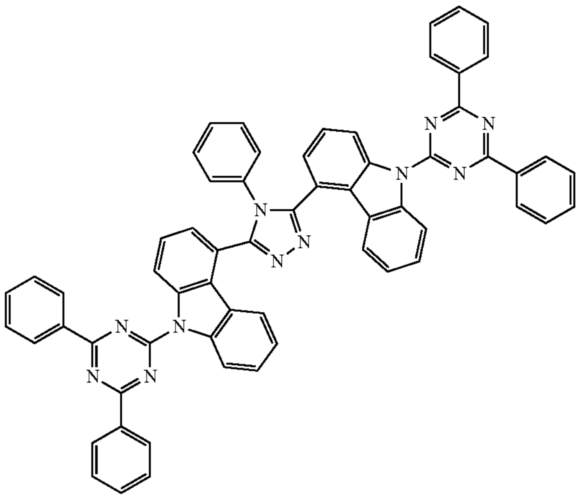
C 372
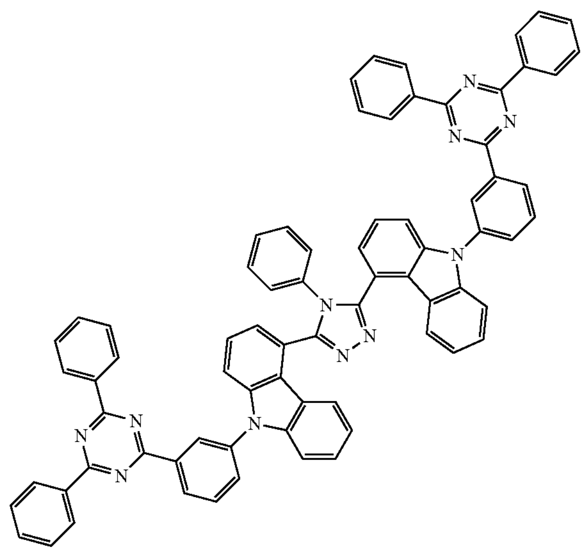
C 373
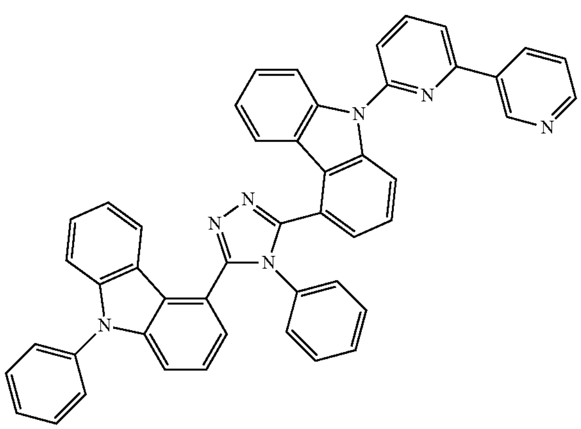
C 374
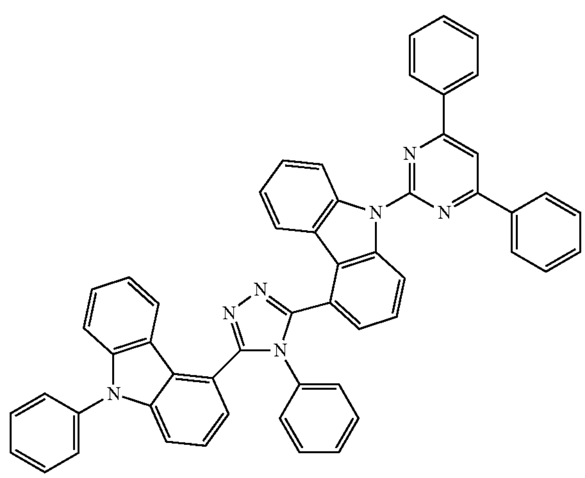
C 375
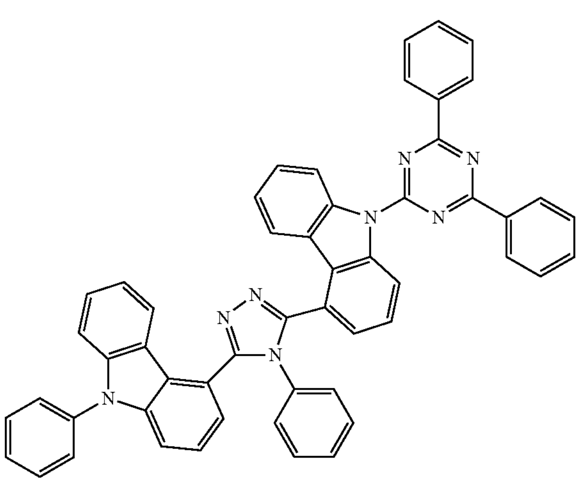
C 376
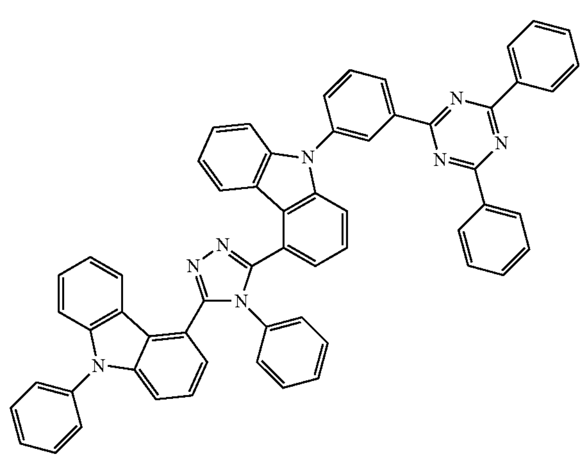

-continued
C 377
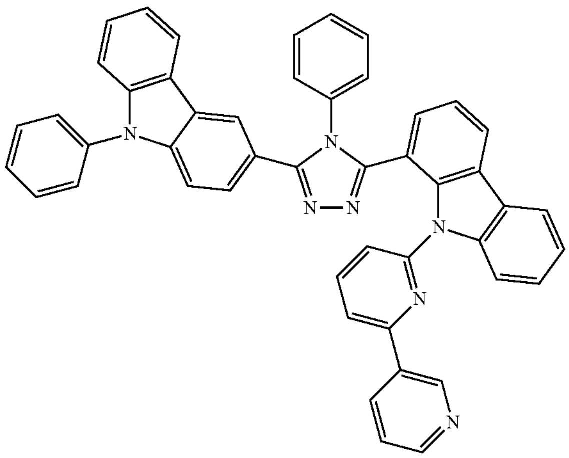
C 378
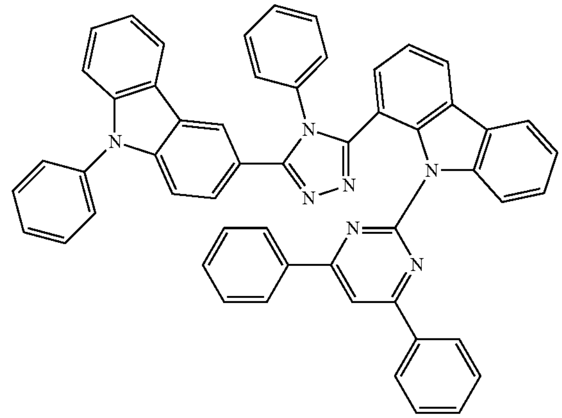
C 379
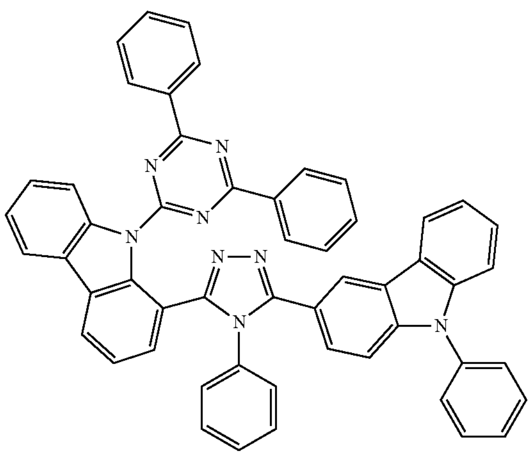
C 380
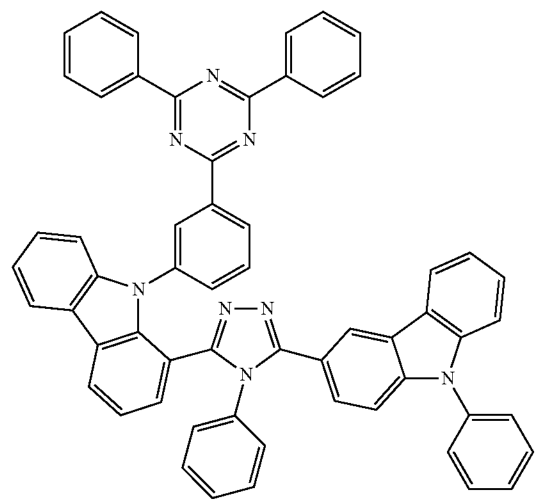
C 381
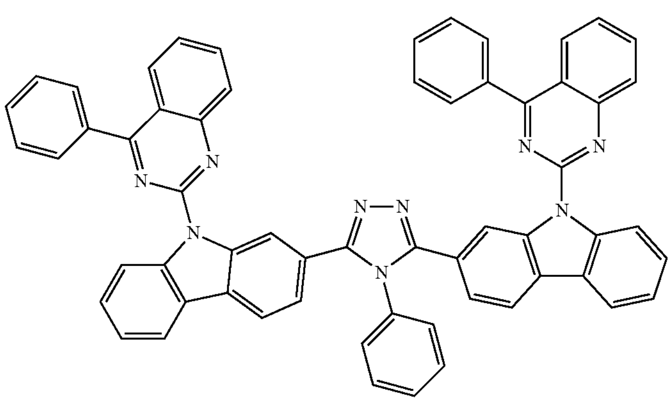

-continued
C 382
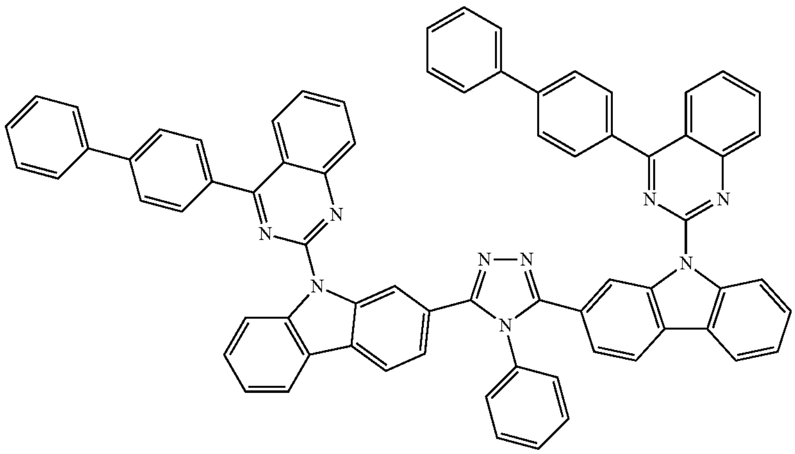
C 383
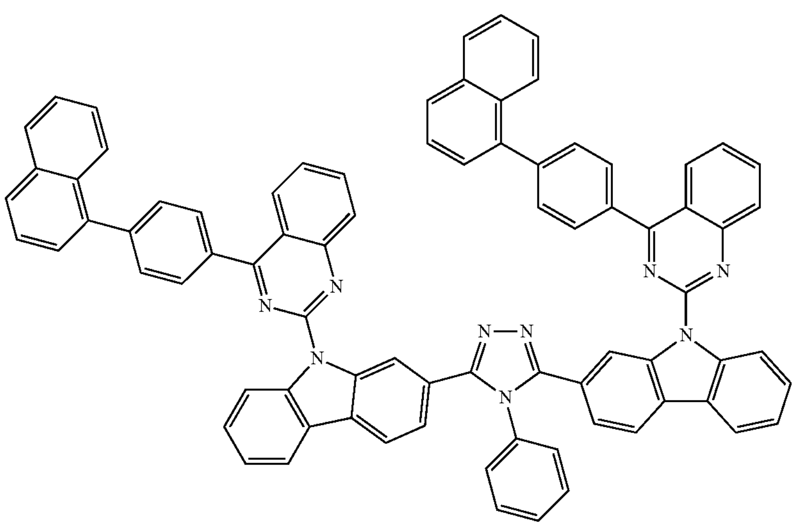

The second host may be represented by any one of the following Formulae 2-1 to 2-6.

Formula 2-1

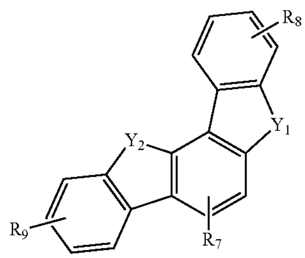

Formula 2-2

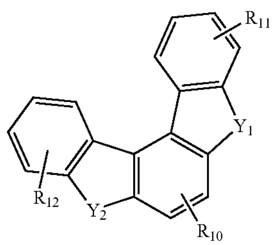

Formula 2-3

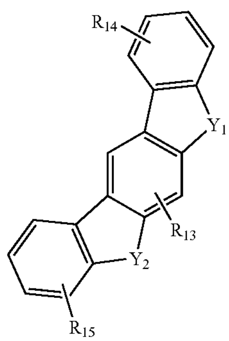

Formula 2-4

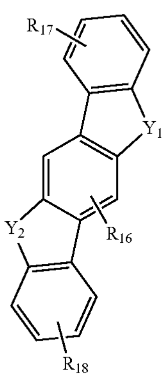

Formula 2-5

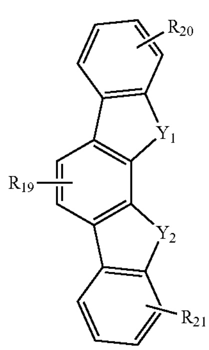

-continued

Formula 2-6

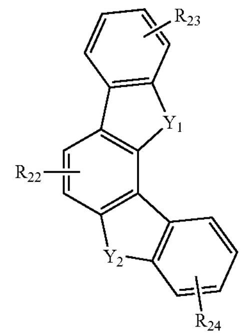

In Formulae 2-1 to 2-6, $Y_1$ and $Y_2$ may be each independently $NR_2$, $CR_3R_4$, or $SiR_5R_6$. $Y_1$ and $Y_2$ may be the same or different from each other. For example, at least one of $Y_1$ or $Y_2$ may be $NR_2$, and the other may be $CR_3R_4$ or $SiR_5R_6$. For example, one of $Y_1$ or $Y_2$ may be $NR_2$, and the other one of $Y_1$ or $Y_2$ may be $CR_3R_4$ or $SiR_5R_6$.

$R_2$ to $R_6$ may be each independently a hydrogen atom, a deuterium atom, an alkyl group, an aryl group, or a heteroaryl group. The alkyl group may be a substituted or unsubstituted alkyl group having 1 to 40 carbon atoms, the aryl group may be a substituted or unsubstituted aryl group having 6 to 40 carbon atoms for forming a ring, and the heteroaryl group may be a substituted or unsubstituted heteroaryl group having 3 to 40 carbon atoms for forming a ring.

$R_7$ to $R_{24}$ may be each independently a hydrogen atom, a deuterium atom, an alkyl group, an aryl group, or a heteroaryl group. The alkyl group may be a substituted or unsubstituted alkyl group having 1 to 40 carbon atoms, the aryl group may be a substituted or unsubstituted aryl group having 6 to 40 carbon atoms for forming a ring, and the heteroaryl group may be a substituted or unsubstituted heteroaryl group having 3 to 40 carbon atoms for forming a ring.

In one embodiment, at least one of $R_2$ to $R_6$ or $R_7$ to $R_{24}$ may be represented by any one of the following H1 to H89, and H91 to H110. For example, at least one selected from $R_2$ to $R_{24}$ may be represented by any one of the following H1 to H89, and H91 to H110.

H1

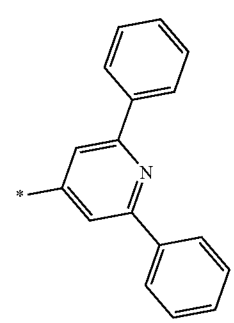

-continued
H2
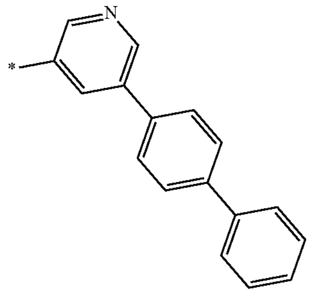
H3
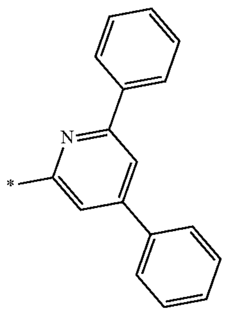
H4
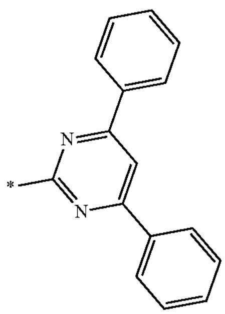
H5
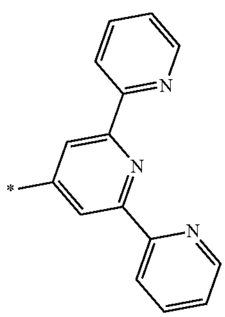
H6
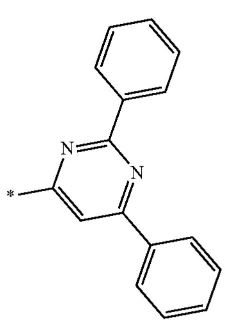
-continued
H7
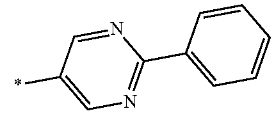
H8
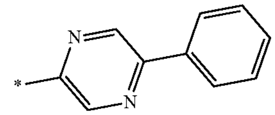
H9
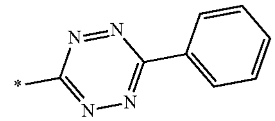
H10
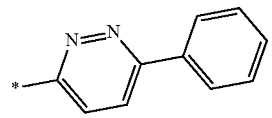
H11
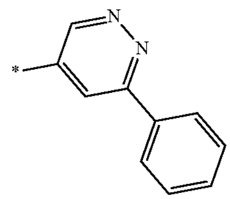
H12
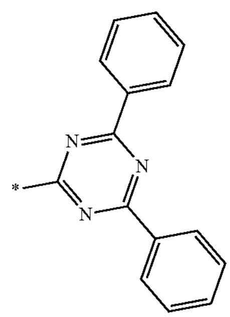
H13
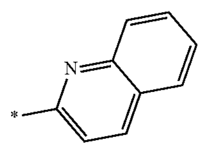
H14
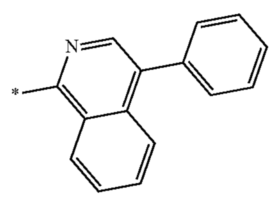
H15
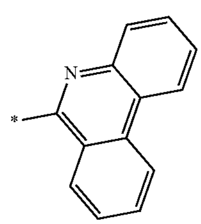

-continued
H16
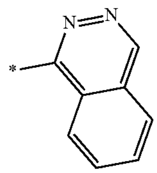
H17
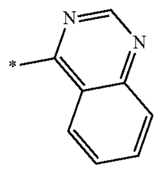
H18
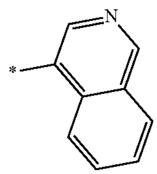
H19
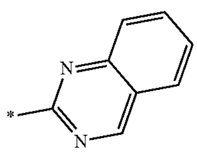
H20
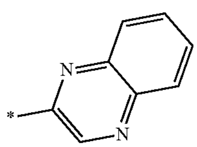
H21
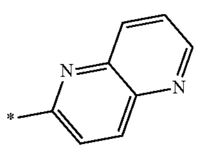
H22
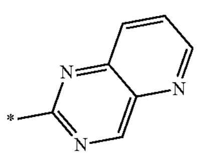
H23
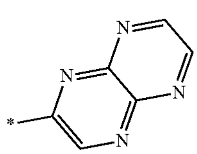
H24
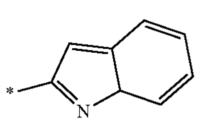
H25
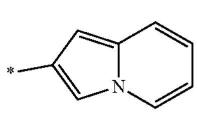
-continued
H26
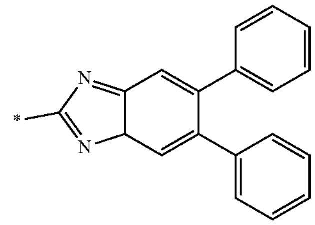
H27
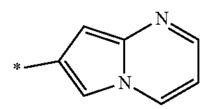
H28
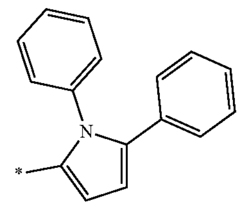
H29
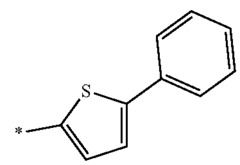
H30
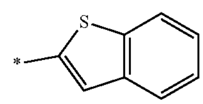
H31
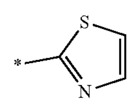
H32
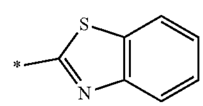
H33
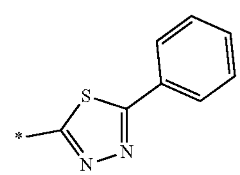
H34
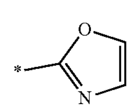
H35
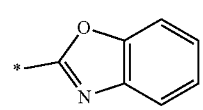
H36
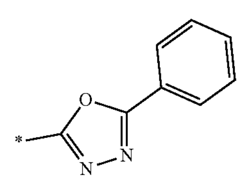

-continued
H37
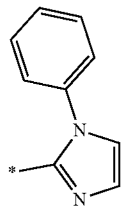
H38
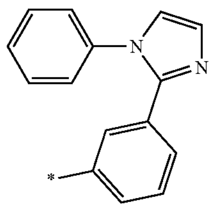
H39
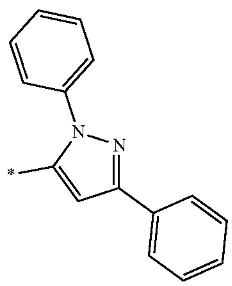
H40
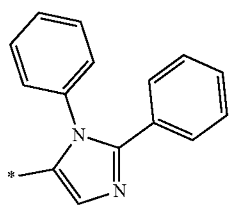
H41
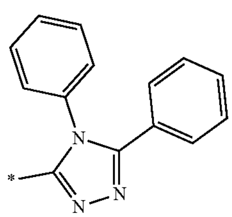
H42
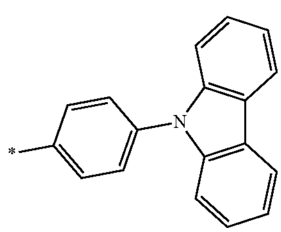
H43
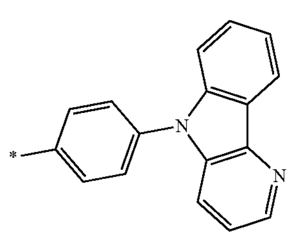
-continued
H44
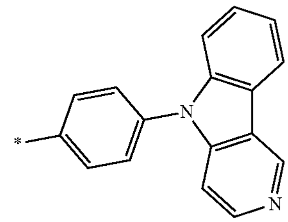
H45
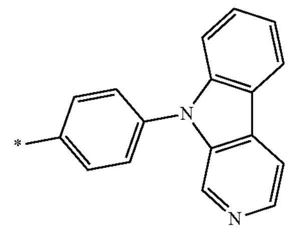
H46
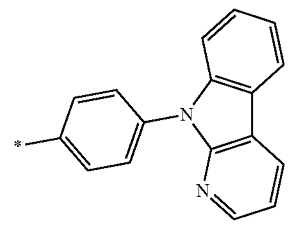
H47
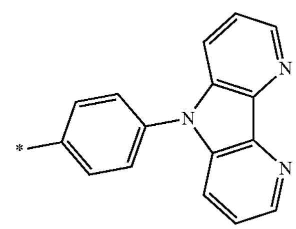
H48
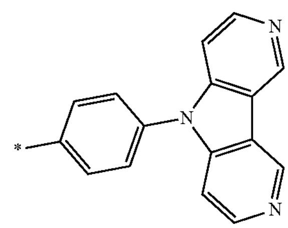
H49
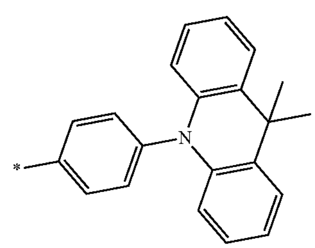
H50
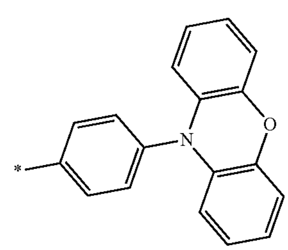

-continued
H51
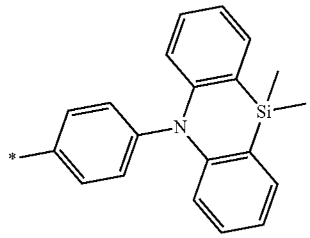
H52
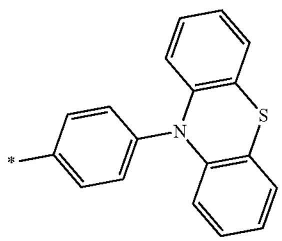
H53
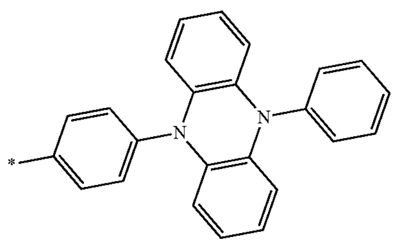
H54
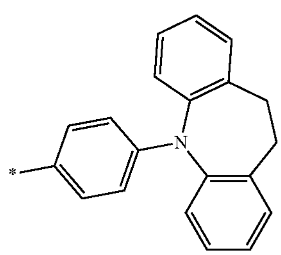
H55
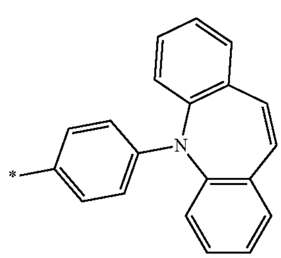
H56
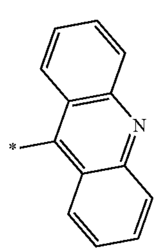
-continued
H57
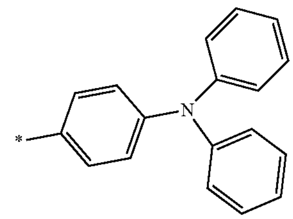
H58
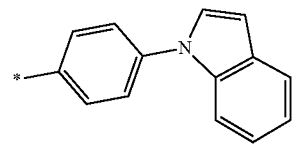
H59
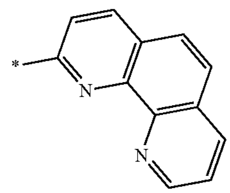
H60
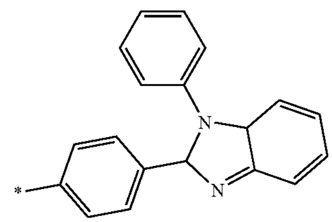
H61
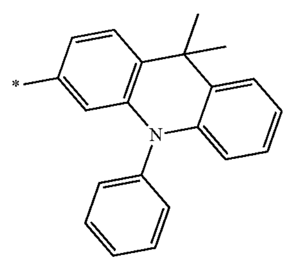
H62
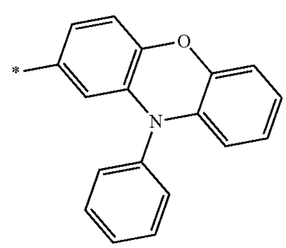
H63
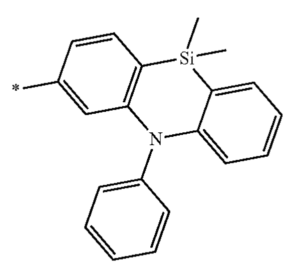

H64
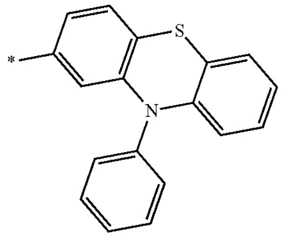
H65
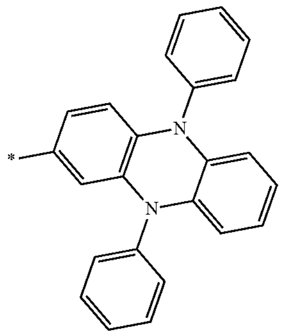
H66
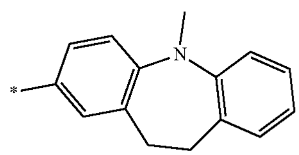
H67
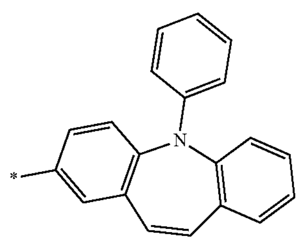
H68
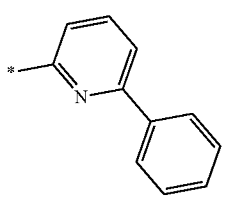
H69
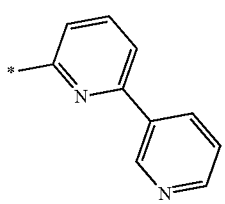
H70
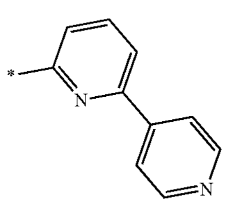
H71
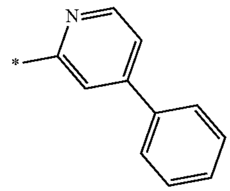
H72
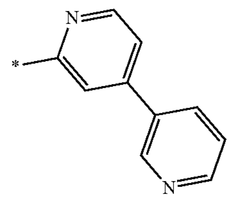
H73
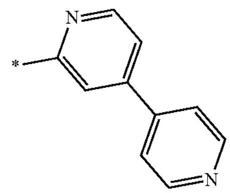
H74
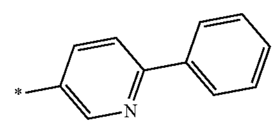
H75
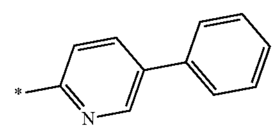
H76
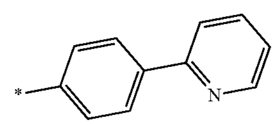
H77
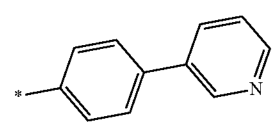
H78
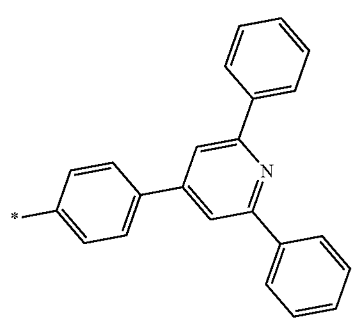

-continued
H79
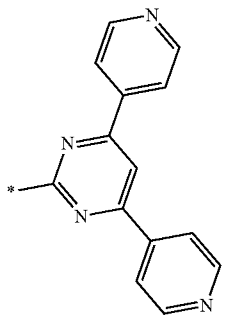
H80
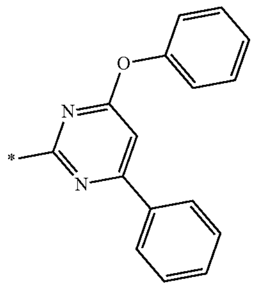
H81
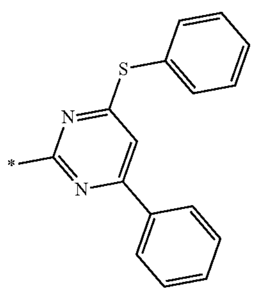
H82
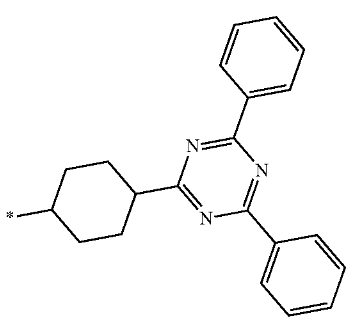
-continued
H83
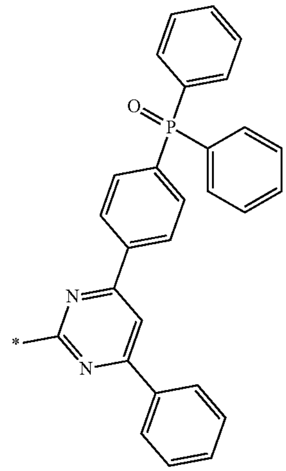
H84
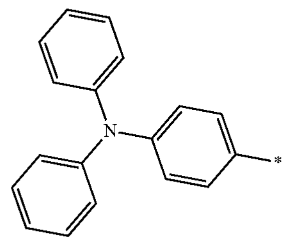
H85
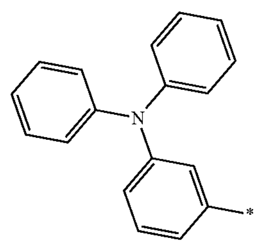
H86
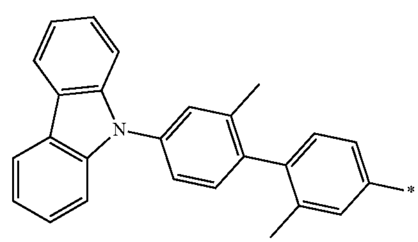
H87
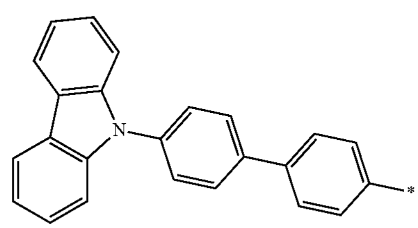
H88
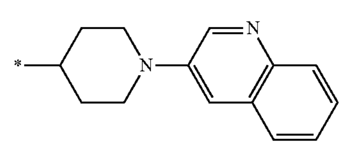

-continued
H89
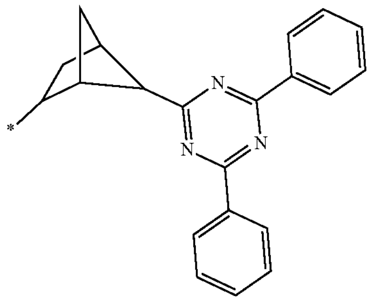
H91
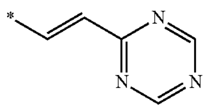
H92
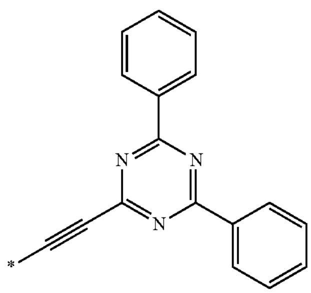
H93
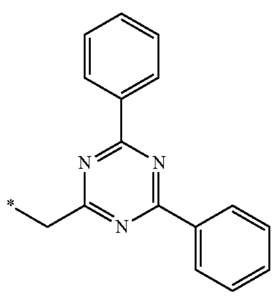
H94
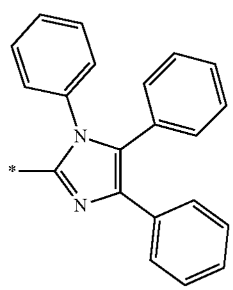
H95
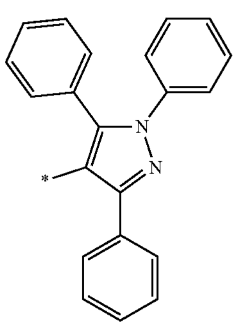
-continued
H96
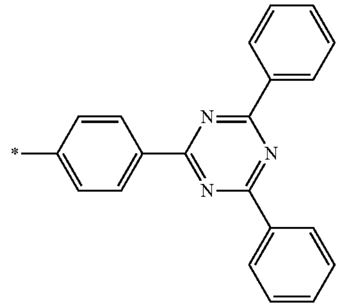
H97
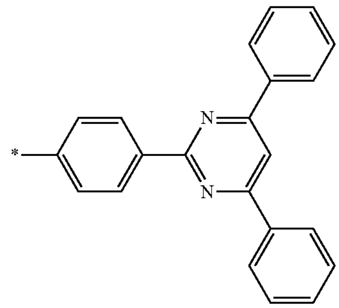
H98
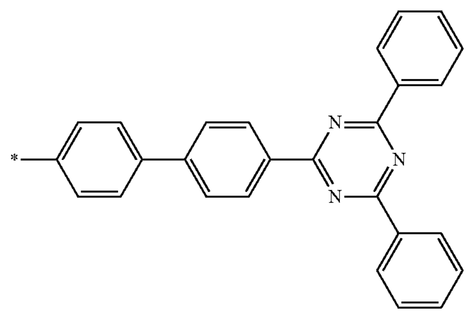
H99
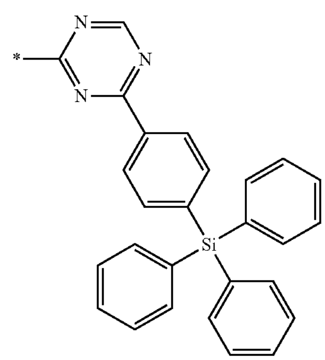
H100
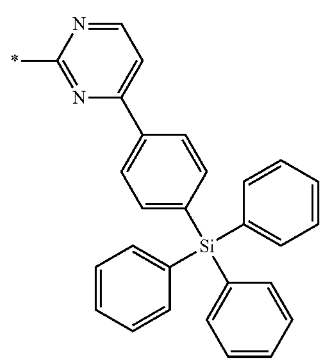

-continued
H101
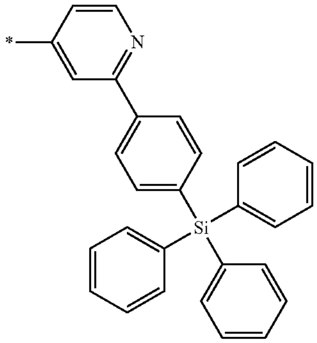
H102
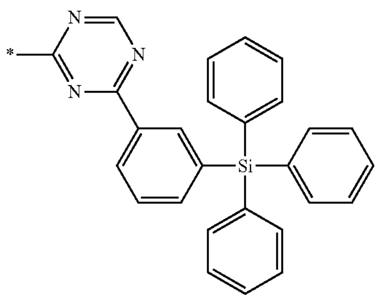
H103
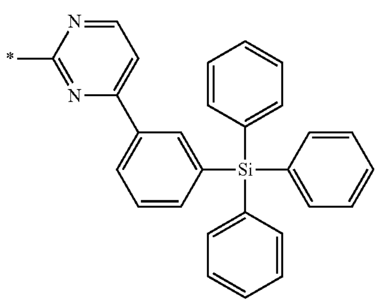
H104
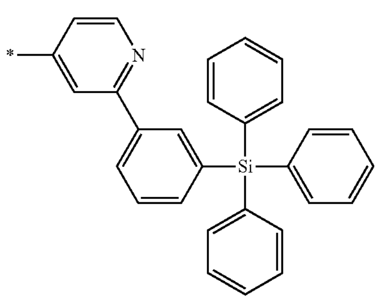
H105
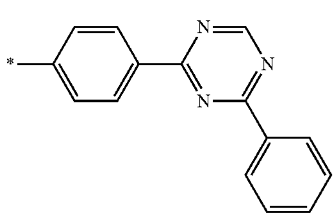
-continued
H106
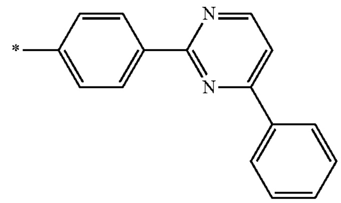
H107
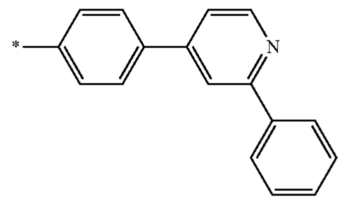
H108
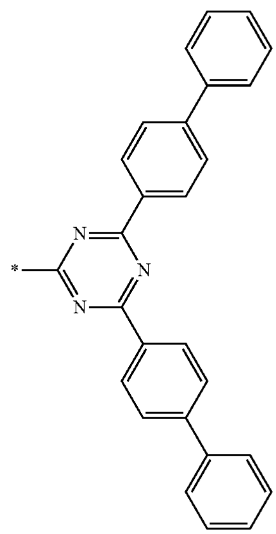
H109
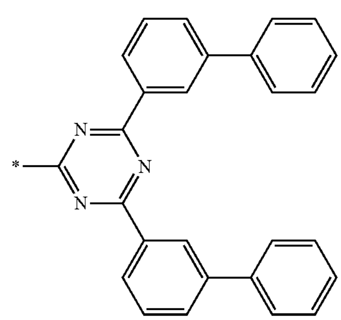

-continued

H110

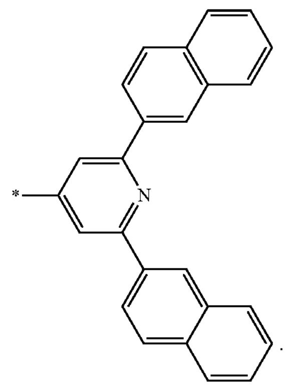

In the organic electroluminescence device 10 according to an embodiment of the present disclosure, the emission layer EML may include as a second host at least one of compounds represented by the following Formulae TC1 to TC12. Also, the second host represented by Formulae 2-1 to 2-6 may be represented by any one of the following Formulae TC1 to TC12.

In one embodiment, each of Formulae TC1 and TC7 is an embodiment of Formula 2-5, each of Formulae TC2 and TC8 is an embodiment of Formula 2-6, each of Formulae TC3 and TC9 is an embodiment of Formula 2-3, each of Formulae TC4 and TC10 is an embodiment of Formula 2-4, each of Formulae TC5 and TC11 is an embodiment of Formula 2-2, and each of Formulae TC6 and TC12 is an embodiment of Formula 2-1.

TC1

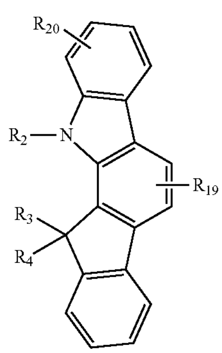

TC2

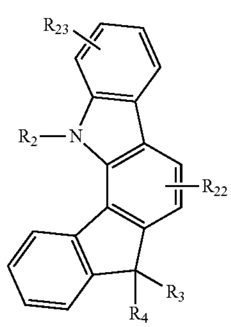

-continued

TC3

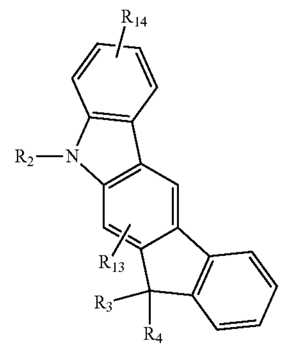

TC4

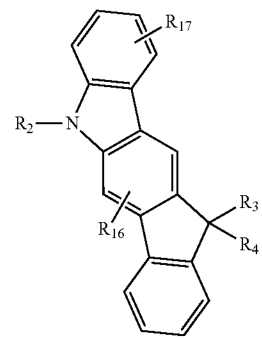

TC5

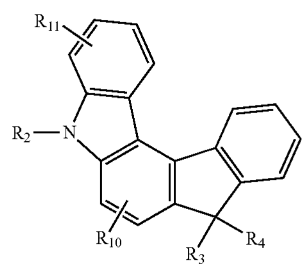

TC6

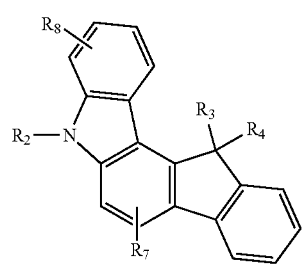

TC7

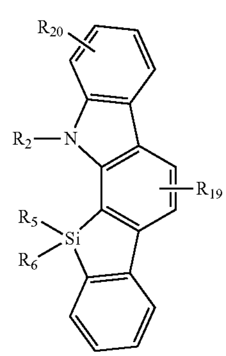

-continued

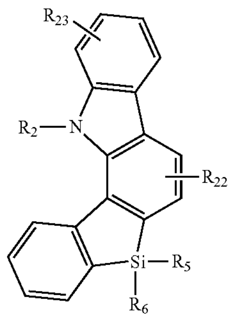

TC8

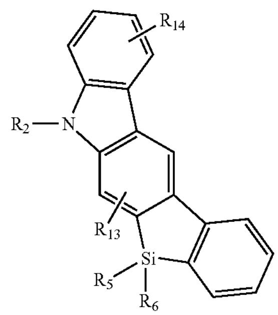

TC9

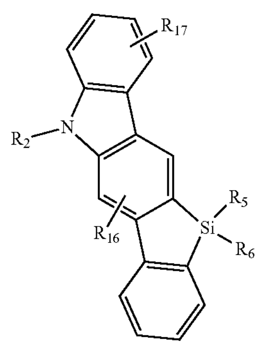

TC10

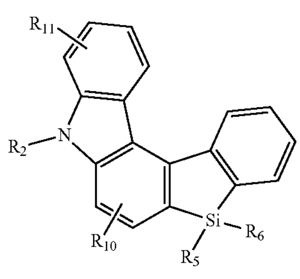

TC11

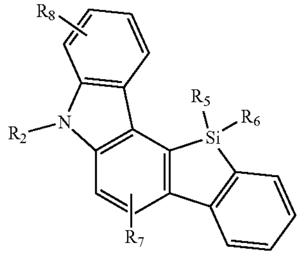

TC12

In Formulae TC1 to TC12, $R_2$ to $R_8$, $R_{10}$, $R_{11}$, $R_{13}$, $R_{14}$, $R_{16}$, $R_{17}$, $R_{19}$, $R_{20}$, $R_{22}$, and $R_{23}$ may be the same as respectively defined with respect to Formulae 2-1 to 2-6. For example, $R_7$, $R_8$, $R_{10}$, $R_{11}$, $R_{13}$, $R_{14}$, $R_{16}$, $R_{17}$, $R_{19}$, $R_{20}$, $R_{22}$, and $R_{23}$ may each independently be represented by any one of the above-described H1 to H89, and H91 to H110.

In the organic electroluminescence device 10 according to an embodiment of the present disclosure, the emission layer EML may include the first host represented by Formula 1 and the second host represented by any one of Formulae 2-1 to 2-6 together. For example, the organic electroluminescence device of an embodiment may include both the first host represented by Formula 1-1 or 1-2 and the second host represented by Formula 2-4. For example, the organic electroluminescence device of an embodiment may include both the first host represented by Formula 1-1 or 1-2 and the second host represented by Formula TC4 or TC10.

The organic electroluminescence device 10 according to an embodiment of the present disclosure includes both the first host and the second host in the emission layer EML, and therefore, it may keep desirable (e.g., excellent) emission efficiency and have increased device life when compared with a device utilizing the first host or the second host alone. Because the organic electroluminescence device 10 of an embodiment includes both the first host and the second host, the injection of holes and electrons into the emission layer EML may become favorable, and charge balance in the emission layer EML may be improved, thereby achieving a low driving voltage, high emission efficiency and long life characteristics.

For example, because the organic electroluminescence device of an embodiment utilizes both the first host, which is a hole transport host, and the second host, which is an electron transport host, as co-hosts, the first host and the second host may form an exciplex in the emission layer EML.

The highest occupied molecular orbital (HOMO) energy level and the lowest occupied molecular orbital (LUMO) energy level of the first host may be higher than the HOMO energy level and a LUMO energy level of the second host, respectively. When the first host and the second host of an embodiment satisfy the above-described condition, an exciplex may be favorably produced.

In the organic electroluminescence device 10 according to an embodiment of the present disclosure, a weight ratio of the first host to the second host may be about 90:10 to about 10:90 in the whole of the first host and the second host included in the emission layer EML. That is, a weight ratio of a total weight of the first host to a total weight of the second host included in the emission layer EML may be about 90:10 to about 10:90. For example, in the whole of the first host and the second host, a weight ratio of the first host to the second host may be about 55:45 to about 89:11.

When the weight ratio of the first host to the second host is out of range of about 90:10 to about 10:90 in the whole of the first host and the second host, the ratio (e.g., relative amount) of one of the first host and the second host increases excessively and that of the other decreases too much. Accordingly, an appropriate amount of exciplex may not be formed in the emission layer.

In the organic electroluminescence device 10 according to an embodiment of the present disclosure, the emission layer EML includes the first host and the second host in a weight ratio of about 90:10 to about 10:90, thereby enabling the formation of an appropriate amount of exciplexes.

In a typical organic electroluminescence device, most of electrons and holes injected into the emission layer EML are recombined in the host material to form excitons, and then the exciton energy is transferred from the host material to the dopant material, which results in the excited state of dopant material for emitting light. When the host material itself emits light or when the excitation energy is converted into thermal energy before it is transferred from the host material to the dopant material, inactivation of excitation energy occurs. For example, the host molecule in a singlet excited state has shorter excitation time when compared with that in a triplet excited state, which may easily result in inactivation of excitation energy. Accordingly, an organic electroluminescence device utilizing one host material tends to have deterioration and decreased life of the device.

In the organic electroluminescence device according to an embodiment of the present disclosure utilizing both the first host having a hole affinity and the second host having an electron affinity as a co-host, an exciplex may be formed and the production of a singlet exciton (having a short excitation time) may be prevented or reduced. That is, there may be a process of directly forming an exciplex without forming a singlet exciton, which may prevent or reduce inactivation of a singlet excitation energy of the host material. Even if the hole affinity host or the electron affinity host forms a singlet exciton, it can rapidly form an exciplex with the other host in a ground state, which may prevent or reduce inactivation of a singlet excitation energy.

In conclusion, the organic electroluminescence device 10 according to an embodiment of the present disclosure includes both the first host and the second host to form an exciplex, and therefore, most of holes and electrons injected into the emission layer EML may be utilized for emitting light, and deterioration at the interface of organic layers may be reduced, thereby achieving excellent emission efficiency and improved device life characteristics.

In the organic electroluminescence device 10 according to an embodiment of the present disclosure, the emission layer EML may further include a dopant in addition to the first host and the second host. In an embodiment, the emission layer EML may include the host (e.g., all of the first and second hosts) and the dopant in a weight ratio of about 59:41 to about 95:5. When the total weight of the host is larger than the weight of the dopant, and the amount of the dopant is at least about 5% based on the total amount of the host and the dopant, appropriate emission properties may be achieved. Accordingly, when a weight ratio of the host to the dopant satisfies the above-described range, satisfactory emission efficiency may be obtained along with the effect of improving device life characteristics.

In the organic electroluminescence device 10 according to an embodiment of the present disclosure, the emission layer EML may emit phosphorescence. For example, in an embodiment, the emission layer EML may further include a phosphorescence dopant in addition to the first host and the second host.

The lowest triplet energy level of the phosphorescence dopant may be lower than the lowest triplet energy level of each of the first host, the second host, and the exciplex. Accordingly, the hole transport host and the electron transport host forming exciplex may favorably deliver excitons to the phosphorescence dopant, thereby enhancing device efficiency.

In an embodiment, the emission layer EML may include, as a phosphorescence dopant, a metal complex including iridium (Ir), platinum (Pt), osmium (Os), gold (Au), palladium (Pd), titanium (Ti), zirconium (Zr), hafnium (Hf), europium (Eu), terbium (Tb), or thulium (Tm) as a central atom. For example, the phosphorescence dopant may be a metal complex including iridium (Ir), osmium (Os), platinum (Pt), or palladium (Pd) as a central atom. In one embodiment, iridium (III) bis(4,6-difluorophenylpyridinato-N,C2')picolinate (Flrpic), bis(2,4-difluorophenylpyridinato) (Fir6), and/or platinum octaethyl porphyrin (PtOEP) may be utilized as a phosphorescence dopant. However, embodiments of the present disclosure are not limited thereto.

In the organic electroluminescence device 10 according to an embodiment of the present disclosure, the emission layer EML may emit light of a green wavelength region. For example, the emission layer EML may emit light with a wavelength range of about 495 nm to about 570 nm. However, embodiments of the present disclosure are not limited thereto, and the emission layer EML may emit blue light or red light.

In the organic electroluminescence device 10 according to an embodiment of the present disclosure, the emission layer EML may be a phosphorescence emission layer. For example, the emission layer EML of the organic electroluminescence device 10 of an embodiment may include a first host represented by Formula 1, a second host represented by any one of Formulae 2-1 to 2-6, and a phosphorescence dopant. In one embodiment, the organic electroluminescence device 10 may include a phosphorescence dopant represented by at least one of the following D1 to D4, and may emit green phosphorescence.

D1

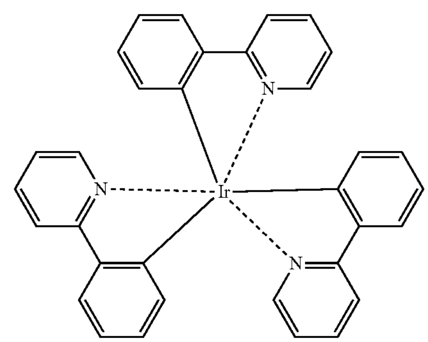

D2

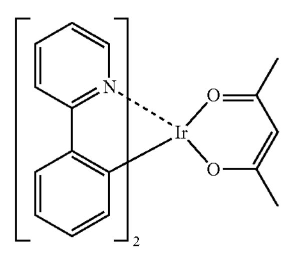

D3

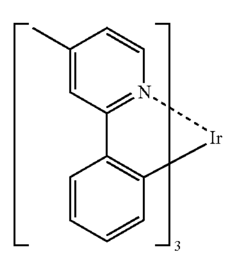

-continued

D4

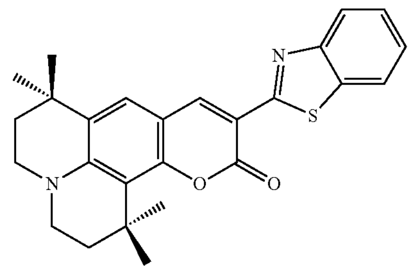

Each of the metal layers and organic layers such as the first electrode EL1, the second electrode EL2, the hole transport region HTR, the emission layer EML, and the electron transport region ETR of the organic electroluminescence device 10 explained referring to FIGS. 1 to 3, may be provided utilizing a deposition process.

In the organic electroluminescence device 10 according to an embodiment of the present disclosure, the emission layer EML may be formed by mixing a first host and a second host before the deposition process to provide one (e.g., a single) source with a mixture of the hosts, and then co-depositing the mixture of the hosts supplied from the one source and a dopant. Alternatively, the emission layer EML may be formed by supplying the first host and the second host to different sources, respectively, and then co-depositing the first host, the second host and the dopant, which are respectively supplied from different sources, in one step. However, embodiments of the present disclosure are not limited thereto, and the emission layer EML may be formed according to a suitable method known by one ordinary skilled in the art In the organic electroluminescence device 10 according to an embodiment of the present disclosure as shown in FIGS. 1 to 3, the electron transport region ETR is provided on the emission layer EML. The electron transport region ETR may include a hole blocking layer HBL, an electron transport layer ETL and/or an electron injection layer EIL, without being limited thereto.

The electron transport region ETR may have a single layer formed utilizing a single material, a single layer formed utilizing a plurality of different materials, or a multilayer structure having a plurality of layers formed utilizing a plurality of different materials.

For example, the electron transport region ETR may have a single layer structure of an electron injection layer EIL or an electron transport layer ETL, or a single layer structure formed utilizing an electron injection material and an electron transport material. In addition, the electron transport region ETR may have a single layer structure having a plurality of different materials, or a laminated structure of electron transport layer ETL/electron injection layer EIL, or hole blocking layer HBL/electron transport layer ETL/electron injection layer EIL, laminated (e.g., stacked) in the stated order from the emission layer EML, without being limited thereto. The thickness of the electron transport region ETR may be, for example, from about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

When the electron transport region ETR includes the electron transport layer ETL, the electron transport region ETR may include anthracene derivatives. However, embodiments of the present disclosure are not limited thereto. For example, the electron transport region may include at least one selected from tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-Biphenyl-4-olato)aluminum (BAlq), berylliumbis(benzoquinolin-10-olate) ($Bebq_2$), 9,10-di(naphthalen-2-yl)anthracene (ADN), and a mixture thereof. The thickness of the electron transport layer ETL may be from about 100 Å to about 1,000 Å, for example, from about 150 Å to about 500 Å. If the thickness of the electron transport layer ETL satisfies the above-described ranges, satisfactory electron transport properties may be obtained without substantial increase of a driving voltage.

When the electron transport region ETR includes the electron injection layer EIL, the electron transport region ETR may utilize LiF, lithium quinolate (LIQ), $Li_2O$, BaO, NaCl, CsF, a metal in lanthanoides (such as Yb), and/or a metal halide (such as RbCl and/or RbI). However, embodiments of the present disclosure are not limited thereto. The electron injection layer EIL also may be formed utilizing a mixture material of an electron transport material and an insulating organo metal salt. The organo metal salt may be a material having an energy band gap of about 4 eV or more. For example, the organo metal salt may include, for example, a metal acetate, a metal benzoate, a metal acetoacetate, a metal acetylacetonate, and/or a metal stearate. The thickness of the electron injection layer EIL may be from about 1 Å to about 100 Å, for example, from about 3 Å to about 90 Å. When the thickness of the electron injection layer EIL satisfies the above described ranges, satisfactory electron injection properties may be obtained without inducing the substantial increase of a driving voltage.

The electron transport region ETR may include a hole blocking layer HBL, as described above. The hole blocking layer HBL may include, for example, 2,9-dimethyl-4,7-diphenyl-1,10-phenanthroline (BCP) and/or 4,7-diphenyl-1,10-phenanthroline (Bphen), without being limited thereto.

The second electrode EL2 is disposed on the electron transport region ETR. The second electrode EL2 may be a common electrode or a cathode. The second electrode EL2 may be a transmissive electrode, a transflective electrode or a reflective electrode. When the second electrode EL2 is the transmissive electrode, the second electrode EL2 may be formed utilizing transparent metal oxides, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed utilizing the above-described materials and a transparent conductive layer formed utilizing ITO, IZO, ZnO, ITZO, etc.

The thickness of the second electrode EL2 may be from about 500 Å to about 10,000 Å, for example, from about 1,000 Å to about 3,000 Å.

In one embodiment, the second electrode EL2 may be connected with an auxiliary electrode. When the second electrode EL2 is connected with the auxiliary electrode, the resistance of the second electrode EL2 may decrease.

In one embodiment, the organic electroluminescence device 10 according to an embodiment of the present disclosure may include a capping layer disposed on the second electrode EL2. The capping layer may include, for example, α-NPD, NPB, TPD, m-MTDATA, Alq3, Cu Pc, N4,N4,N4',N4'-tetra(biphenyl-4-yl)biphenyl-4,4'-diamine (TPD15), 4,4',4"-tris(carbazol-9-yl)-triphenylamine (TCTA), N,N'-bis(naphthalen-1-yl), etc.

Hereinafter, the organic electroluminescence device according to an embodiment of the present disclosure will be explained in more detail with reference to specific embodiments and comparative embodiments. The following embodiments are illustrated only for assisting the understanding of the present disclosure, and the scope of the present disclosure is not limited thereto.

EXAMPLES

1. Manufacturing of Organic Electroluminescence Devices

The organic electroluminescence devices of Examples and Comparative Examples were manufactured by a method described below.

On a glass substrate, ITO with a thickness of about 500 Å was patterned to form a first electrode EL1, which was cleaned with ultrasonic waves in isopropyl alcohol and ultrapure water for about 10 minutes each, exposed to ultraviolet light (UV) for about 10 minutes, and treated with ozone. Then, 2-TNATA was deposited to a thickness of about 600 Å to form a hole injection layer HIL, and NBP was deposited to a thickness of about 300 Å to form a hole transport layer HTL. On the hole transport layer HTL, a host and a dopant were co-deposited to form an emission layer EML with a thickness of about 400 Å.

By changing the constitution of the host utilized in the emission layer, organic electroluminescence devices of Examples 1 to 12 and Comparative Examples 1 to 5 were manufactured. In the emission layers EML of Examples 1 to 12 and Comparative Examples 1 to 5, a green phosphorescence dopant D1 was utilized as the dopant, and the whole host (e.g., all of the host materials) and the dopant were co-deposited in a weight ratio of about 90:10.

In Examples 1 to 12, both the first host represented by Formula 1 and the second host represented by one of Formulae 2-1 to 2-6 were included in the emission layer EML. In Comparative Examples 1 to 3, only the first host was utilized, and in Comparative Examples 4 and 5, only the second host was utilized.

The combinations of the host materials utilized in Examples and Comparative Examples are listed in Table 1 below.

TABLE 1

| Device manufacturing examples | First host | Second host |
|---|---|---|
| Example 1 | C112 | TC4-106 |
| Example 2 | C112 | TC4-106 |
| Example 3 | C112 | TC4-106 |
| Example 4 | C112 | TC4-106 |
| Example 5 | C225 | TC10-52 |
| Example 6 | C225 | TC10-52 |
| Example 7 | C225 | TC10-52 |
| Example 8 | C225 | TC10-52 |
| Example 9 | C203 | TC4-106 |
| Example 10 | C203 | TC4-106 |
| Example 11 | C203 | TC10-52 |
| Example 12 | C203 | TC10-52 |
| Comparative Example 1 | C112 | — |
| Comparative Example 2 | C225 | — |
| Comparative Example 3 | C203 | — |
| Comparative Example 4 | — | TC4-106 |
| Comparative Example 5 | — | TC10-52 |

Dopant D1 utilized in Examples and Comparative Examples is shown below.

D1

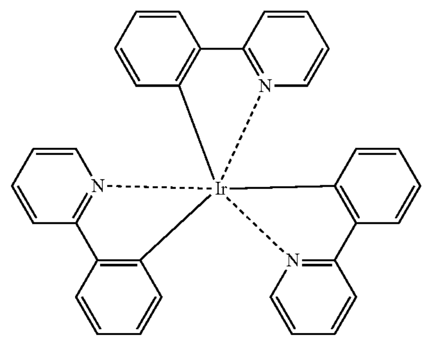

In addition, the first host compounds and the second host compounds utilized in Examples and Comparative Examples are shown below.

First Host Compounds

C 112

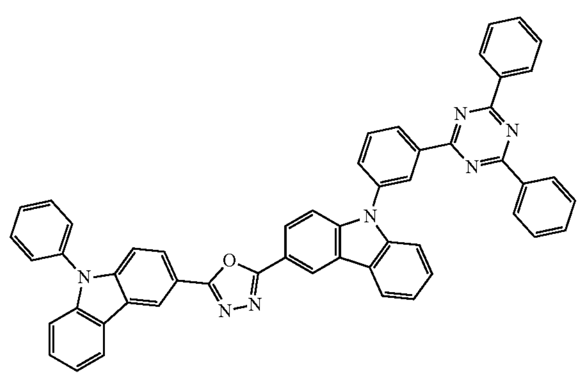

C 225

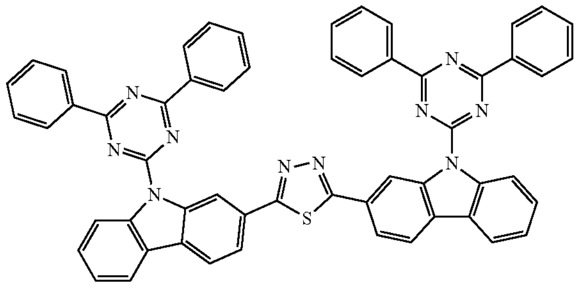

C 203

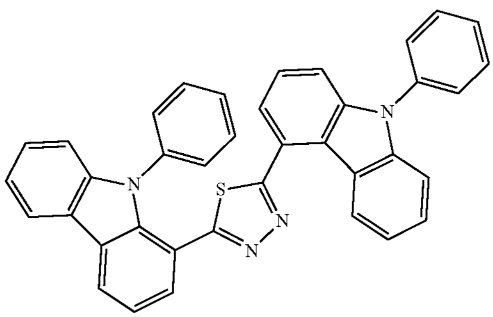

Second Host Compounds

TC4-106

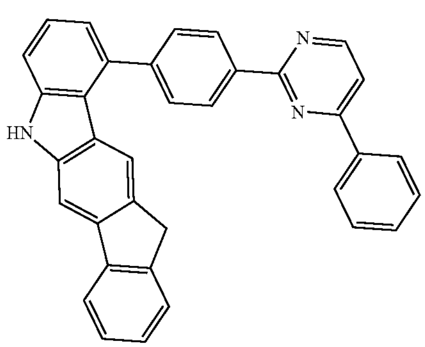

TC10-52

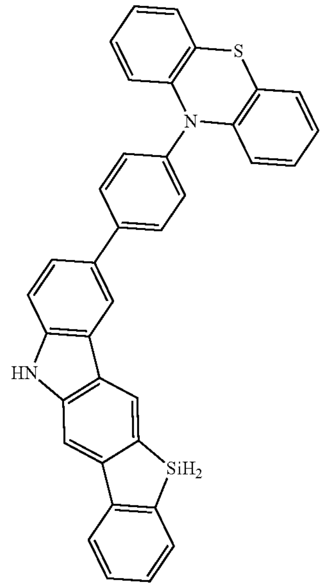

On the emission layer EML formed utilizing each host combination of Examples 1 to 12 and Comparative Examples 1 to 5 as shown in Table 1, $Alq_3$ was deposited to a thickness of about 300 Å to form an electron transport layer ETL. Then, a second electrode EL2 was formed utilizing aluminum (Al) to a thickness of about 1,200 Å.

The materials of the hole injection layer HIL and the hole transport layer HTL utilized for the manufacture of the organic electroluminescence devices 10 of Examples and Comparative Examples are shown below.

2-TNATA

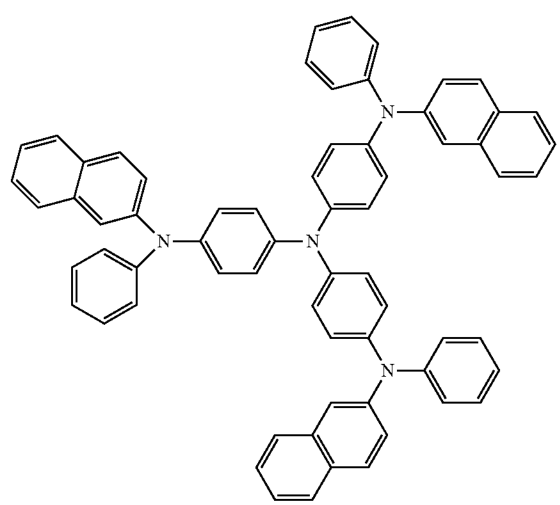

-continued

NPB

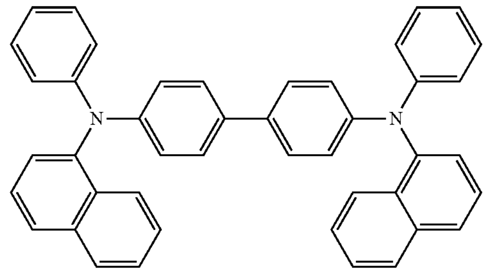

2. Property Evaluation of Organic Electroluminescence Devices

In Table 2, the evaluation results of the organic electroluminescence devices of Examples 1 to 12 and Comparative Examples 1 to 5 are shown. Table 2 shows emission efficiency at a current density of 8 mA/cm$^2$, and life ($T_{90}$) corresponding to the time required for the luminance to decrease to 90% from an initial luminance of 9000 nits standard, for the organic electroluminescence devices manufactured in Examples and Comparative Examples.

TABLE 2

| Device manufacturing examples | Emission layer configuration (first host:second host:dopant) | Current density (mA/cm$^2$) | Efficiency (cd/A) | Life ($T_{90}$) (hrs) |
|---|---|---|---|---|
| Example 1 | 75:15:10 | 8 | 76.1 | 110 |
| Example 2 | 65:25:10 | 8 | 78.2 | 88 |
| Example 3 | 70:20:10 | 8 | 68.2 | 96 |
| Example 4 | 60:30:10 | 8 | 64.3 | 110 |
| Example 5 | 75:15:10 | 8 | 60.2 | 68 |
| Example 6 | 65:25:10 | 8 | 71.5 | 113 |
| Example 7 | 70:20:10 | 8 | 73.2 | 76 |
| Example 8 | 60:30:10 | 8 | 75.2 | 87 |
| Example 9 | 75:15:10 | 8 | 64.2 | 84 |
| Example 10 | 65:25:10 | 8 | 68.4 | 78 |
| Example 11 | 75:15:10 | 8 | 60.2 | 86 |
| Example 12 | 65:25:10 | 8 | 64.8 | 64 |
| Comparative Example 1 | 90:10 | 8 | 38.2 | 42 |
| Comparative Example 2 | 90:10 | 8 | 37.6 | 40 |
| Comparative Example 3 | 90:10 | 8 | 22.2 | 45 |
| Comparative Example 4 | 90:10 | 8 | 14.3 | 58 |
| Comparative Example 5 | 90:10 | 8 | 14.7 | 52 |

Referring to the results of Table 2, it may be found that the devices of Examples 1 to 12 having an emission layer EML including both the first host represented by Formula 1 and the second host represented by one of Formulae 2-1 to 2-6, which is the configuration of the organic electroluminescence device 10 according to an embodiment of the present disclosure, have enhanced efficiency and life characteristics, when compared with those of Comparative Examples 1 to 5 utilizing a single host.

For example, the organic electroluminescence devices of Examples 1 to 12 have an efficiency of 60.2 to 78.2 cd/A and life ($T_{90}$) of 64 to 113 hours, thereby attaining high efficiency and a long device life. In addition, the organic electroluminescence devices of Comparative Examples 1 to 5 have an efficiency of 14.3 to 38.2 cd/A and life ($T_{90}$) of 40 to 58 hours, failing to attain high efficiency and a long device life.

Referring to the results of Examples 1 to 12 and Comparative Examples 1 to 5, it may be found that the organic electroluminescence devices 10 of an embodiment including both the first host and the second host in the emission layer EML have synergistic effects and show enhanced emission efficiency along with increased device life, when compared with those including a single host.

In the organic electroluminescence device 10 according to an embodiment of the present disclosure, the emission layer EML includes both the first host having a hole affinity and the second host having an electron affinity, and the first host and the second host may form an exciplex.

That is, in the organic electroluminescence device 10 according to an embodiment of the present disclosure utilizing both the first host having a hole affinity and the second host having an electron affinity, a hole injection barrier and an electron injection barrier are lowered, and therefore, holes and electrons may be easily injected into the emission layer EML, thereby decreasing a driving voltage. In addition, because the first host and the second host form an exciplex, a charge balance may increase, and the recombination probability of holes and electrons in the emission layer EML may increase, thereby showing increased emission efficiency. Furthermore, through the recombination of holes and electrons in the emission layer EML, sufficient light emission may be attained, and deterioration at the interface of the emission layer EML with other organic layers may be reduced or relieved, thereby increasing device life. For example, when a phosphorescence dopant is utilized in the organic electroluminescence device, deterioration of device may be reduced or relieved, thereby showing a long device life.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

The organic electroluminescence device 10 according to an embodiment of the present disclosure includes a first host represented by Formula 1, a second host represented by any one of Formulae 2-1 to 2-6, and a phosphorescence dopant, thereby attaining high efficiency and a long device life.

The organic electroluminescence device according to an embodiment of the present disclosure may attain high efficiency and a long device life.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6.

Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Accordingly, the scope of the present disclosure is to be determined by the broadest permissible interpretation of the following claims and their equivalents, and shall not be restricted or limited by the foregoing detailed description.

What is claimed is:

1. An organic electroluminescence device, comprising:

a first electrode;

a second electrode on the first electrode; and an emission layer between the first electrode and the second electrode, the emission layer comprising a first host represented by the following Formula 1 and a second host represented by any one of the following Formulae 2-1 to 2-6:

Formula 1

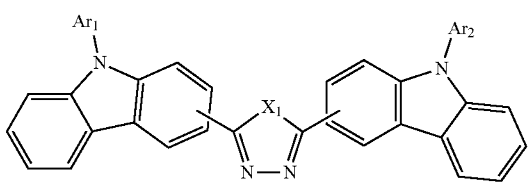

Formula 2-1

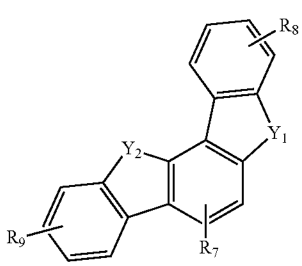

Formula 2-2

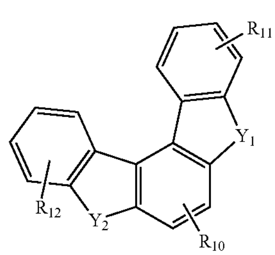

-continued

Formula 2-3

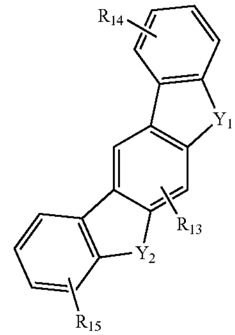

Formula 2-4

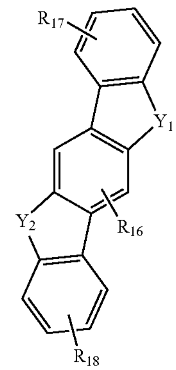

Formula 2-5

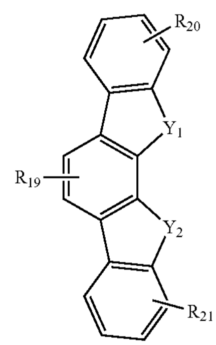

Formula 2-6

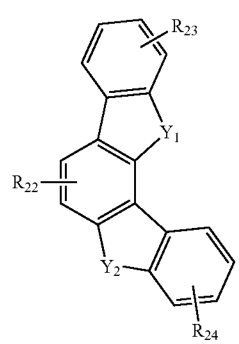

wherein in Formula 1, $X_1$ is O, S, or $NR_1$, $R_1$ is a hydrogen atom, a deuterium atom, a cyano group, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $Ar_1$ and $Ar_2$ are each independently a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and wherein in Formulae 2-1 to 2-6, $Y_1$ and $Y_2$ are each independently $NR_2$, $CR_3R_4$, or $SiR_5R_6$, and one of $Y_1$ or $Y_2$ is $CR_3R_4$, or $SiR_5R_6$, $R_2$ to $R_6$ are each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $R_7$ to $R_{24}$ are each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring.

2. The organic electroluminescence device of claim 1, wherein a weight ratio of the first host to the second host is 10:90 to 90:10.

3. The organic electroluminescence device of claim 1, wherein the first host and the second host form an exciplex.

4. An organic electroluminescence device, comprising:

a first electrode;

a second electrode on the first electrode; and an emission layer between the first electrode and the second electrode, the emission layer comprising a first host represented by the following Formula 1 and a second host represented by any one of the following Formulae 2-1 to 2-6:

Formula 1

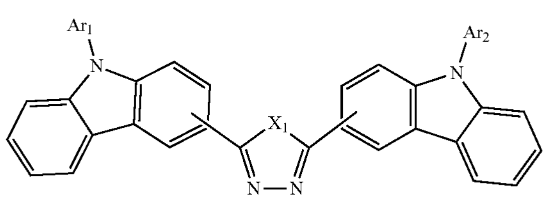

Formula 2-1

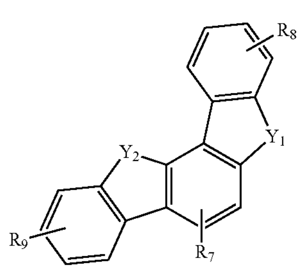

Formula 2-2

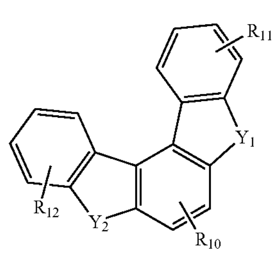

-continued

Formula 2-3

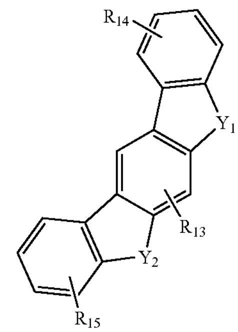

Formula 2-4

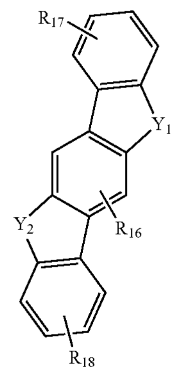

Formula 2-5

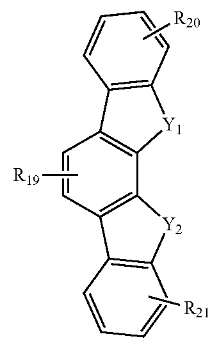

Formula 2-6

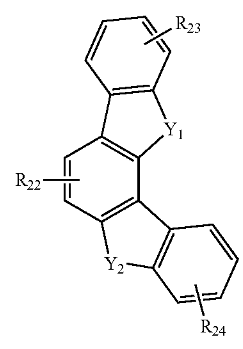

wherein in Formula 1, $X_1$ is O, S, or $NR_1$, $R_1$ is a hydrogen atom, a deuterium atom, a cyano group, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $Ar_1$ and $Ar_2$ are each independently a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, wherein in Formulae 2-1 to 2-6, $Y_1$ and $Y_2$ are each independently $NR_2$, $CR_3R_4$, or $SiR_5R_6$, $R_2$ to $R_6$ are each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $R_7$ to $R_{24}$ are each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and wherein a HOMO energy level and a LUMO energy level of the first host are higher than a HOMO energy level and a LUMO energy level of the second host, respectively.

5. The organic electroluminescence device of claim 1, wherein the first host represented by Formula 1 is represented by any one of the following Formulae 1-1 to 1-7:

Formula 1-1

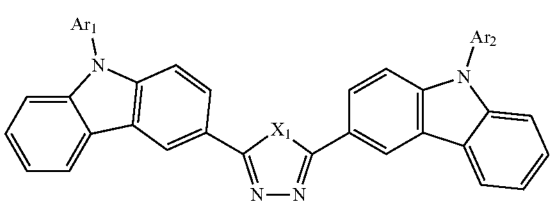

Formula 1-2

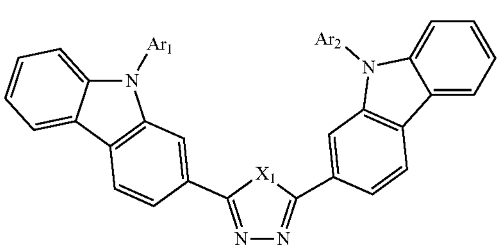

-continued

Formula 1-3

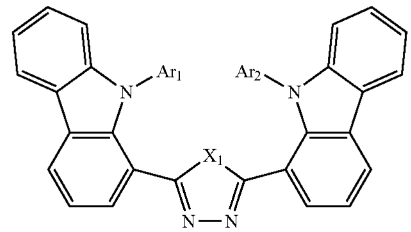

Formula 1-4

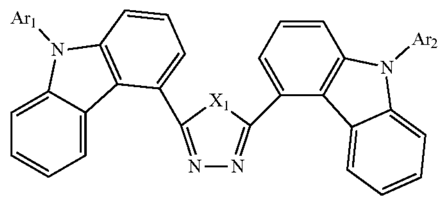

Formula 1-5

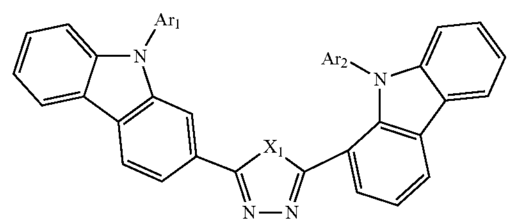

Formula 1-6

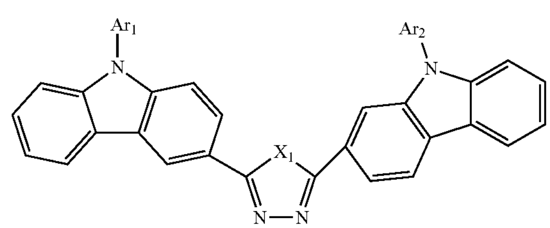

Formula 1-7

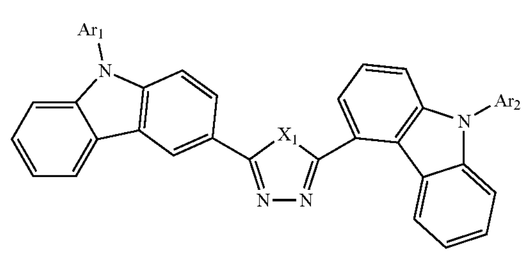

and wherein in Formulae 1-1 to 1-7, $X_1$, $Ar_1$, and $Ar_2$ are the same as respectively defined with respect to Formula 1.

6. The organic electroluminescence device of claim 1, wherein the first host comprises at least one of compounds represented in the following Compound Group 1:
[Compound Group 1]
C 1
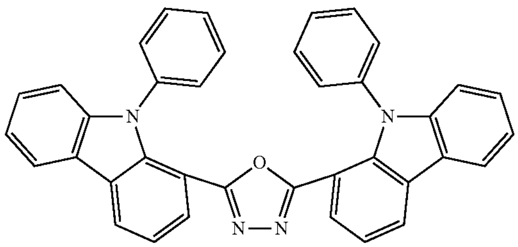
C 2
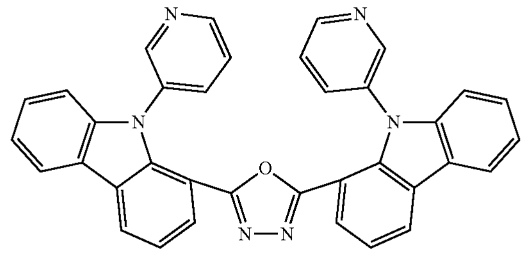
C 3
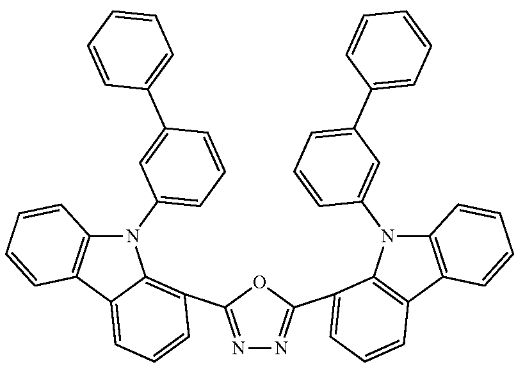
C 4
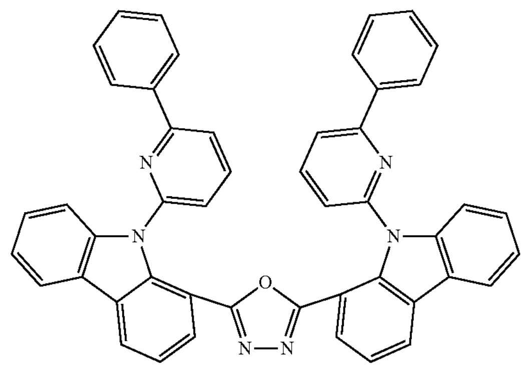
C 5
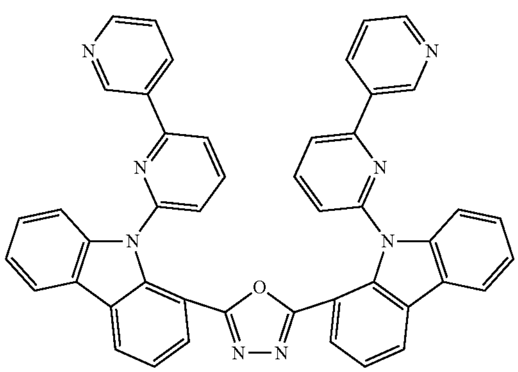
C 6
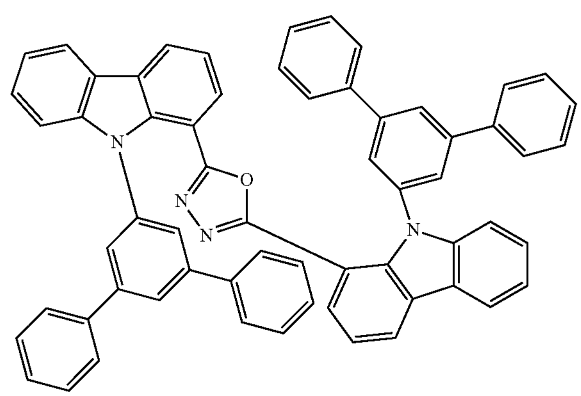
C 7
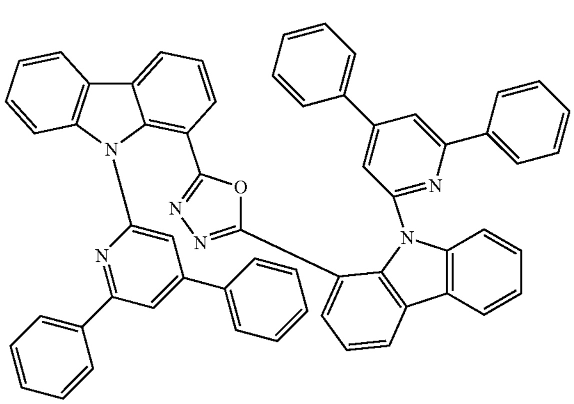
C 8
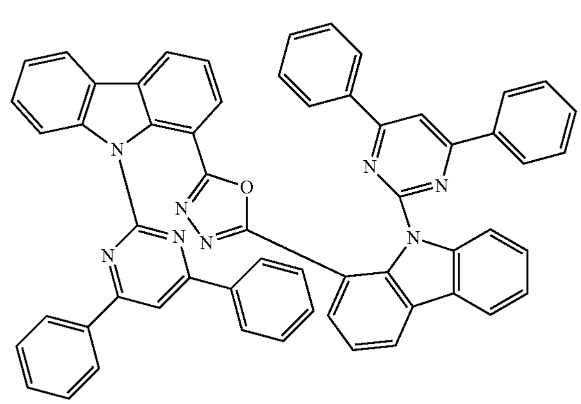

-continued
C 9
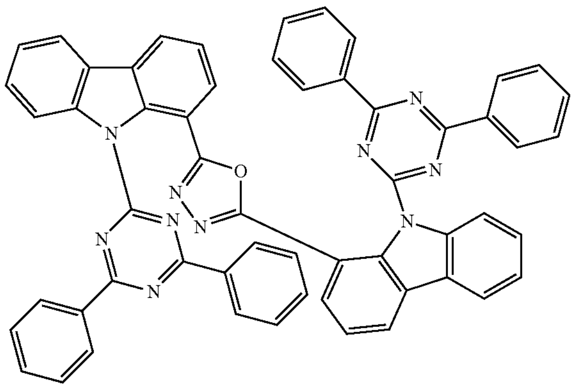
C 10
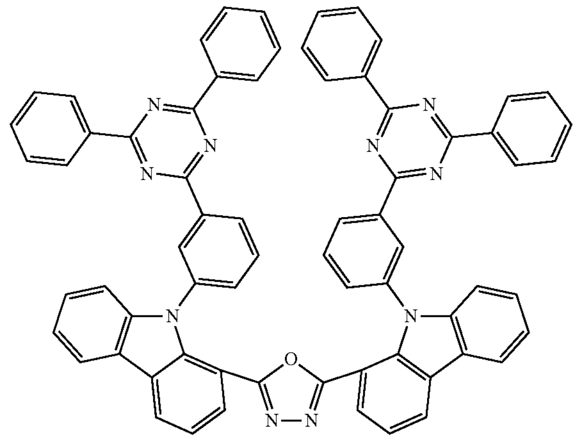
C 11
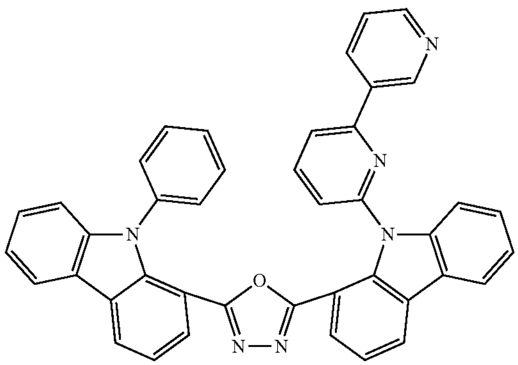
C 12
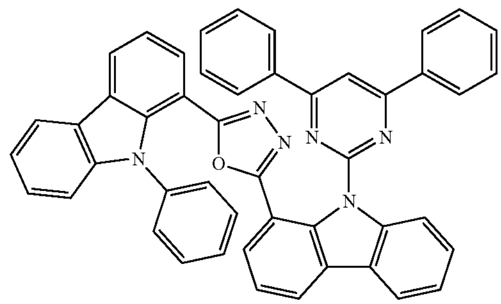
C 13
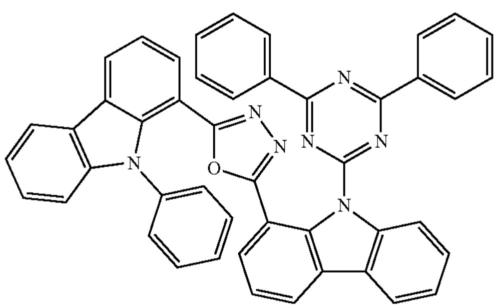
C 14
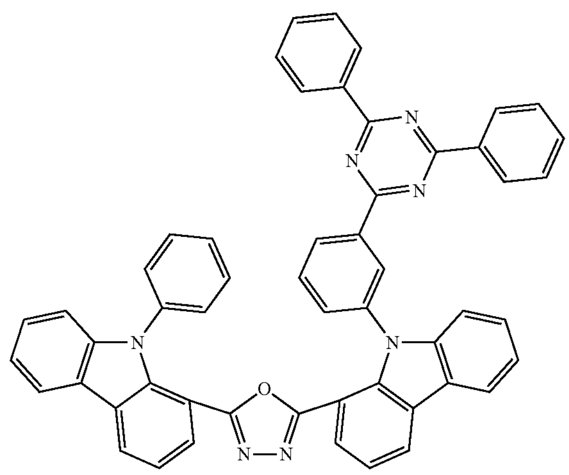
C 15
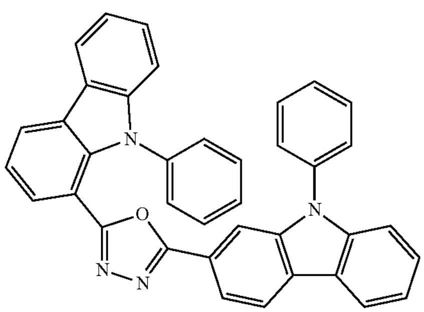
C 16
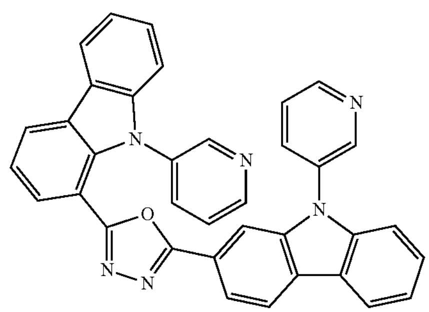

-continued
C 17
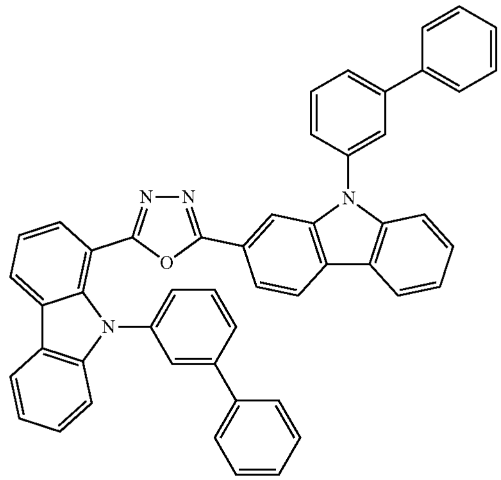
C 18
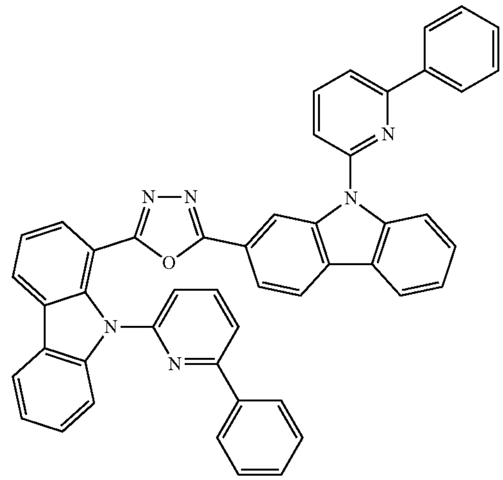
C 19
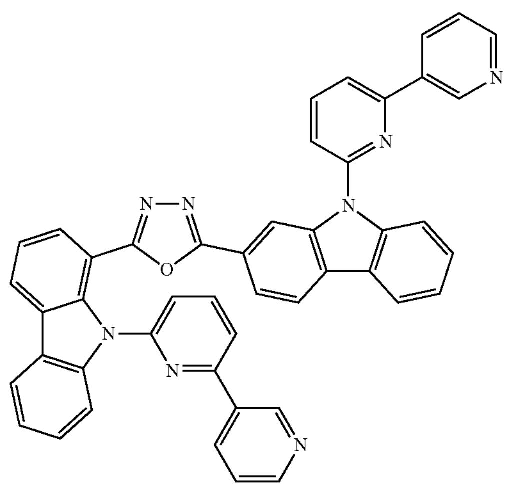
C 20
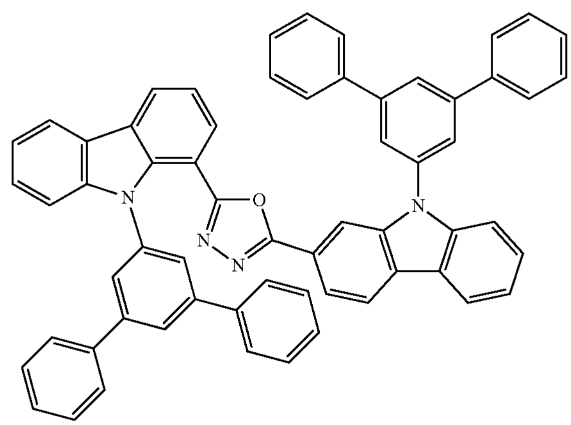
C 21
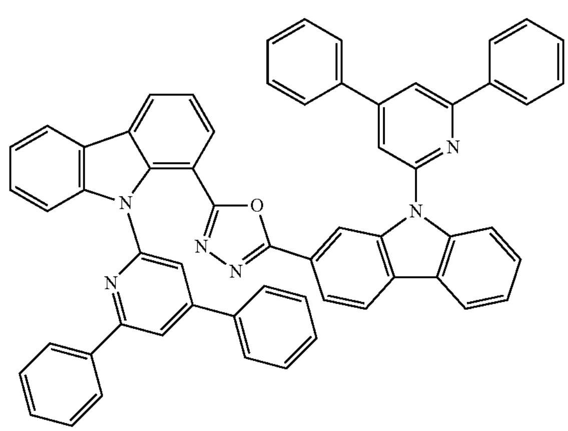
C 22
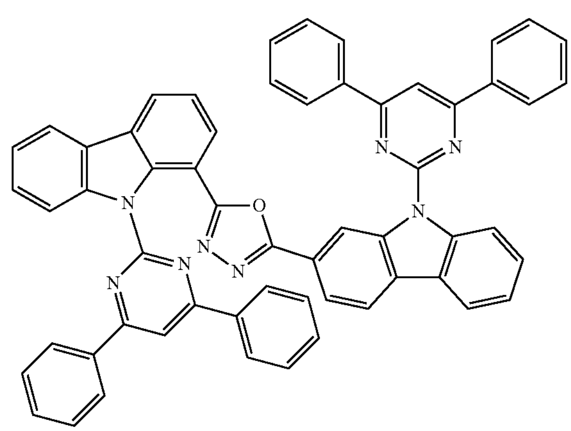

-continued
C 23
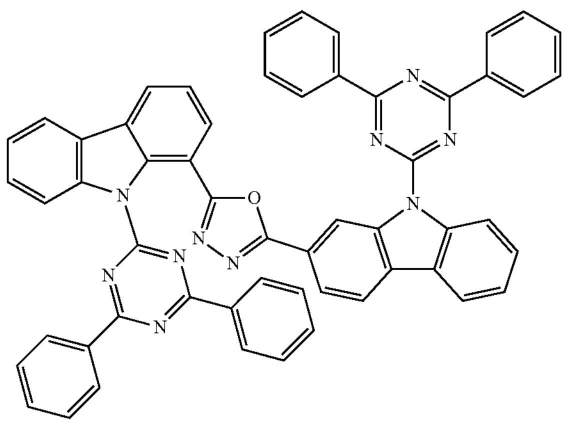
C 24
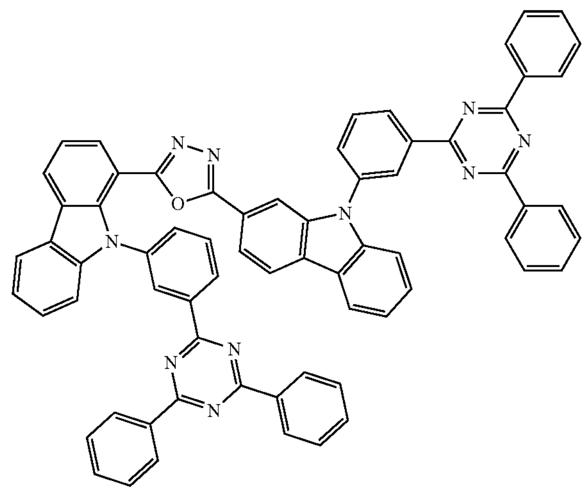
C 25
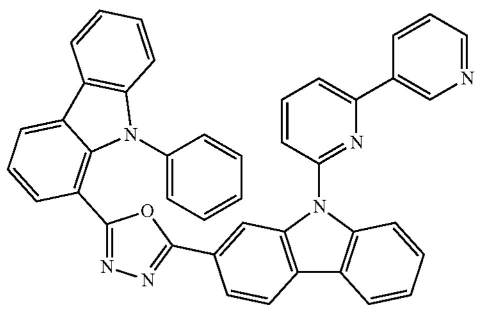
C 26
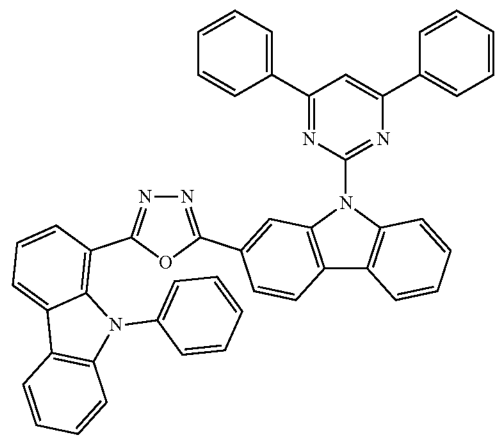
C 27
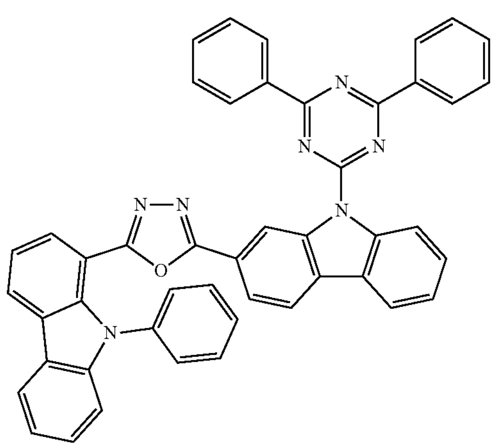
C 28
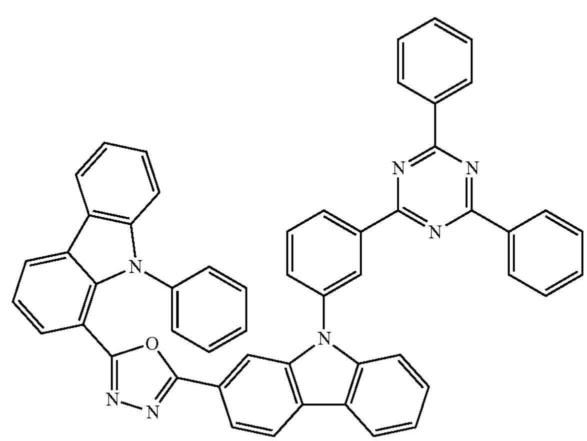

-continued
C 29
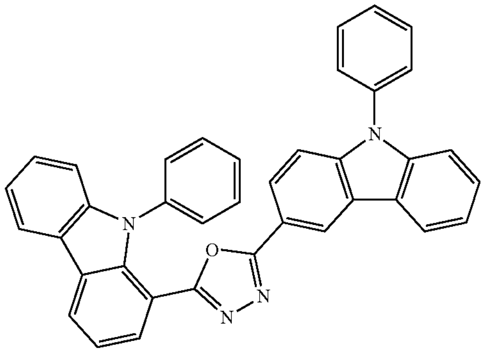
C 30
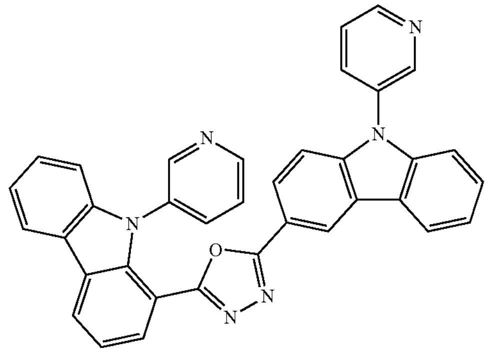
C 31
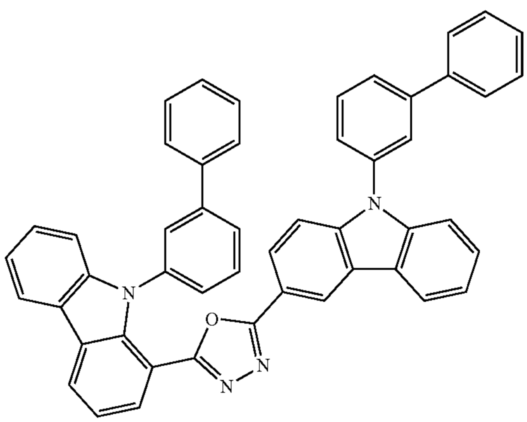
C 32
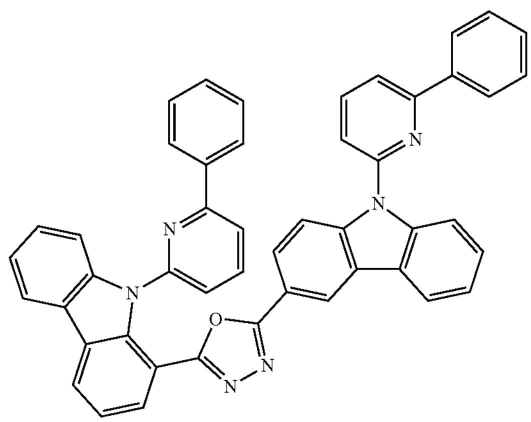
C 33
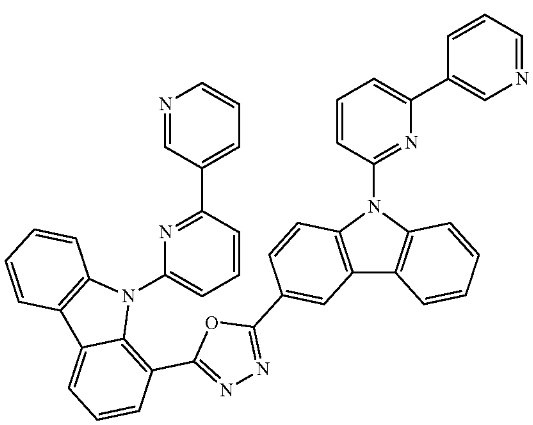
C 34
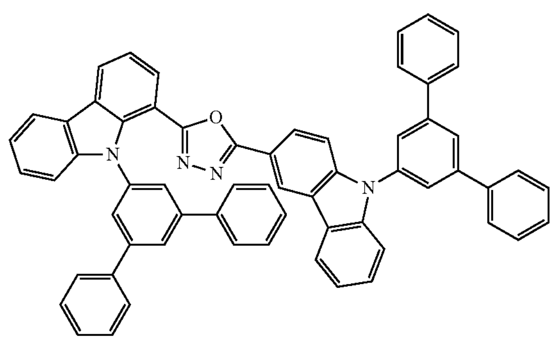
C 35
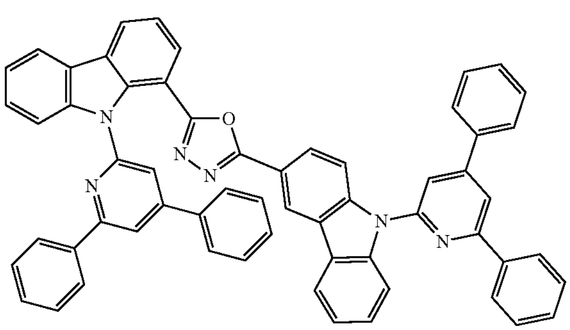
C 36
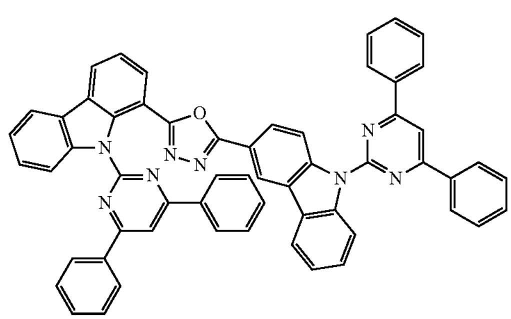

-continued
C 37
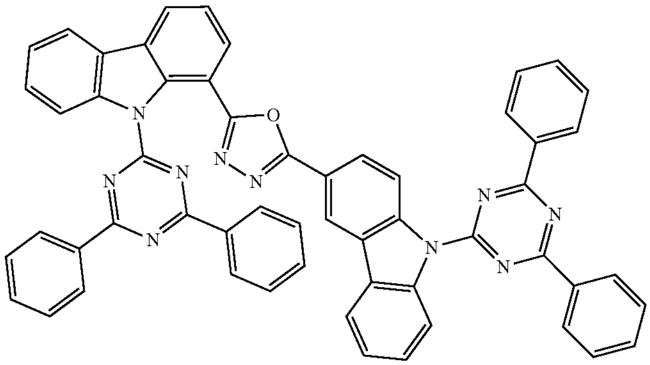
C 38
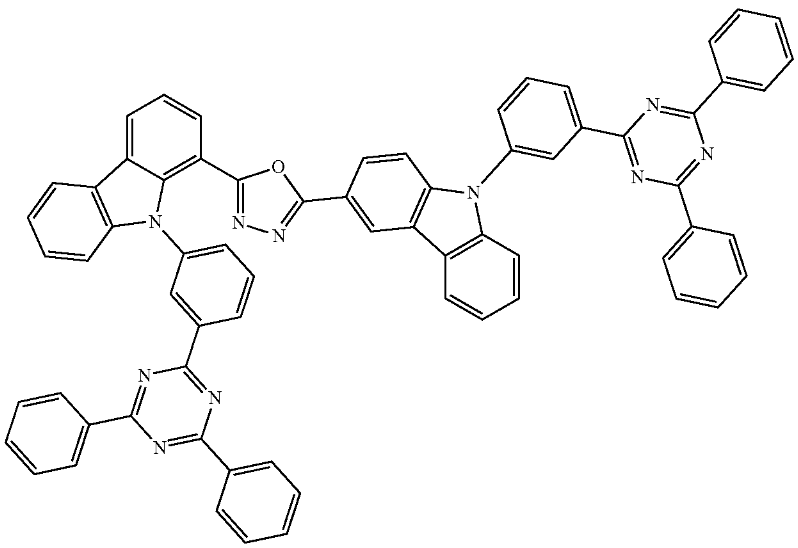
C 39
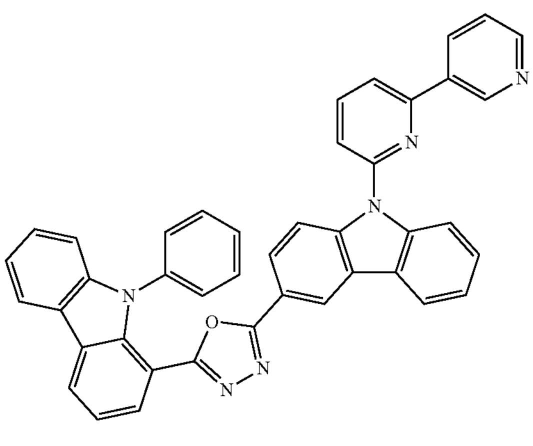
C 40
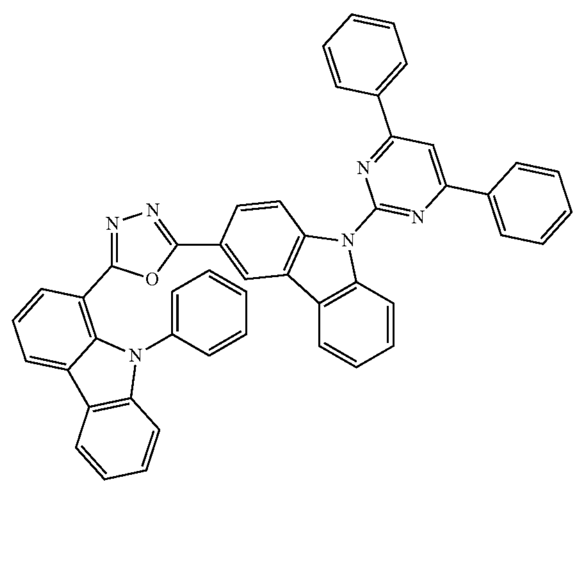

-continued
C 41
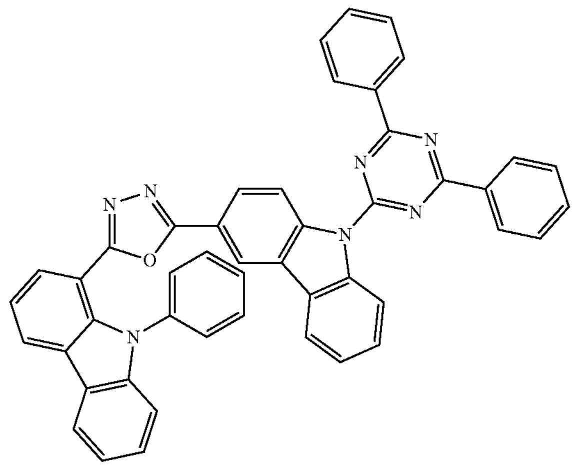
C 42
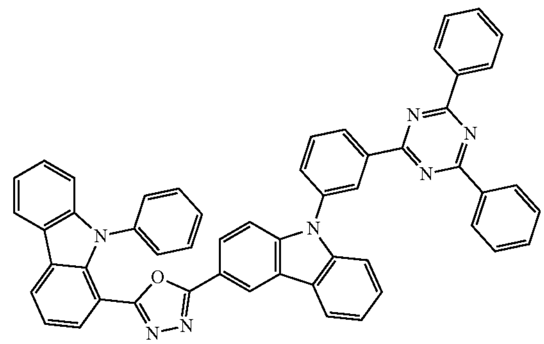
C 43
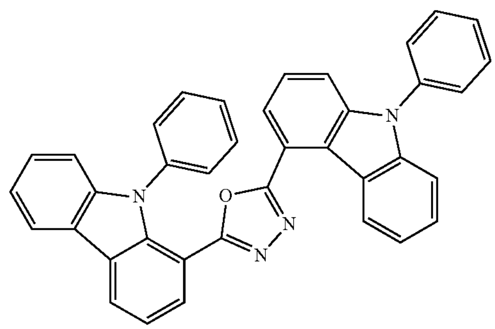
C 44
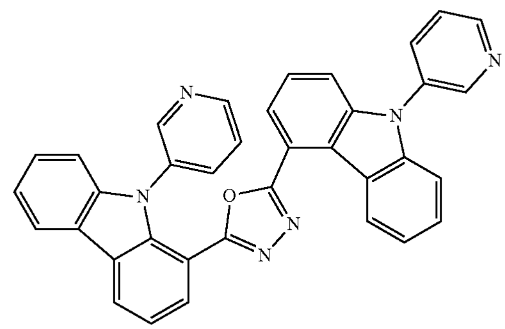
C 45
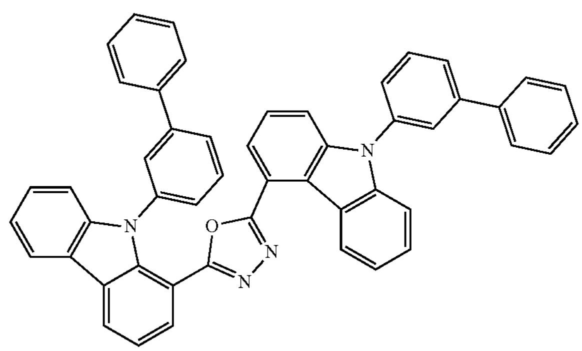
C 46
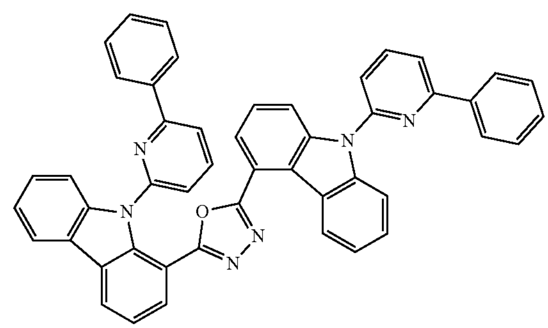
C 47
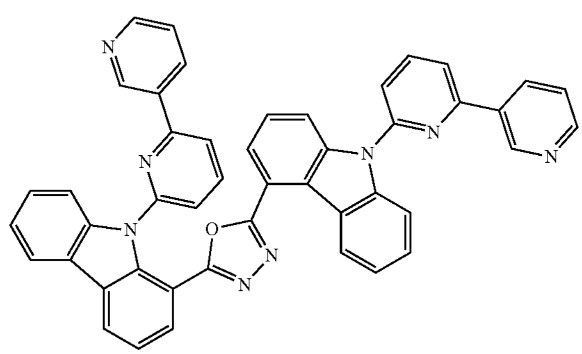
C 48
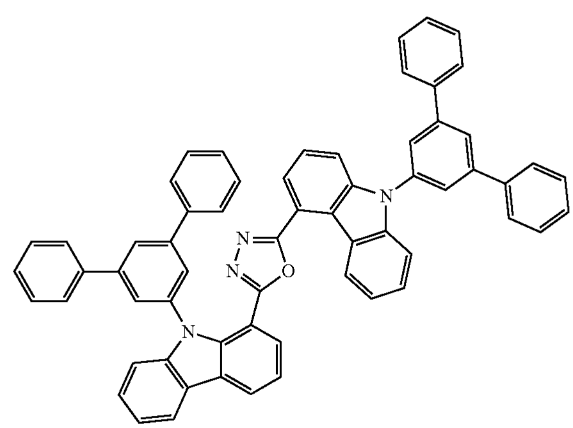

-continued
C 49
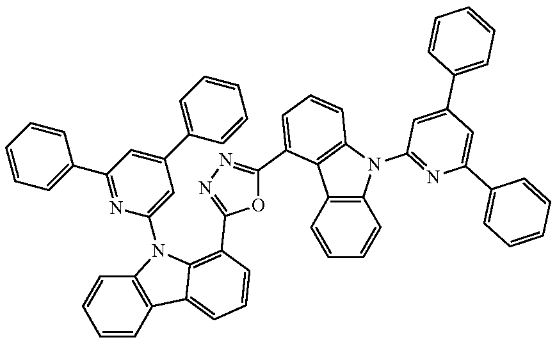
C 50
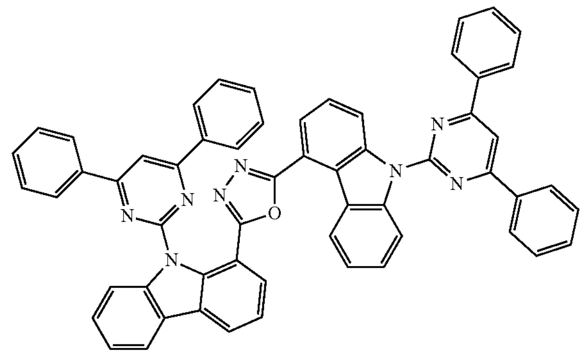
C 51
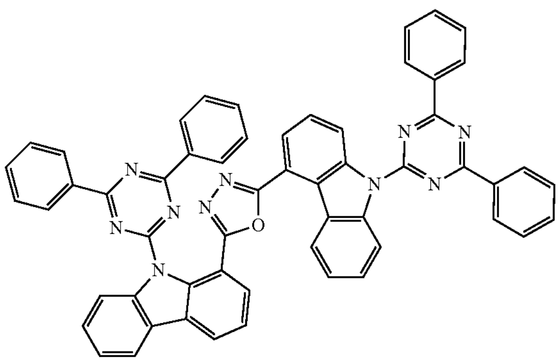
C 52
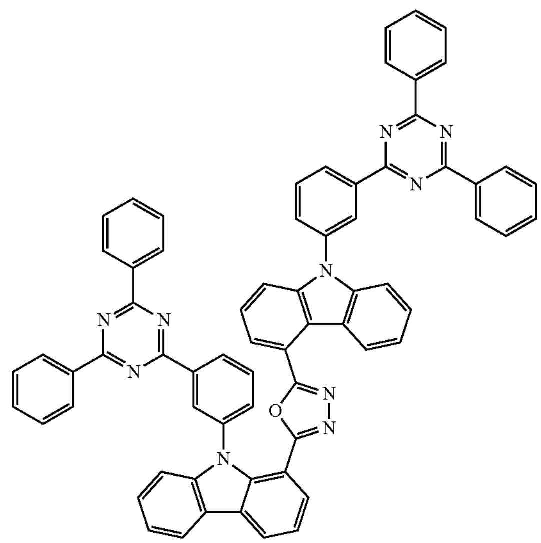
C 53
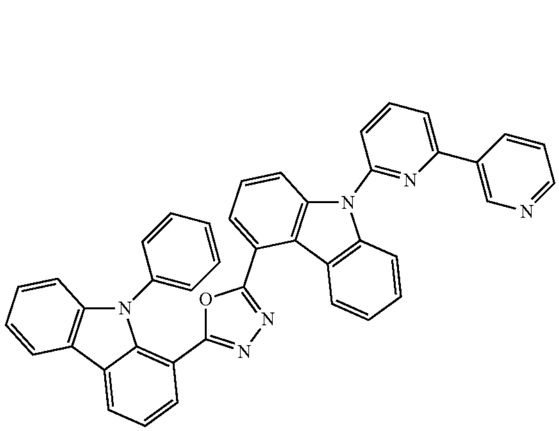
C 54
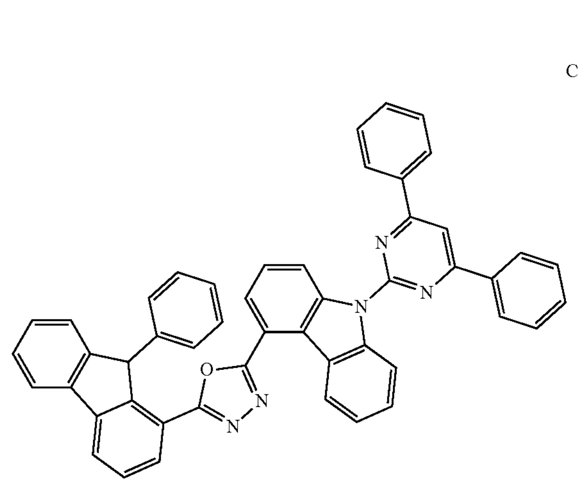

-continued
C 55
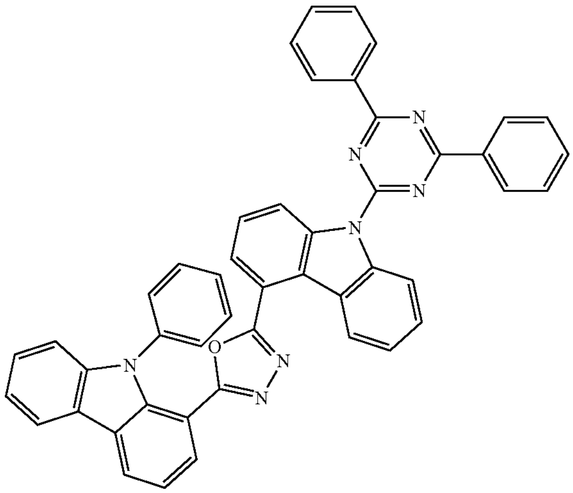
C 56
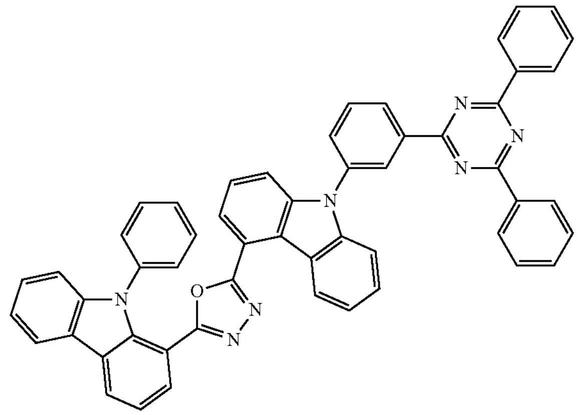
C 57
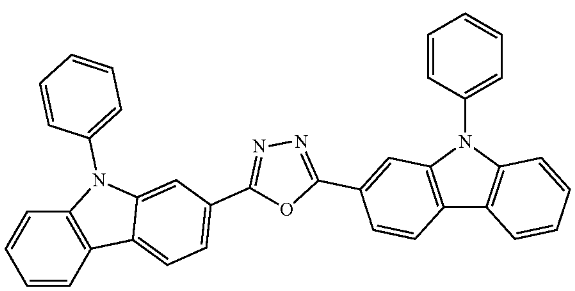
C 58
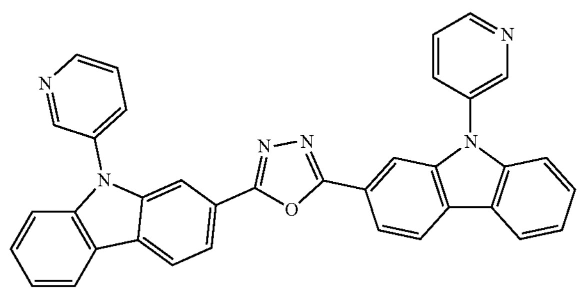
C 59
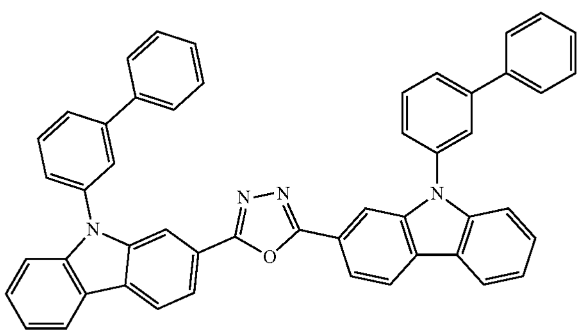
C 60
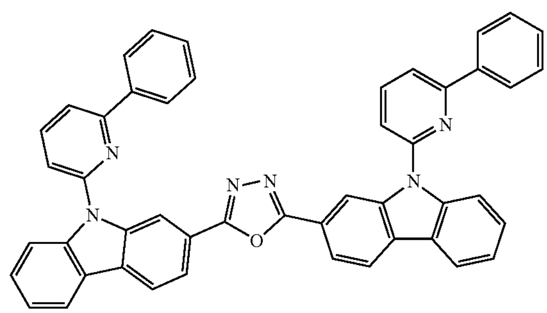
C 61
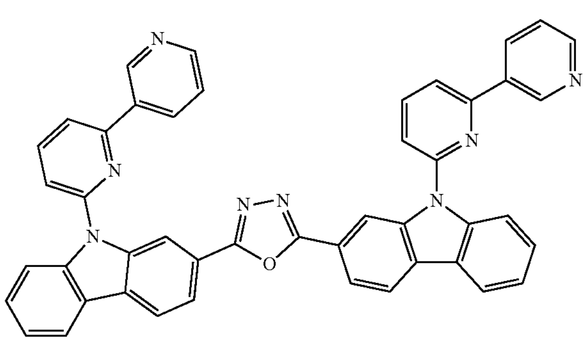
C 62
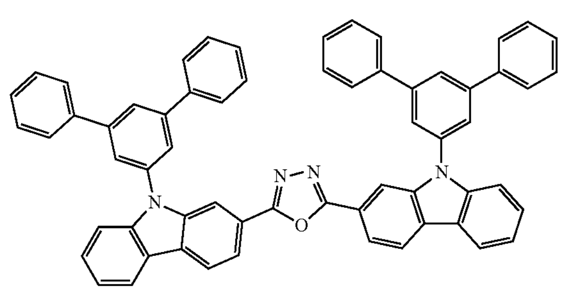

-continued
C 63
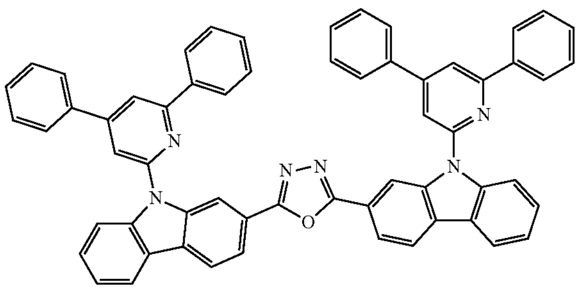
C 64
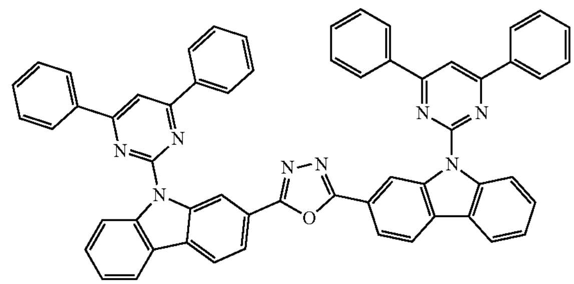
C 65
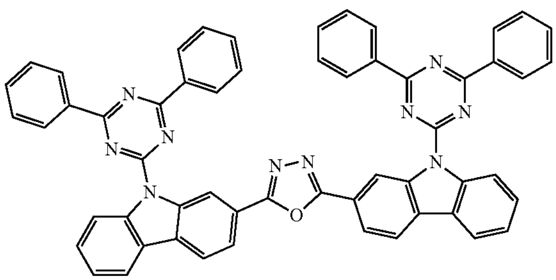
C 66
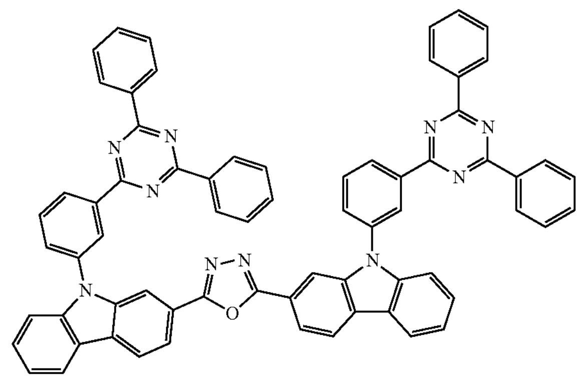
C 67
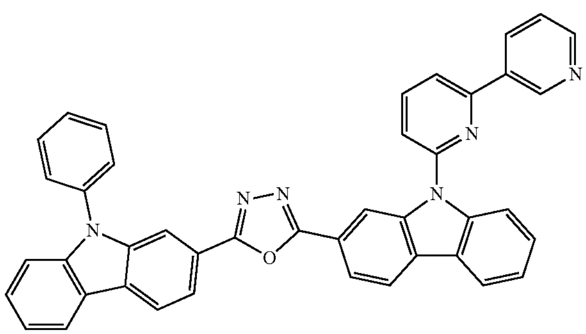
C 68
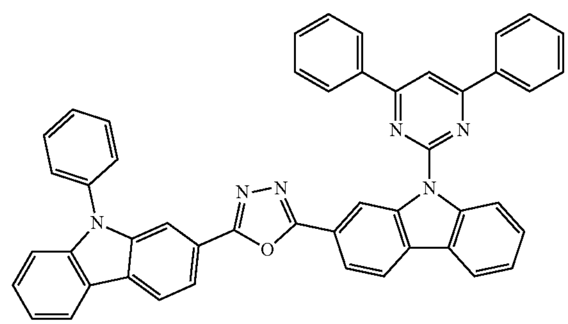
C 69
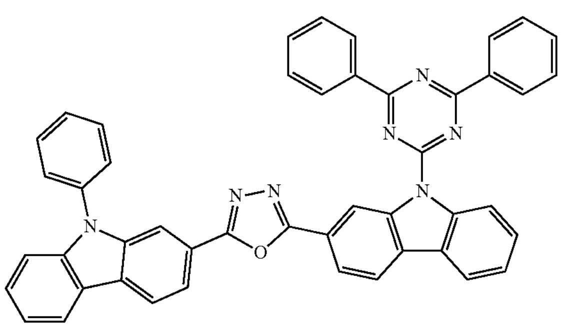
C 70
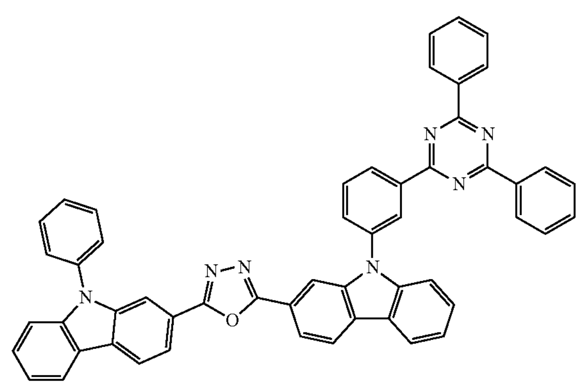

-continued
C 71
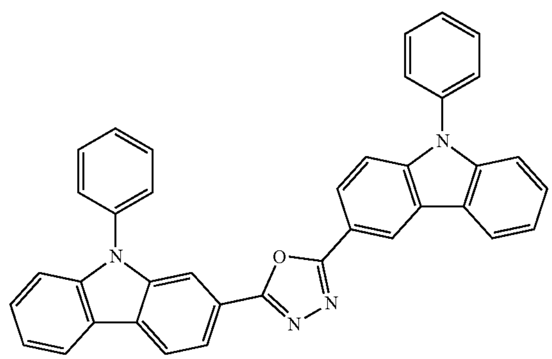
C 72
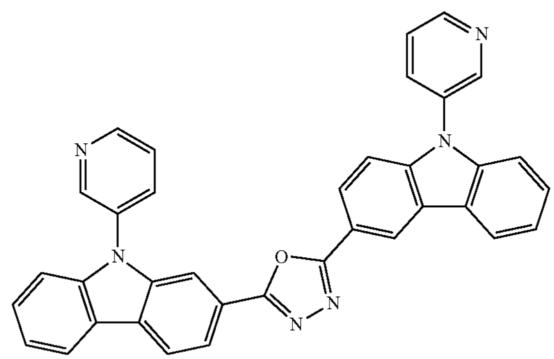
C 73
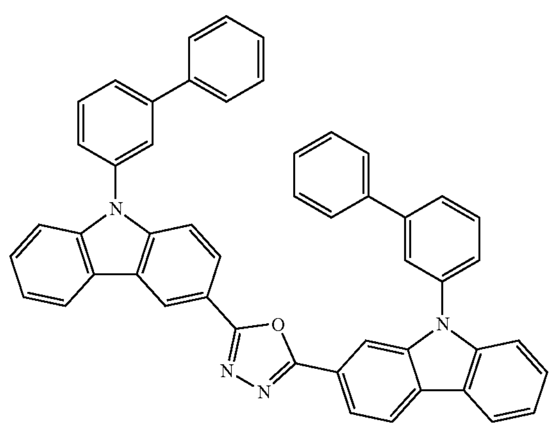
C 74
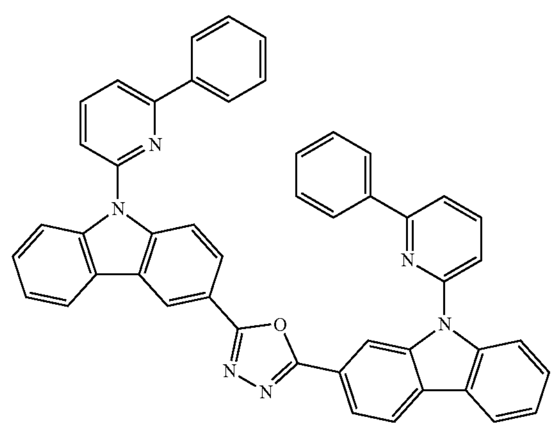
C 75
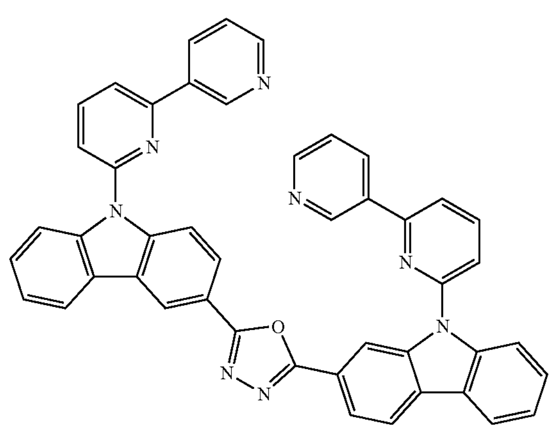
C 76
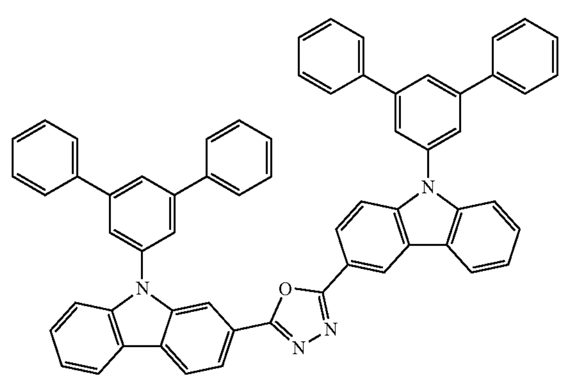
C 77
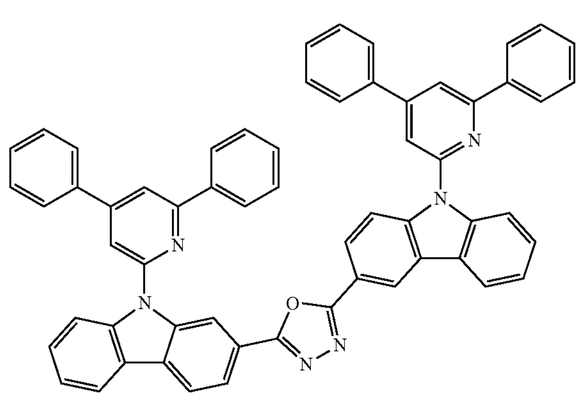
C 78
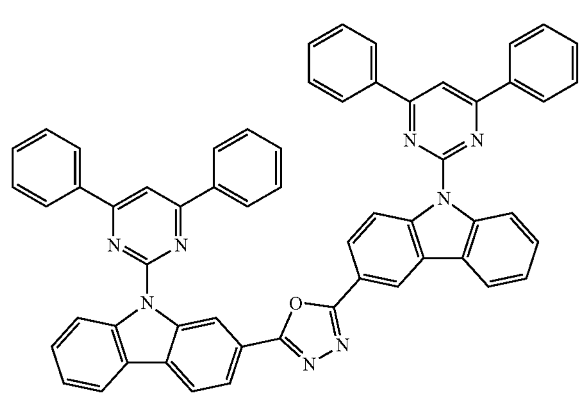

-continued
C 79
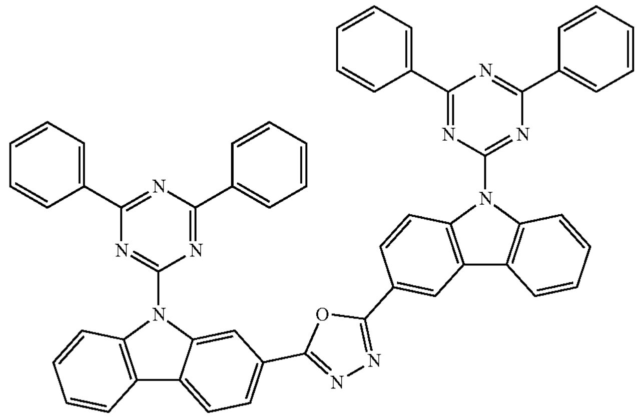
C 80
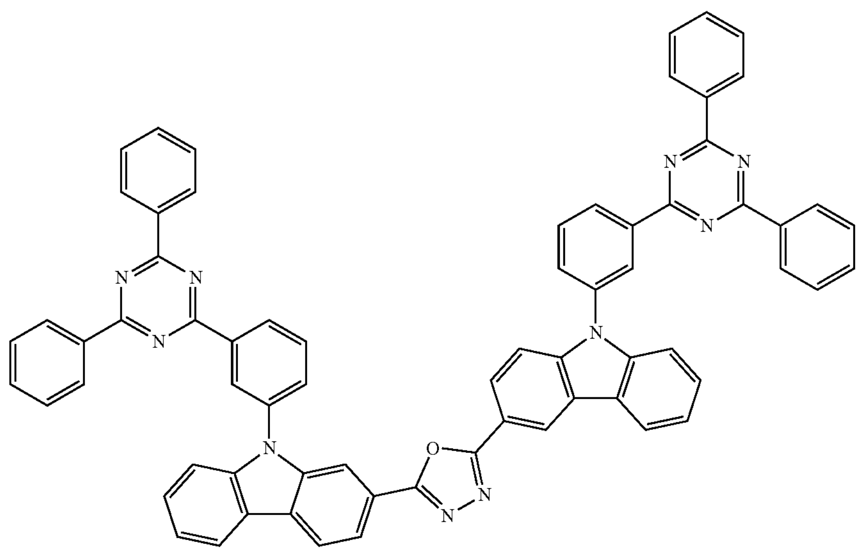
C 81
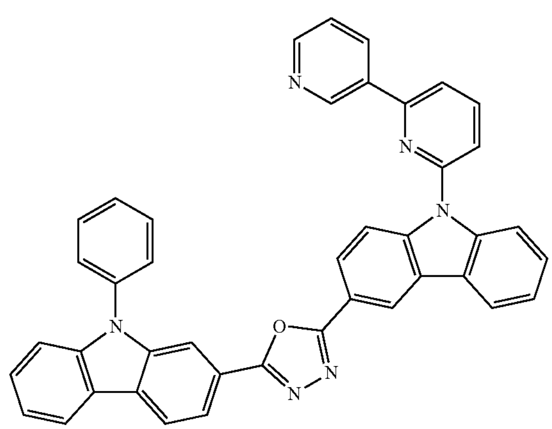
C 82
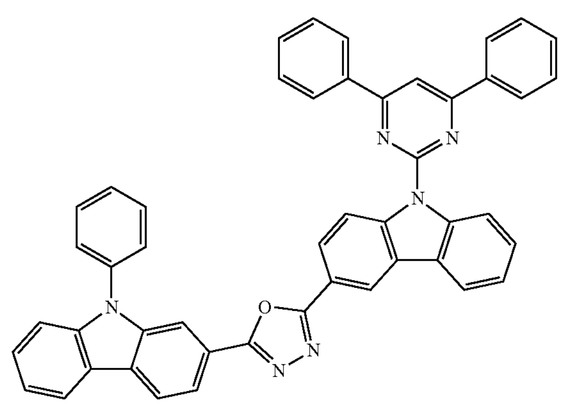

-continued
C 83
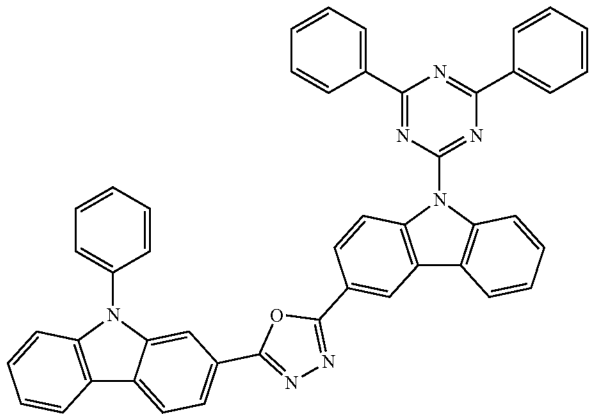
C 84
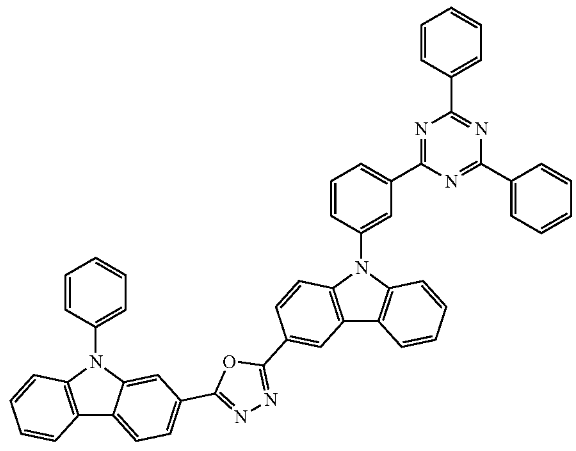
C 85
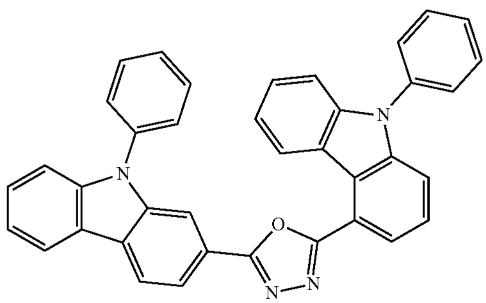
C 86
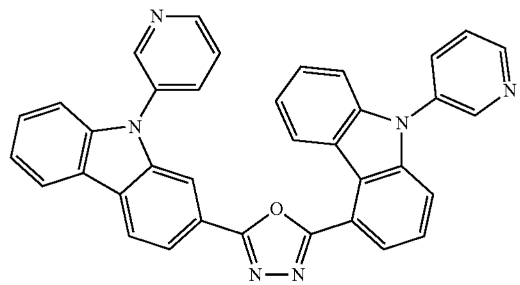
C 87
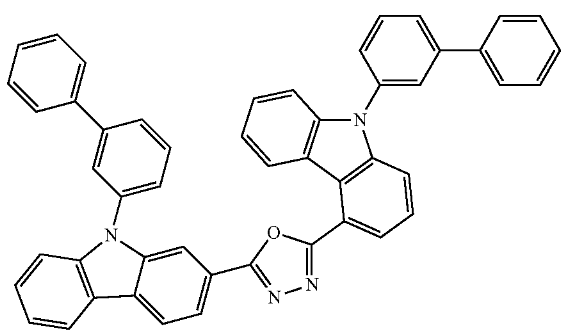
C 88
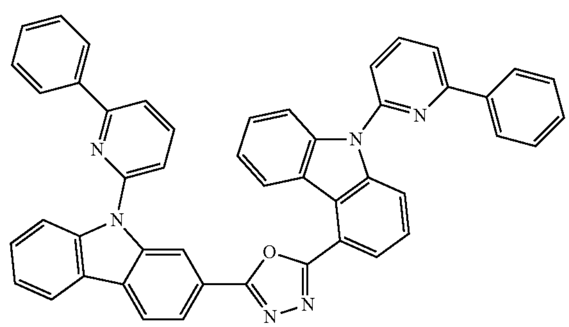
C 89
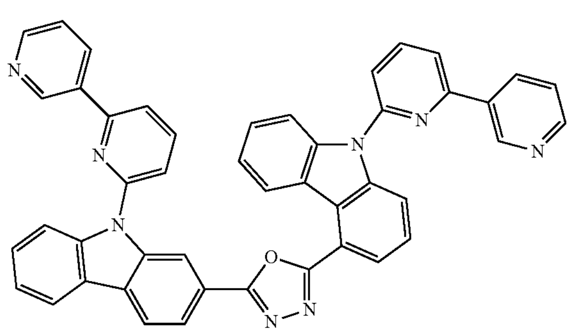
C 90
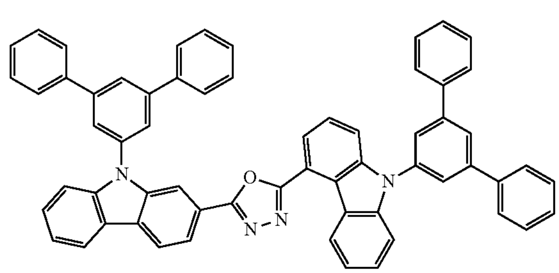

-continued
C 91
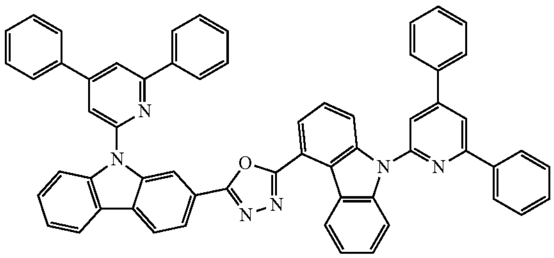
C 92
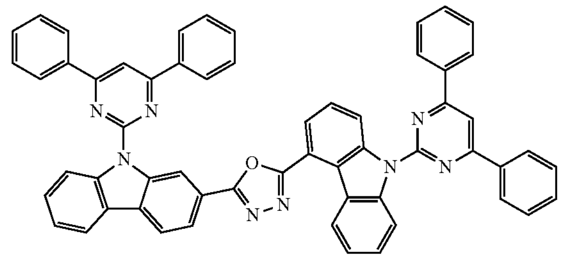
C 93
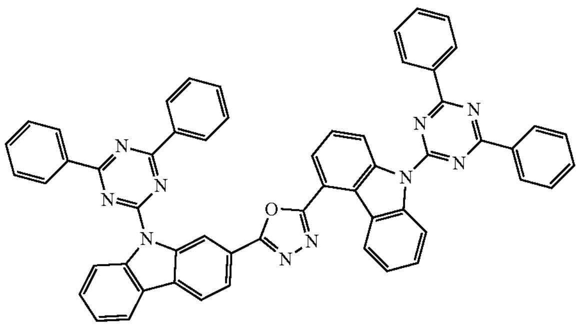
C 94
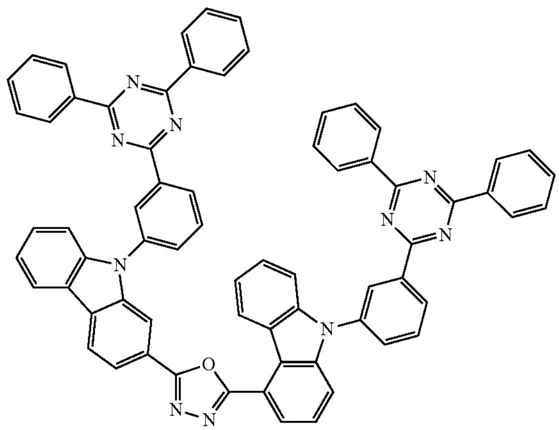
C 95
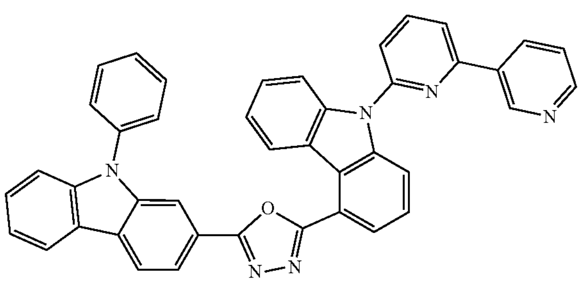
C 96
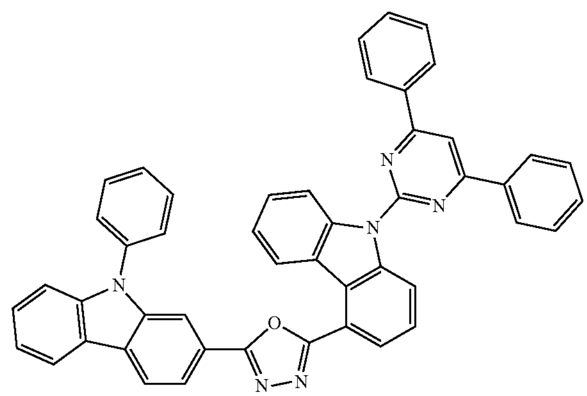
C 97
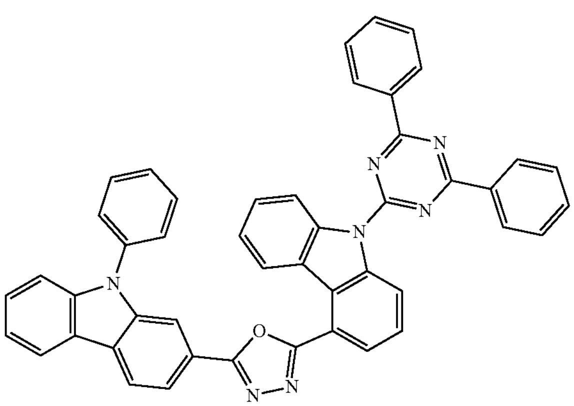
C 98
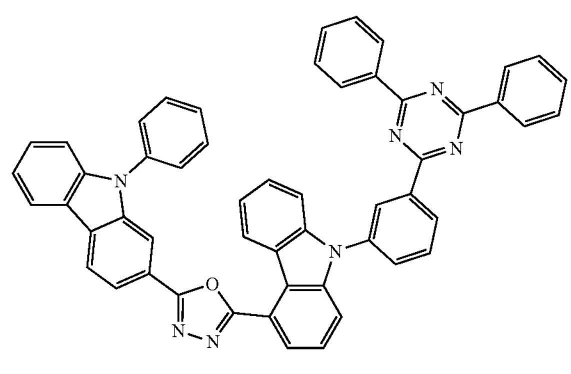

-continued
C 99
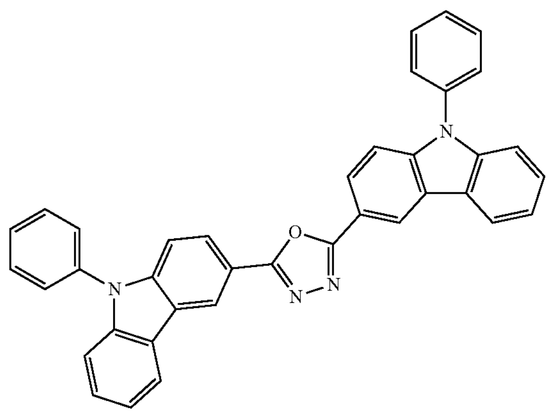
C 100
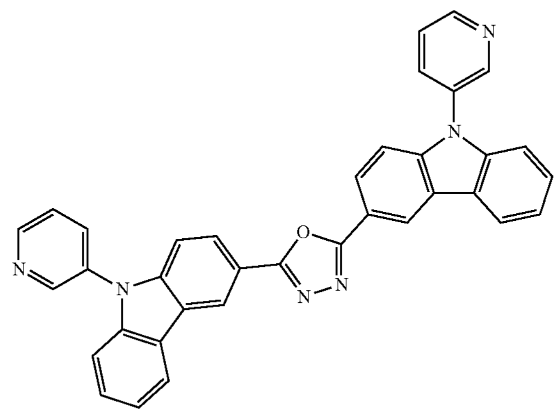
C 101
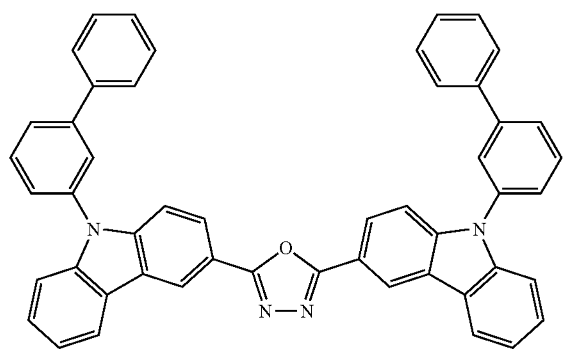
C 102
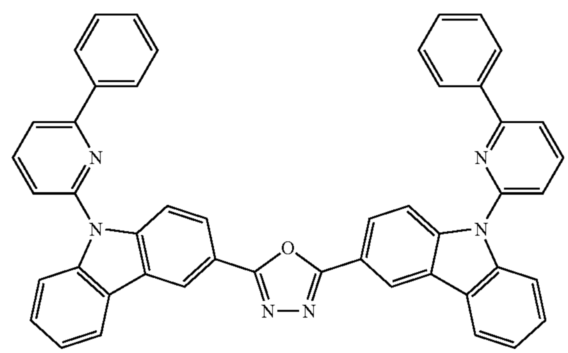
C 103
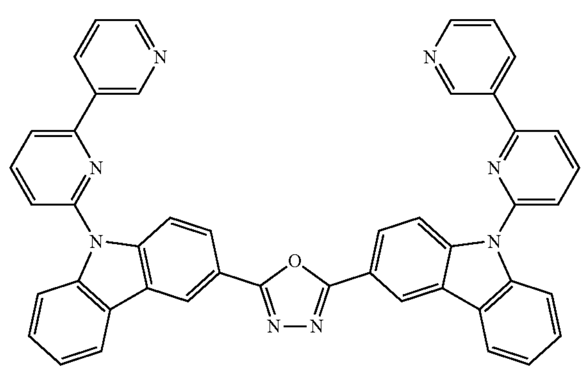
C 104
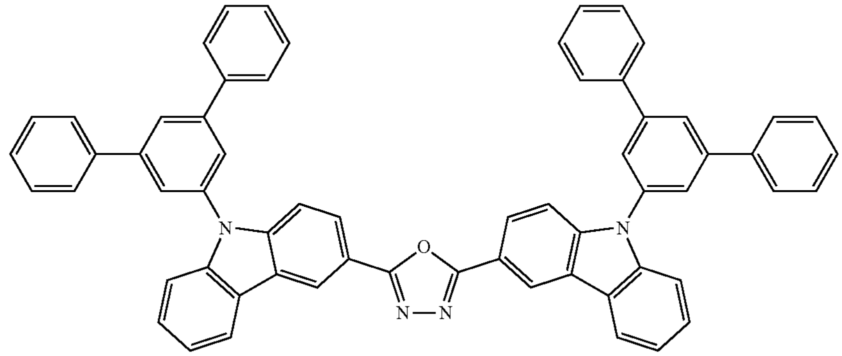

-continued
C 105
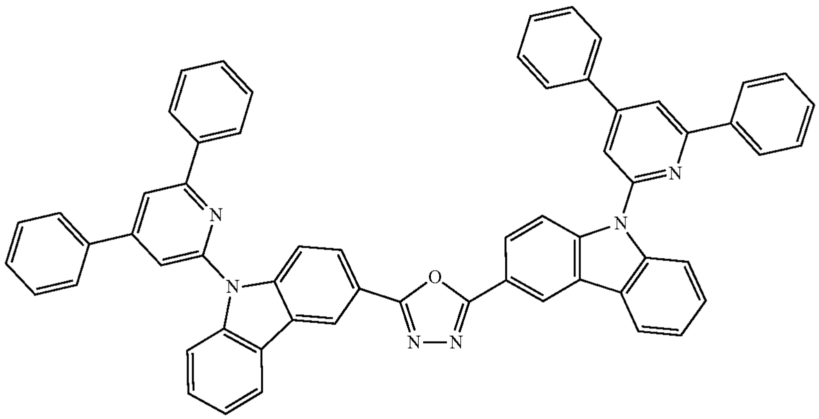
C 106
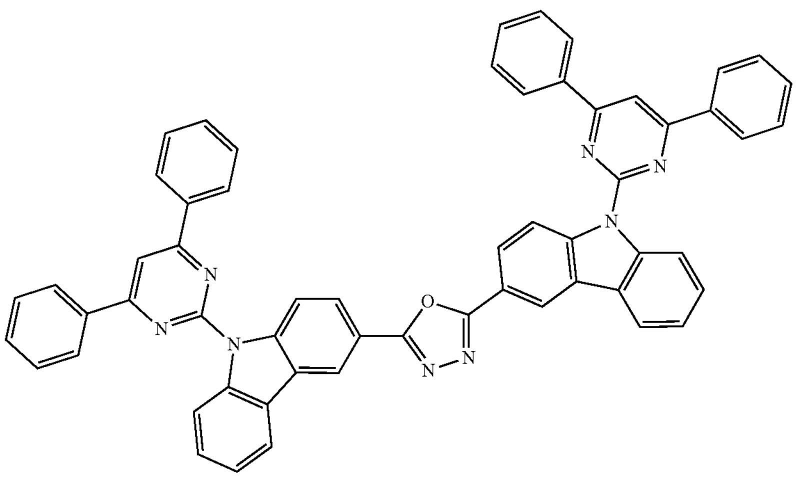
C 107
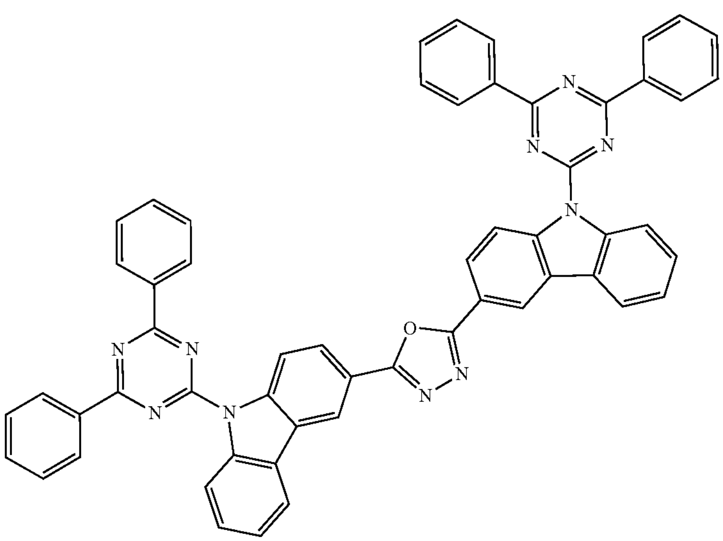

-continued
C 108
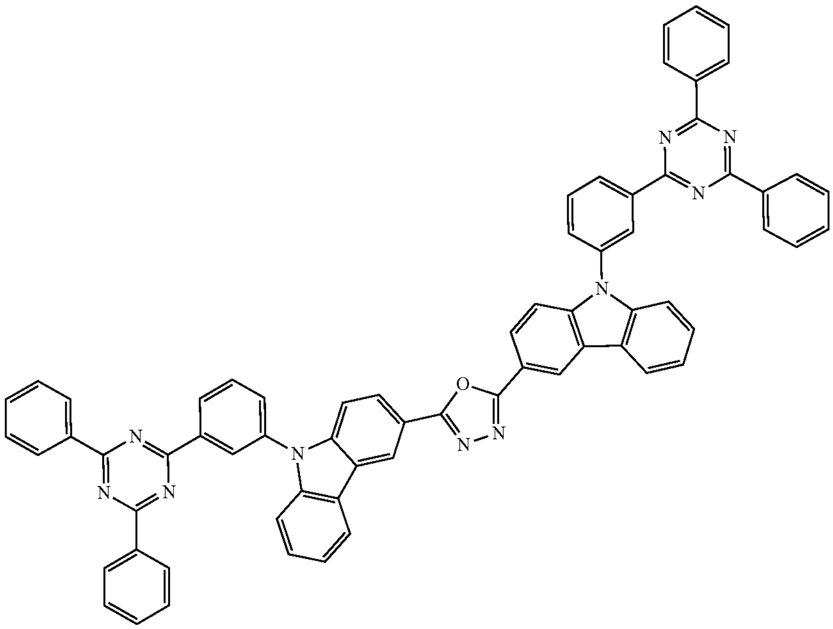
C 109
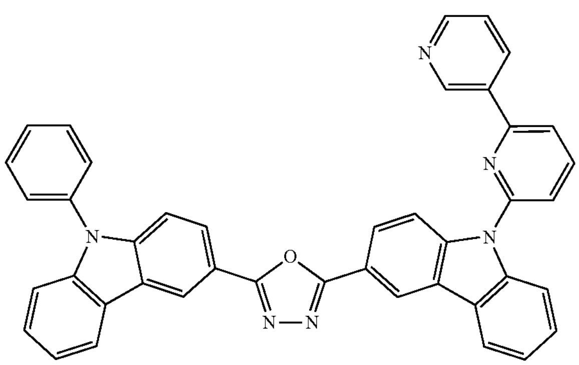
C 110
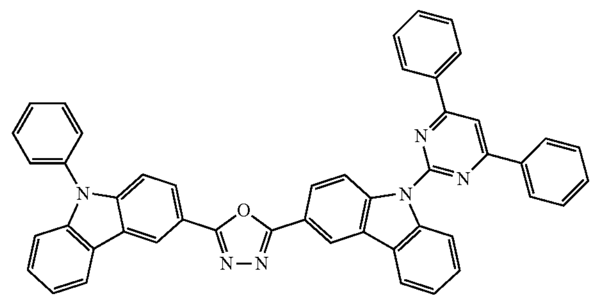
C 111
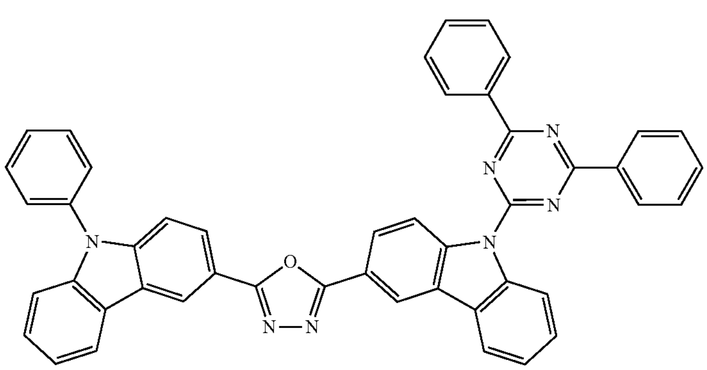

-continued
C 112
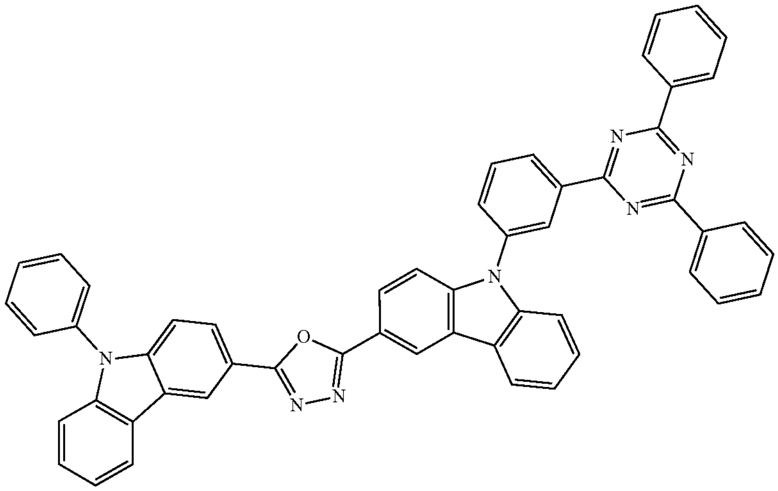
C 113
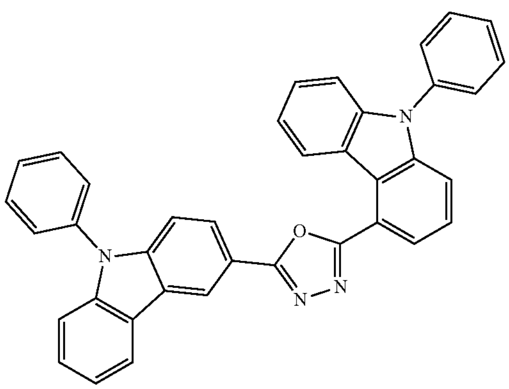
C 114
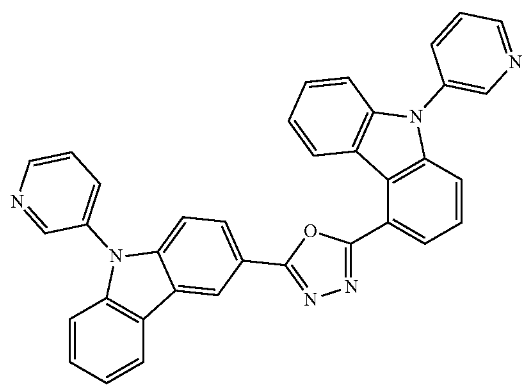
C 115
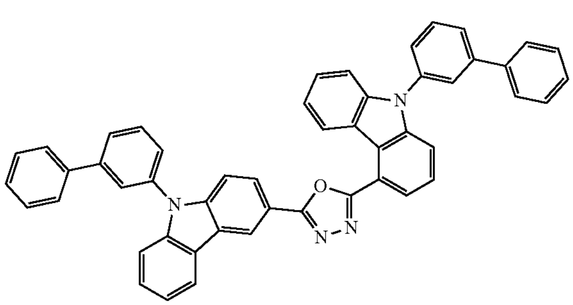
C 116
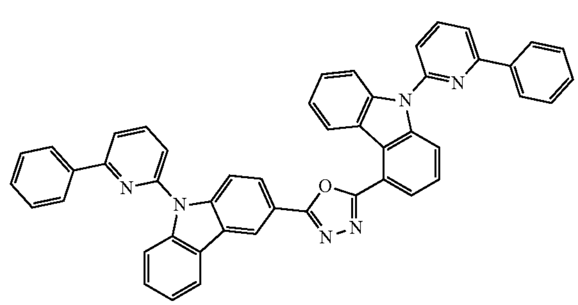

-continued
C 117
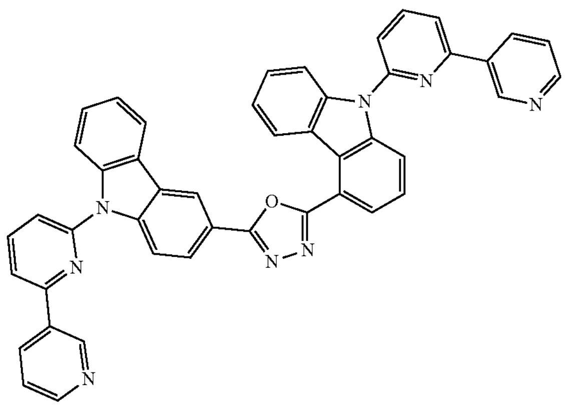
C 118
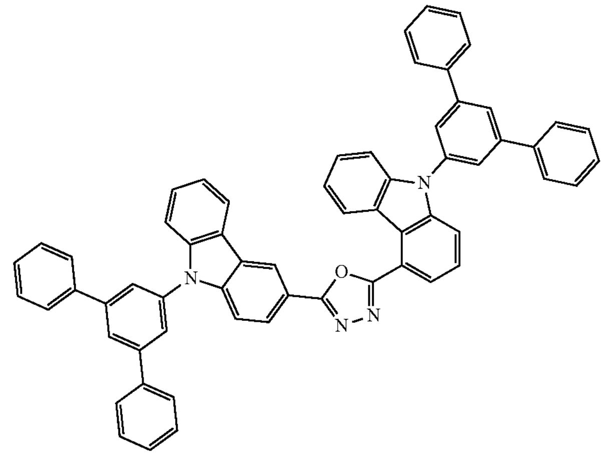
C 119
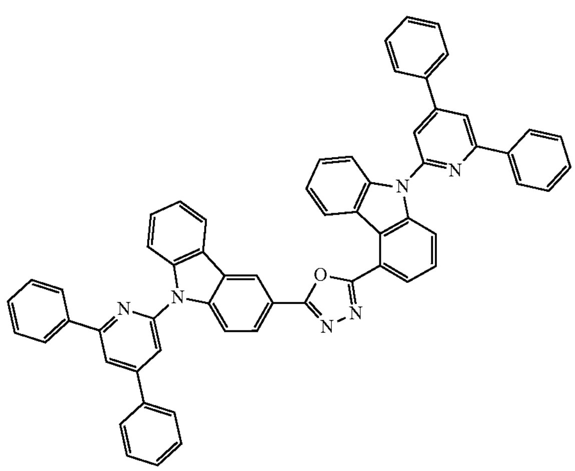
C 120
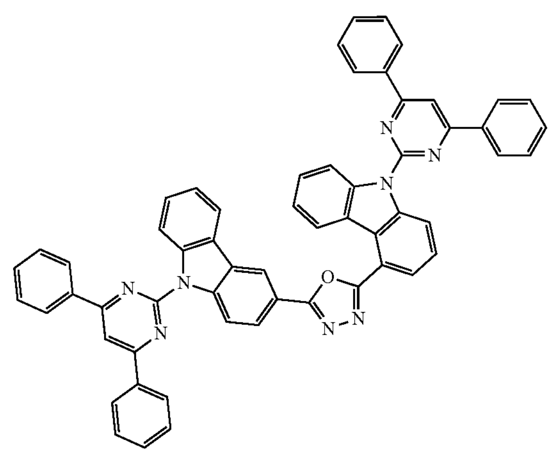
C 121
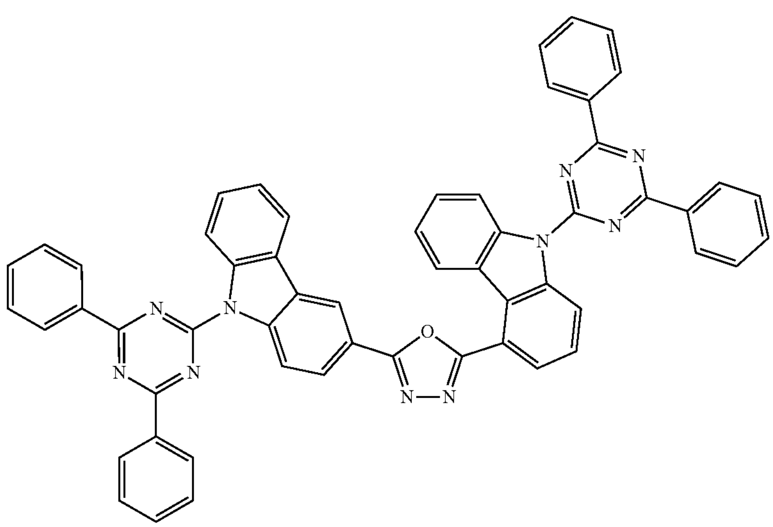

-continued
C 122
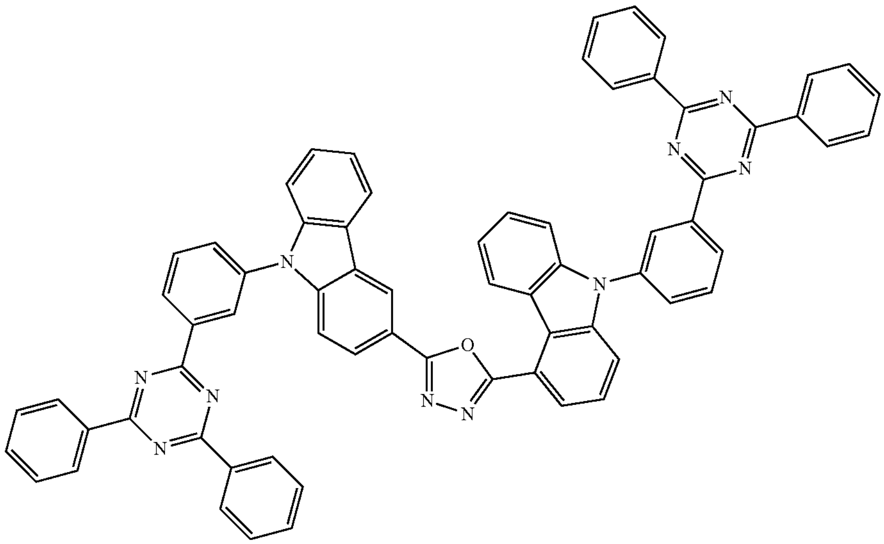
C 123
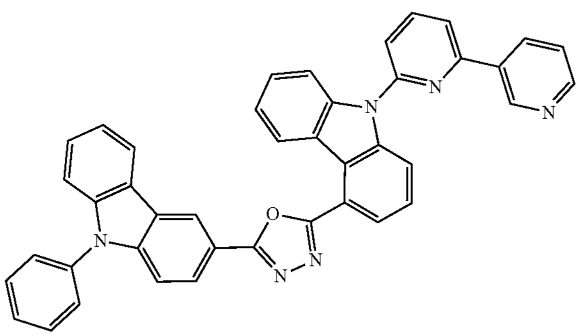
C 124
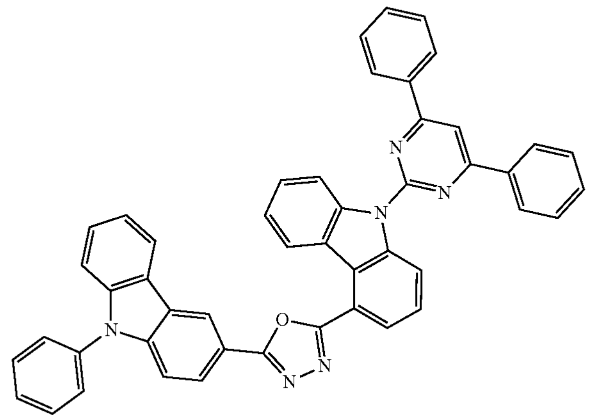
C 125
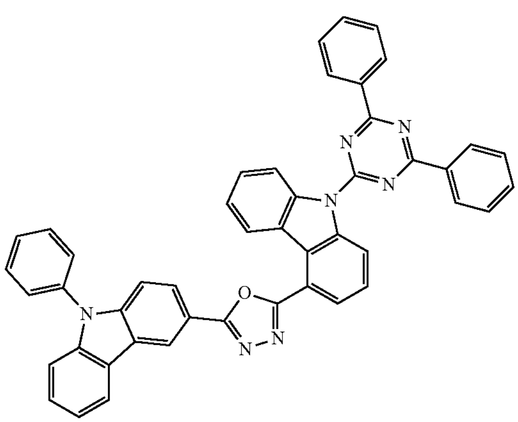
C 126
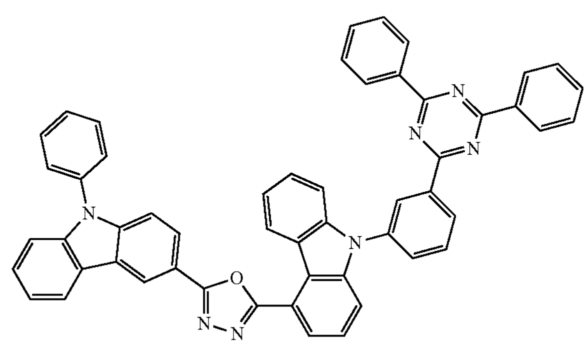

-continued
C 127
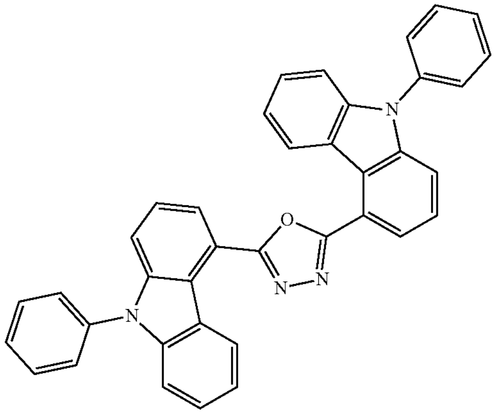
C 128
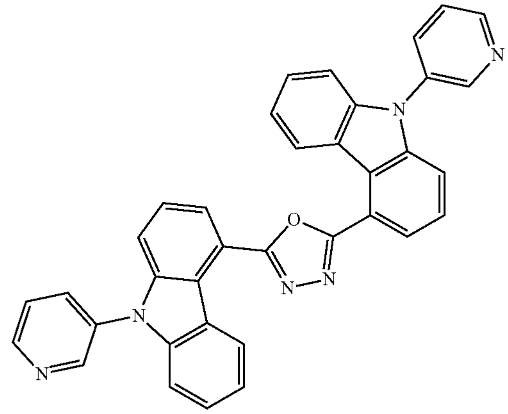
C 129
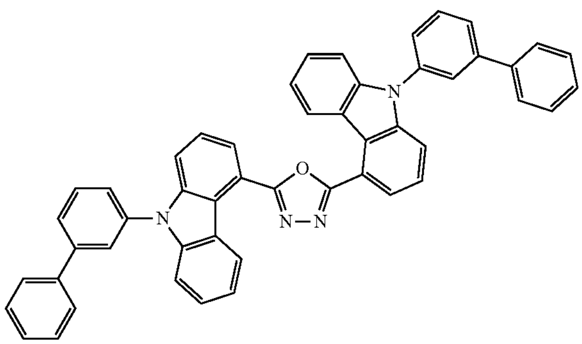
C 130
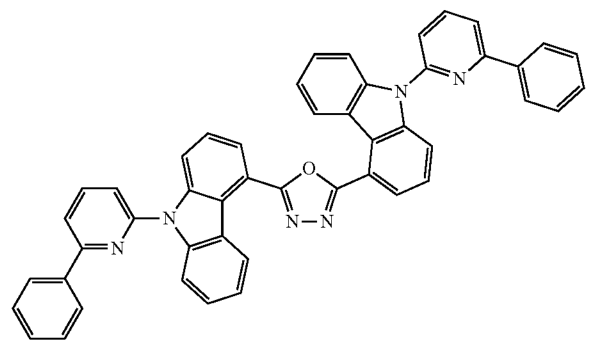
C 131
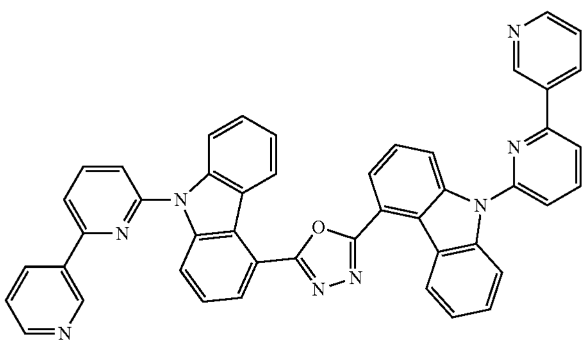
C 132
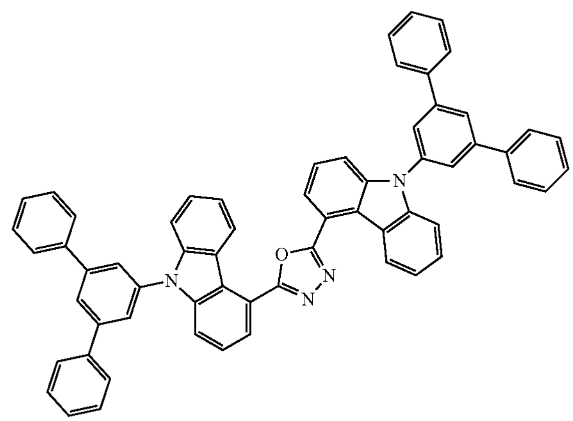
C 133
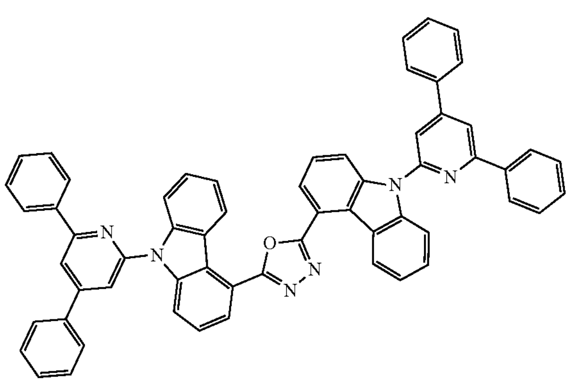
C 134
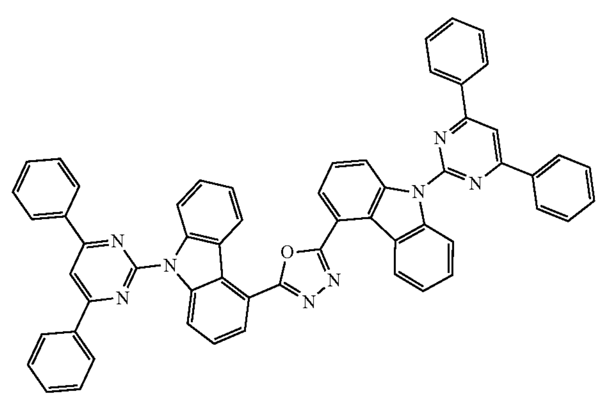

-continued
C 135
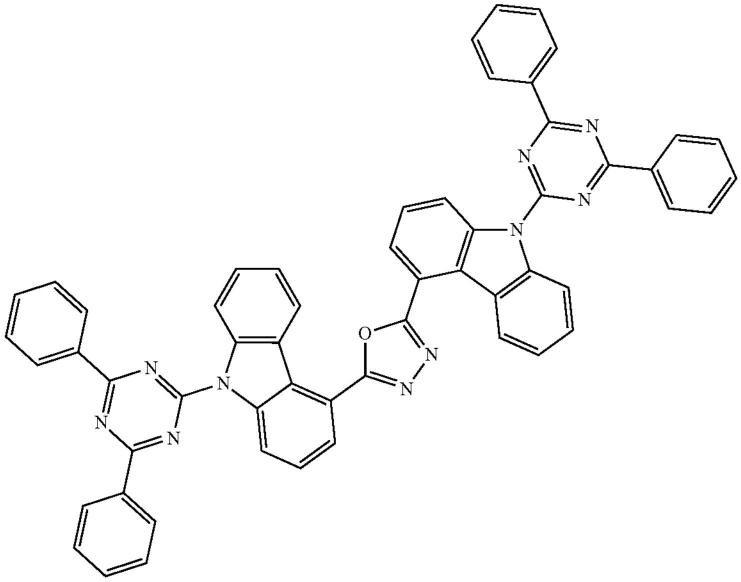
C 136
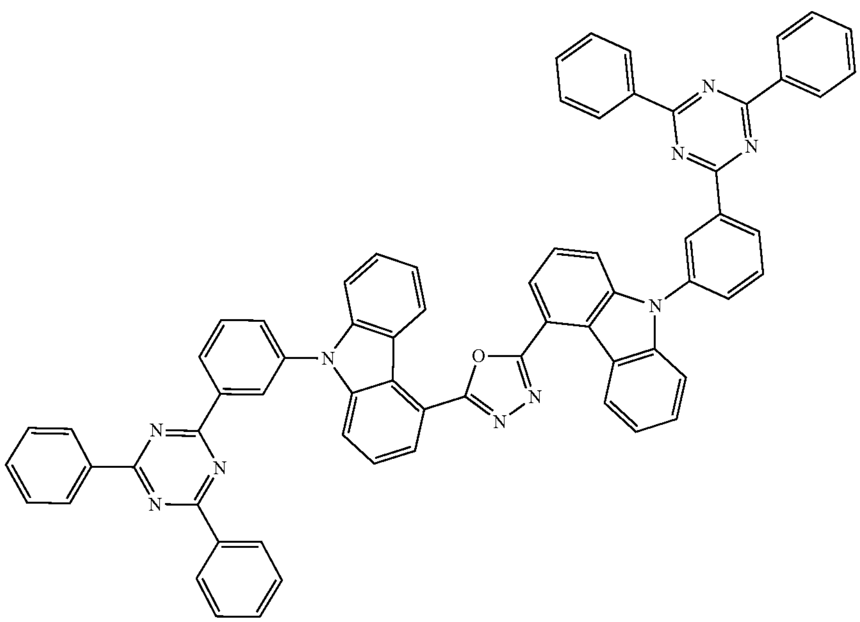
C 137
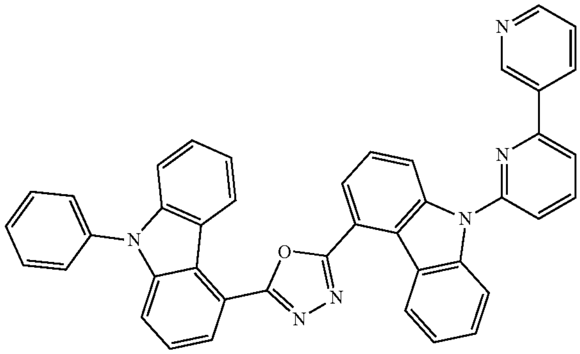
C 138
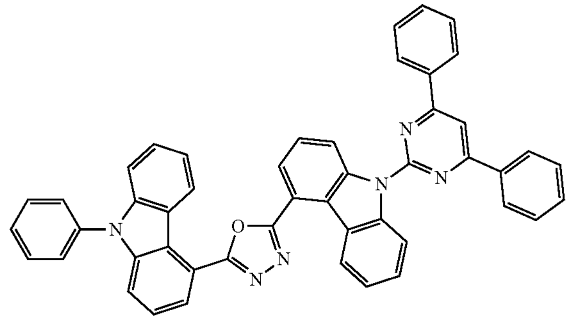

-continued
C 139
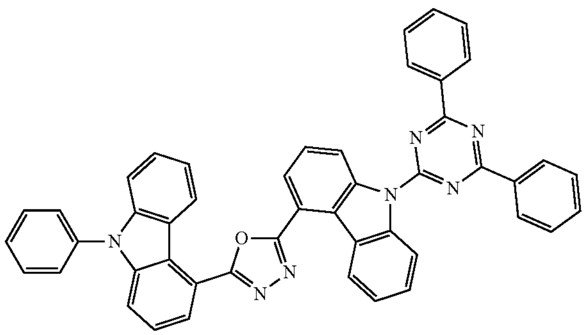
C 140
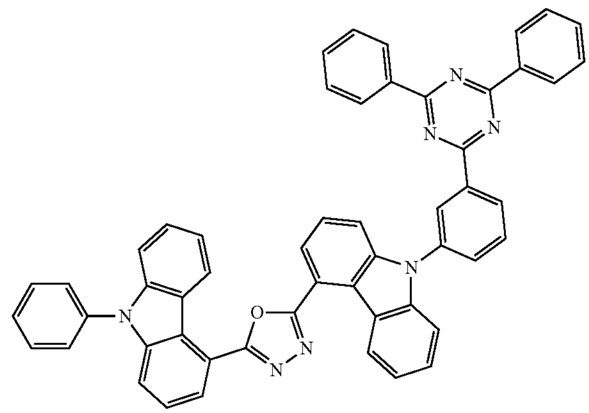
C 141
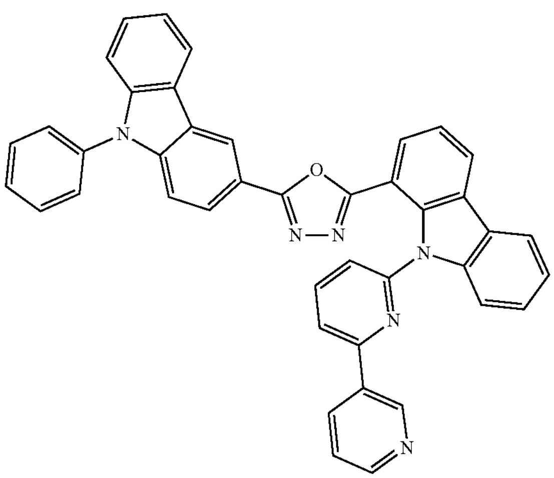
C 142
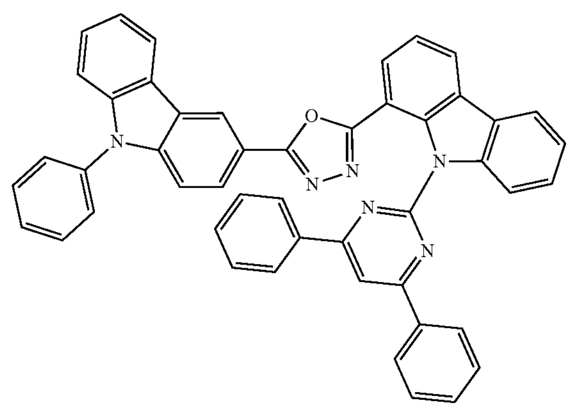
C 143
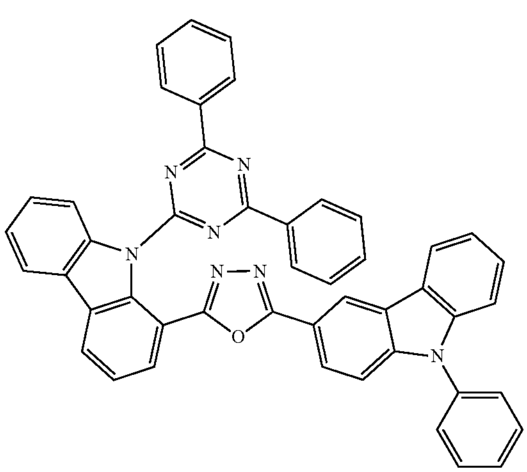
C 144
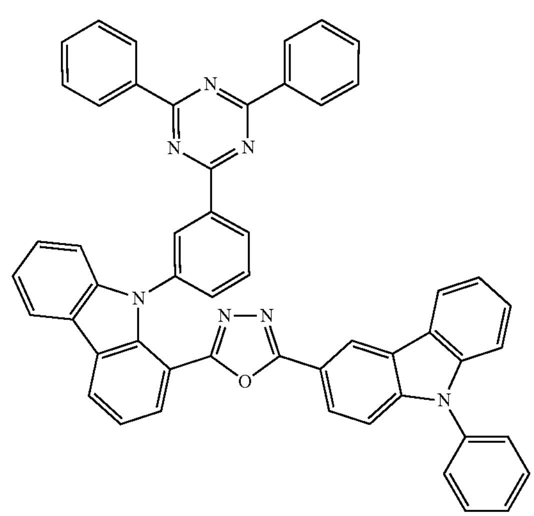

-continued
C 145
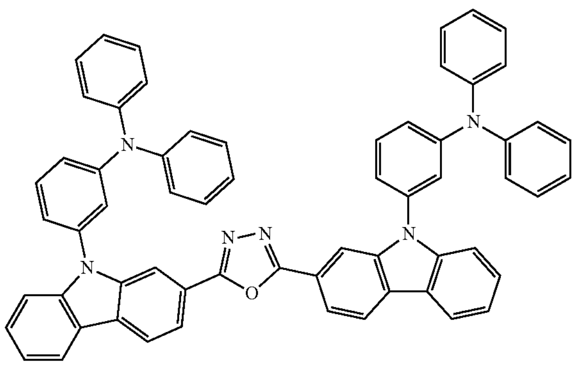
C 146
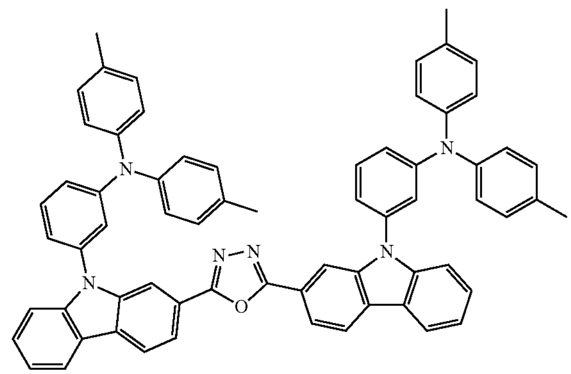
C 147
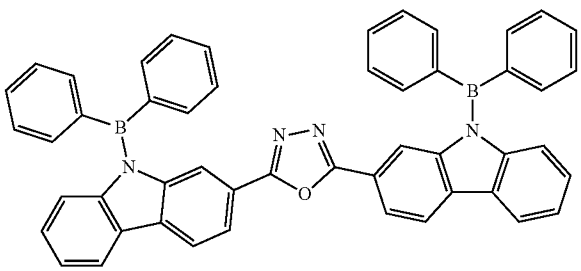
C 148
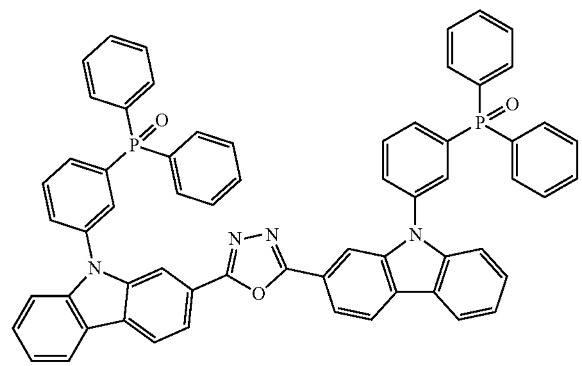
C 149
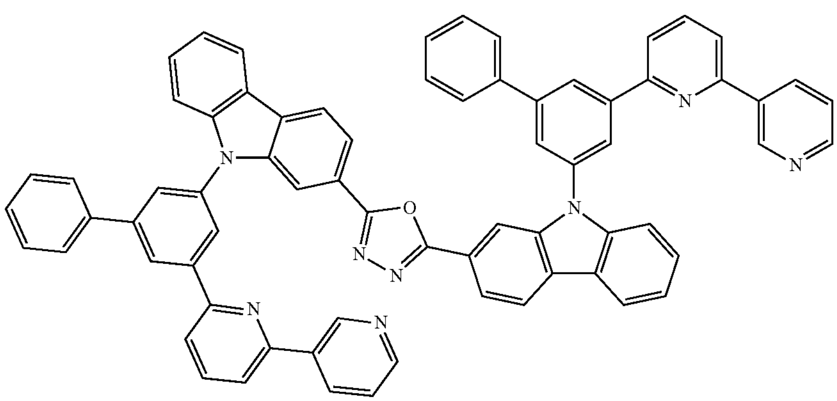
C 150
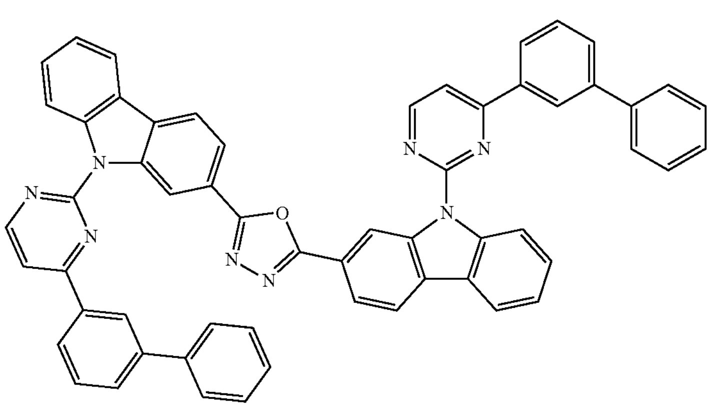

-continued
C 151
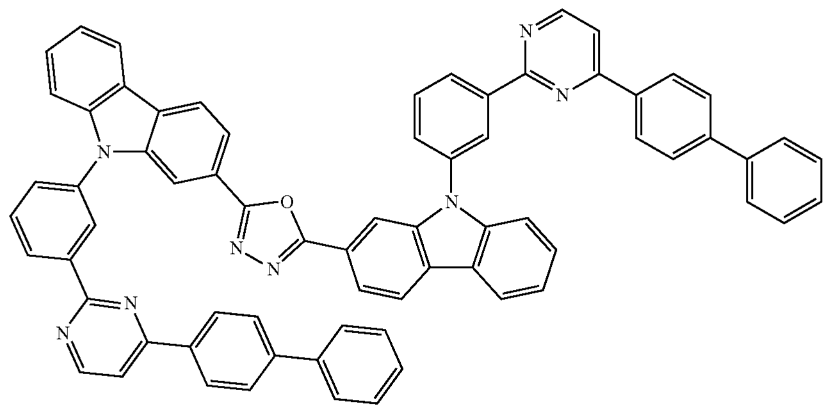
C 152
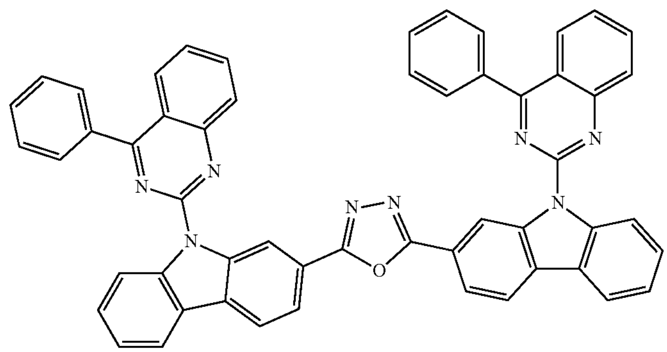
C 153
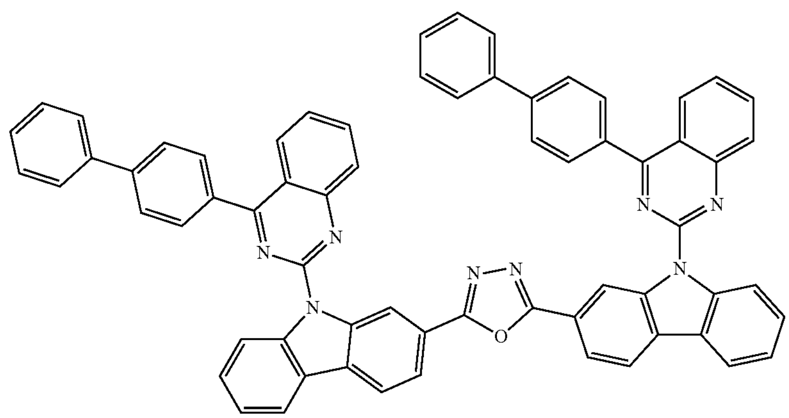
C 154
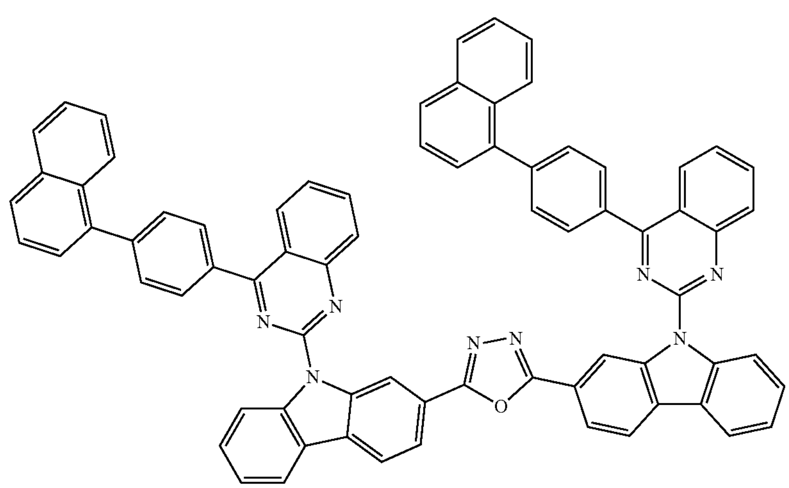

-continued
C 155
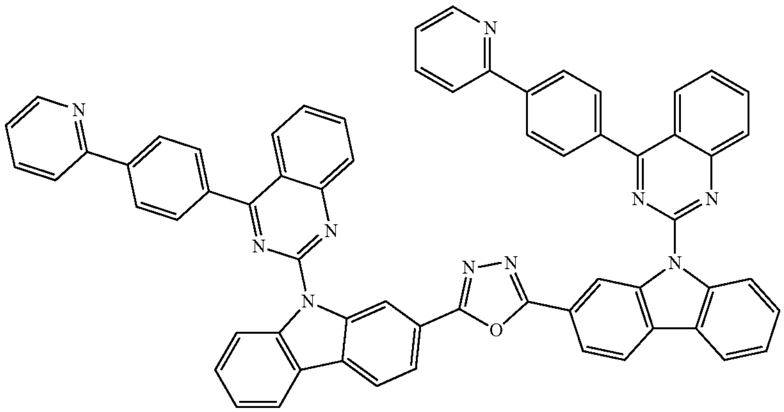
C 156
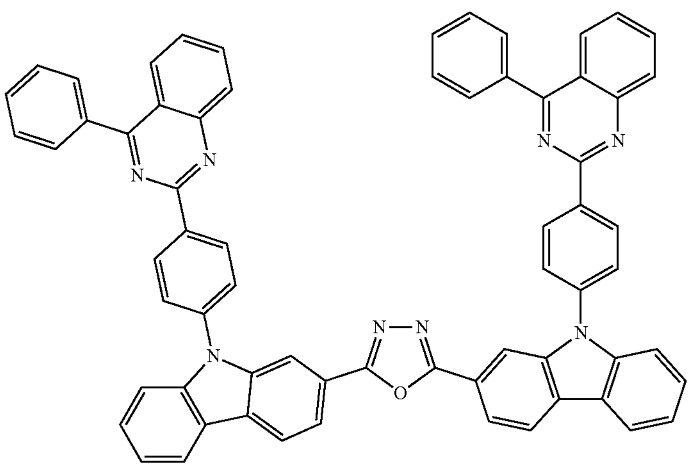
C 157
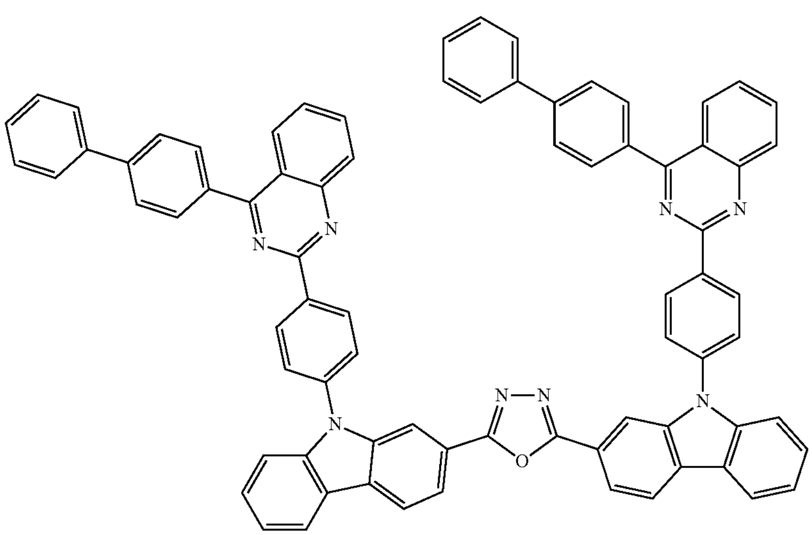

-continued
C 158
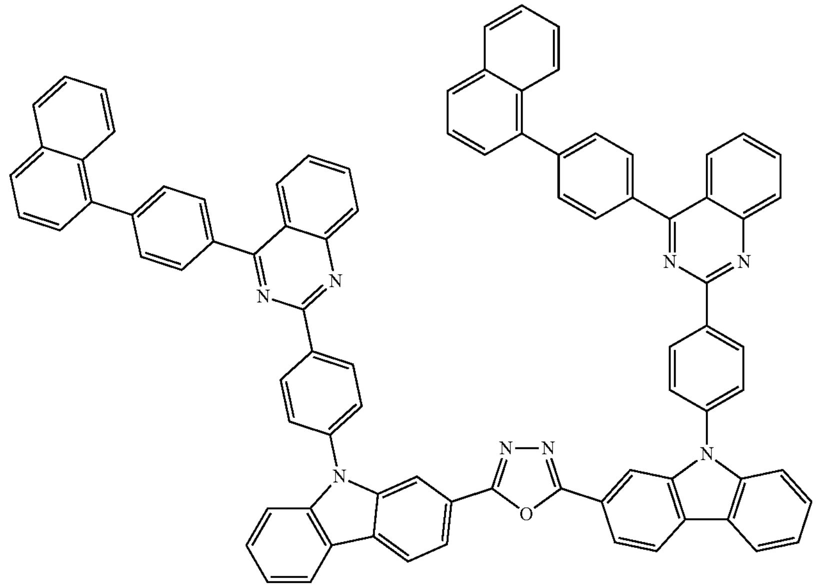
C 159
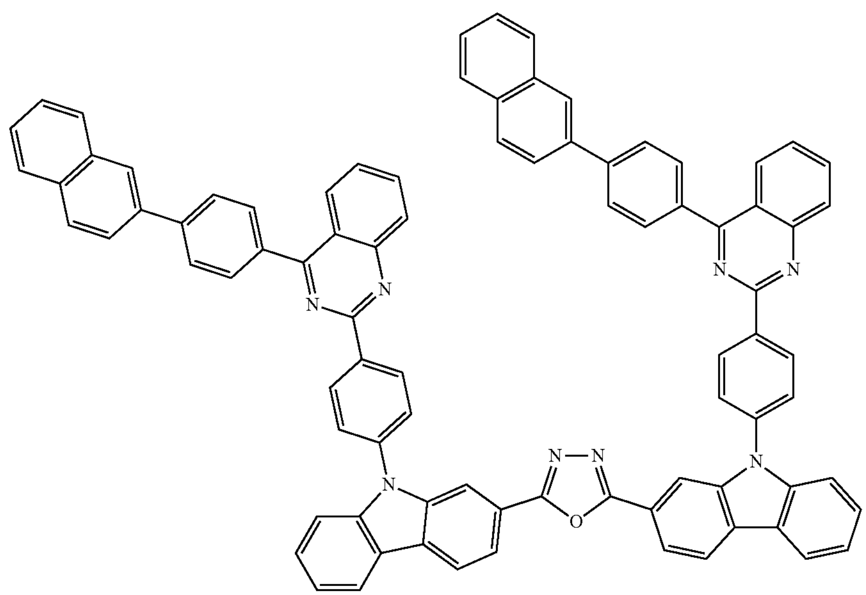
C 160
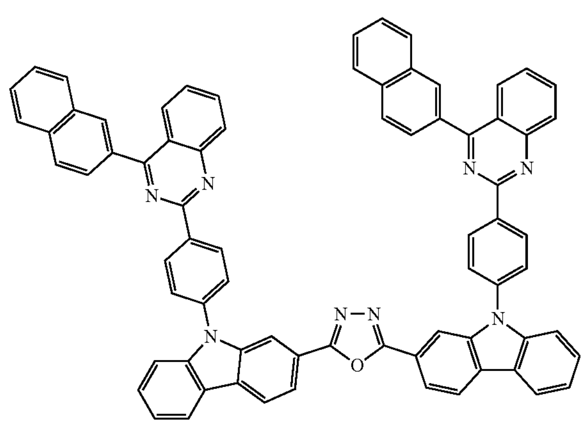
C 161
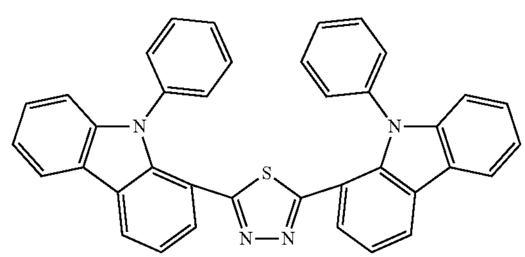

-continued
C 162
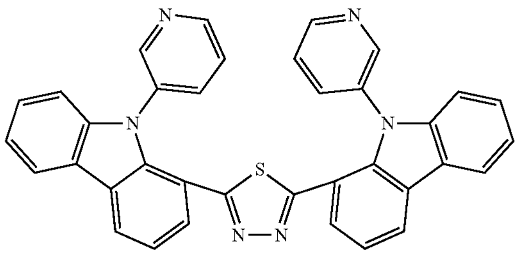
C 163
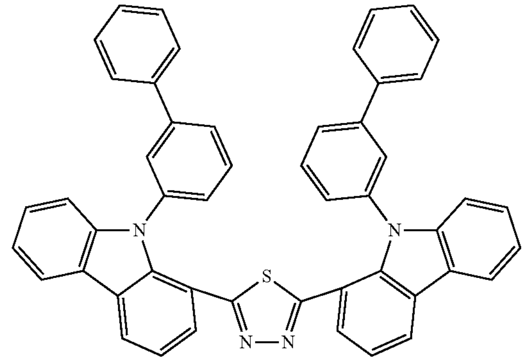
C 164
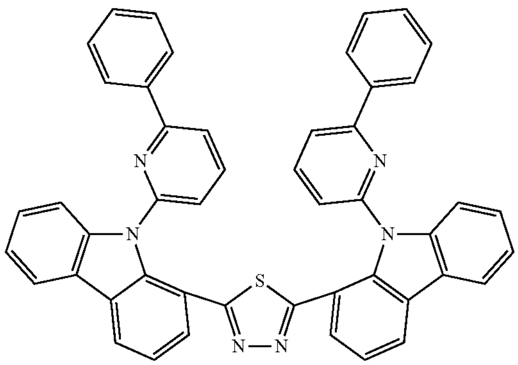
C 165
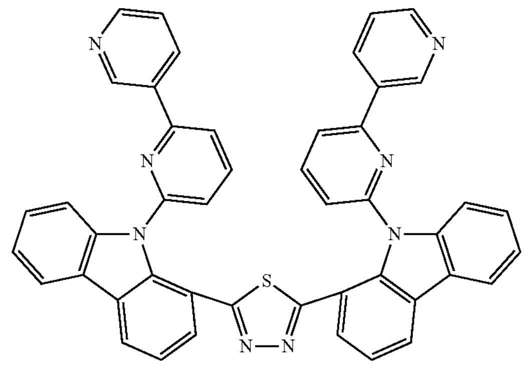
C 166
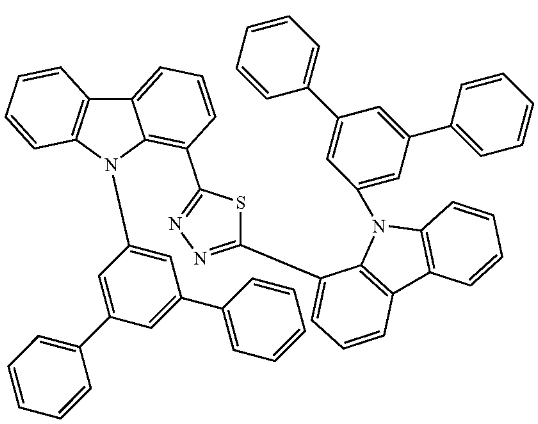
C 167
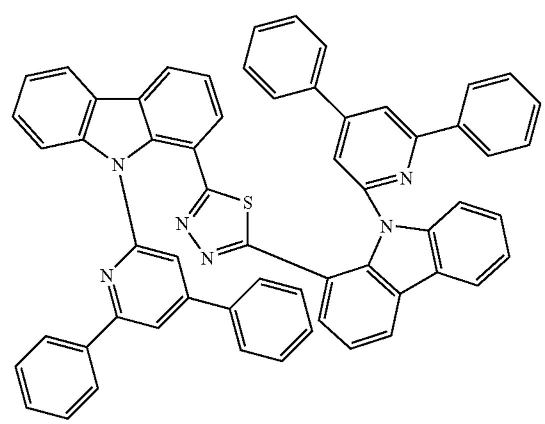
C 168
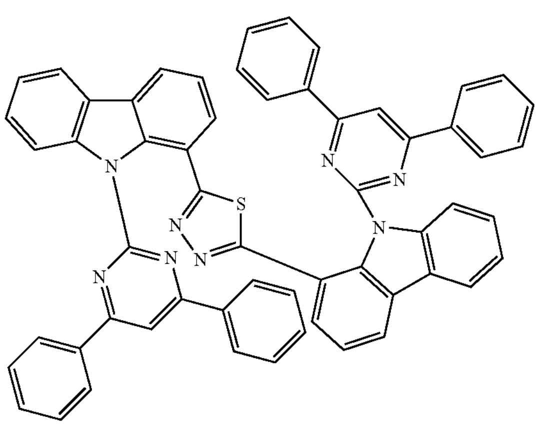
C 169
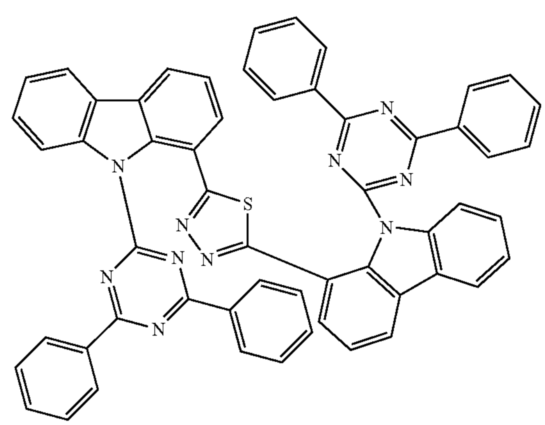

-continued
C 170
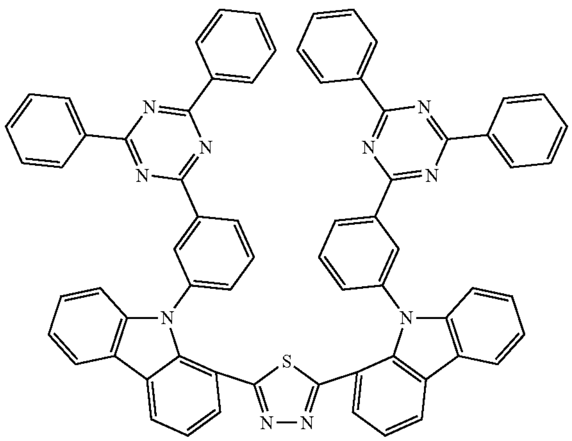
C 171
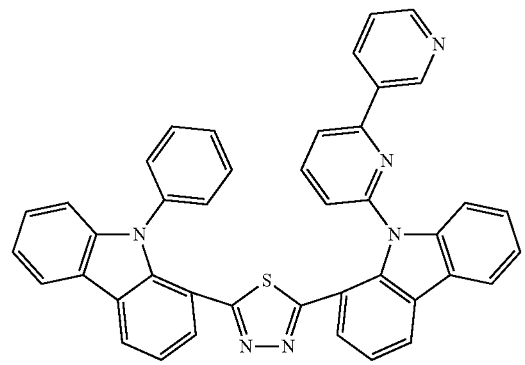
C 172
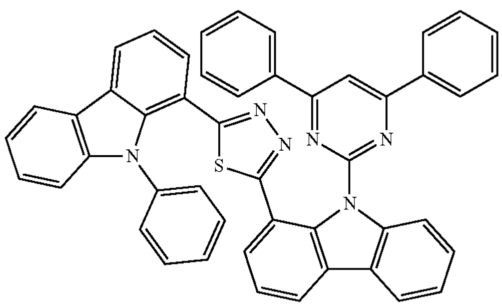
C 173
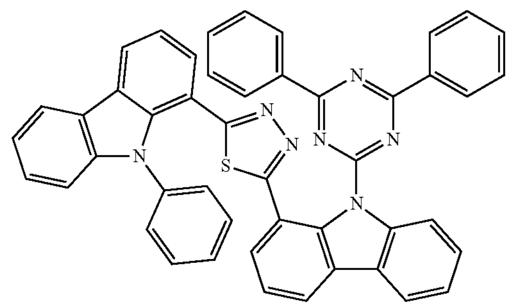
C 174
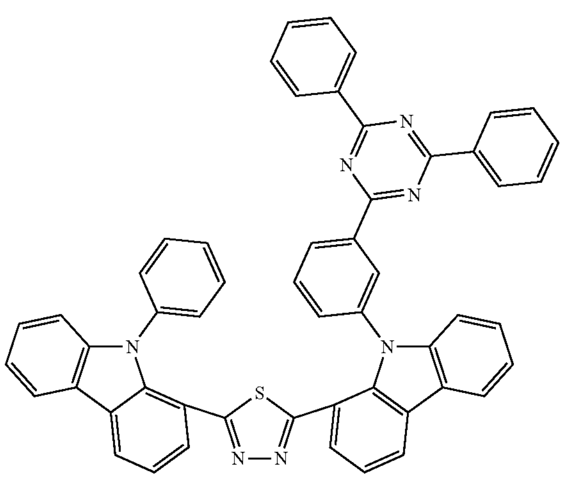
C 175
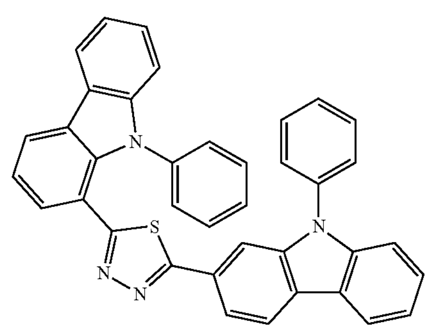

-continued
C 176
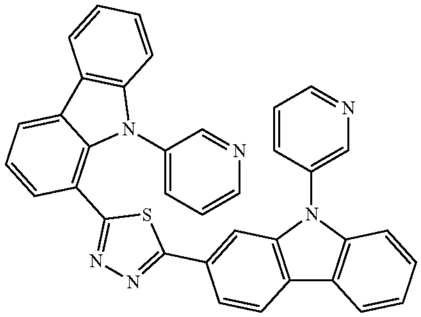
C 177
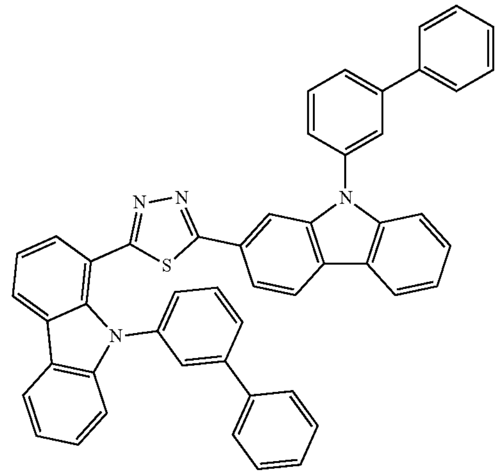
C 178
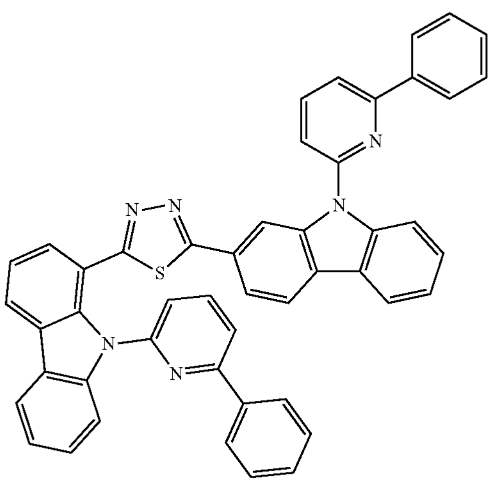
C 179
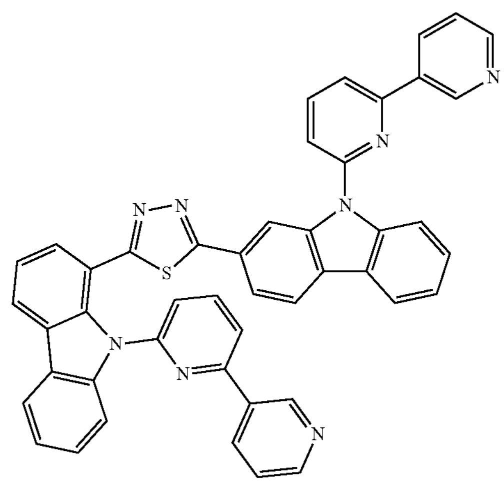
C 180
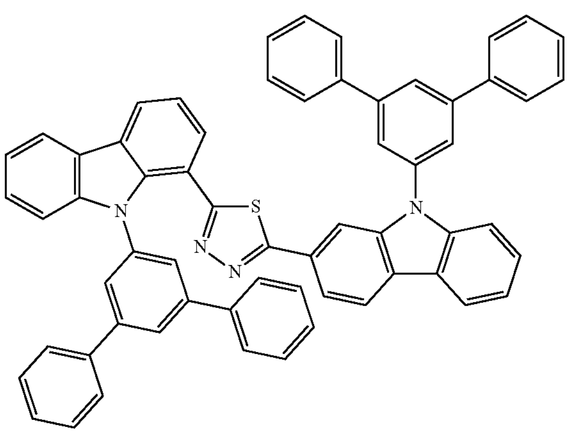
C 181
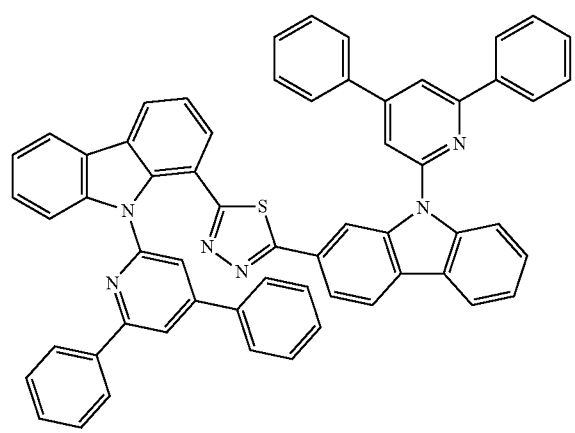

-continued
C 182
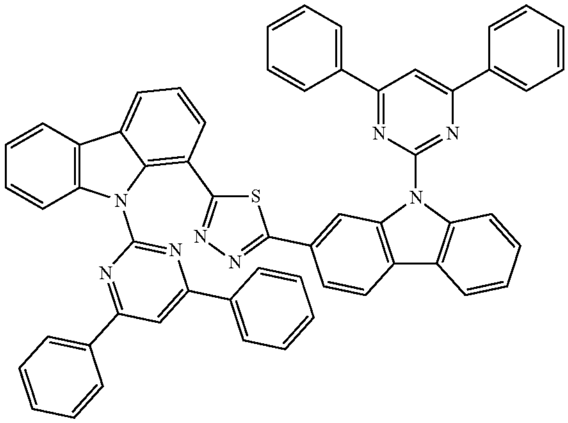
C 183
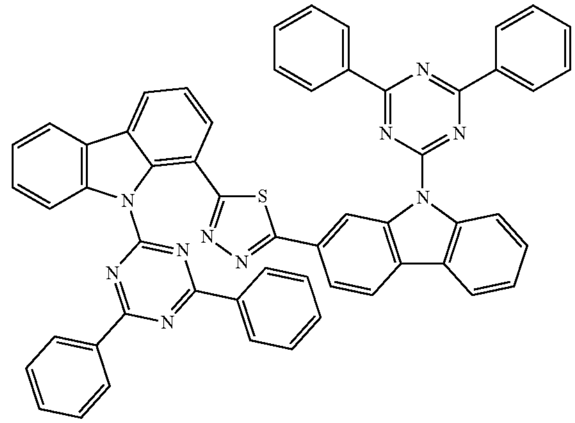
C 184
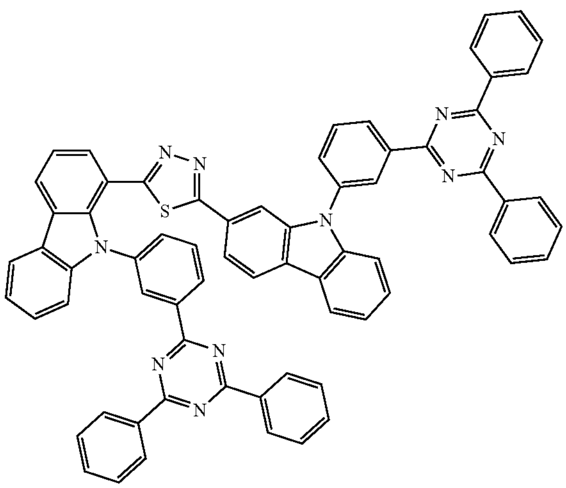
185
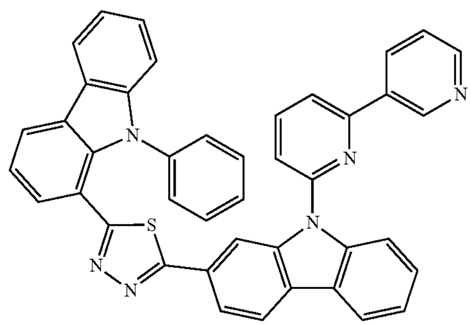
C 186
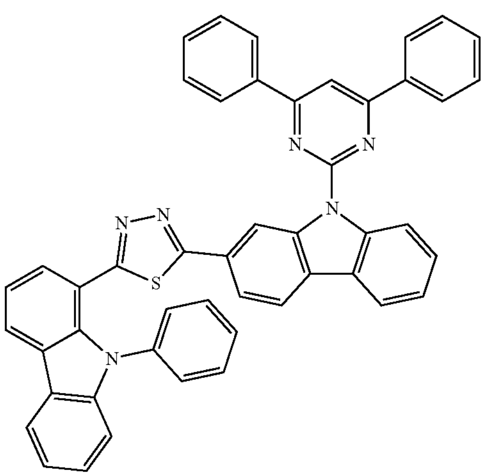
C 187
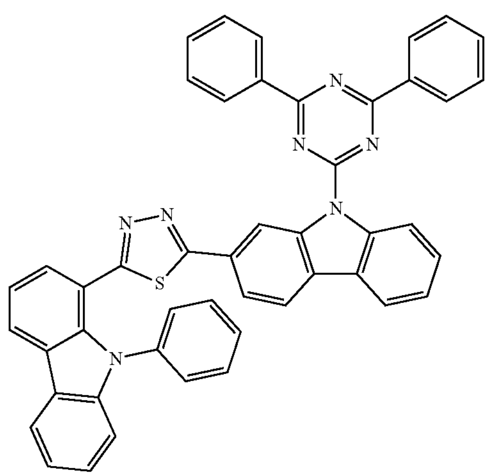

-continued
C 188
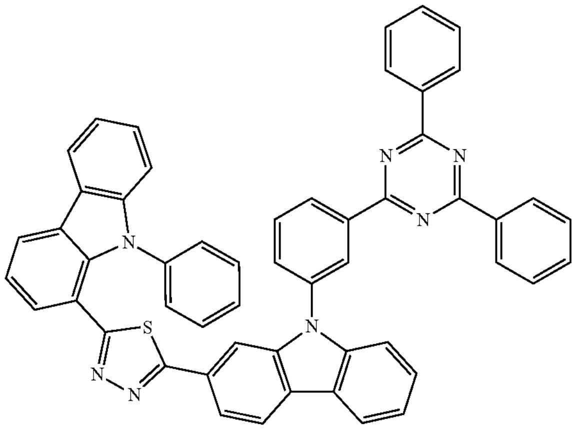
C 189
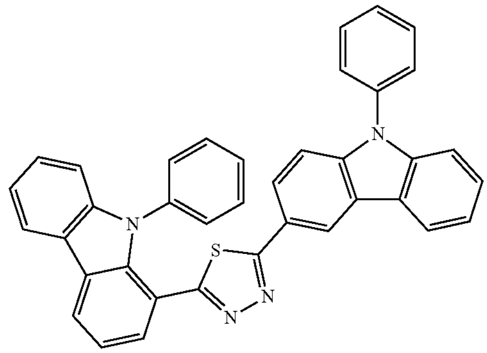
C 190
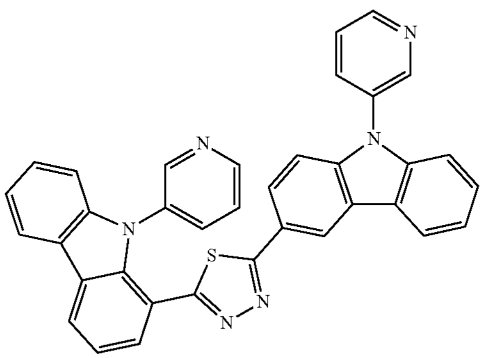
C 191
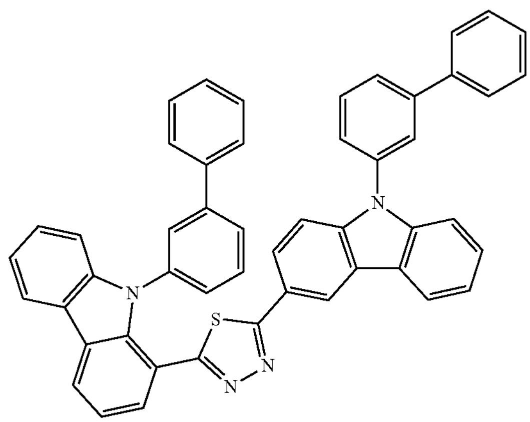
C 192
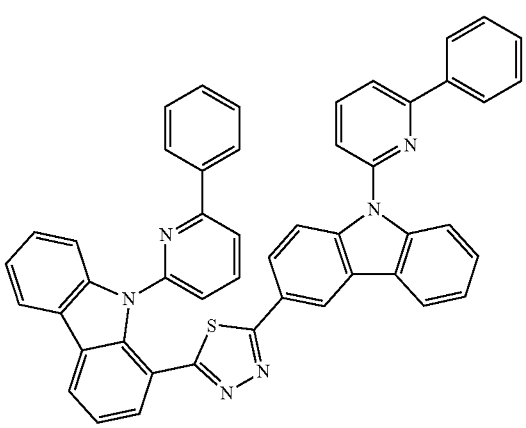
C 193
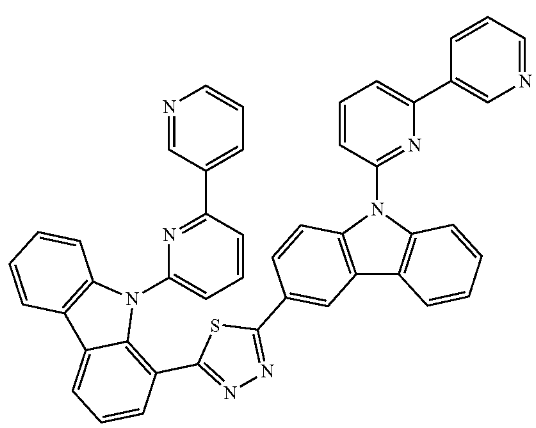

-continued
C 194
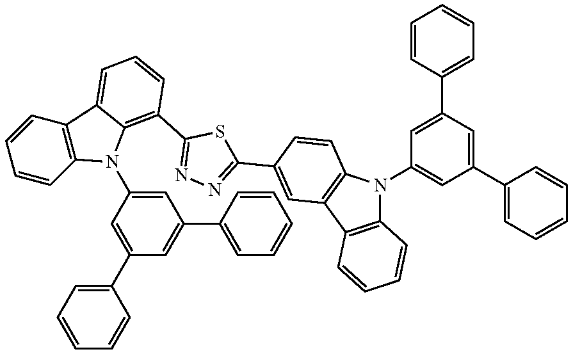
C 195
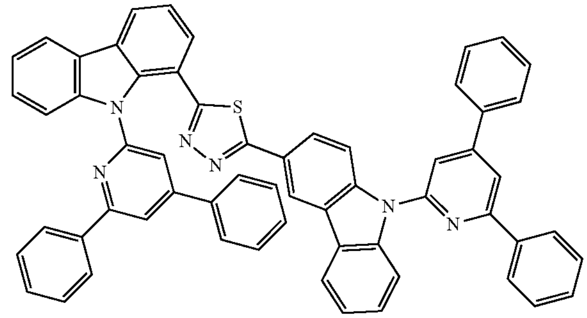
C 196
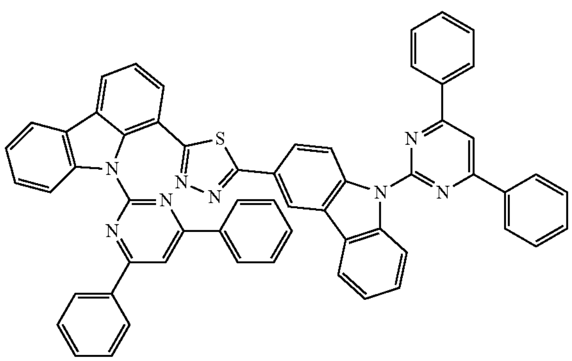
C 197
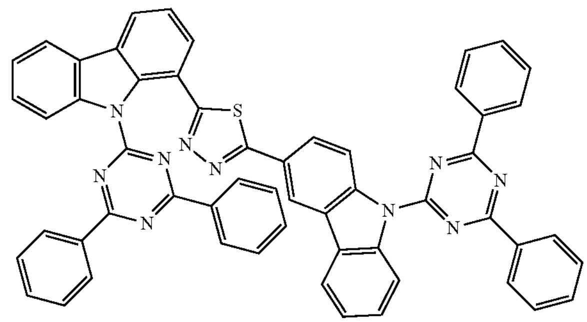
C 198
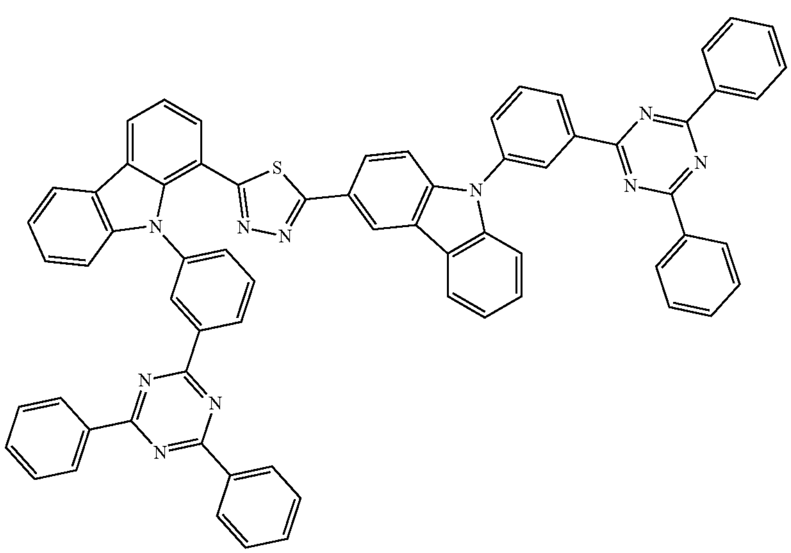

-continued
C 199
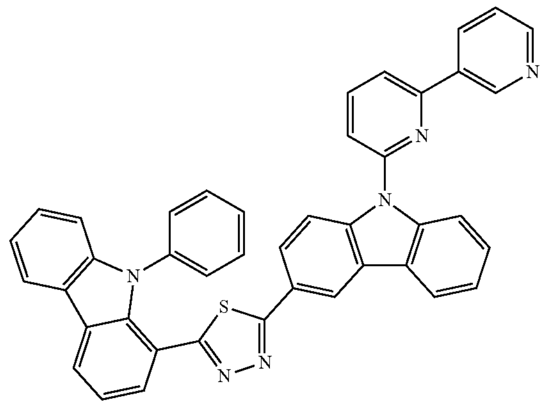
C 200
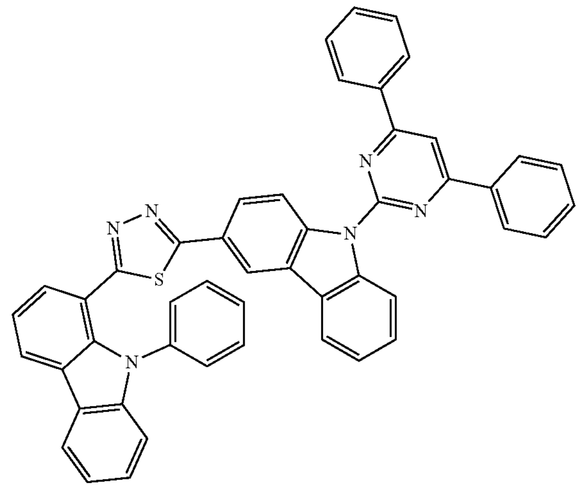
C 201
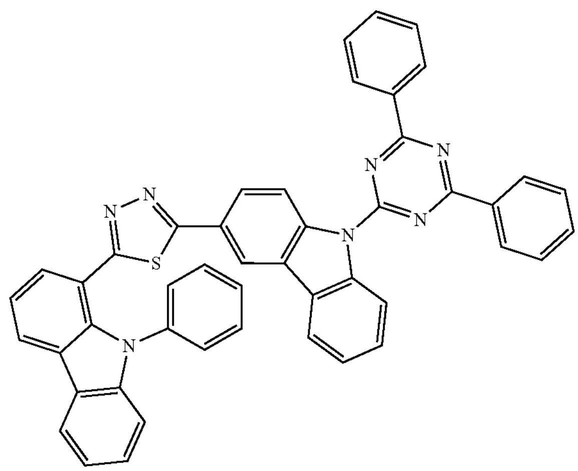
C 202
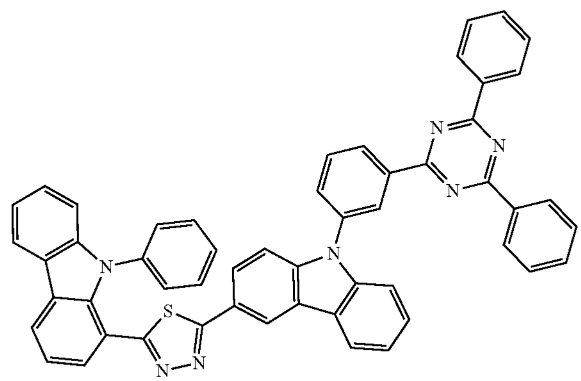
C 203
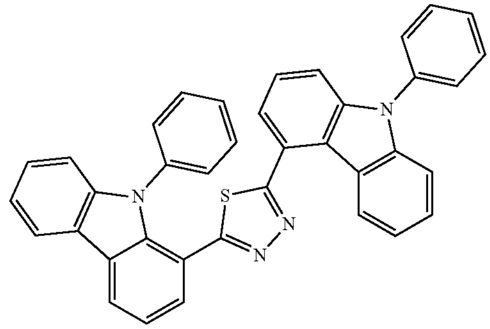
C 204
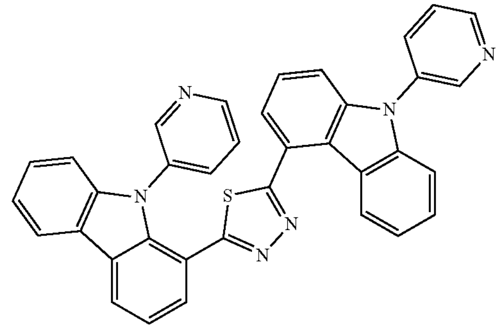

-continued
C 205
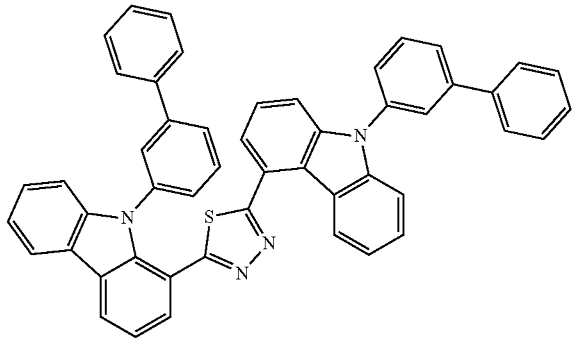
C 206
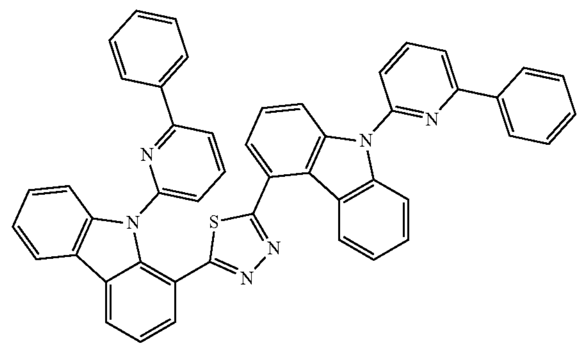
C 207
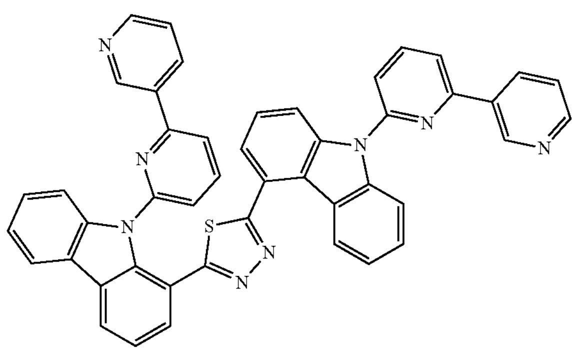
C 208
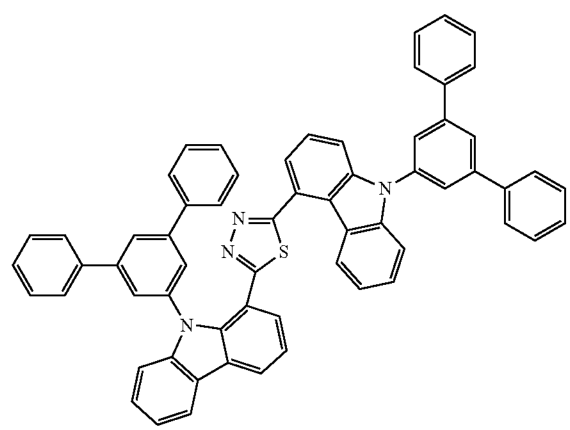
C 209
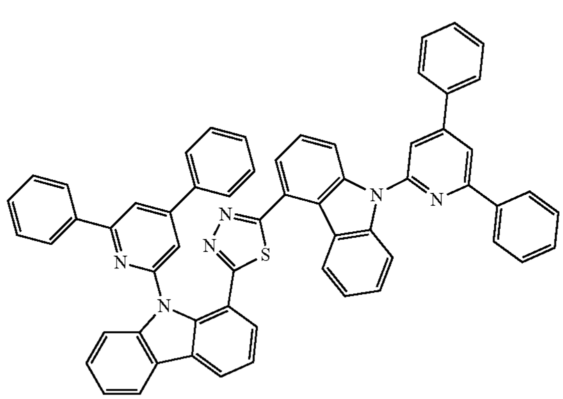
C 210
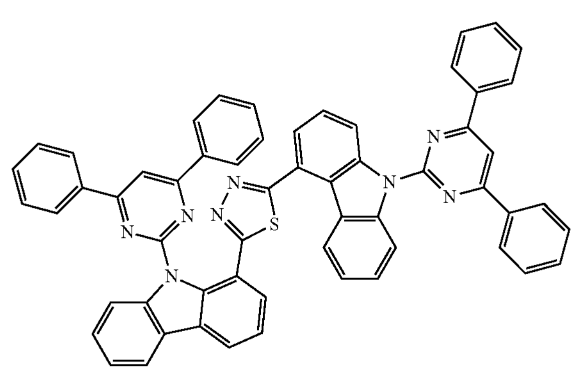

-continued
C 211
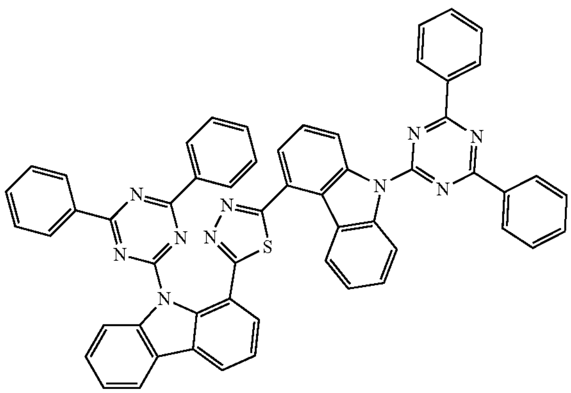
C 212
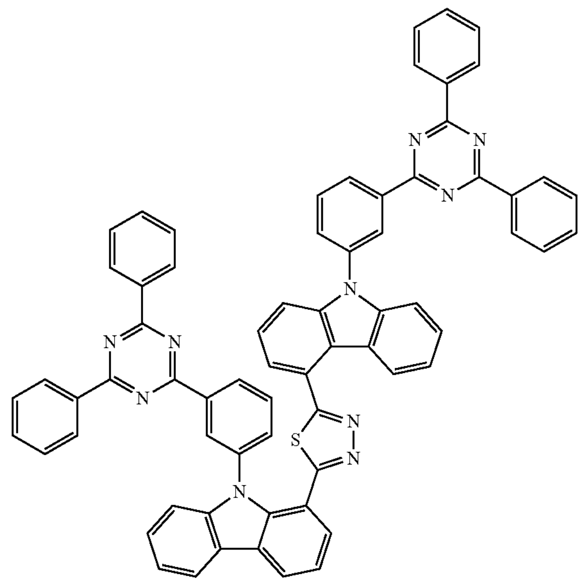
C 213
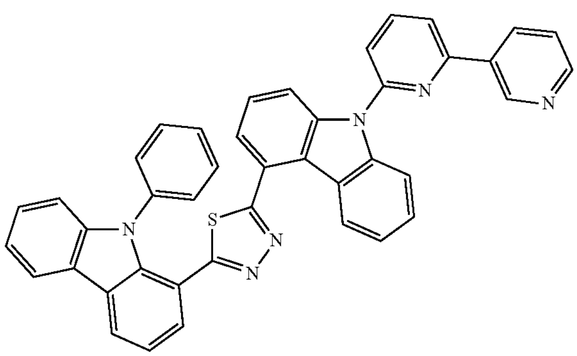
C 214
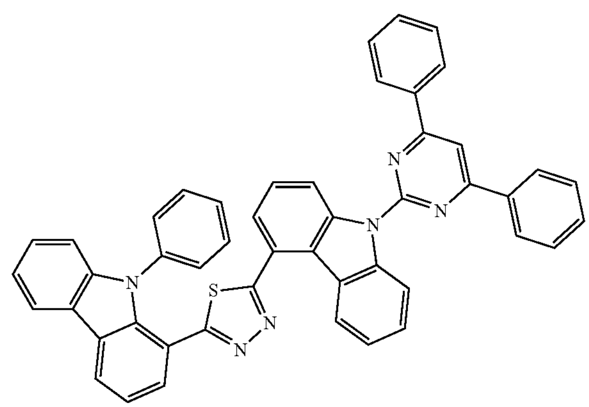
C 215
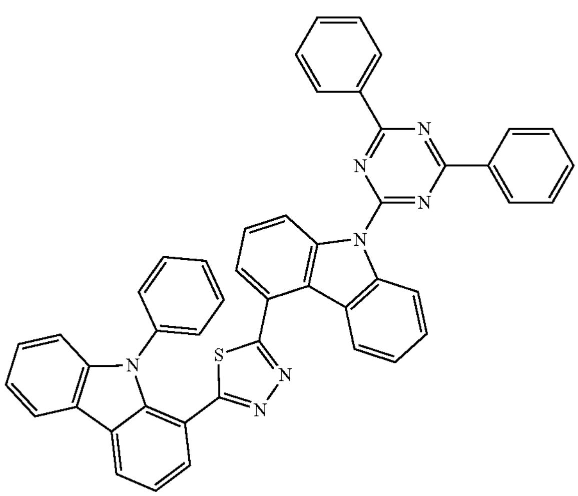
C 216
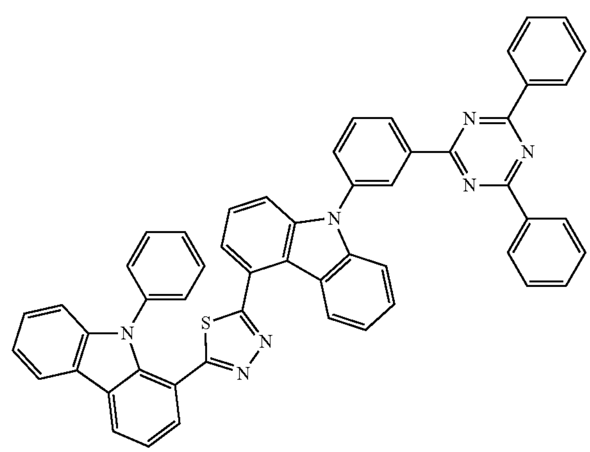

C217
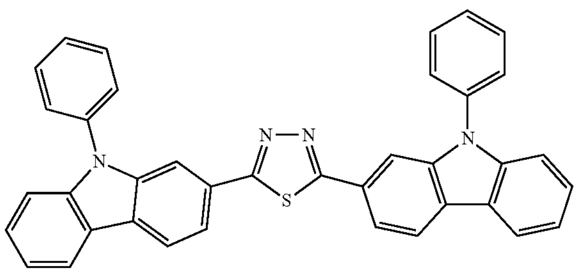
C218
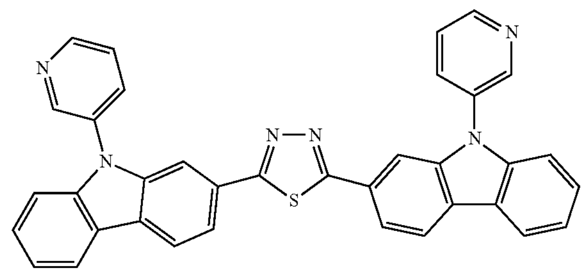
C 219
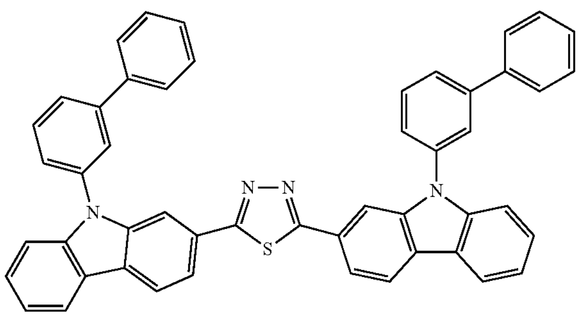
C 220
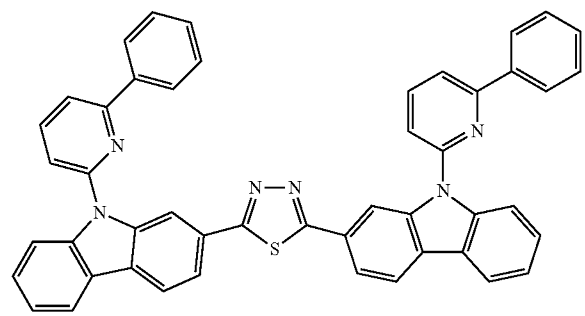
C 221
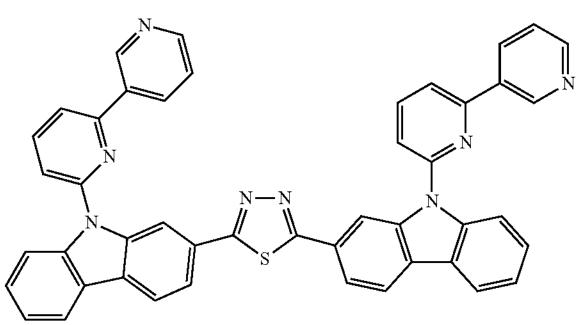
C 222
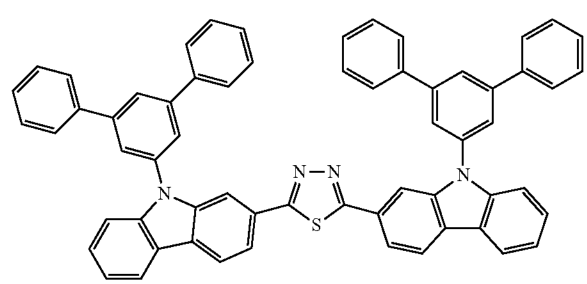
C 223
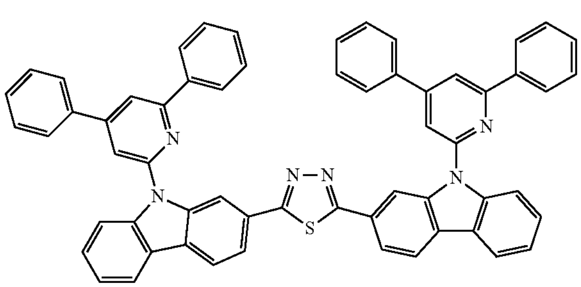
C 224
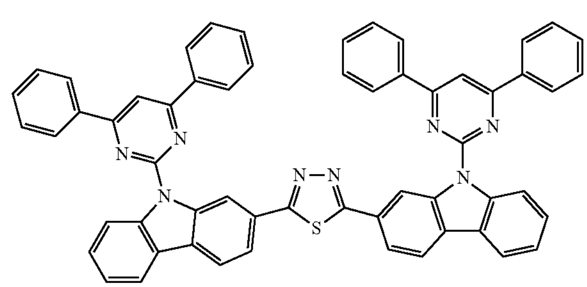

-continued
C 225
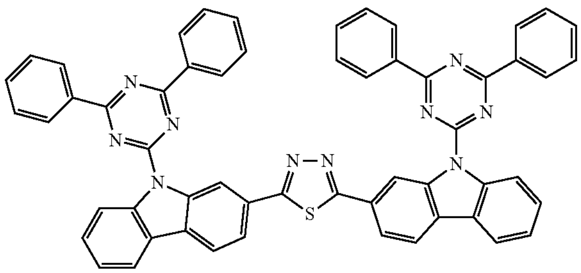
C 226
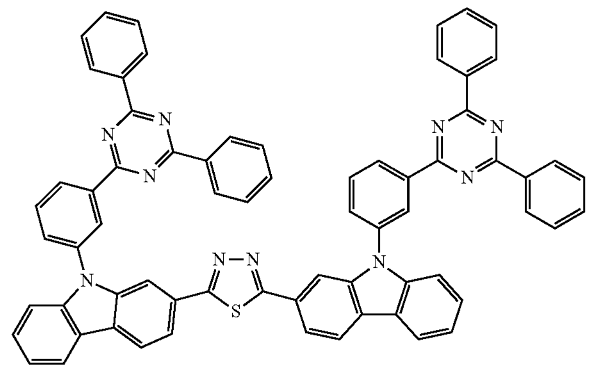
C 227
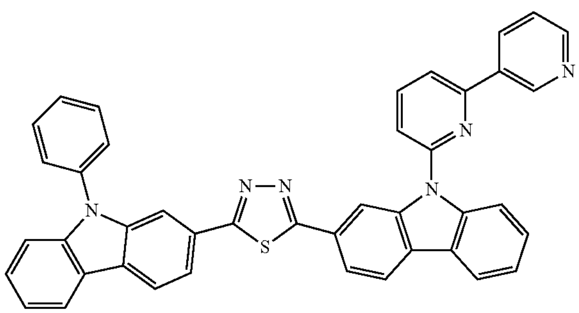
C 228
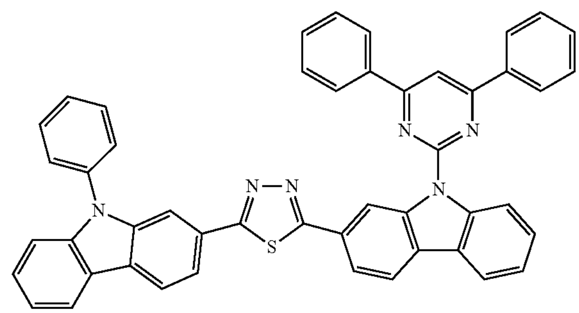
C 229
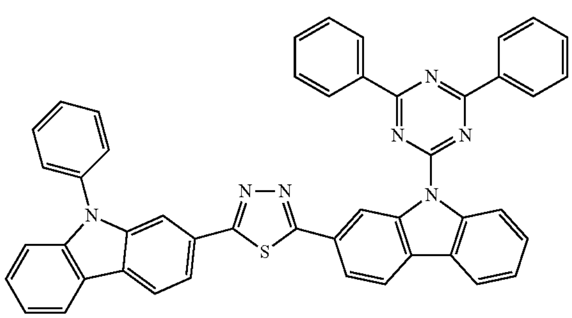
C 230
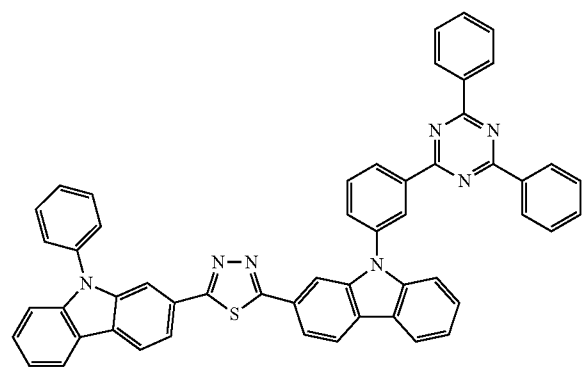
C 231
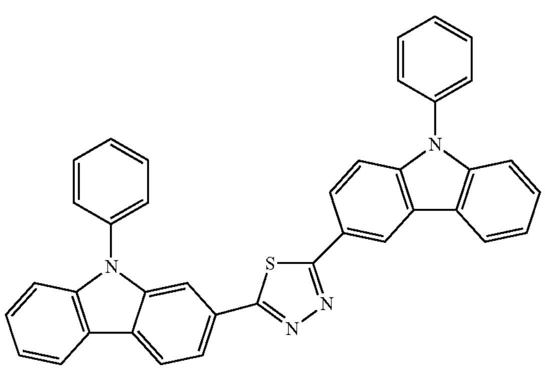
C 232
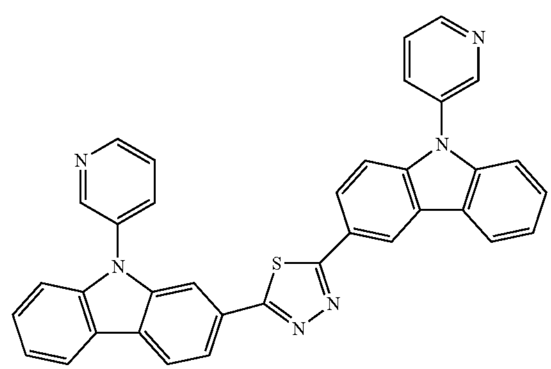

-continued
C 233
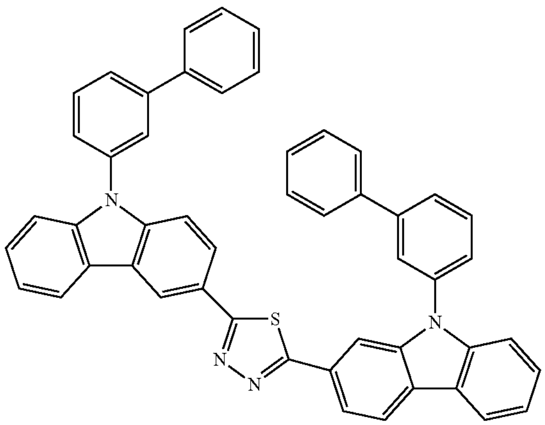
C 234
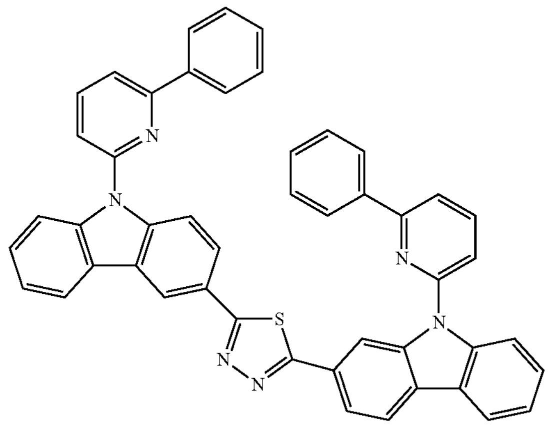
C 235
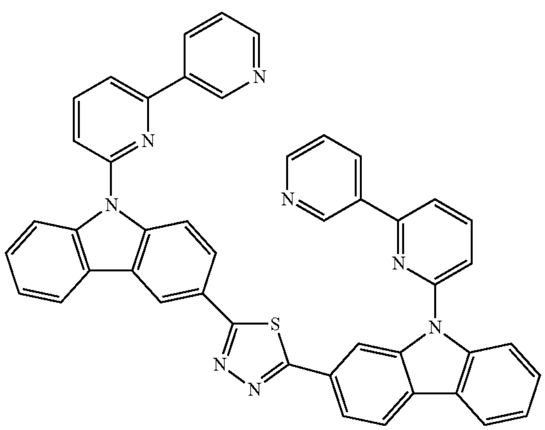
C 236
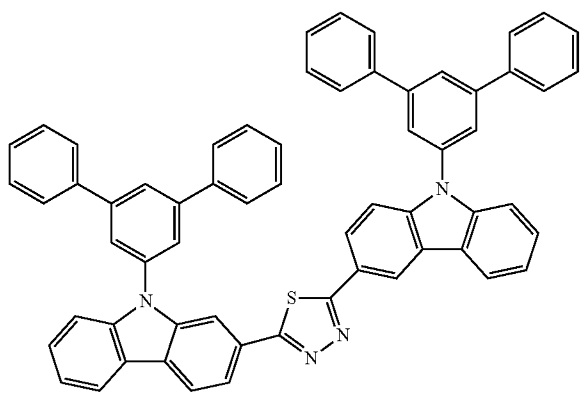
C 237
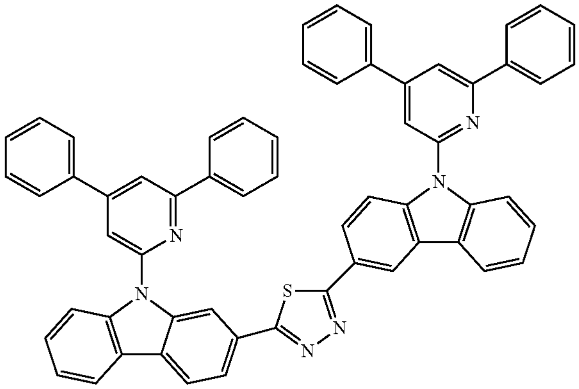
C 238
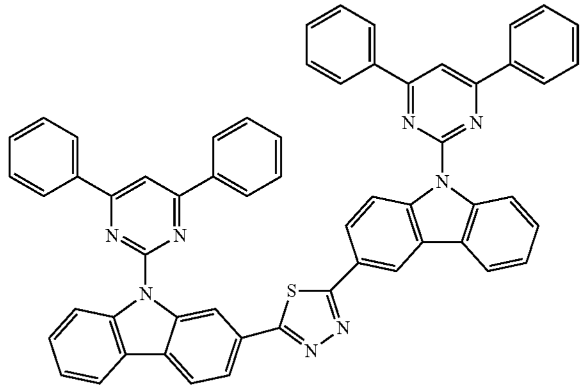

-continued
C 239
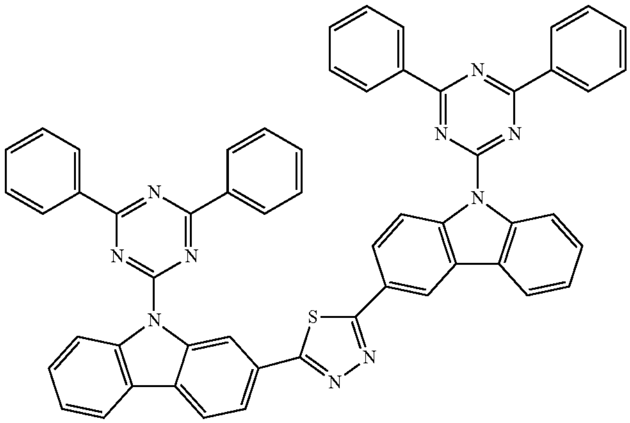
C 240
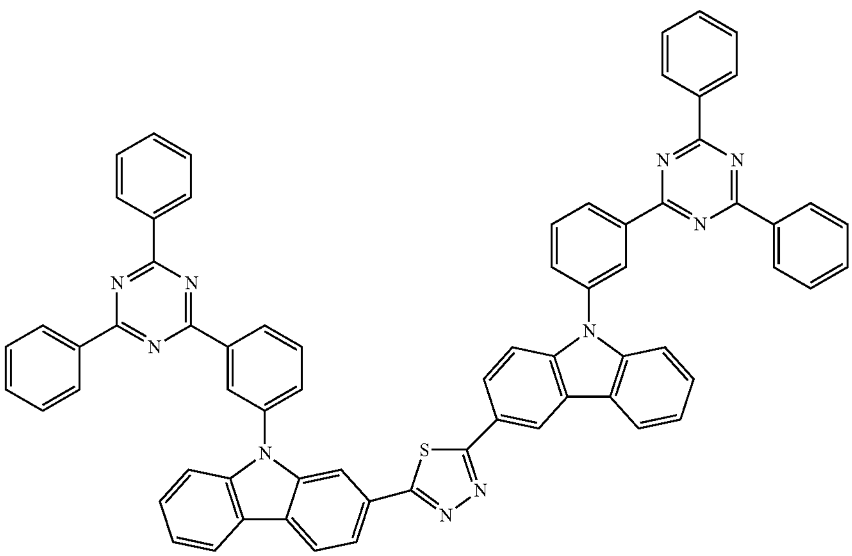
C 241
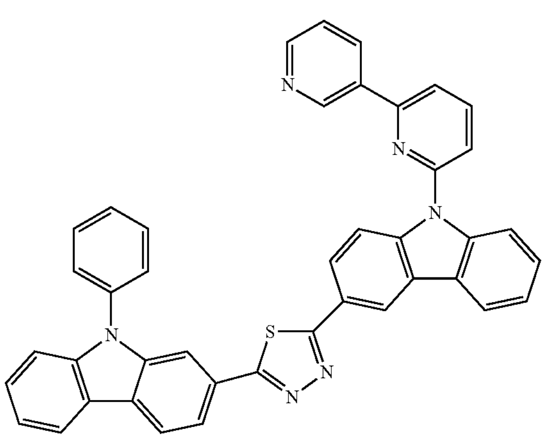
C 242
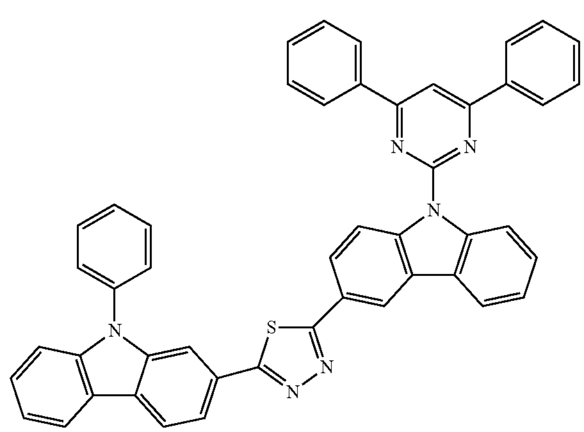

-continued
C 243
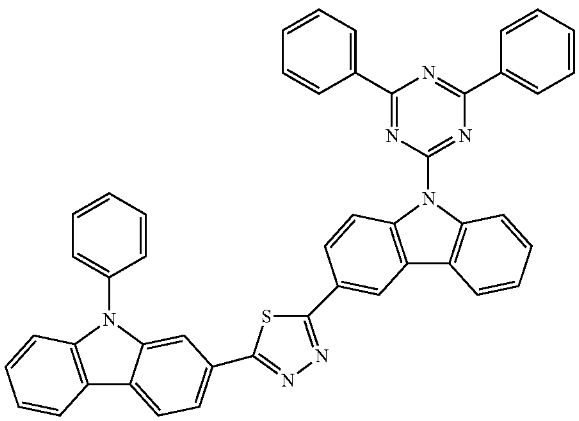
C 244
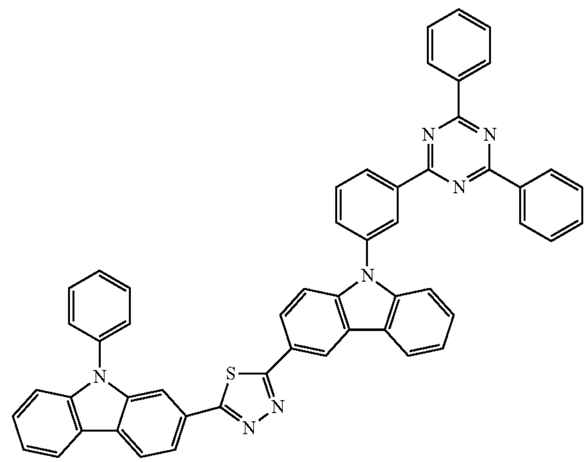
C 245
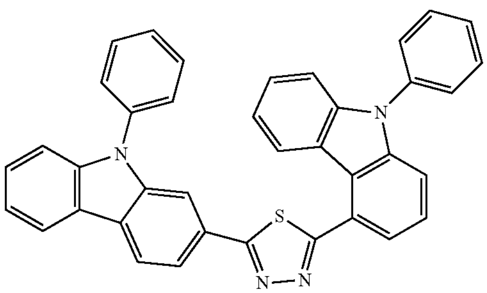
C 246
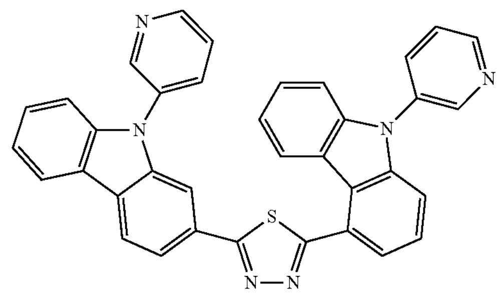
C 247
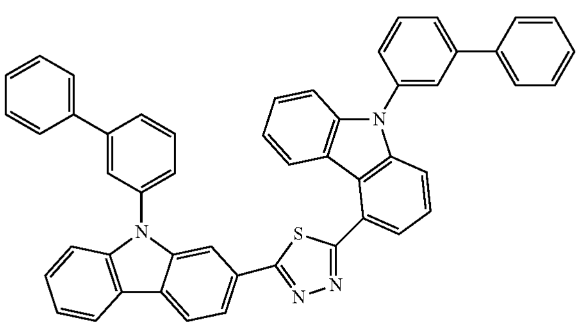
C 248
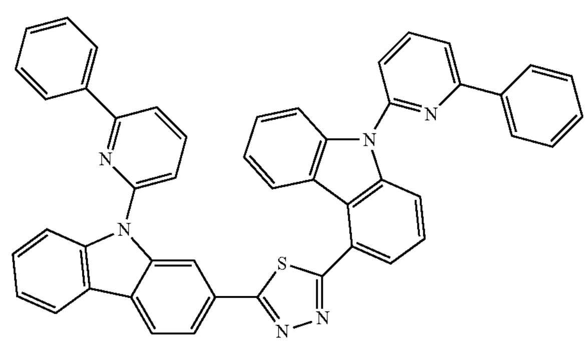
C 249
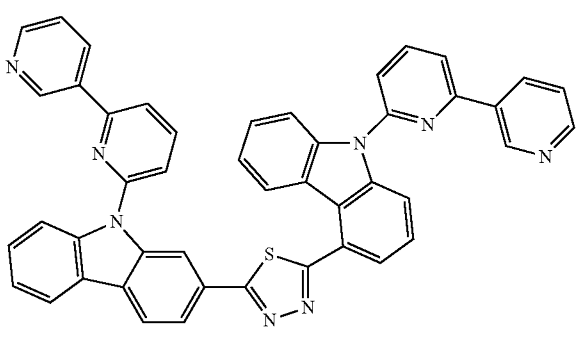
C 250
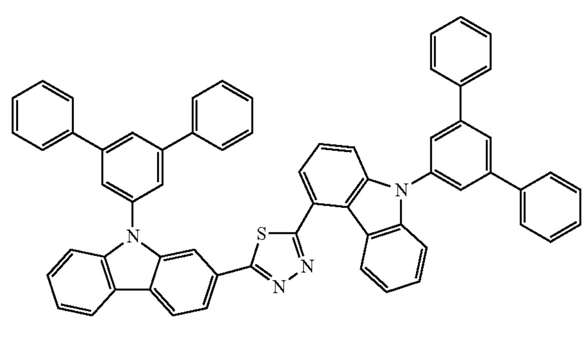

-continued
C 251
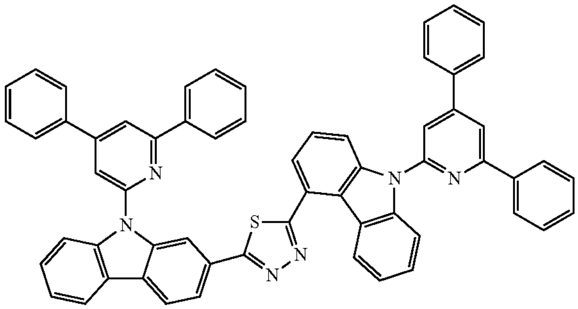
C 252
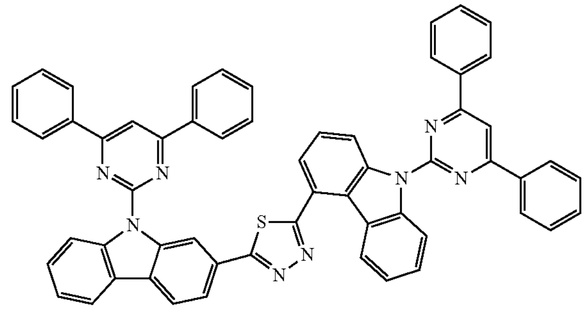
C 253
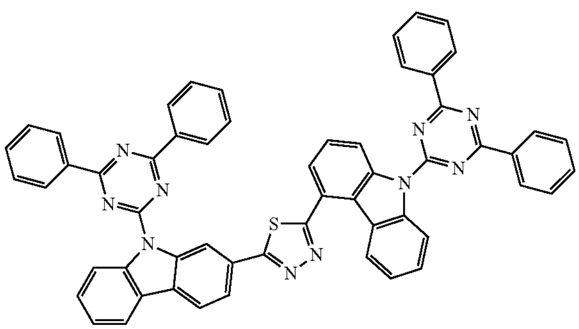
C 254
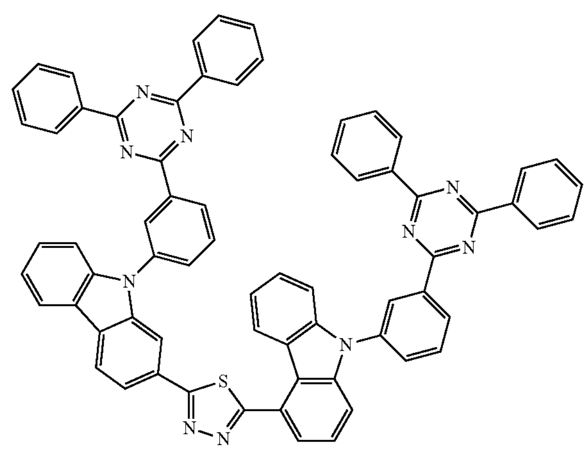
C 255
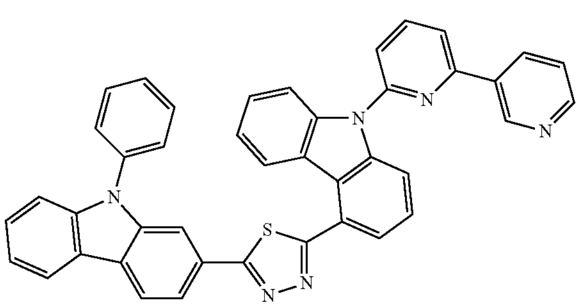
C 256
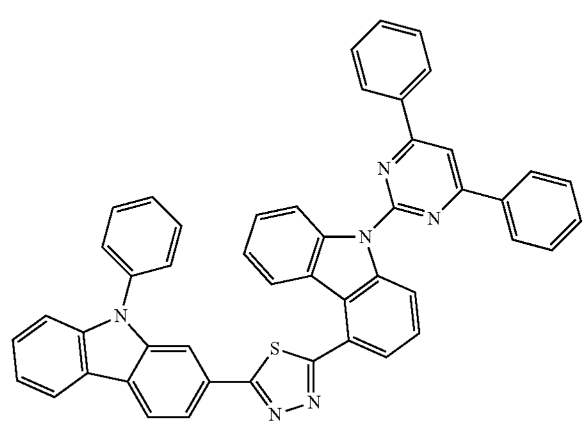

-continued
C 257
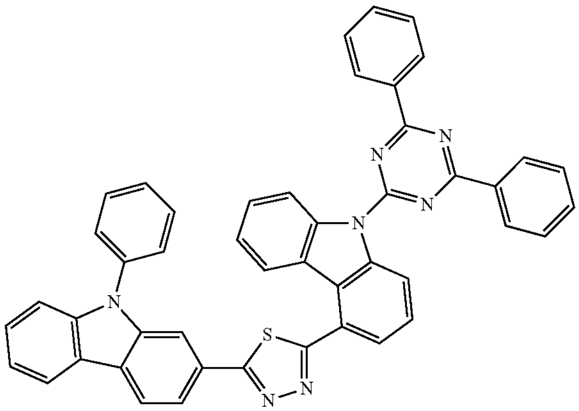
C 258
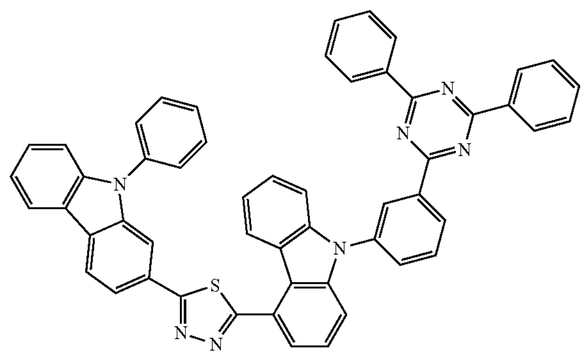
C 259
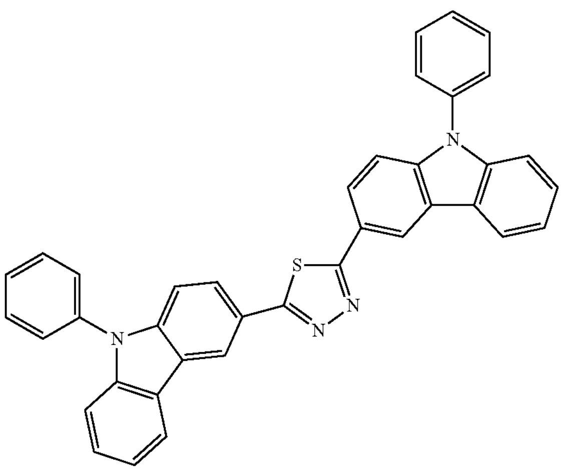
C 260
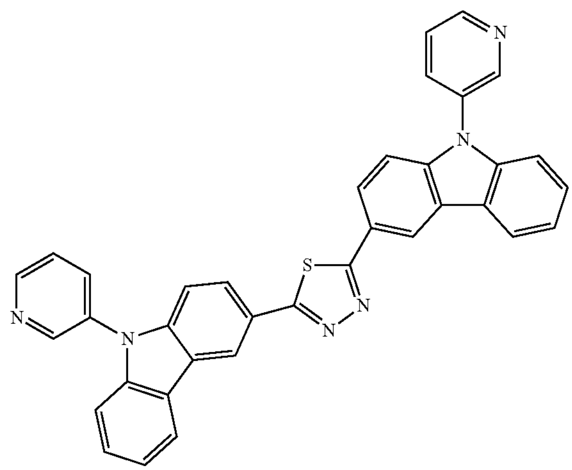
C 261
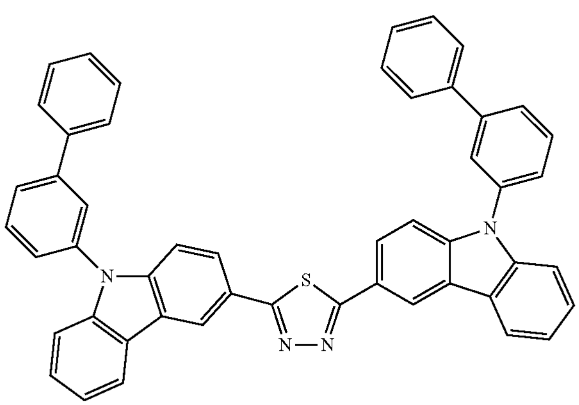
C 262
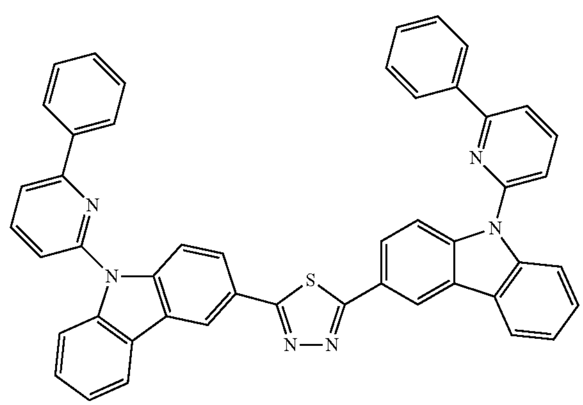

-continued
C 263
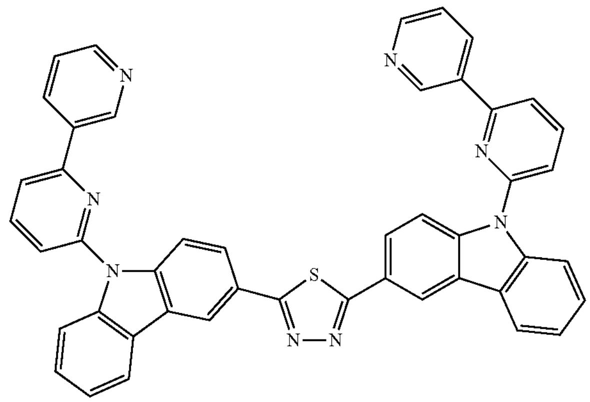
C 264
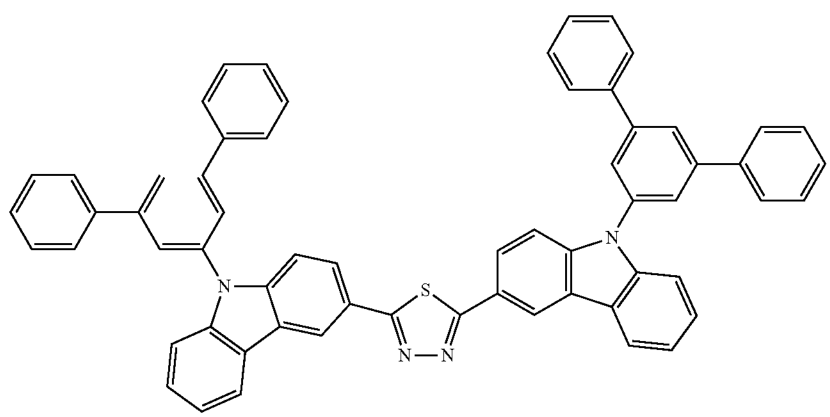
C 265
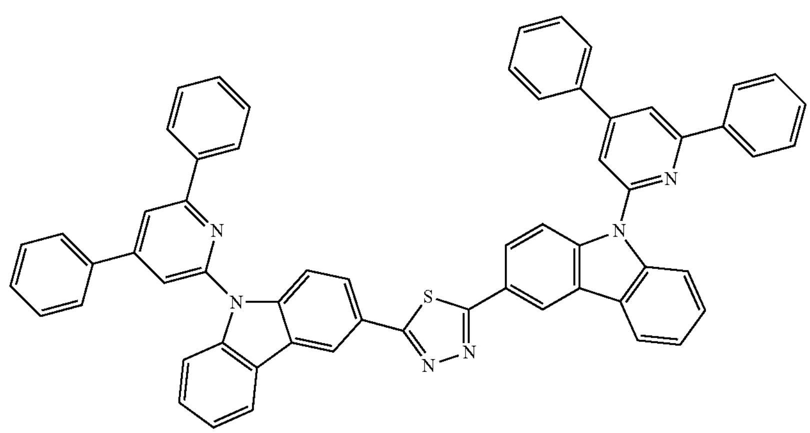

-continued
C 266
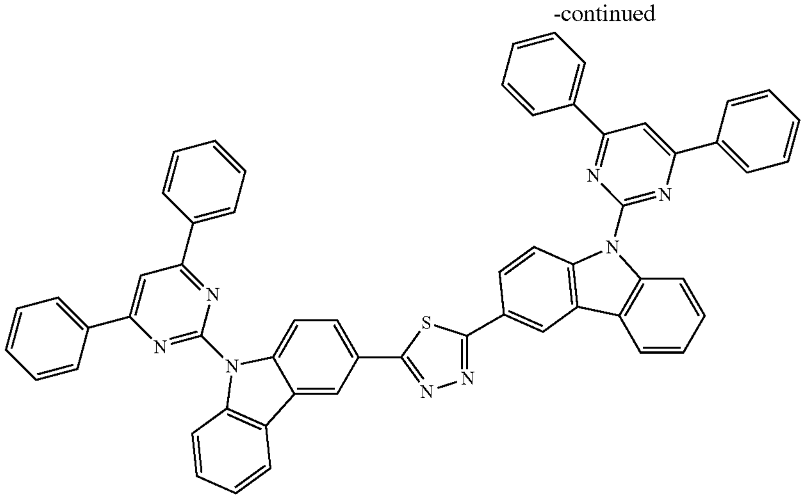
C 267
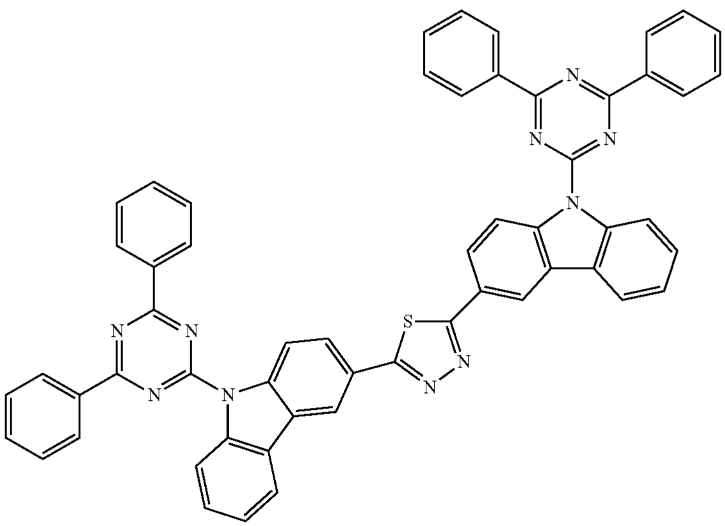
C 268
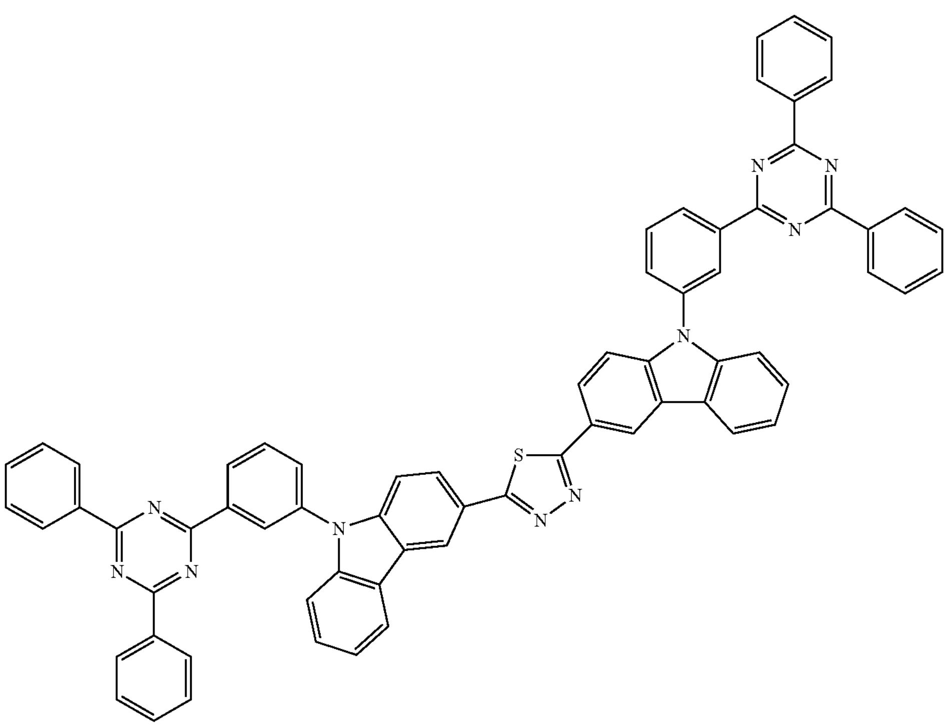

-continued
C 269
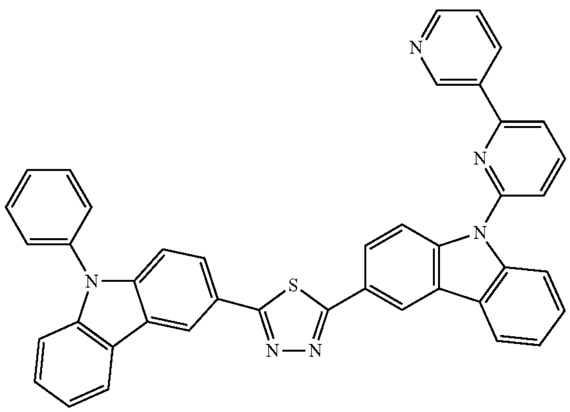
C 270
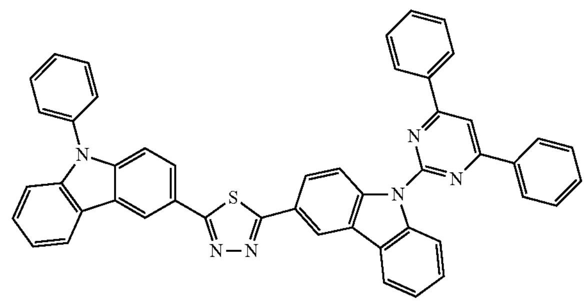
C 271
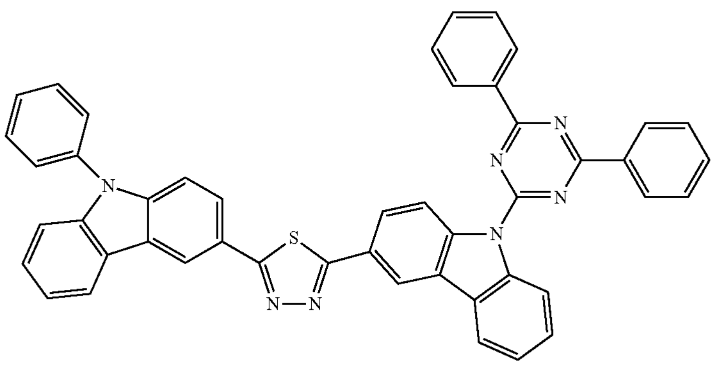
C 272
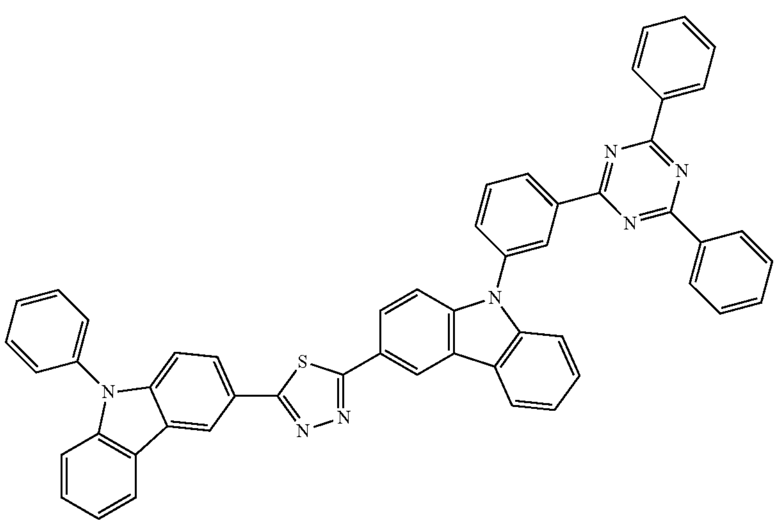

-continued
C 273
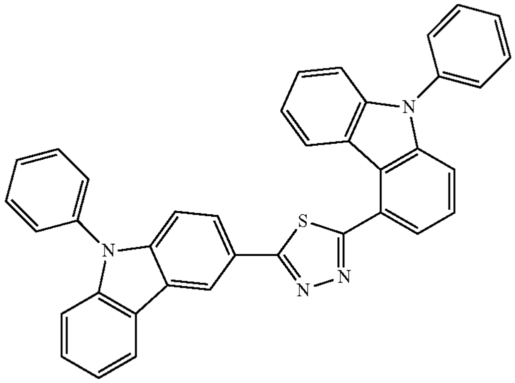
C 274
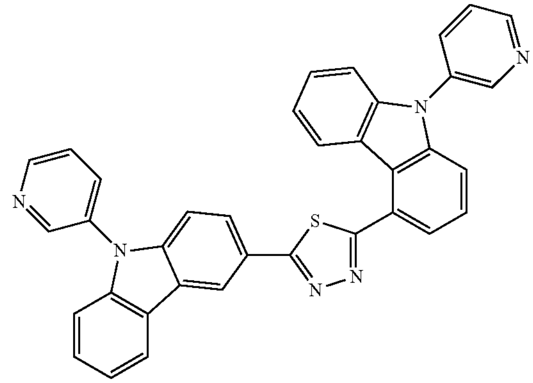
C 275
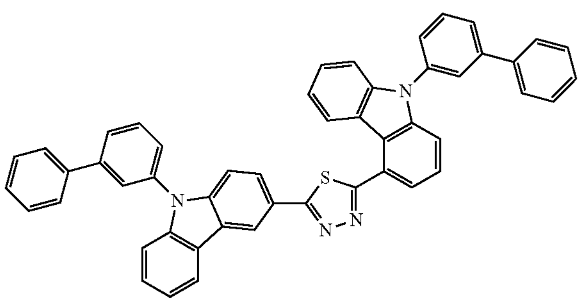
C 276
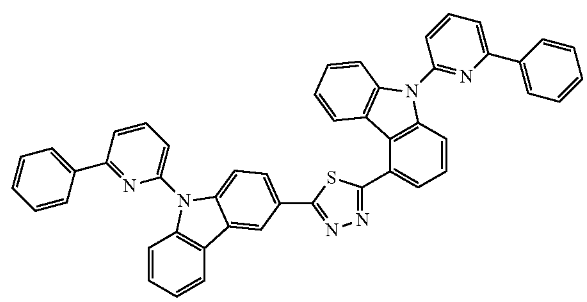
C 277
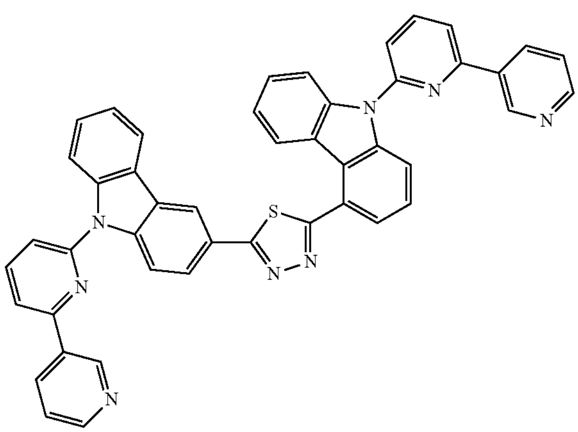
C 278
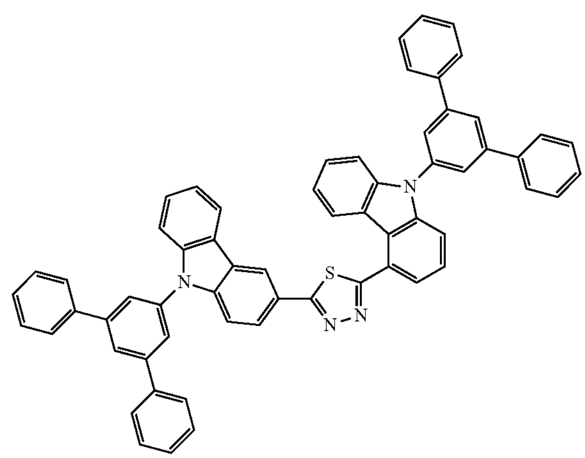
C 279
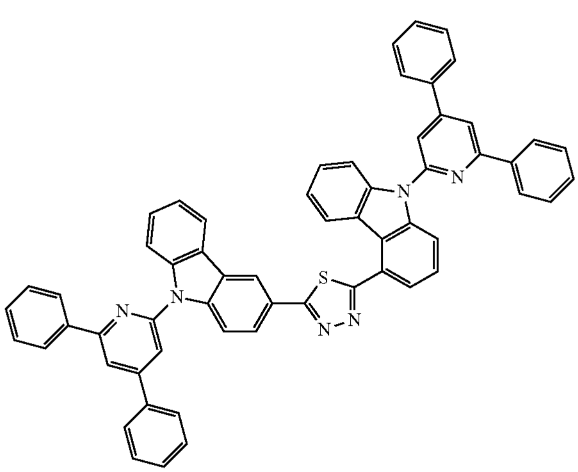
C 280
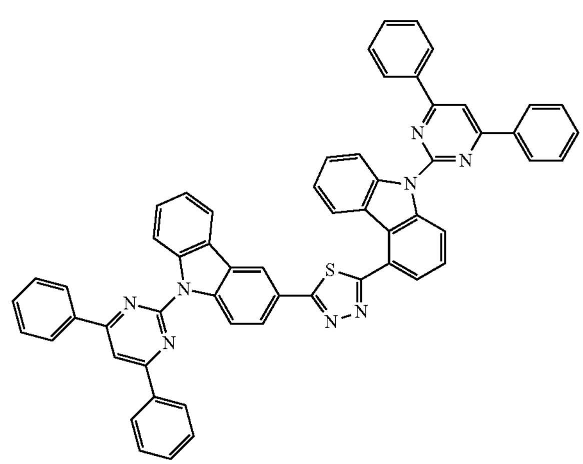

-continued
C 281
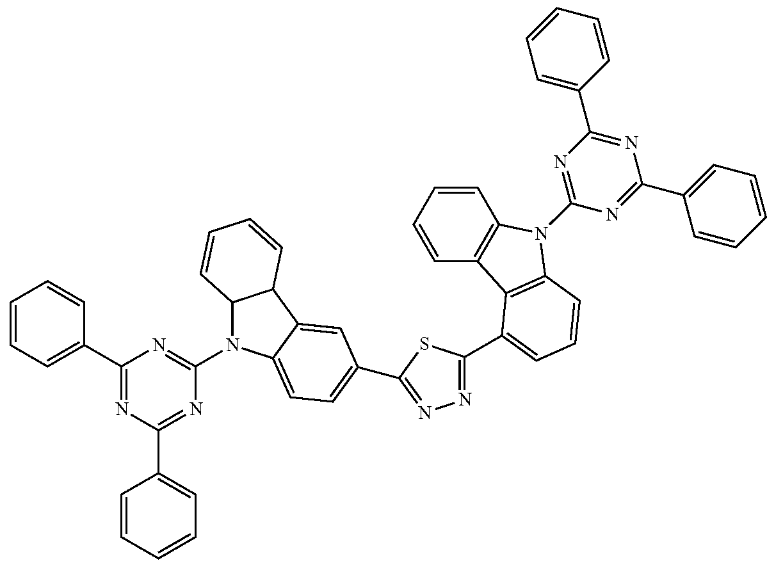
C 282
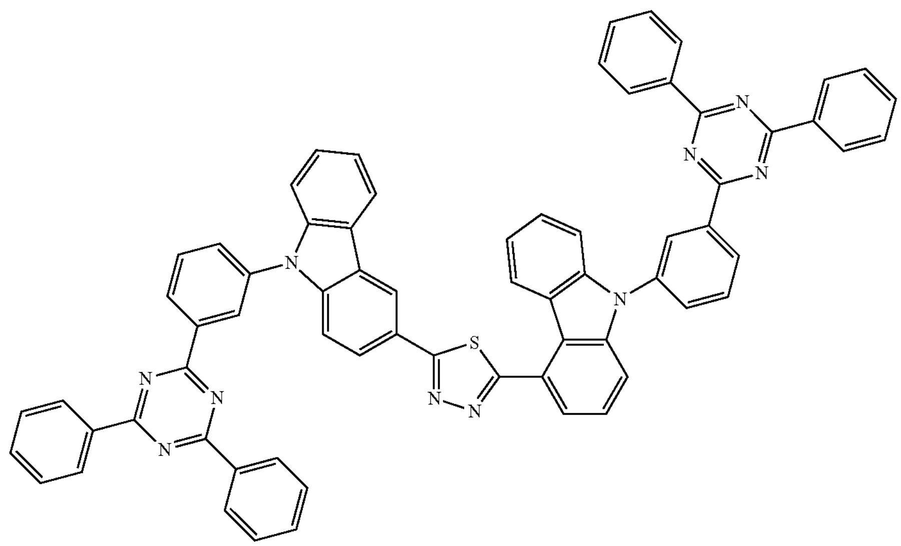
C 283
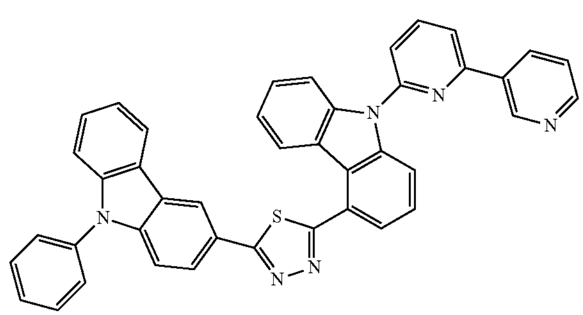
C 284
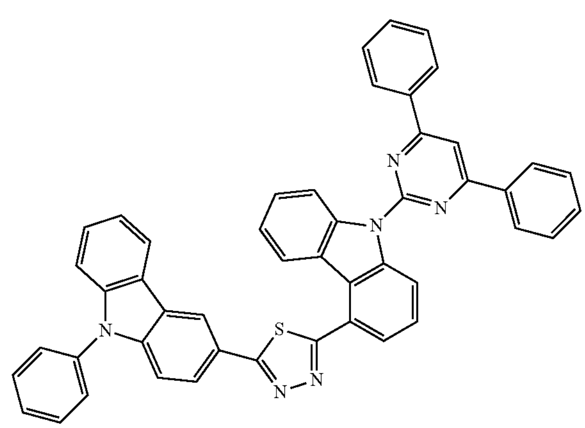

-continued
C 285
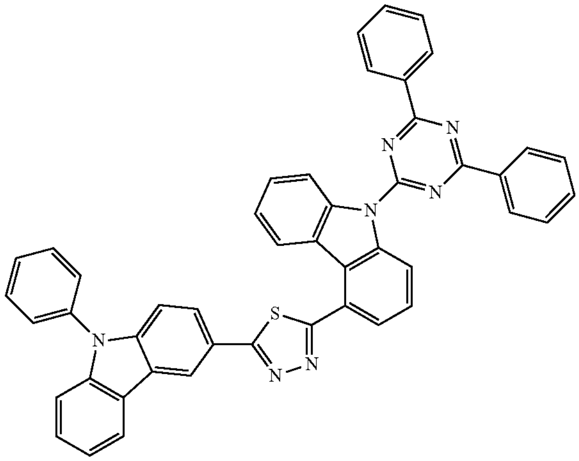
C 286
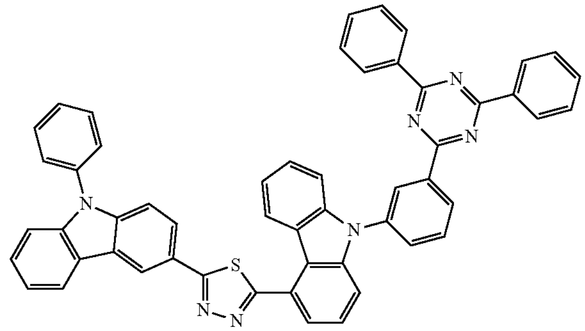
C 287
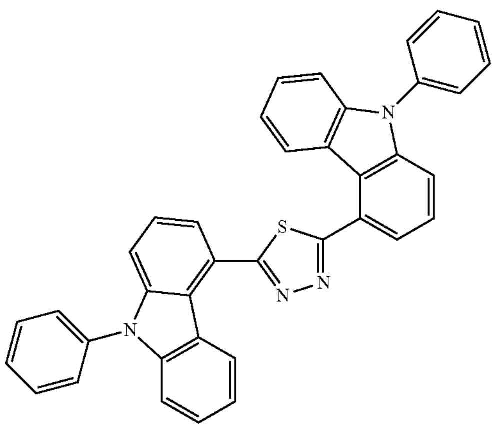
C 288
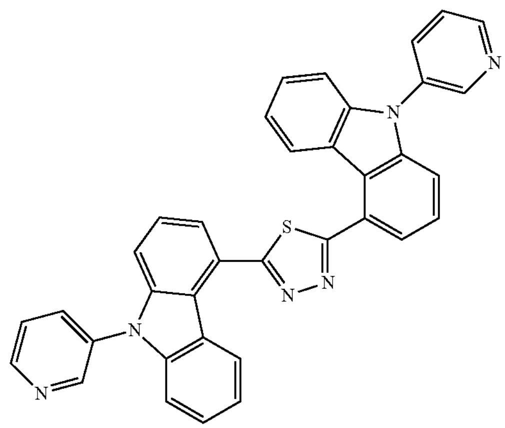
C 289
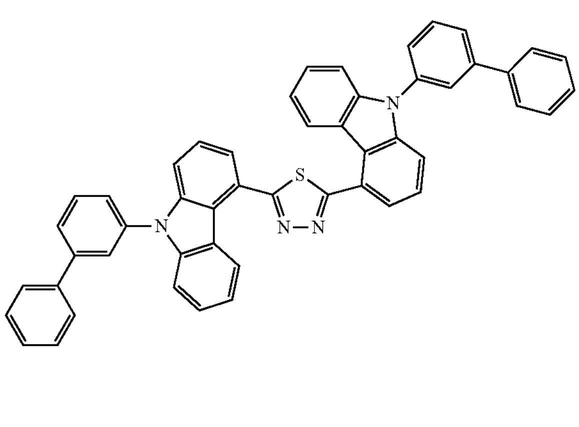
C 290
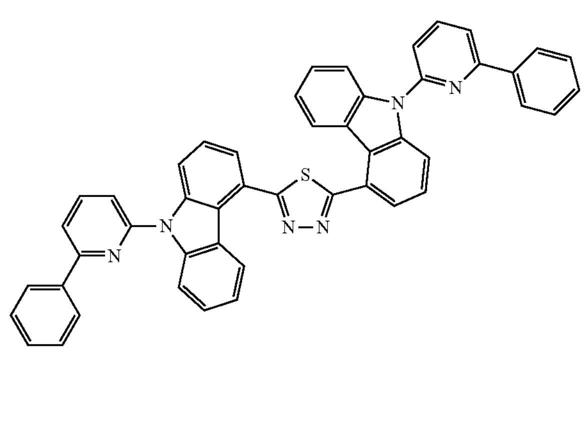

-continued
C 291
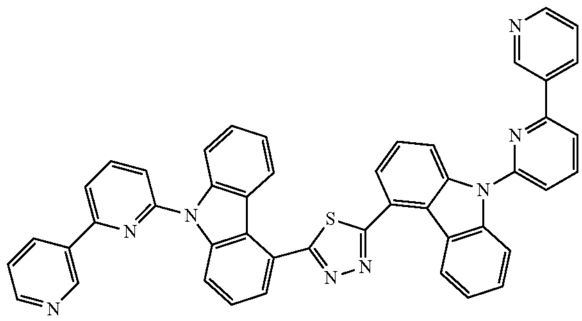
C 292
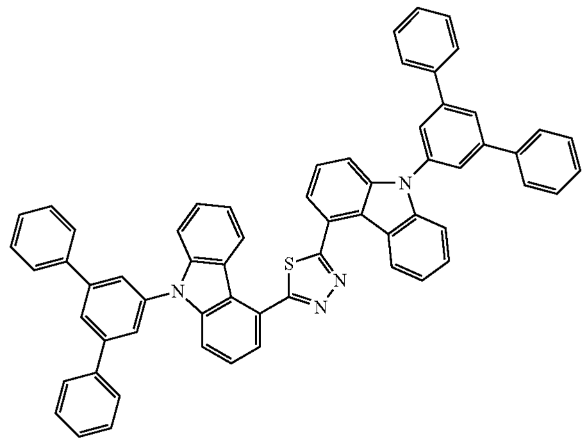
C 293
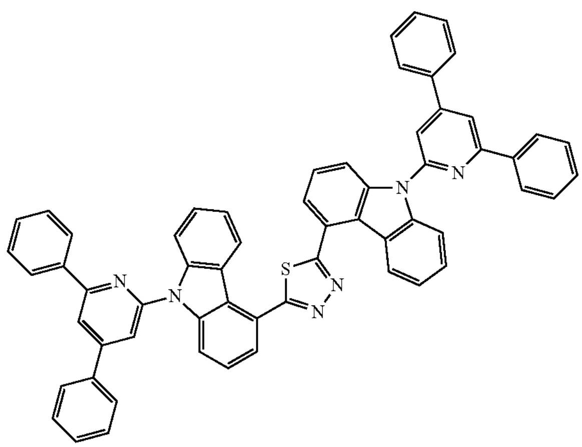
C 294
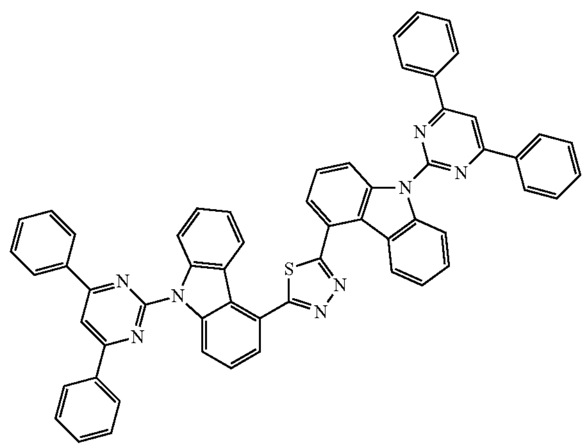
C 295
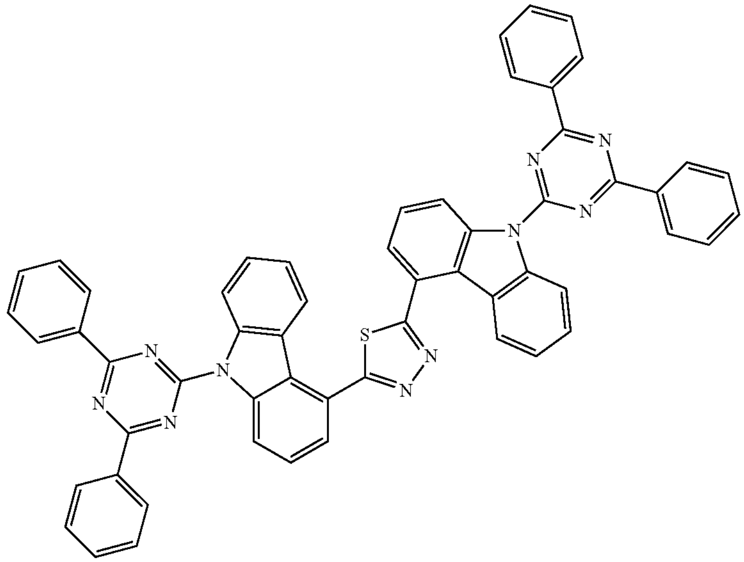

-continued
C 296
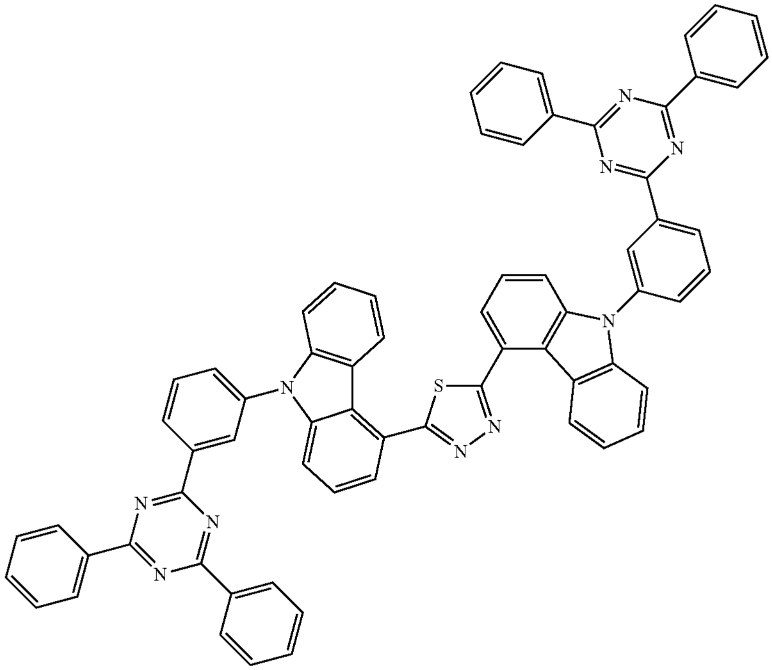
C 297
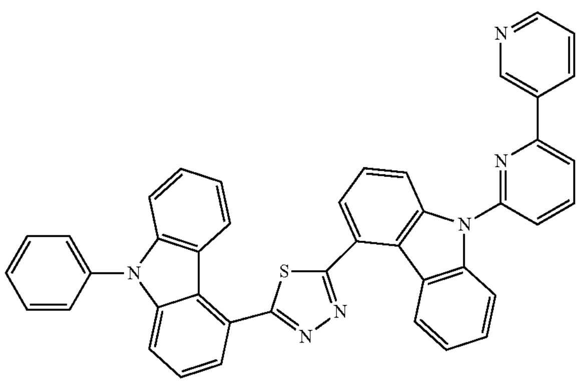
C 298
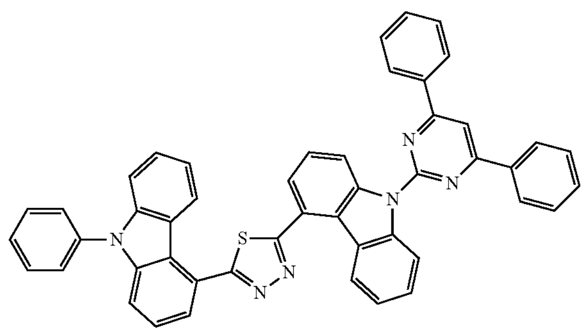
C 299
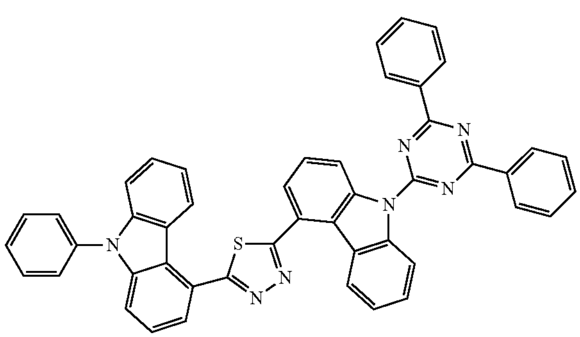
C 300
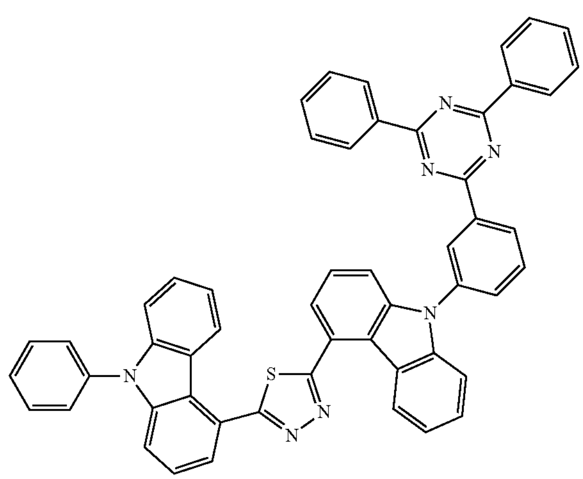

-continued
C 301
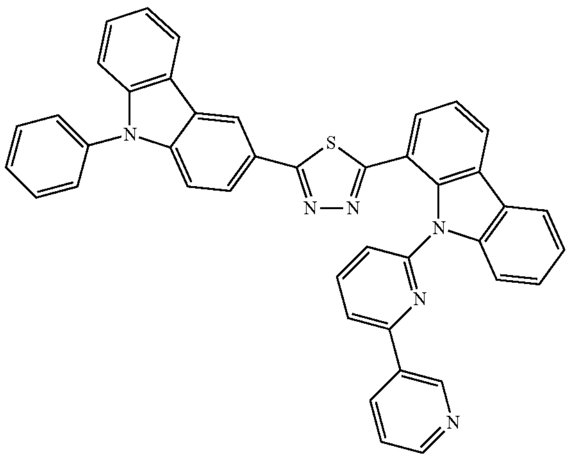
C 302
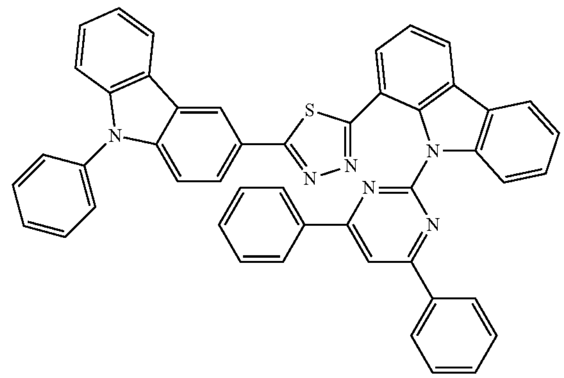
C 303
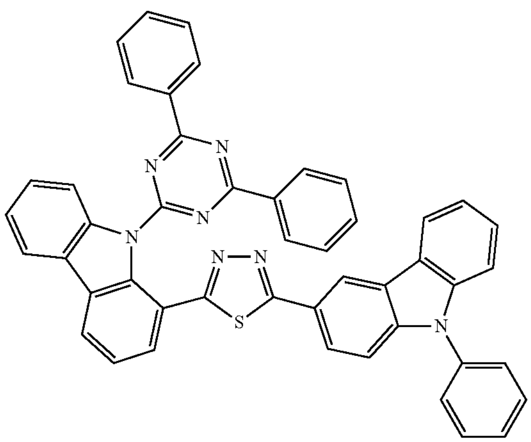
C 304
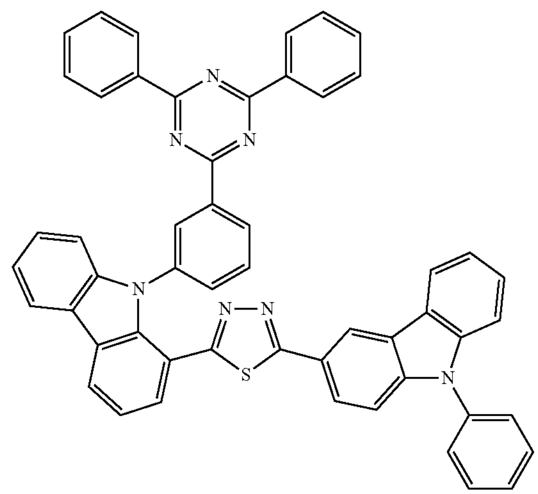
C 305
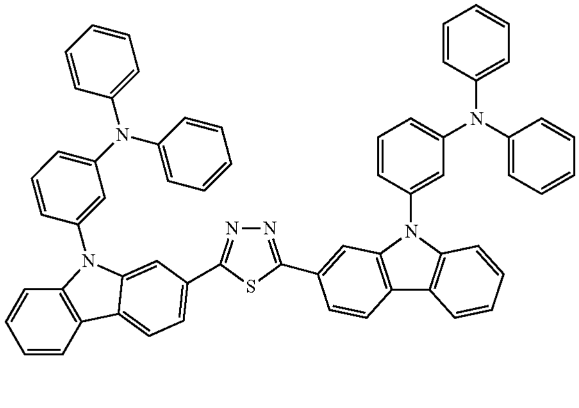
C 306
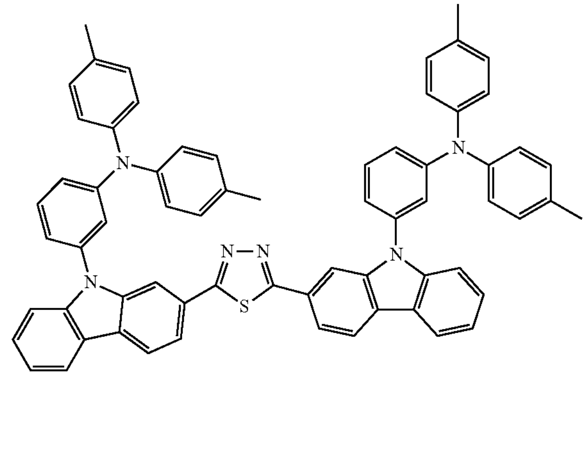

-continued
C 307
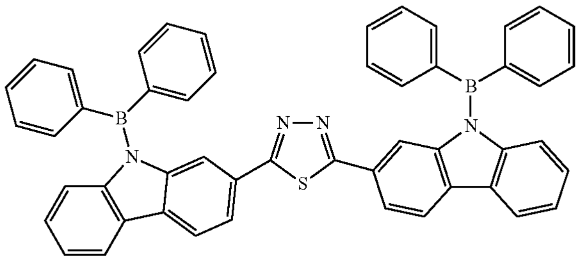
C 308
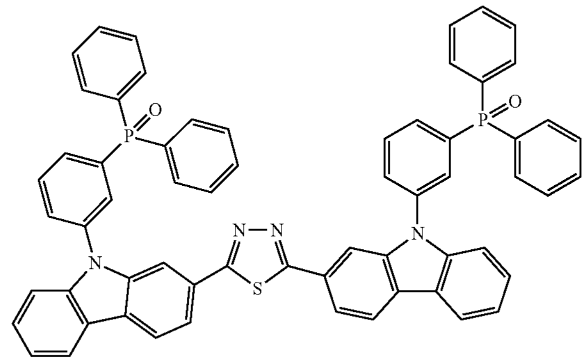
C 309
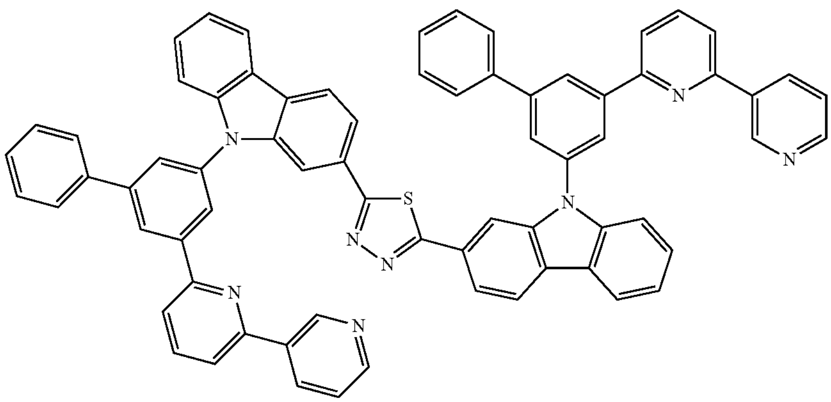
C 310
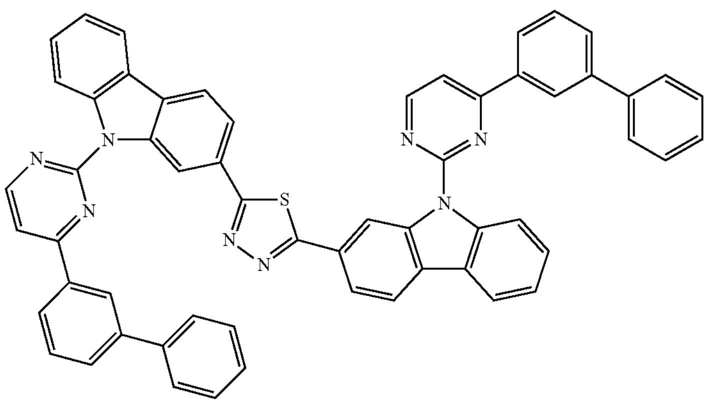
C 311
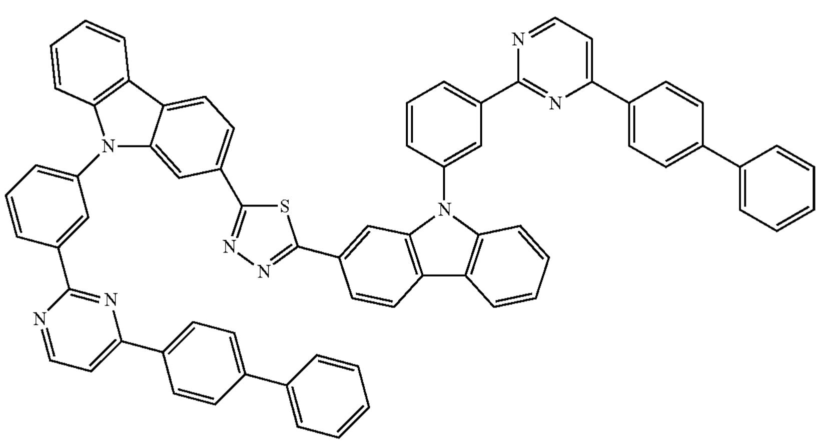

-continued
C 312
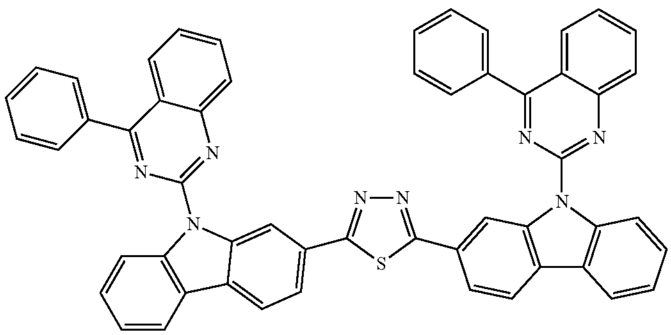
C 313
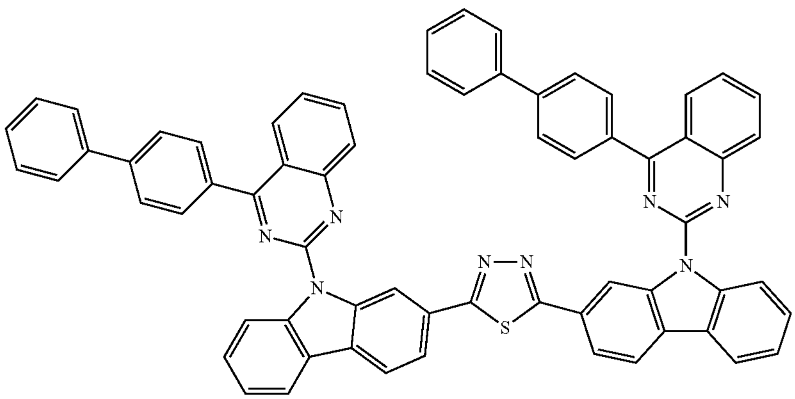
C 314
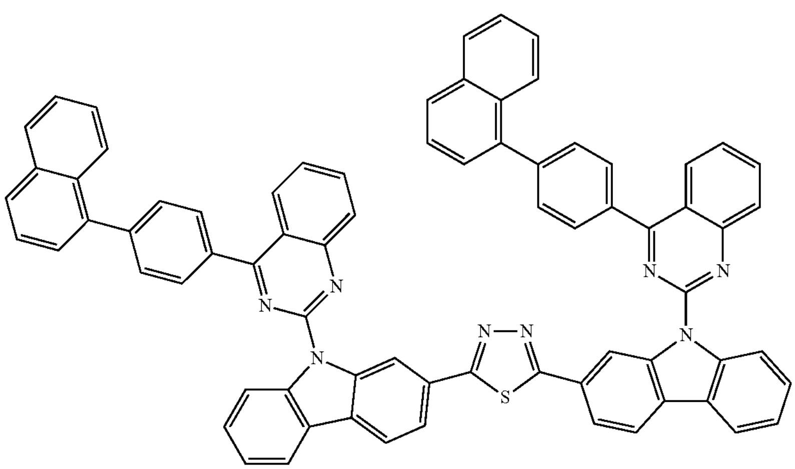
C 315
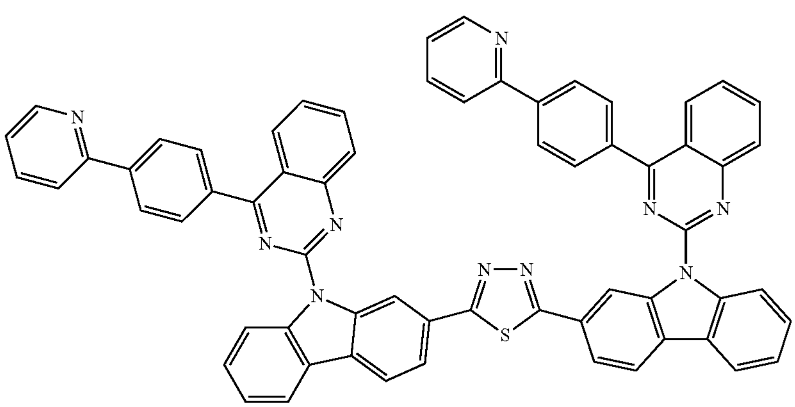

-continued
C 316
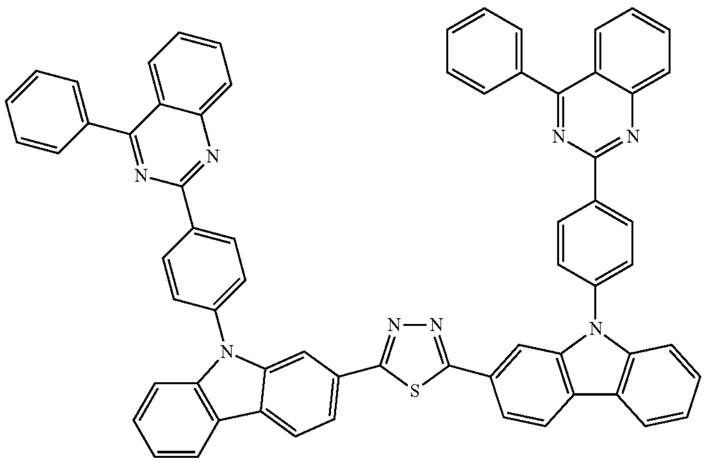
C 317
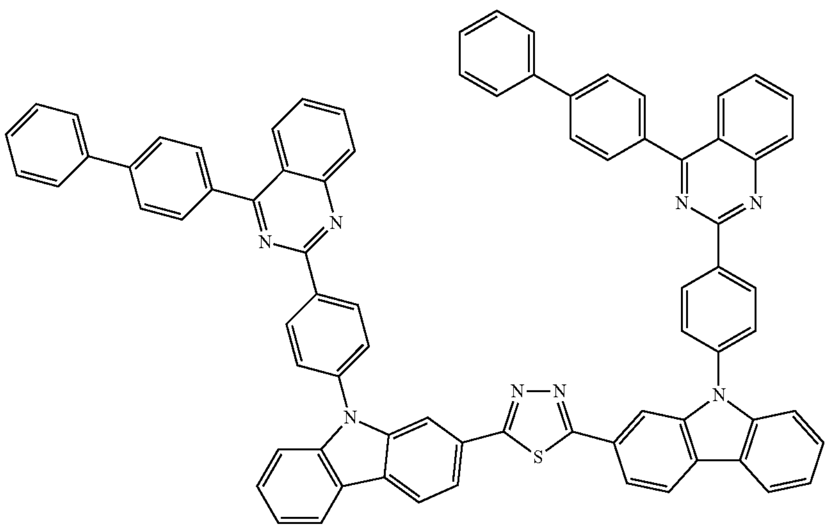
C 318
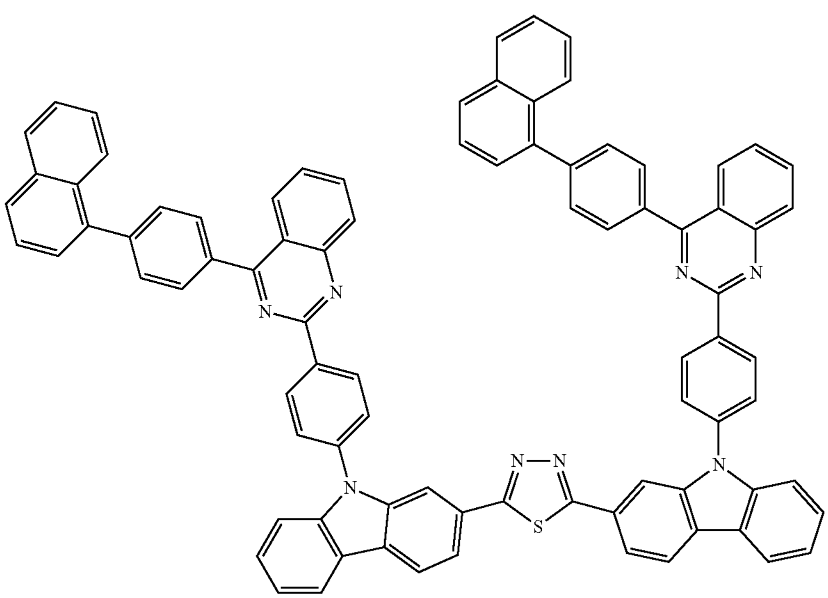

-continued
C 319
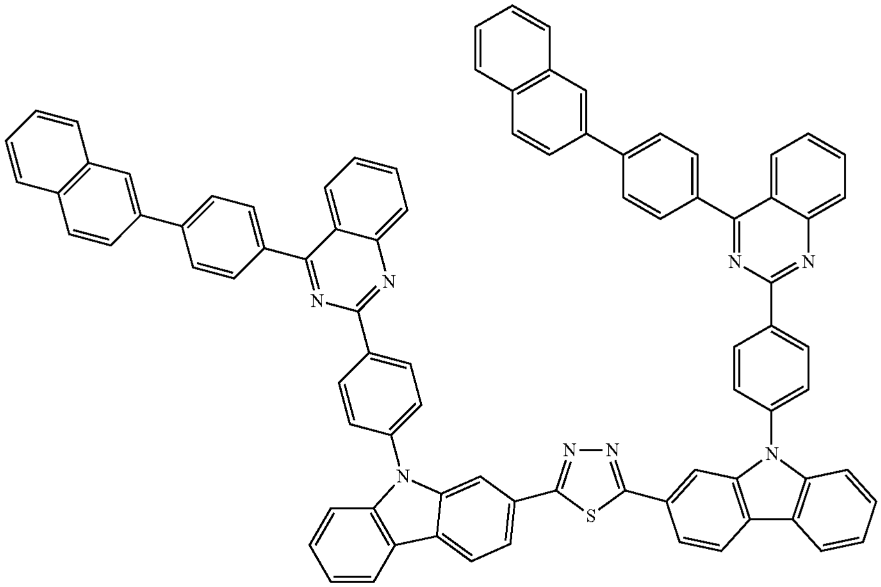
C 320
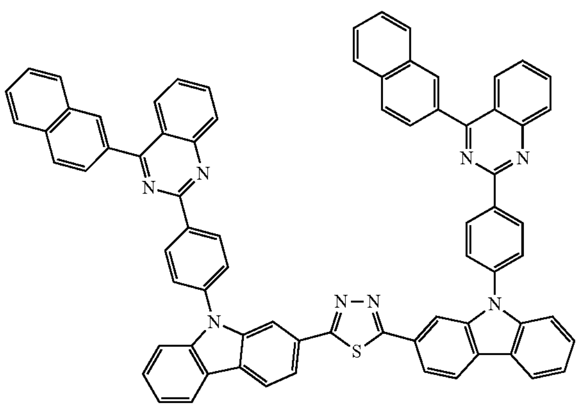
C 321
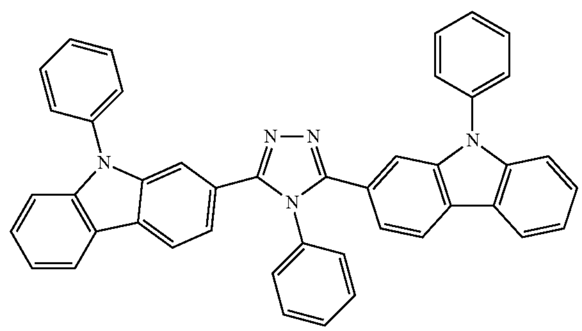
C 322
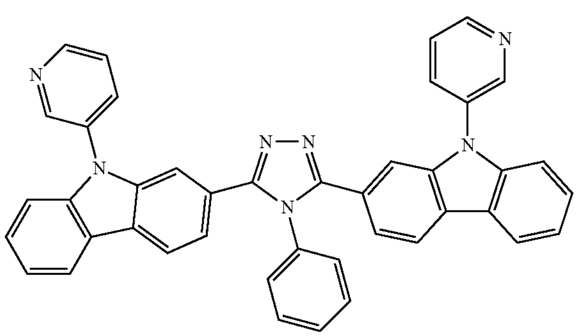
C 323
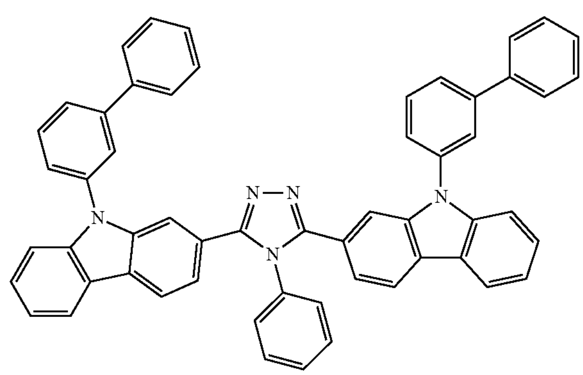

-continued
C 324
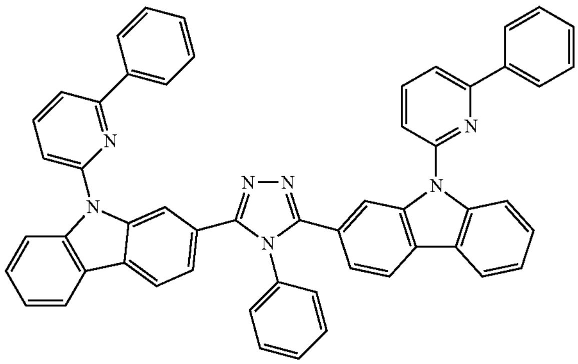
C 325
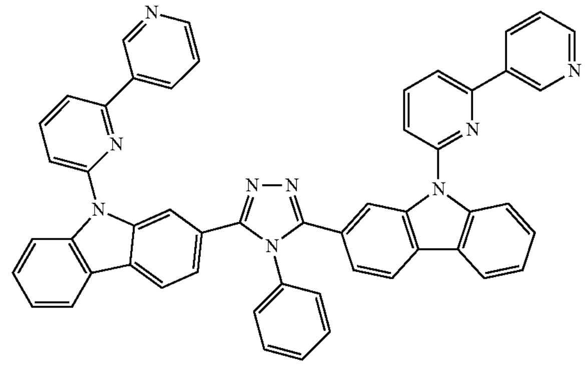
C 326
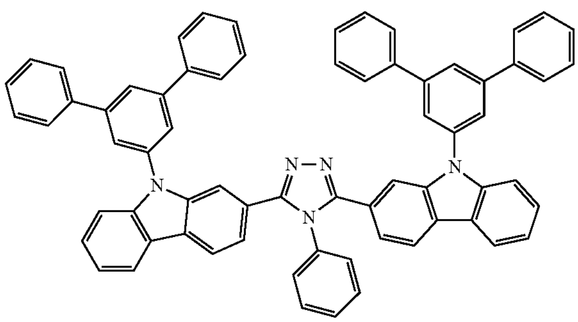
C 327
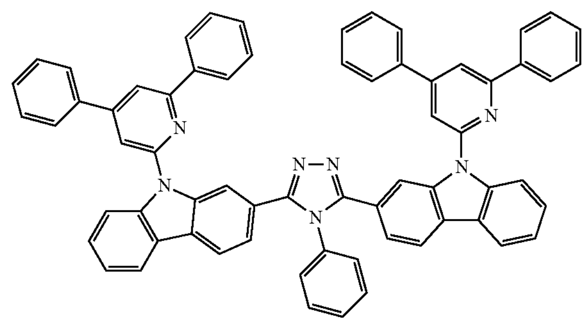
C 328
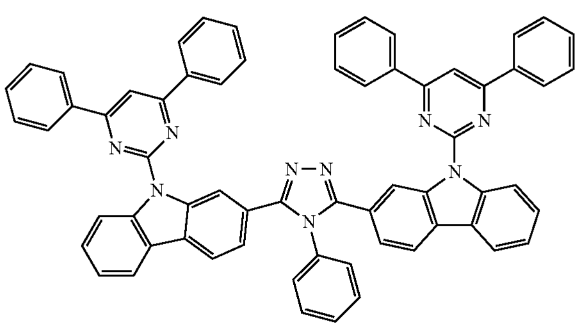
C 329
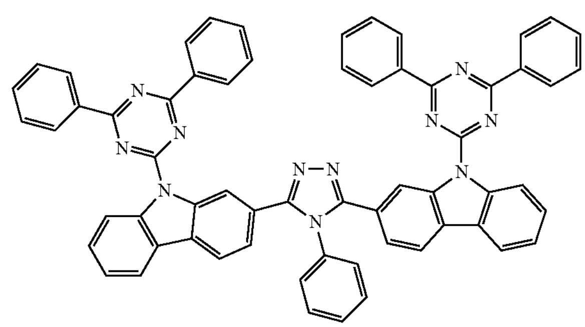
C 330
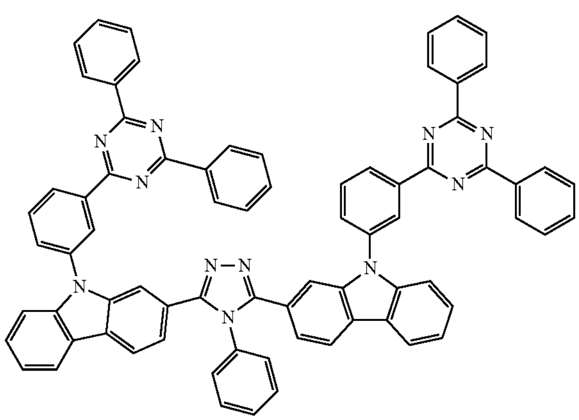
C 331
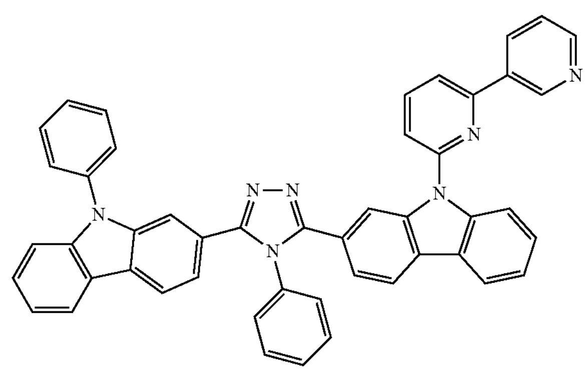

-continued
C 332
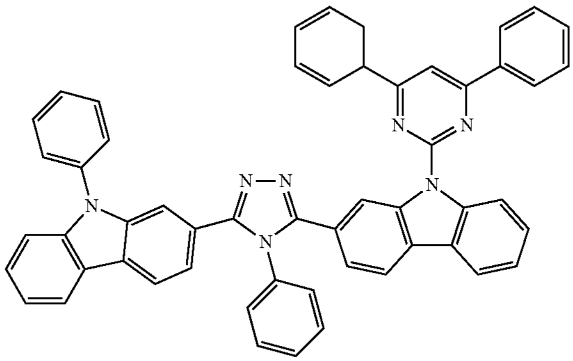
C 333
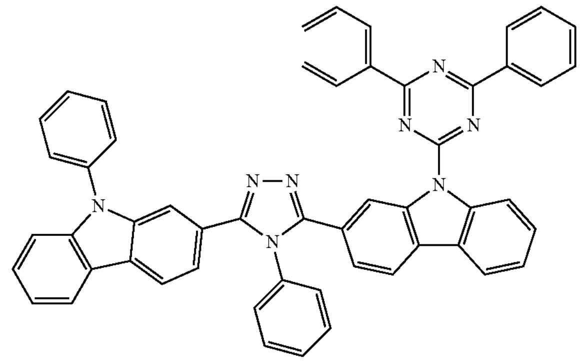
C 334
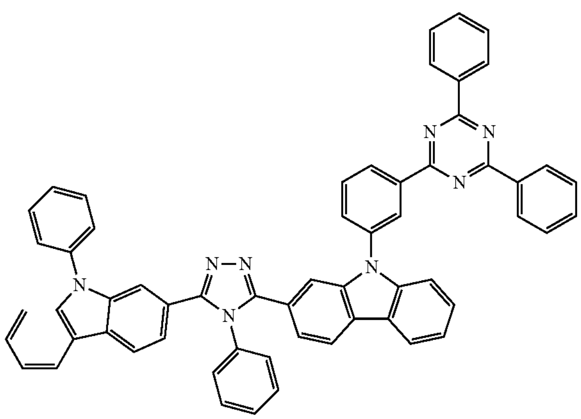
C 335
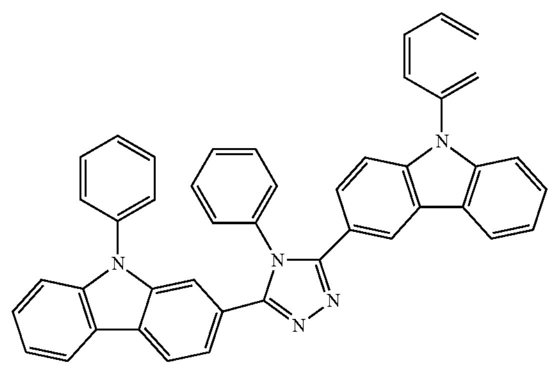
C 336
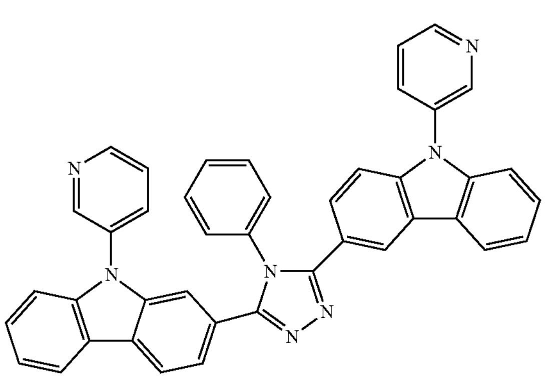
C 337
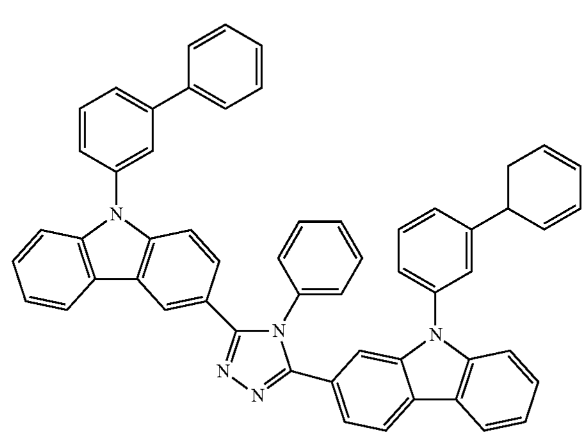

-continued
C 338
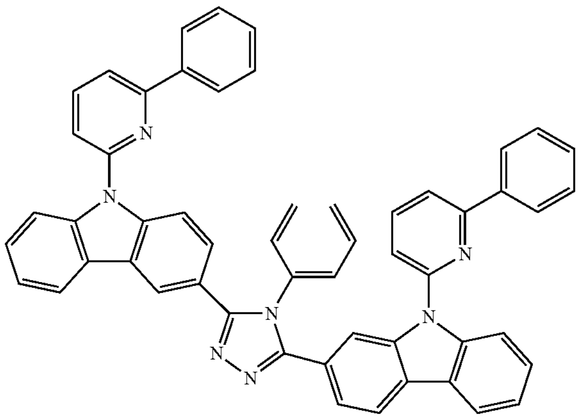
C 339
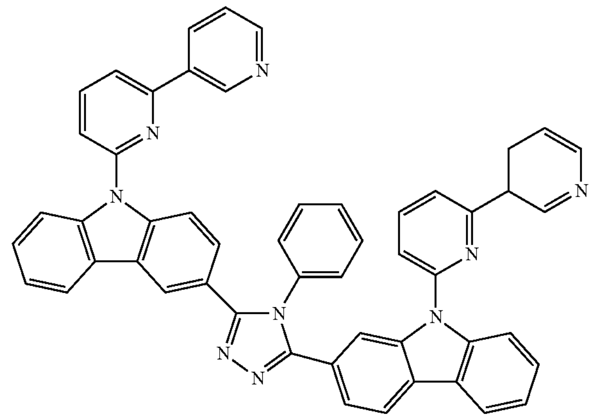
C 340
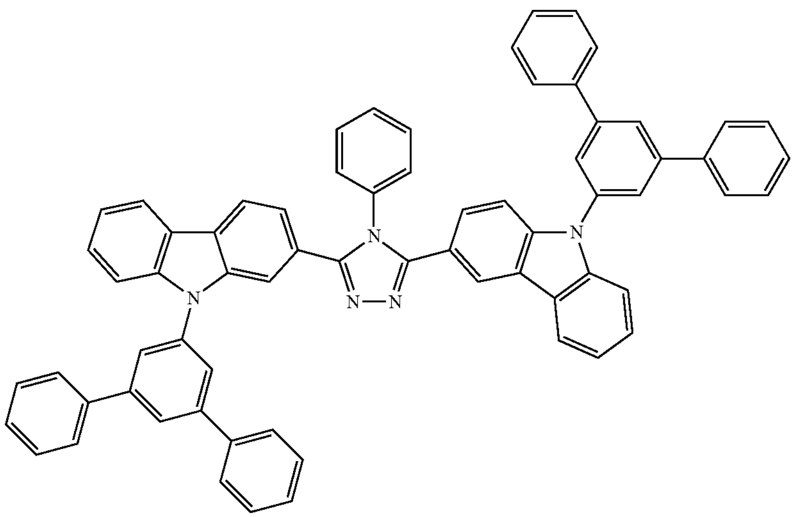
C 341
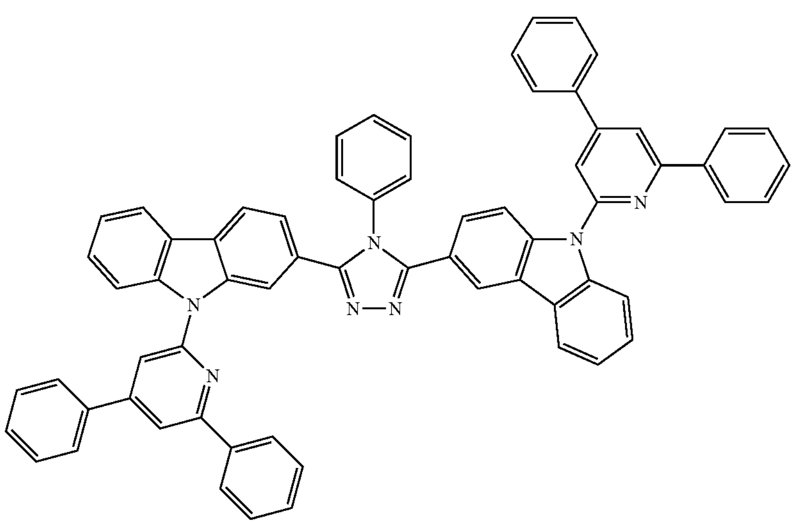

-continued
C 342
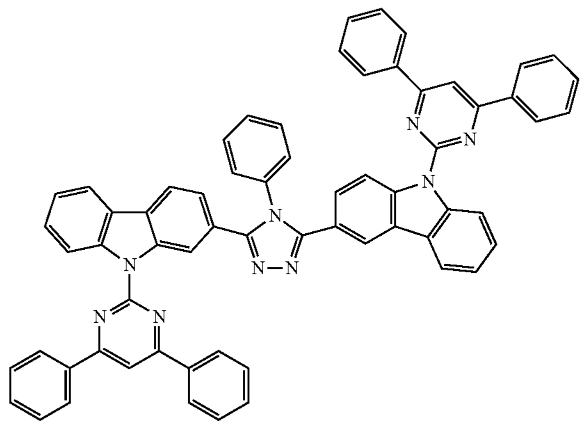
C 343
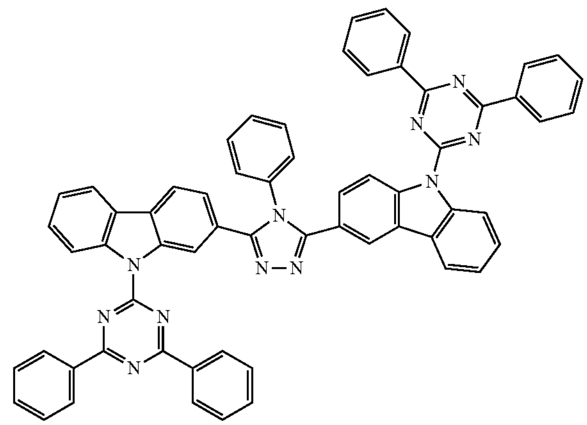
C 344
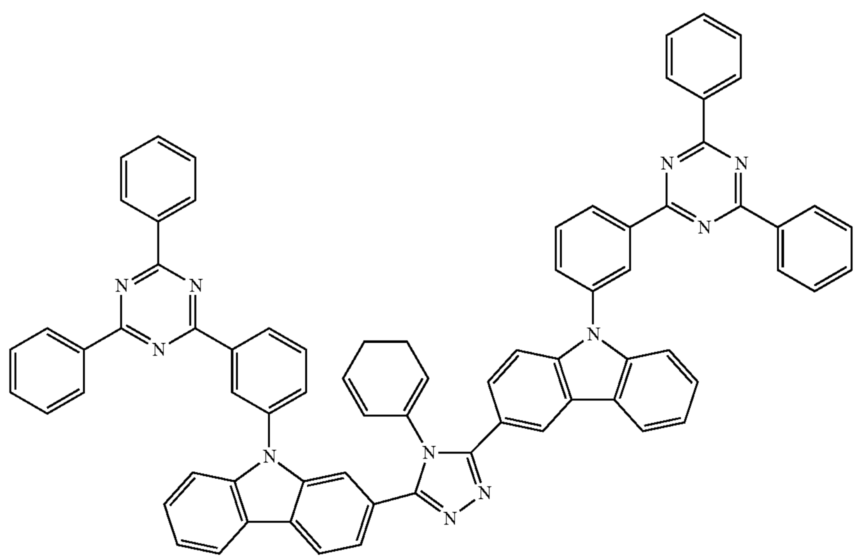
C 345
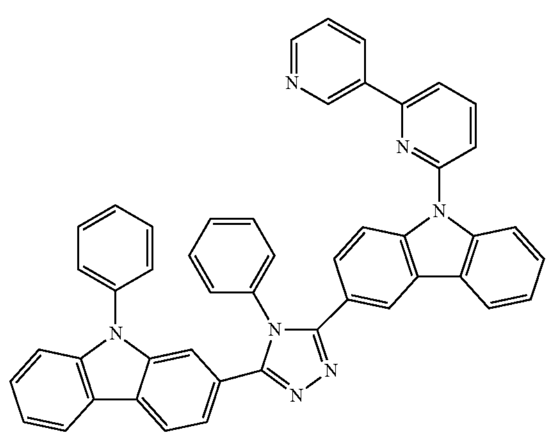
C 346
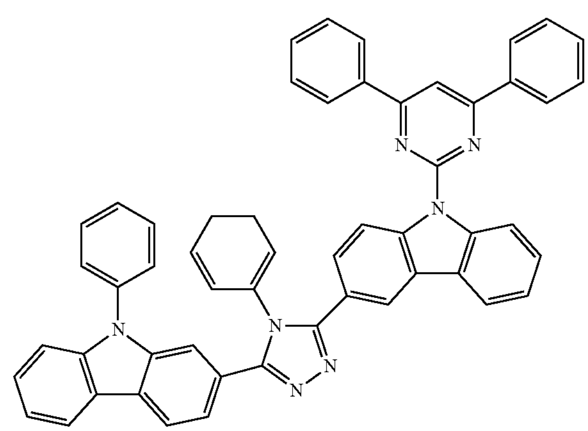

-continued
C 347
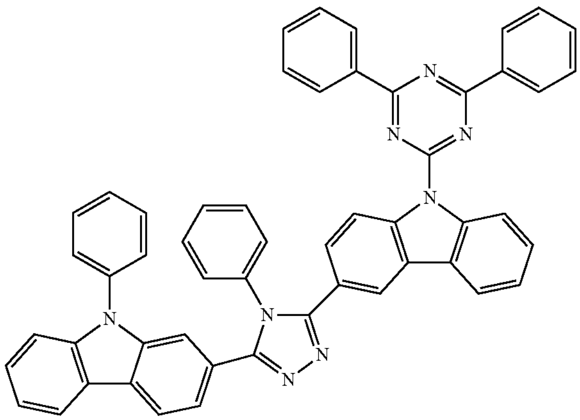
C 348
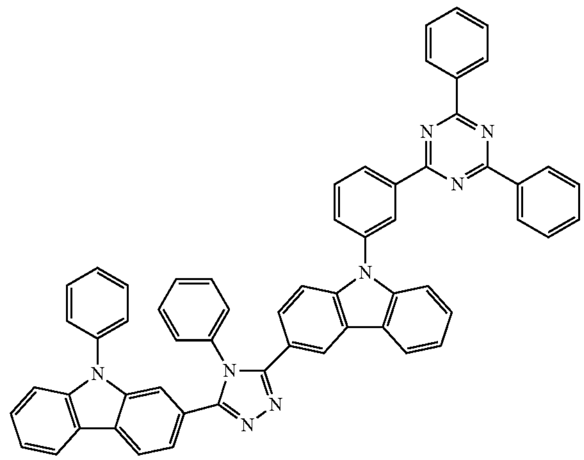
C 349
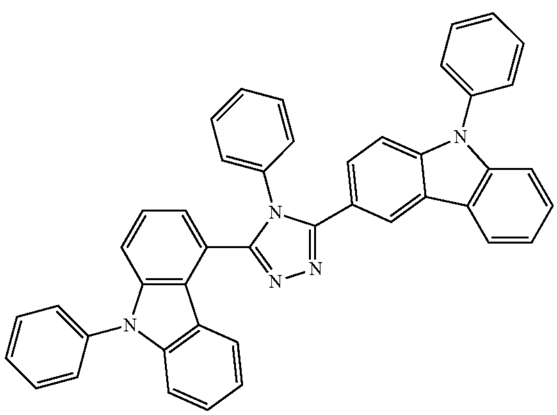
C 350
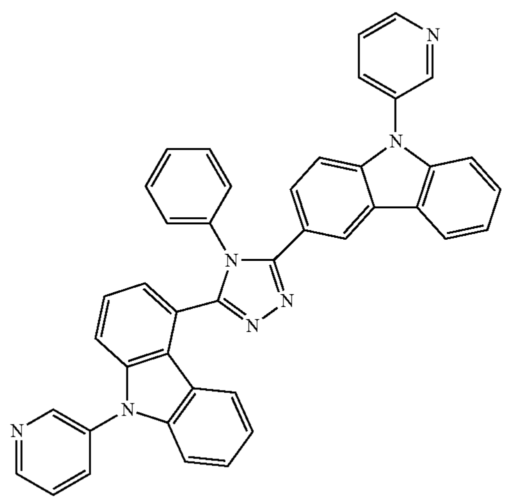
C 351
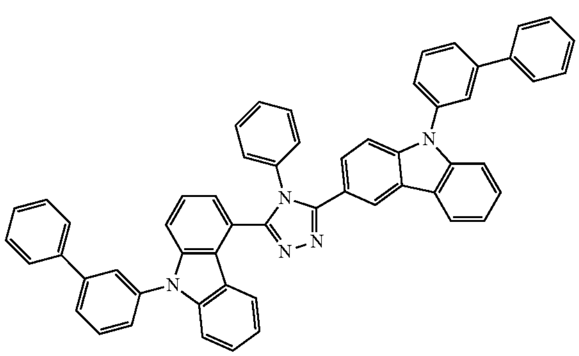
C 352
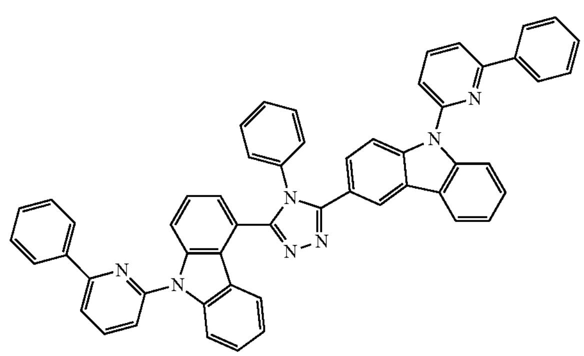

-continued
C 353
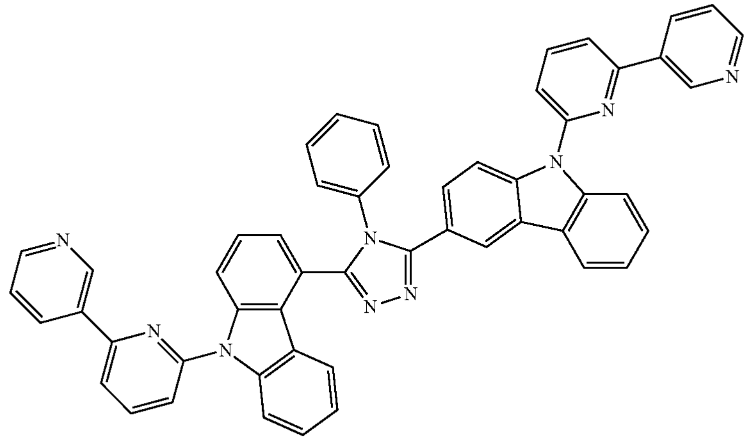
C 354
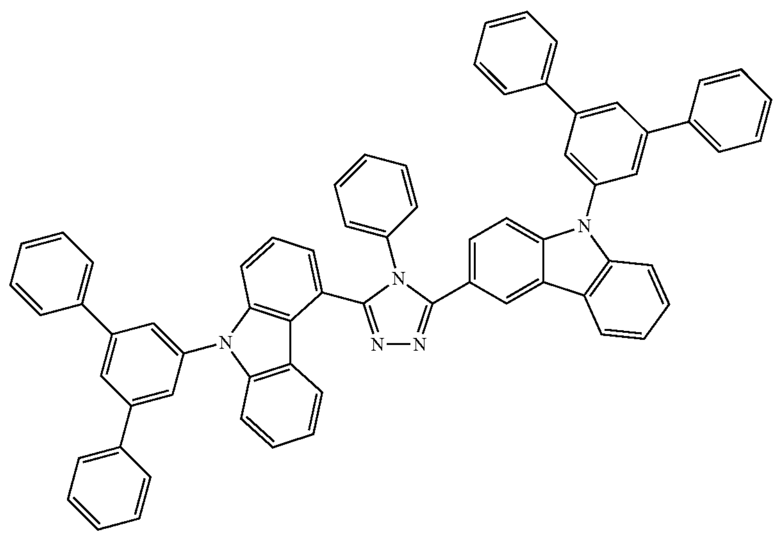
C 355
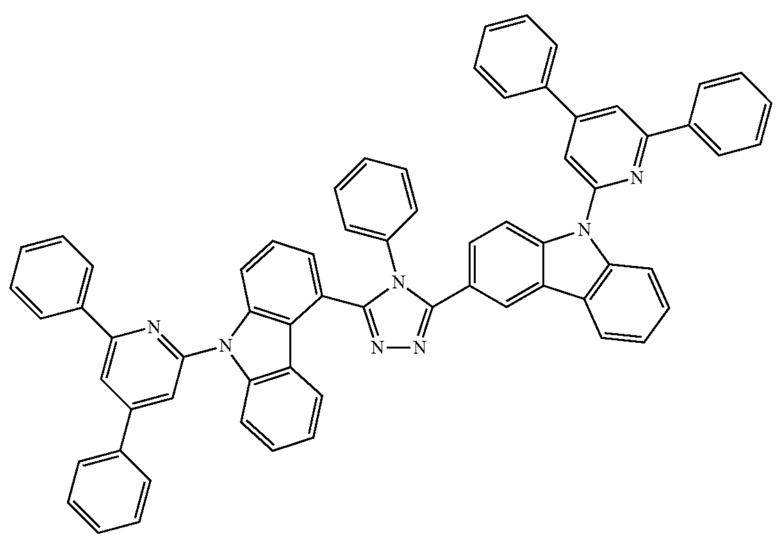

-continued
C 356
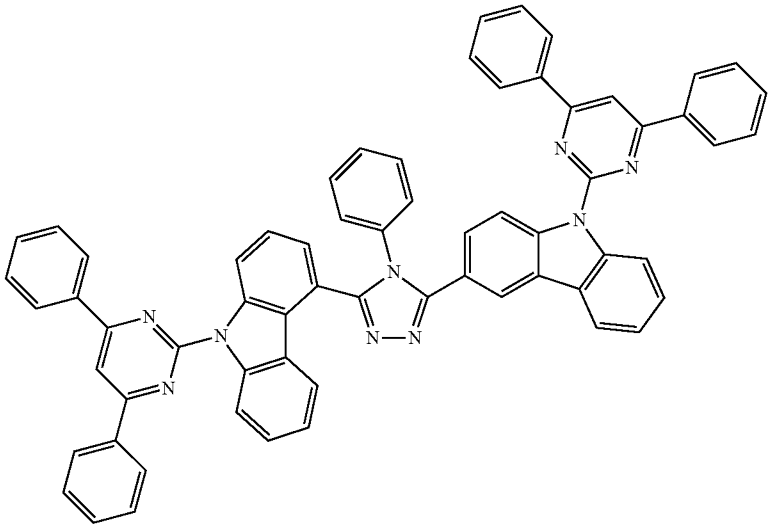
C 357
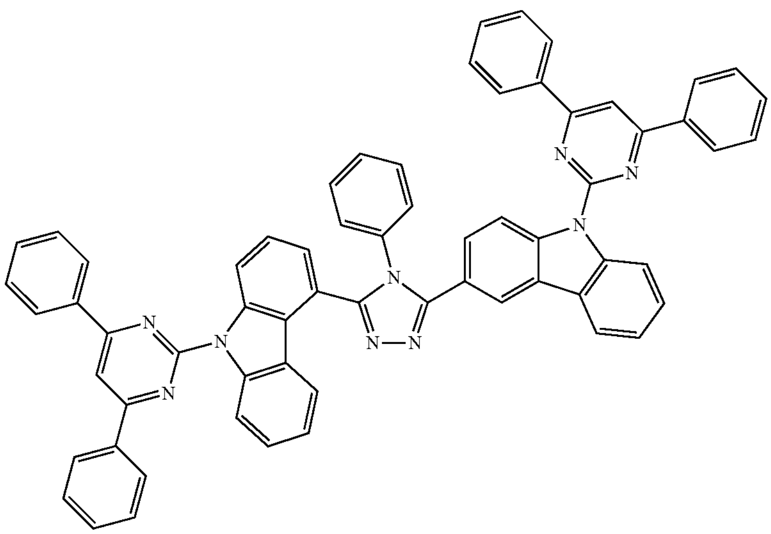
C 358
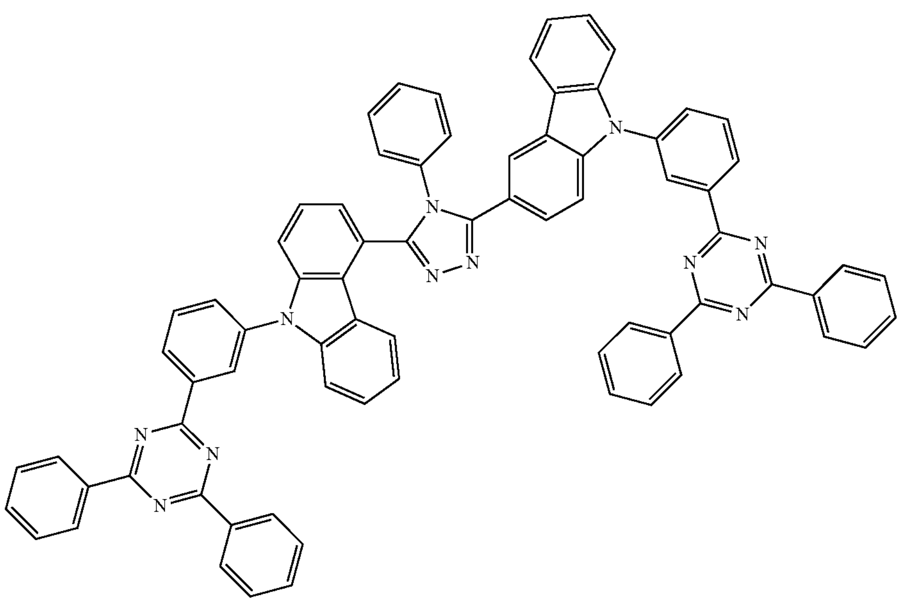

-continued
C 359
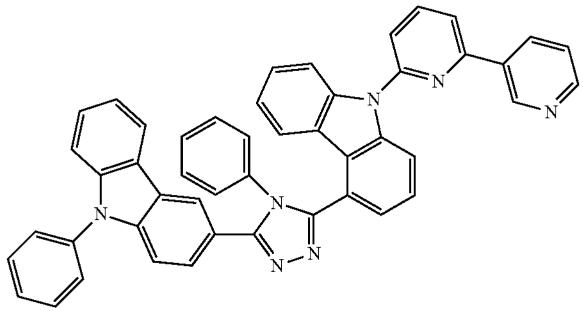
C 360
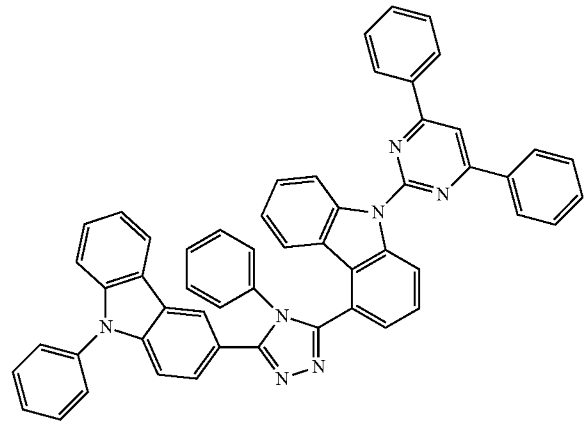
C 361
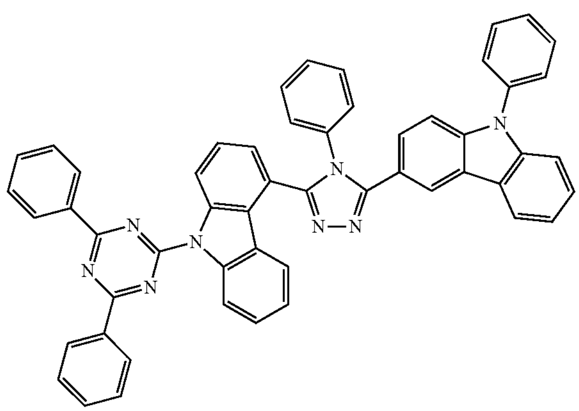
C 362
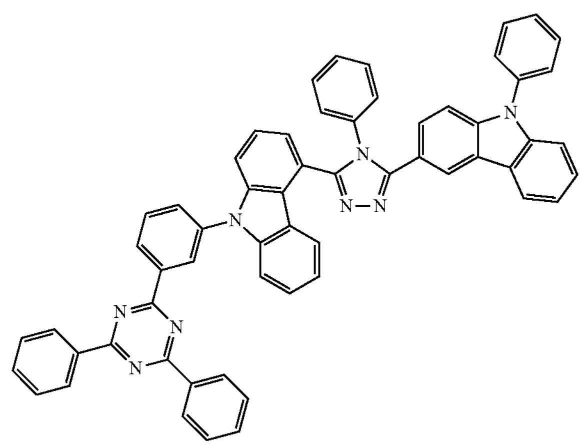
C 363
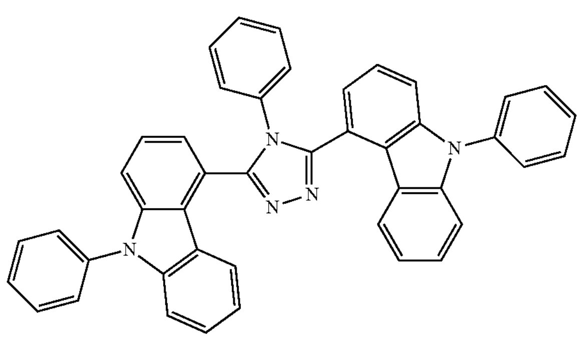
C 364
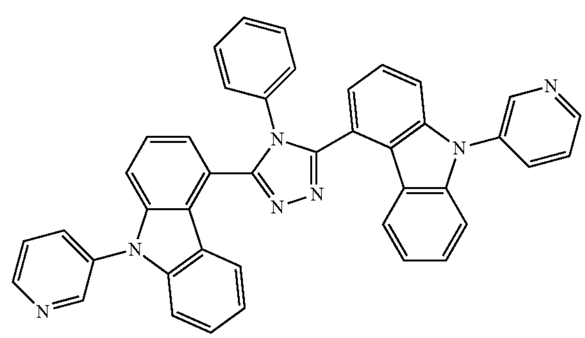

-continued
C 365
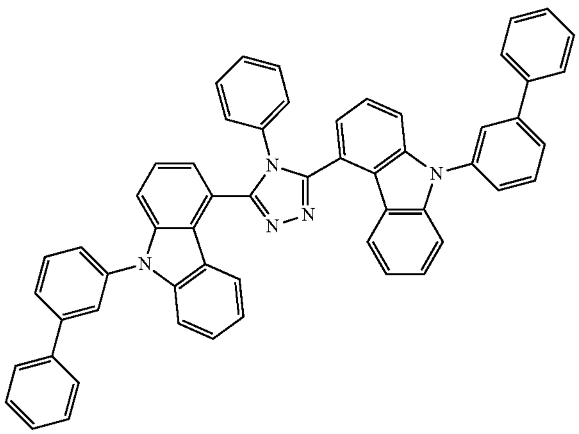
C 366
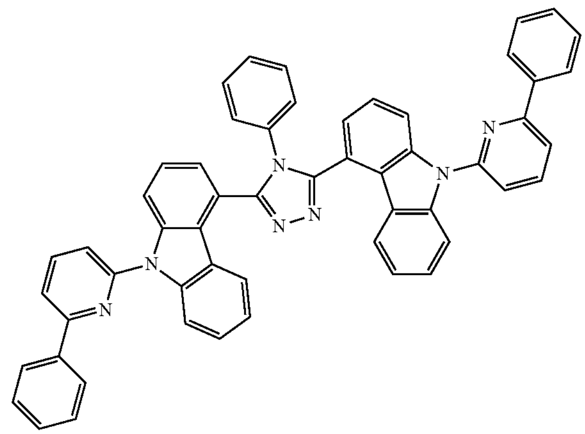
C 367
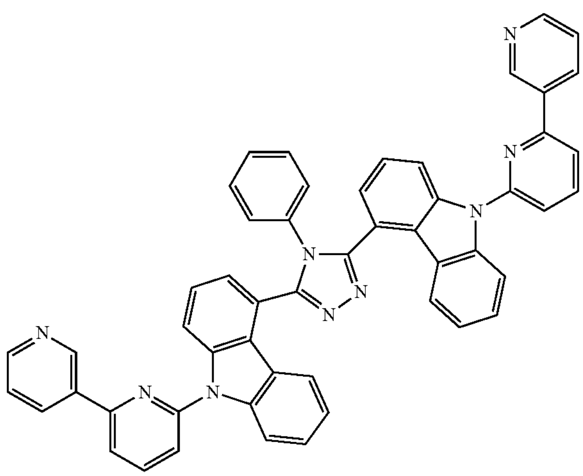
C 368
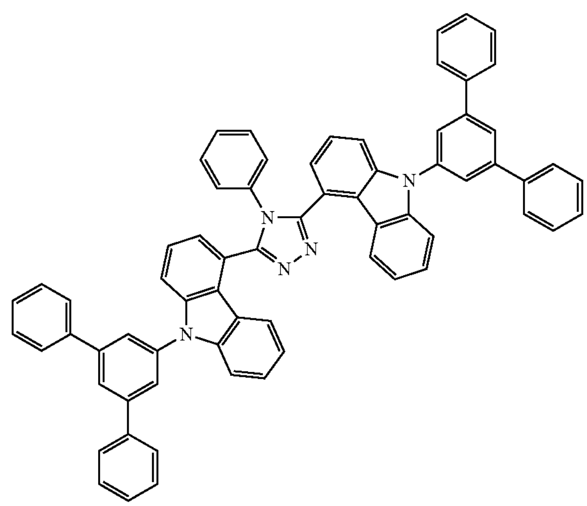
C 369
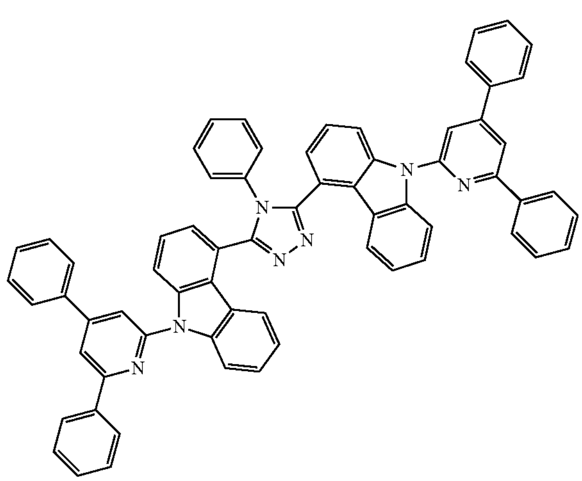
C 370
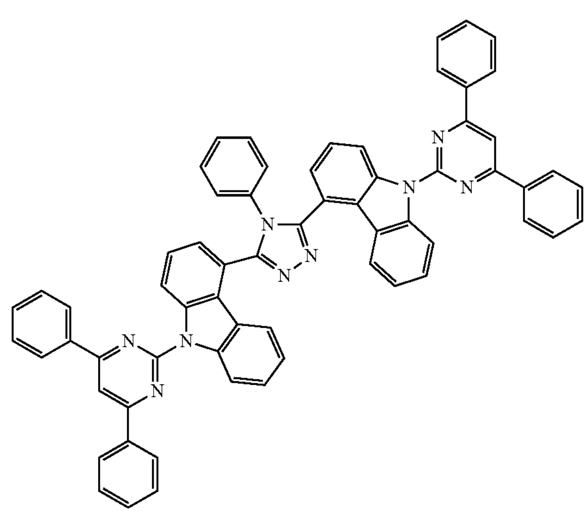

-continued
C 371
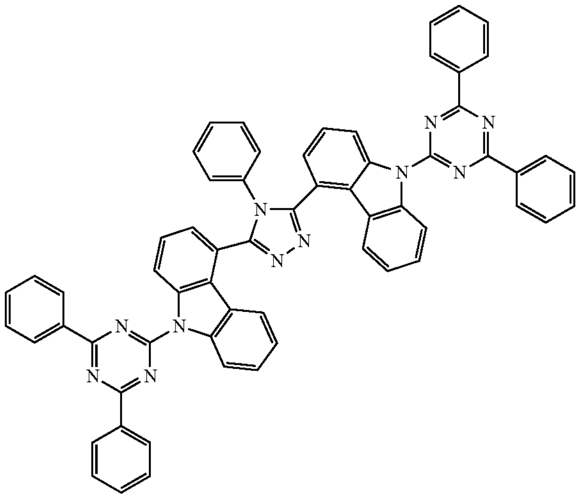
C 372
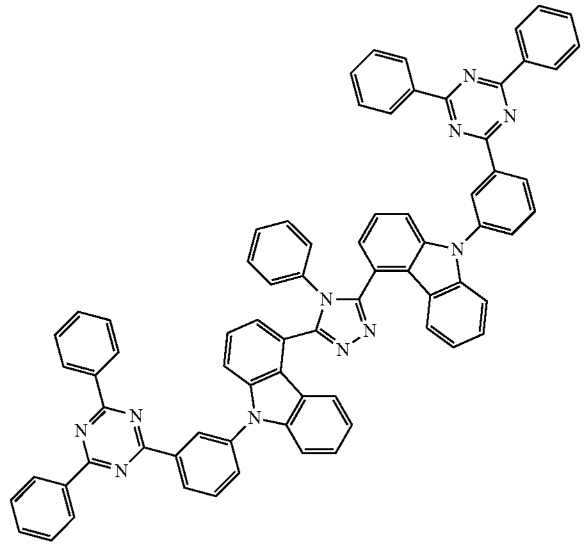
C 373
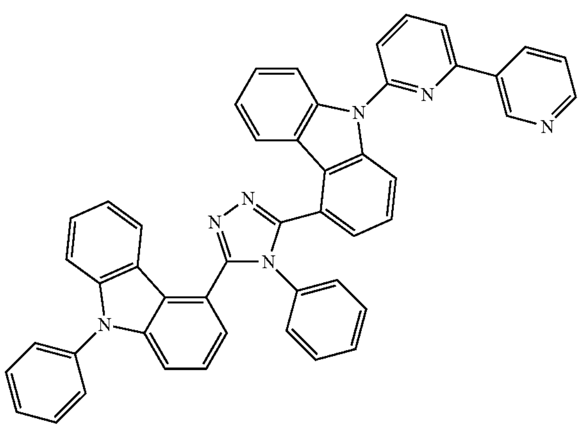
C 374
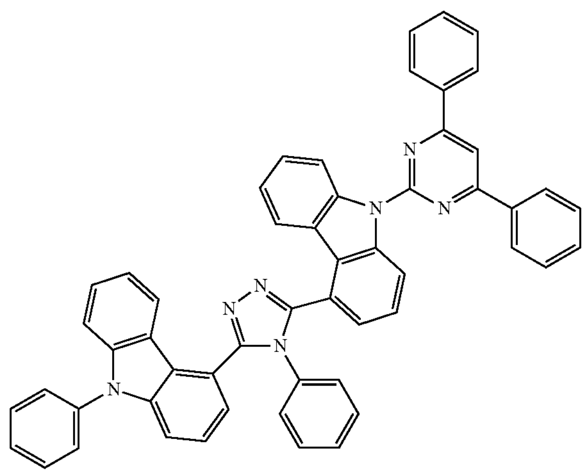
C 375
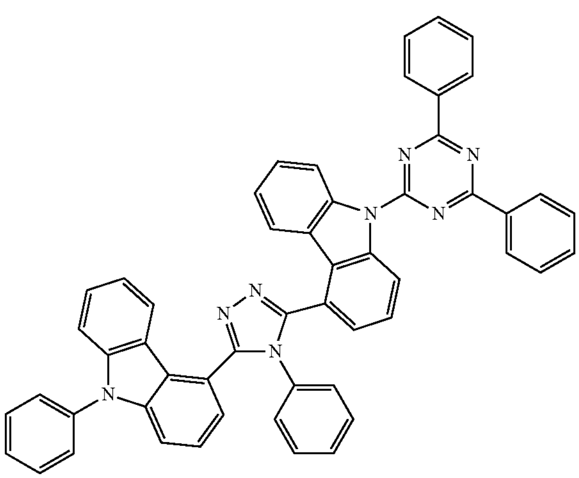
C 376
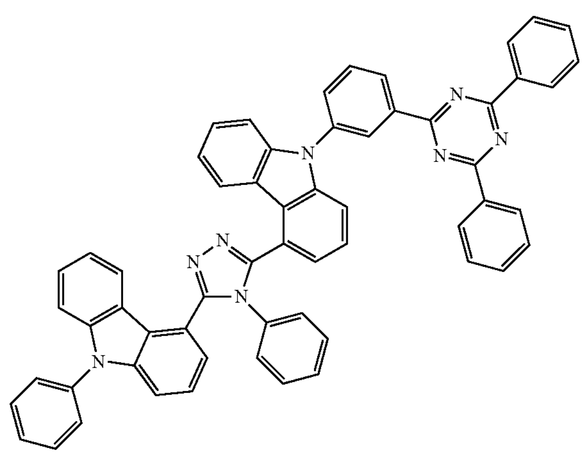

-continued
C 377
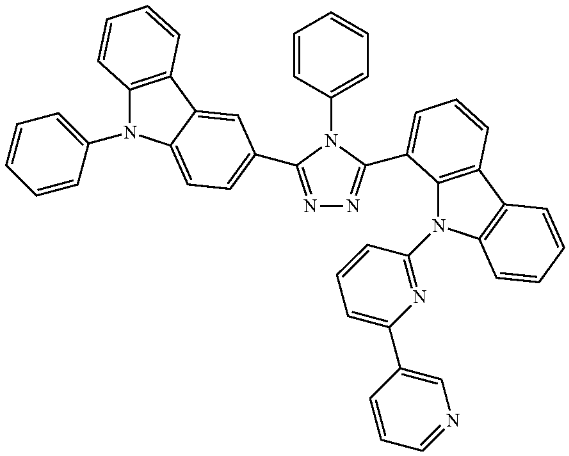
C 378
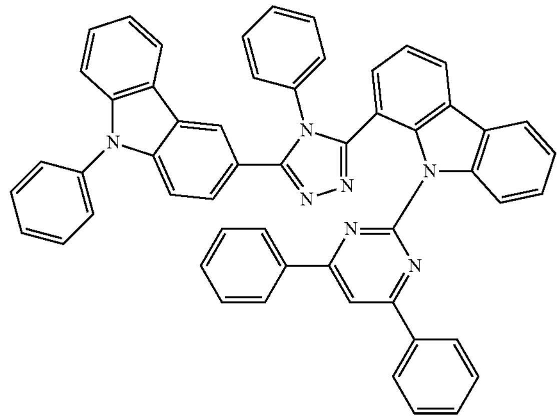
C 379
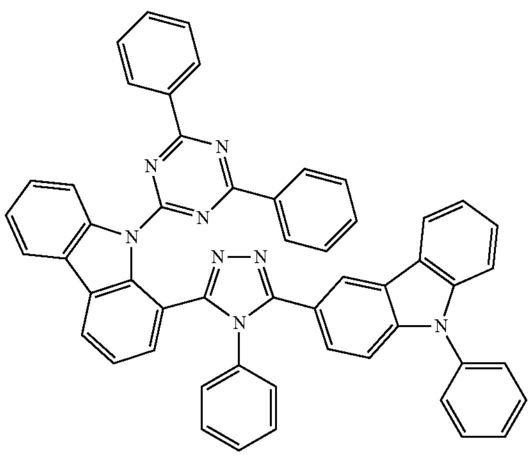
C 380
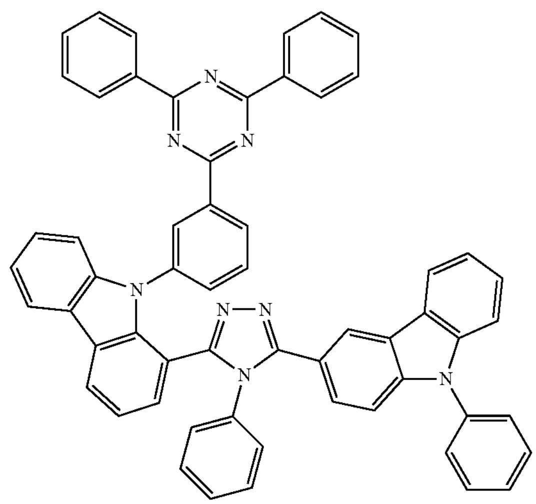
C 381
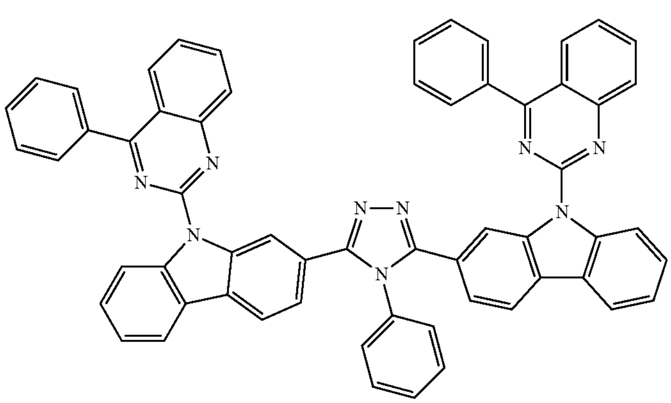

-continued
C 382
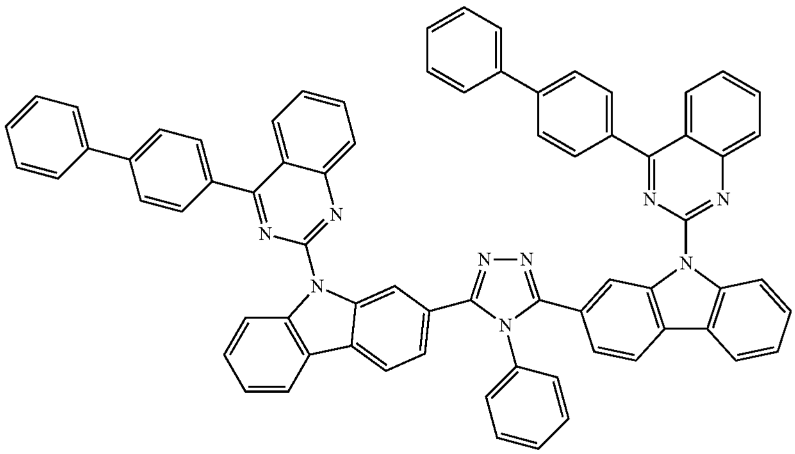
C 383
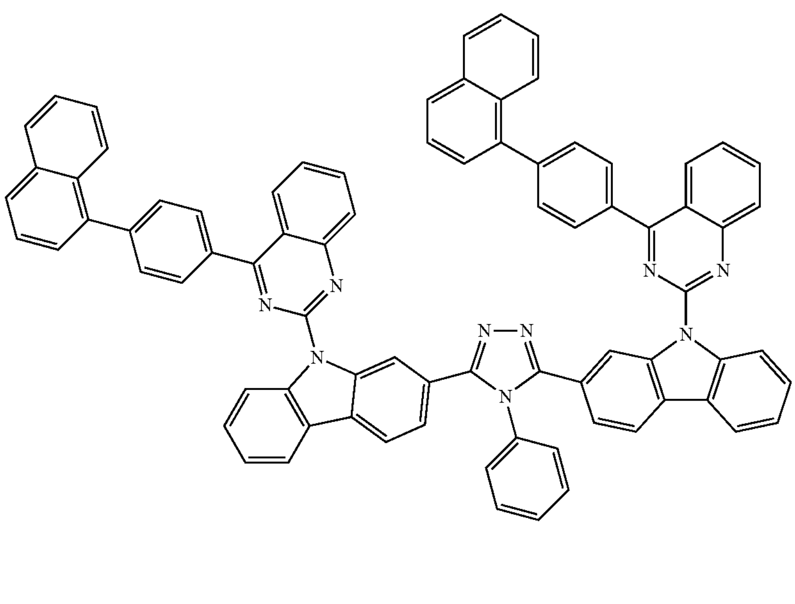

7. The organic electroluminescence device of claim 1, wherein the second host comprises at least one of compounds represented by the following Formulae TC1 to TC12:
TC1
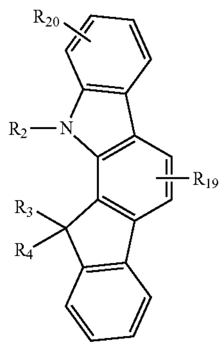
TC2
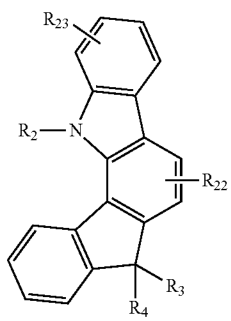
TC3
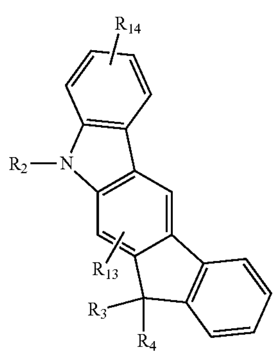
TC4
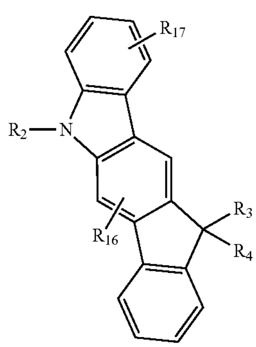
-continued
TC5
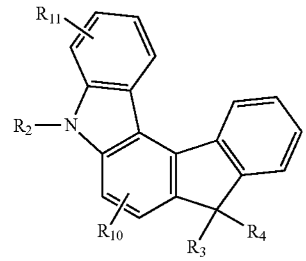
TC6
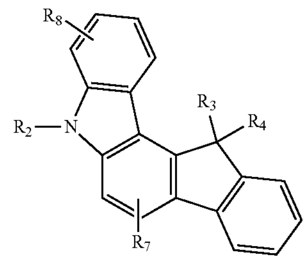
TC7
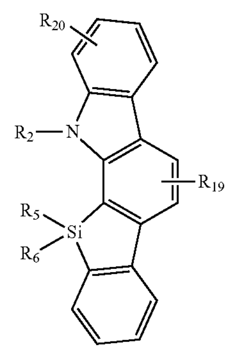
TC8
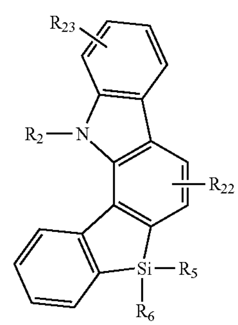
TC9
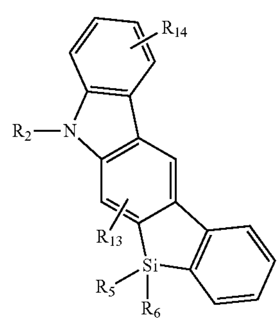

-continued
TC10
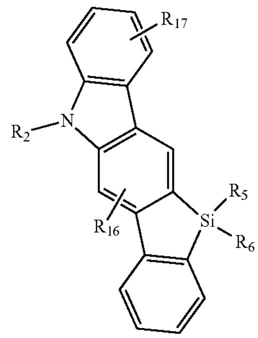
TC11
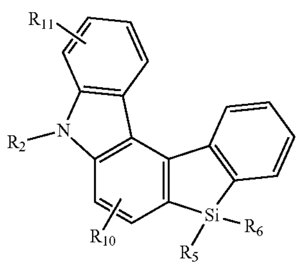
TC12
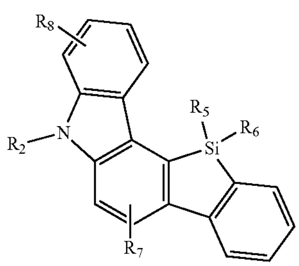
and
wherein in Formulae TC1 to TC12,
$R_2$ to $R_6$, $R_7$, $R_8$, $R_{10}$, $R_{11}$, $R_{13}$, $R_{14}$, $R_{16}$, $R_{17}$, $R_{19}$, $R_{20}$, $R_{22}$, and $R_{23}$ are the same as respectively defined with respect to Formulae 2-1 to 2-6.
8. The organic electroluminescence device of claim 1, wherein at least one of $R_2$ to $R_6$ or $R_7$ to $R_{24}$ is represented by any one of the following H1 to H89 or H91 to H110:
H1
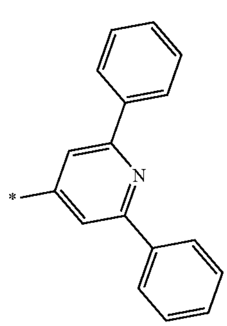
-continued
H2
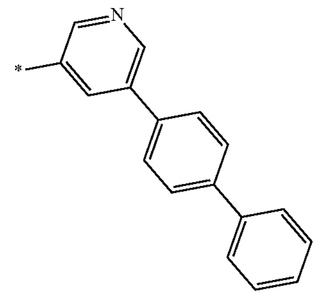
H3
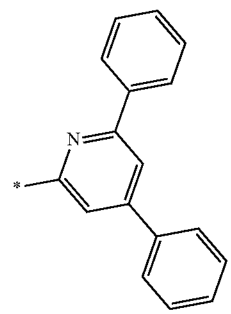
H4
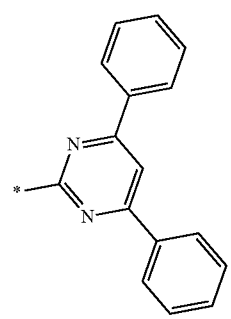
H5
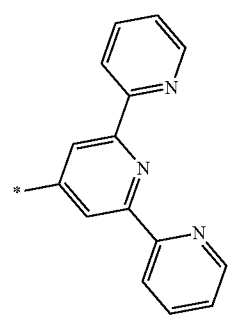
H6
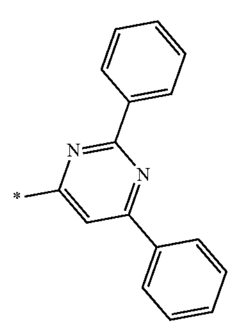

-continued
H7
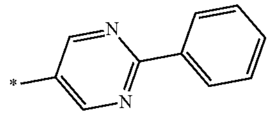
H8
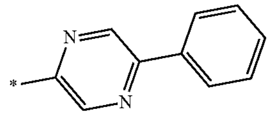
H9
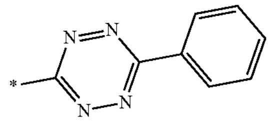
H10
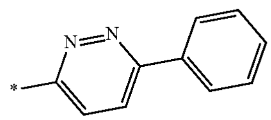
H11
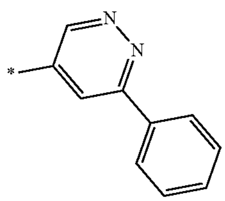
H12
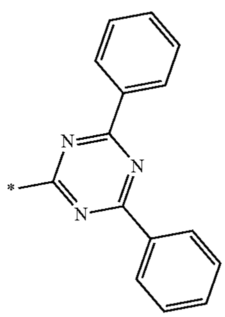
H13
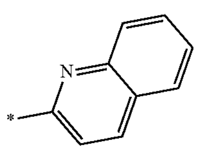
H14
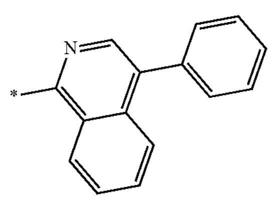
H15
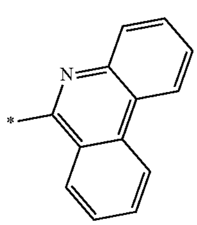
-continued
H16
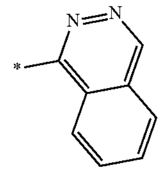
H17
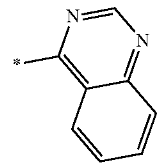
H18
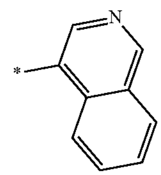
H19
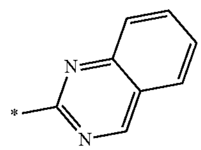
H20
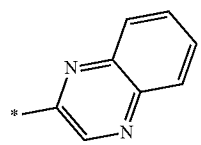
H21
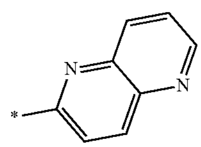
H22
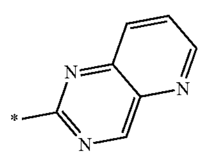
H23
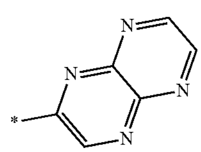
H24
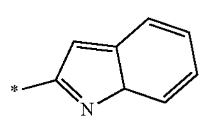
H25
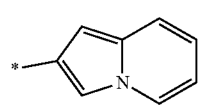

-continued
H26
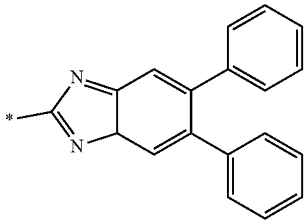
H27
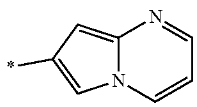
H28
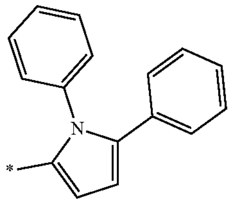
H29
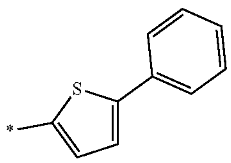
H30
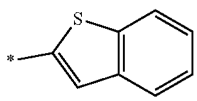
H31
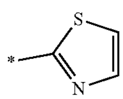
H32
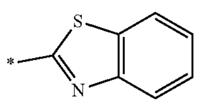
H33
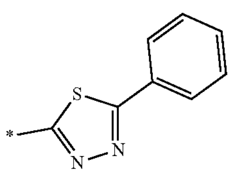
H34
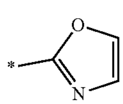
H35
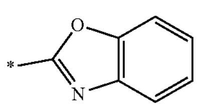
H36
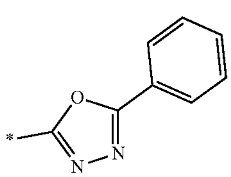
-continued
H37
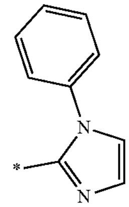
H38
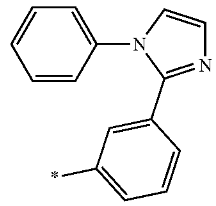
H39
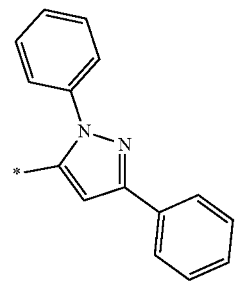
H40
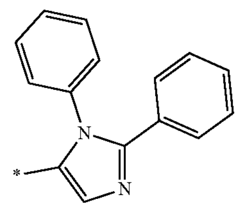
H41
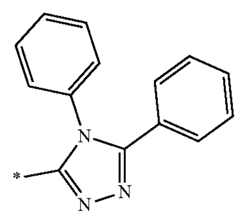
H42
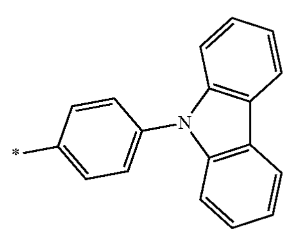
H43
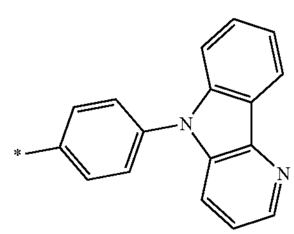

-continued
H44
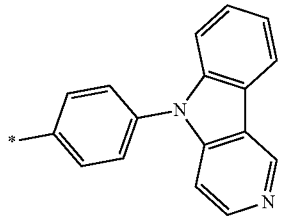
H45
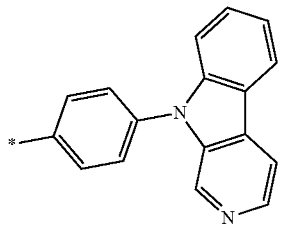
H46
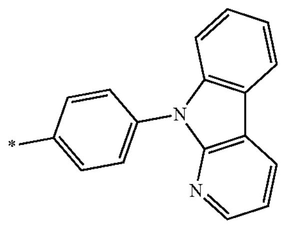
H47
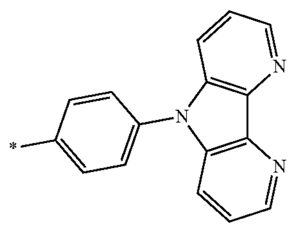
H48
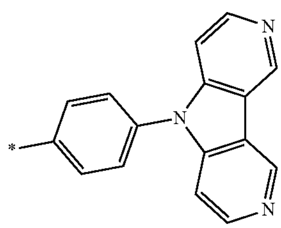
H49
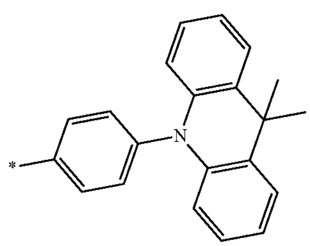
H50
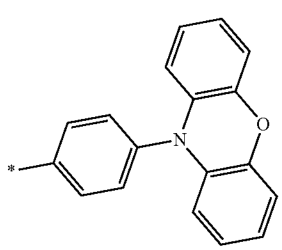
-continued
H51
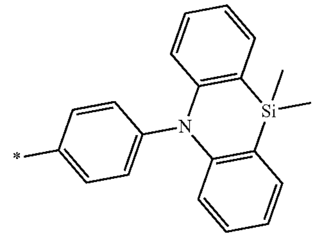
H52
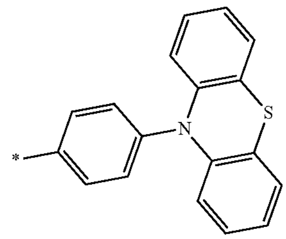
H53
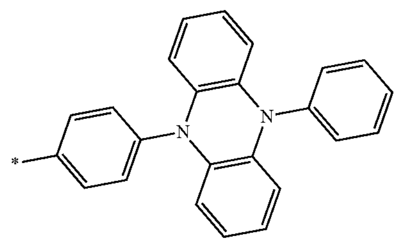
H54
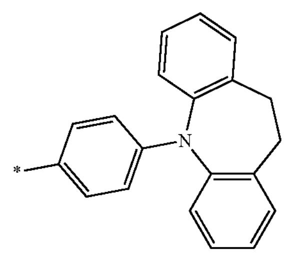
H55
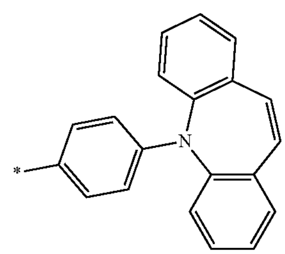
H56
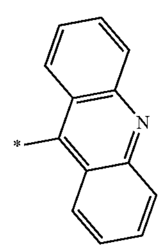

-continued
H57
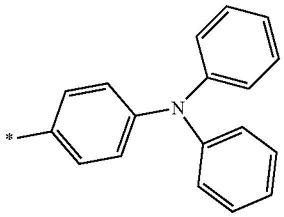
H58
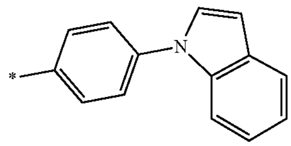
H59
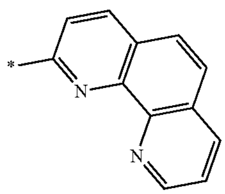
H60
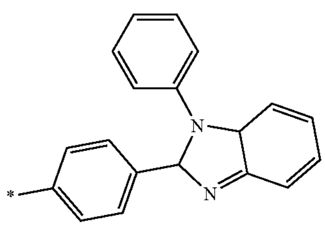
H61
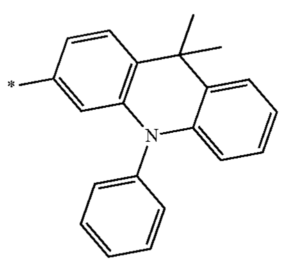
H62
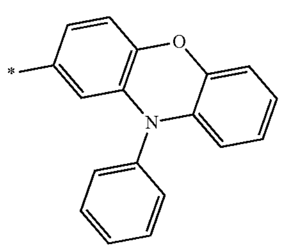
H63
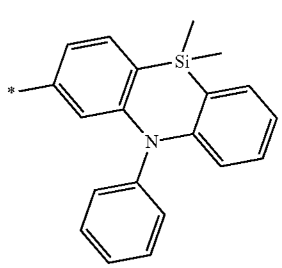
-continued
H64
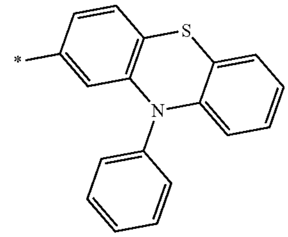
H65
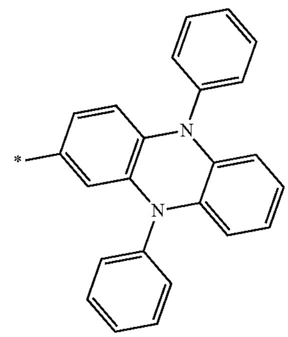
H66
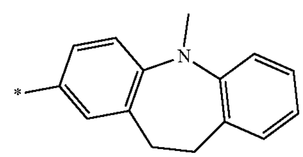
H67
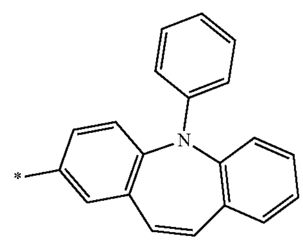
H68
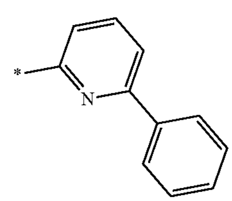
H69
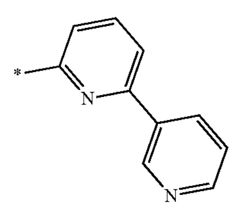
H70
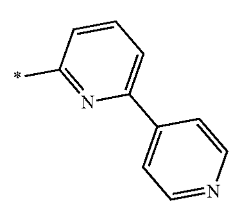

-continued
H71
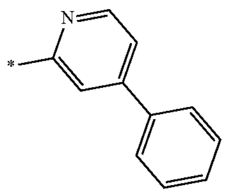
H72
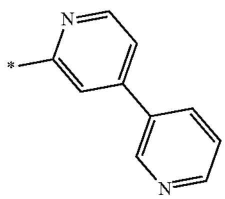
H73
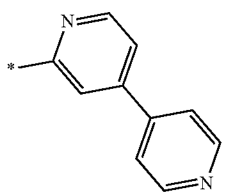
H74
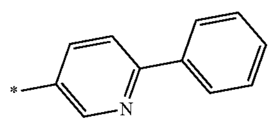
H75
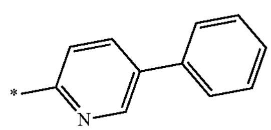
H76
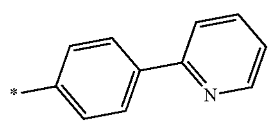
H77
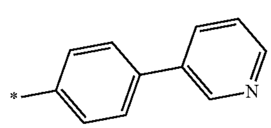
H78
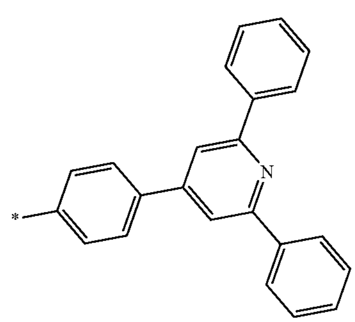
-continued
H79
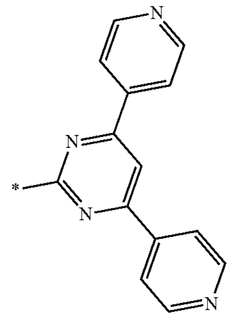
H80
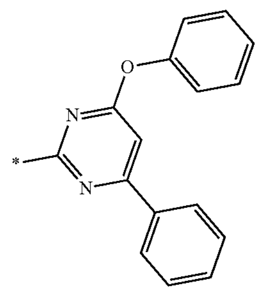
H81
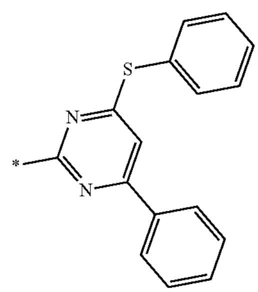
H82
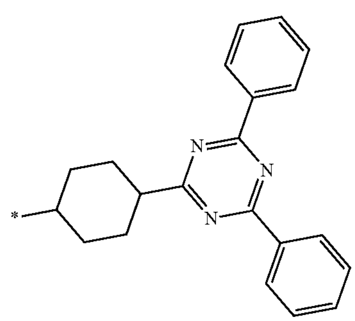

-continued
H83
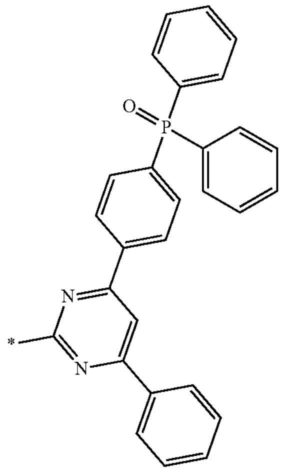
H84
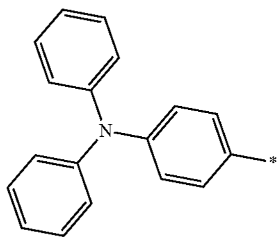
H85
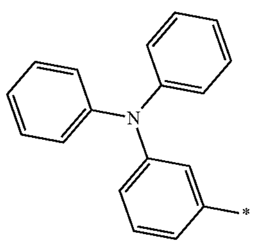
H86
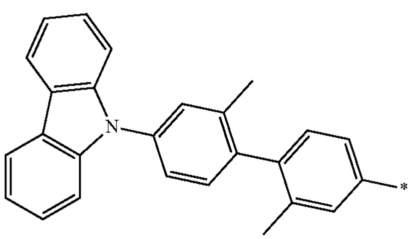
H87
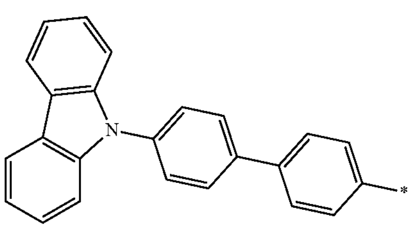
H88
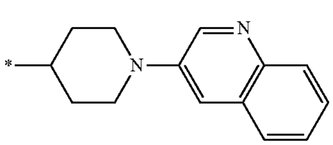
-continued
H89
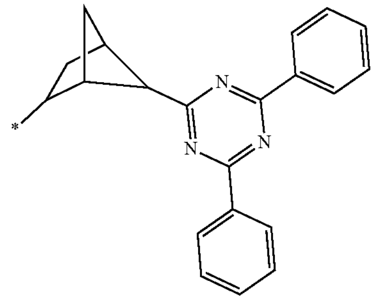
H91
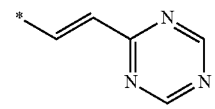
H92
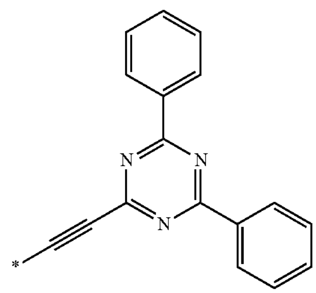
H93
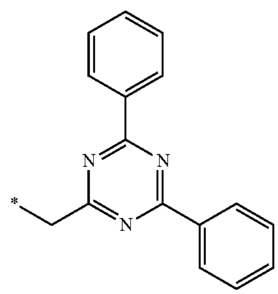
H94
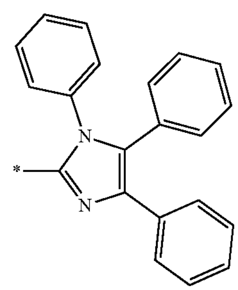
H95
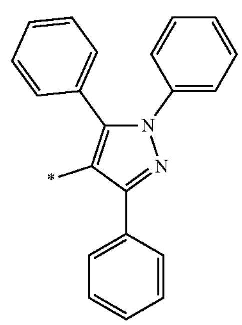

-continued
H96
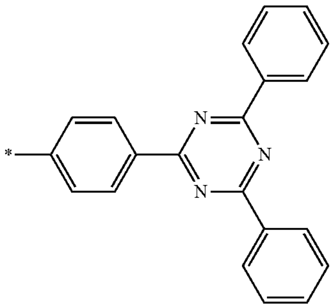
H97
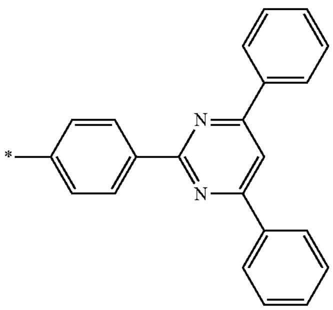
H98
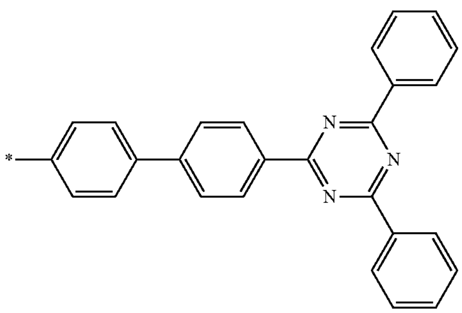
H99
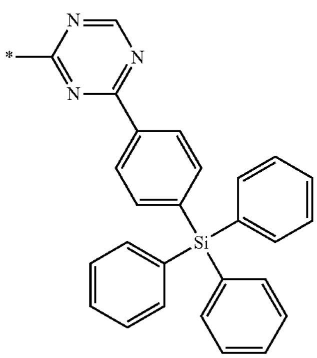
H100
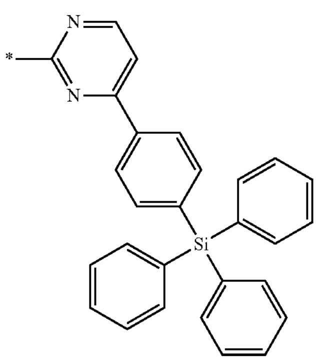
-continued
H101
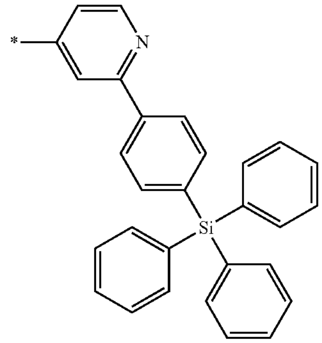
H102
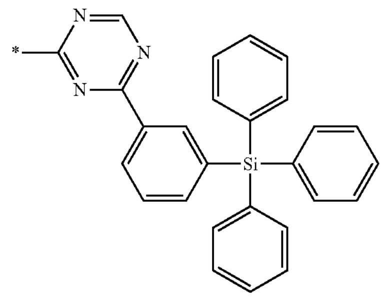
H103
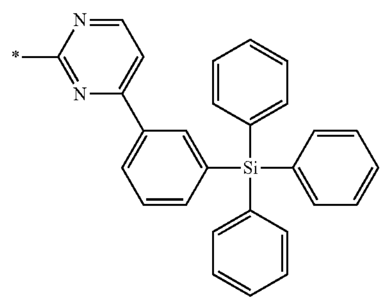
H104
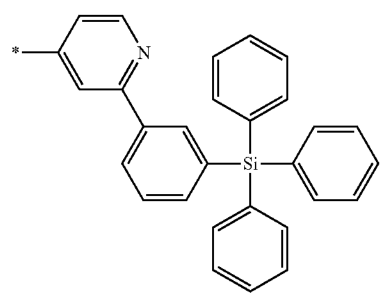
H105
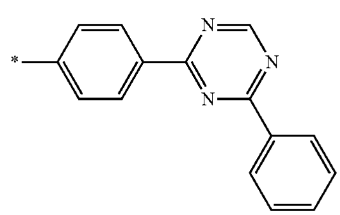

-continued

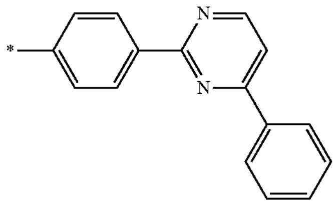

H106

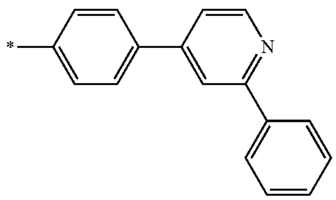

H107

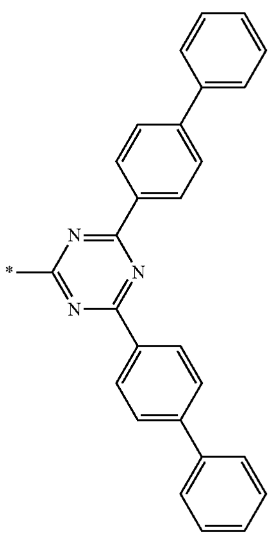

H108

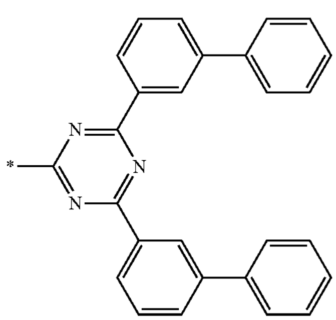

H109

-continued

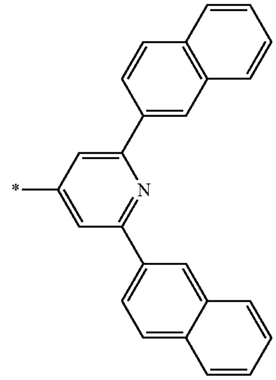

H110

9. The organic electroluminescence device of claim 5, wherein the first host is represented by Formula 1-1 or 1-2 and the second host is represented by Formula 2-4.

10. The organic electroluminescence device of claim 1, wherein the emission layer further comprises a phosphorescence dopant.

11. The organic electroluminescence device of claim 1, wherein the emission layer is to emit light of a green wavelength region.

12. The organic electroluminescence device of claim 10, wherein the dopant is a metal complex comprising Ir, Os, Pt or Pd as a central atom.

13. The organic electroluminescence device of claim 1, further comprising:

a hole transport region between the first electrode and the emission layer; and an electron transport region between the emission layer and second electrode.

14. The organic electroluminescence device of claim 10, wherein a weight ratio of a sum of the first host and the second host to the dopant is 59:41 to 95:5.

15. An organic electroluminescence device, comprising:

a first electrode;

a hole transport region on the first electrode;

an emission layer on the hole transport region, the emission layer comprising a first host represented by the following Formula 1, a second host represented by any one of the following Formulae 2-1 to 2-6, and a phosphorescence dopant;

an electron transport region on the emission layer; and a second electrode on the electron transport region:

Formula 1

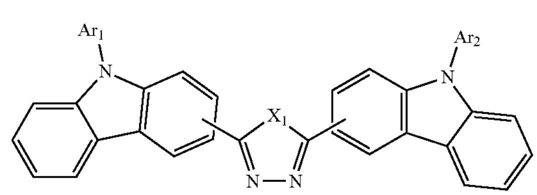

-continued

Formula 2-1

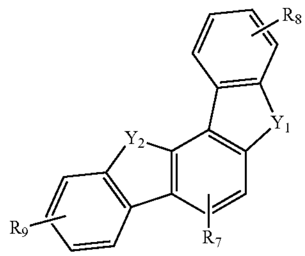

Formula 2-2

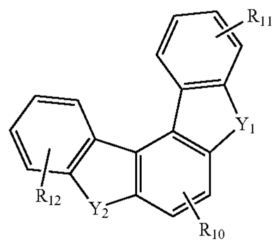

Formula 2-3

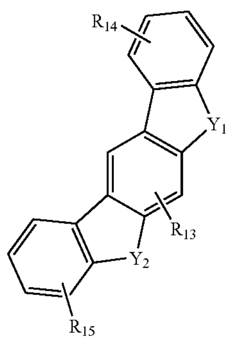

Formula 2-4

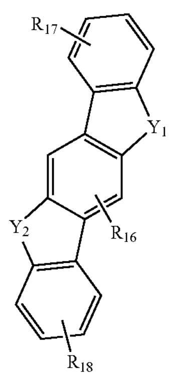

Formula 2-5

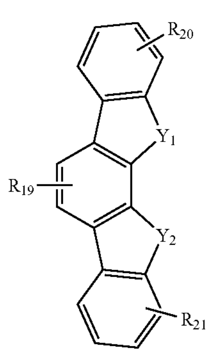

-continued

Formula 2-6

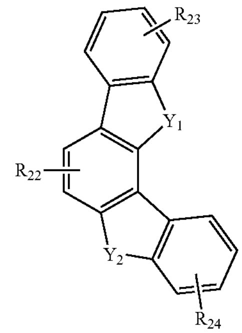

wherein in Formula 1, $X_1$ is O, S, or $NR_1$, $R_1$ is a hydrogen atom, a deuterium atom, a cyano group, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $Ar_1$ and $Ar_2$ are each independently a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and wherein in Formulae 2-1 to 2-6, $Y_1$ and $Y_2$ are each independently $NR_2$, $CR_3R_4$, or $SiR_5R_6$, and one of $Y_1$ or $Y_2$ is $CR_3R_4$, or $SiR_5R_6$, $R_2$ to $R_6$ are each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring, and $R_7$ to $R_{24}$ are each independently a hydrogen atom, a deuterium atom, a substituted or unsubstituted alkyl group having 1 to 40 carbon atoms, a substituted or unsubstituted aryl group having 6 to 40 carbon atoms for forming a ring, or a substituted or unsubstituted heteroaryl group having 3 to 40 carbon atoms for forming a ring.

16. The organic electroluminescence device of claim 15, wherein a weight ratio of the first host to the second host is 10:90 to 90:10.

17. The organic electroluminescence device of claim 15, wherein a weight ratio of a sum of the first host and the second host to the dopant is 59:41 to 95:5.

18. The organic electroluminescence device of claim 15, wherein the emission layer is to emit light with a wavelength range of 495 nm to 570 nm.

19. The organic electroluminescence device of claim 15, wherein the phosphorescence dopant comprises at least one of the following D1 to D4:

-continued
D1
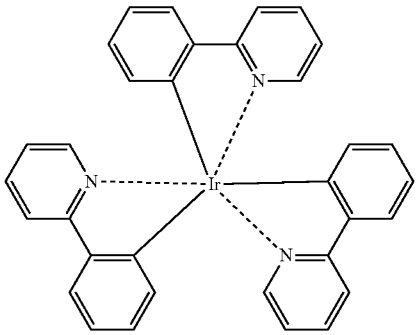
D2
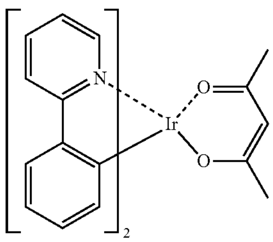
D3
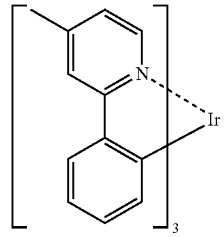
D4
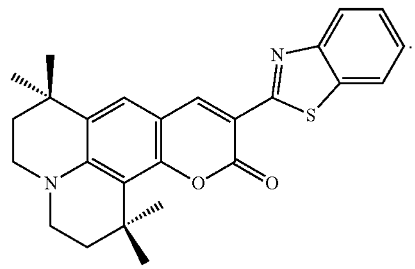
20. The organic electroluminescence device of claim 15, wherein the first host and the second host form an exciplex, and
a lowest triplet energy level of the phosphorescence dopant is lower than a lowest triplet energy level of each of the first host, the second host, and the exciplex.
* * * * *